US010629825B2

(12) United States Patent
Cho et al.

(10) Patent No.: US 10,629,825 B2
(45) Date of Patent: Apr. 21, 2020

(54) ORGANIC LIGHT-EMITTING DEVICE

(71) Applicant: Samsung Display Co., Ltd., Yongin-si, Gyeonggi-do (KR)

(72) Inventors: Hwan-Hee Cho, Yongin-si (KR); Myeong-Suk Kim, Yongin-si (KR); Sung-Wook Kim, Yongin-si (KR); Se-Hun Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 181 days.

(21) Appl. No.: 15/229,775

(22) Filed: Aug. 5, 2016

(65) Prior Publication Data

US 2017/0133590 A1 May 11, 2017

(30) Foreign Application Priority Data

Nov. 5, 2015 (KR) ........................ 10-2015-0155277

(51) Int. Cl.
*H01L 51/54* (2006.01)
*C09K 11/06* (2006.01)
(Continued)

(52) U.S. Cl.
CPC ........ *H01L 51/0073* (2013.01); *C09K 11/025* (2013.01); *C09K 11/06* (2013.01);
(Continued)

(58) Field of Classification Search
CPC ... C09K 11/025; C09K 11/06; C09K 2211/00; C09K 2211/10; C09K 2211/1007; C09K 2211/1014; C09K 2211/1029; C09K 2211/1011; C09K 2211/1088; C09K 2211/1092; H01L 2251/00; H01L 2251/552; H01L 51/0032; H01L 51/005; H01L 51/006; H01L 51/0061; H01L 51/0058; H01L 51/0072; H01L 51/0073;
(Continued)

(56) References Cited

U.S. PATENT DOCUMENTS

2007/0009758 A1 1/2007 Funahashi
2007/0215867 A1* 9/2007 Kawakami ............ C07C 211/61 257/40
(Continued)

FOREIGN PATENT DOCUMENTS

KR 10-2004-0057862 A 7/2004
KR 10-2005-0107809 A 11/2005
(Continued)

*Primary Examiner* — Andrew K Bohaty

(74) *Attorney, Agent, or Firm* — Lewis Roca Rothgerber Christie LLP

(57) ABSTRACT

An organic light-emitting device includes: a first electrode; a second electrode; and an organic layer between the first electrode and the second electrode, the organic layer including an emission layer, wherein the organic layer includes a first compound represented by Formula 1 and a second compound represented by one of Formulae 2 and 3:

Formula 1

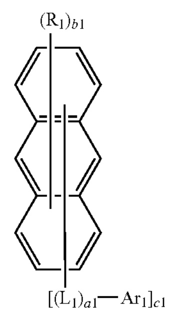

Formula 2

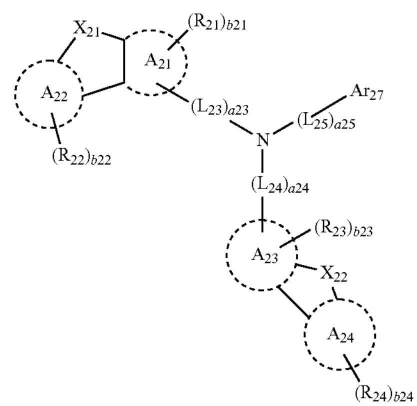

Formula 3

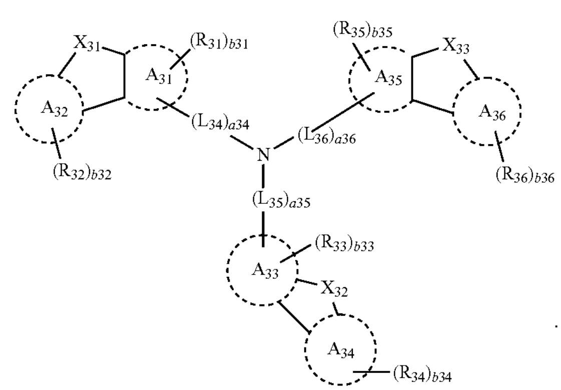

18 Claims, 1 Drawing Sheet

(51) Int. Cl.

| | |
|---|---|
| ***H01L 51/00*** | (2006.01) |
| ***C09K 11/02*** | (2006.01) |
| *H01L 51/50* | (2006.01) |

(52) U.S. Cl.

CPC ...... *H01L 51/0058* (2013.01); *H01L 51/0061* (2013.01); *H01L 51/0072* (2013.01); *H01L 51/0074* (2013.01); *C09K 2211/1007* (2013.01); *C09K 2211/1011* (2013.01); *C09K 2211/1014* (2013.01); *C09K 2211/1029* (2013.01); *C09K 2211/1088* (2013.01); *C09K 2211/1092* (2013.01); *H01L 51/5004* (2013.01); *H01L 51/5012* (2013.01); *H01L 51/5056* (2013.01); *H01L 2251/552* (2013.01)

(58) Field of Classification Search

CPC . H01L 51/0074; H01L 51/50; H01L 51/5012; H01L 51/5016; H01L 51/5004; H01L 51/5056

USPC ....... 428/690, 691, 917, 411.4, 336; 427/58, 427/66; 313/500–512; 257/40, 88–104, 257/E51.001–E51.052; 252/301.16–301.35

See application file for complete search history.

(56) References Cited

U.S. PATENT DOCUMENTS

| | | | | |
|---|---|---|---|---|
| 2008/0286610 | A1* | 11/2008 | Deaton | H01L 51/5016 428/704 |
| 2009/0085474 | A1* | 4/2009 | Shitagaki | H01L 51/5048 313/504 |
| 2009/0096356 | A1 | 4/2009 | Murase et al. | |
| 2010/0207110 | A1* | 8/2010 | Nishimura | C09K 11/06 257/40 |
| 2012/0138914 | A1* | 6/2012 | Kawamura | C07D 307/79 257/40 |
| 2013/0105771 | A1* | 5/2013 | Ryu | C09K 11/06 257/40 |
| 2014/0034943 | A1* | 2/2014 | Mizuki | C09K 11/06 257/40 |
| 2015/0034919 | A1 | 2/2015 | Kim et al. | |

FOREIGN PATENT DOCUMENTS

| | | | |
|---|---|---|---|
| KR | 10-2008-0055891 | A | 6/2008 |
| KR | 10-2011-0117548 | A | 10/2011 |
| KR | 10-2015-0006199 | A | 1/2015 |
| KR | 10-2015-0007476 | A | 1/2015 |
| KR | 10-2015-0016035 | A | 2/2015 |
| KR | 10-2015-0079664 | A | 7/2015 |

* cited by examiner

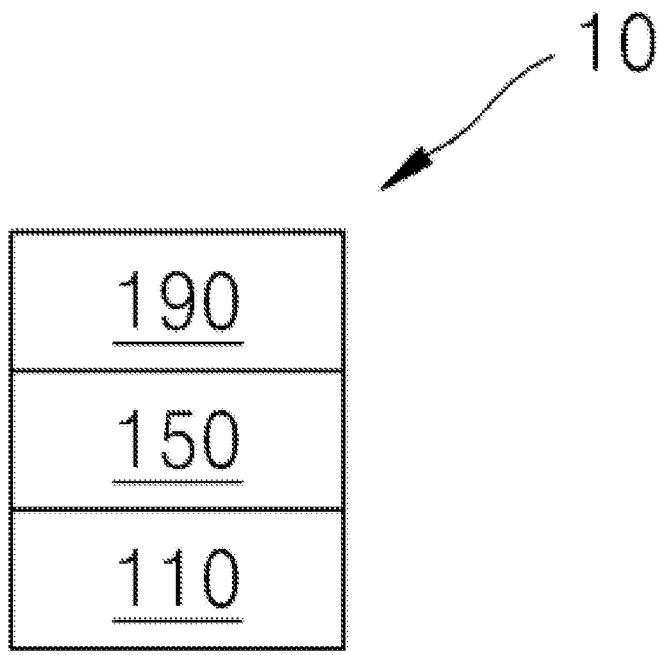
10
190
150
110

ORGANIC LIGHT-EMITTING DEVICE

CROSS-REFERENCE TO RELATED APPLICATION

This application claims priority to and the benefit of Korean Patent Application No. 10-2015-0155277, filed on Nov. 5, 2015, in the Korean Intellectual Property Office, the entire content of which is incorporated herein by reference.

BACKGROUND

1. Field

One or more aspects of embodiments of the present disclosure relate to an organic light-emitting device.

2. Description of the Related Art

Organic light-emitting devices (OLEDs) are self-emission devices that have wide viewing angles, high contrast ratios, and short response times. In addition, the OLEDs exhibit high luminance, low driving voltage, and good response speed characteristics, and can produce full-color images.

An OLED may include a first electrode disposed (e.g., positioned) on a substrate, and a hole transport region, an emission layer, an electron transport region, and a second electrode, which are sequentially disposed on the first electrode. Holes provided from the first electrode, for example, may move toward the emission layer through the hole transport region, and electrons provided from the second electrode, for example, may move toward the emission layer through the electron transport region. Carriers, such as holes and electrons, may then recombine in the emission layer to produce excitons. These excitons change from an excited state to a ground state to thereby generate light.

SUMMARY

One or more aspects of embodiments of the present disclosure are directed toward an organic light-emitting device having high efficiency and long lifespan.

Additional aspects will be set forth in part in the description which follows and, in part, will be apparent from the description, or may be learned by practice of the presented embodiments.

According to one or more embodiments, an organic light-emitting device includes:

a first electrode;

a second electrode; and an organic layer between the first electrode and the second electrode, the organic layer including an emission layer, wherein the organic includes a first compound represented by Formula 1 and a second compound represented by one of Formulae 2 and 3:

Formula 1

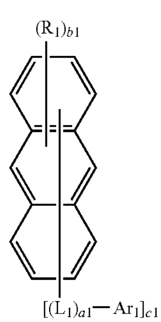

-continued

Formula 1-1

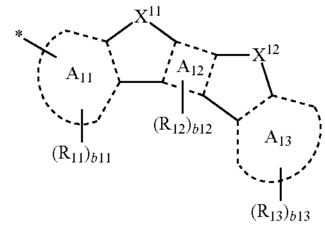

Formula 1-2

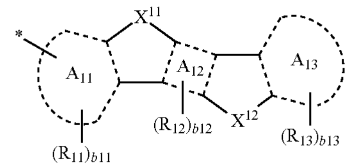

Formula 2

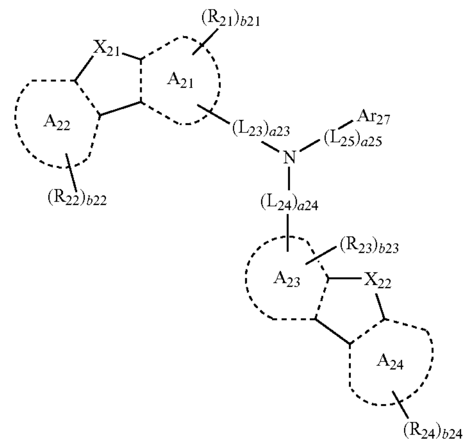

Formula 3

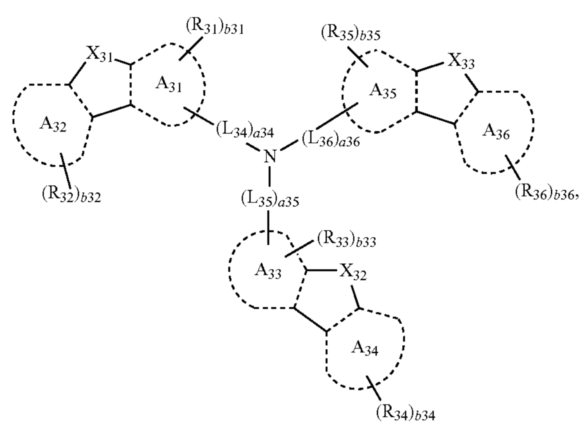

wherein, in Formulae 1, 1-1, 1-2, 2, and 3, $X_{11}$ is selected from $N[(L_{11})_{a11}\text{-}Ar_{11}]$, $C(Ar_{13})(Ar_{15})$, O, and S, $X_{12}$ is selected from $N[(L_{12})_{a12}\text{-}Ar_{12}]$, $C(Ar_{14})(Ar_{16})$, O, and S, $X_{21}$ is selected from $N[(L_{21})_{a21}\text{-}Ar_{21}]$, $C(Ar_{23})(Ar_{25})$, O, and S, $X_{22}$ is selected from $N[(L_{22})_{a22}\text{-}Ar_{22}]$, $C(Ar_{24})(Ar_{26})$, O, and S, when $X_{21}$ is $N[(L_{21})_{a21}\text{-}Ar_{21}]$, $X_{22}$ is selected from $N(L_{22})_{a22}\text{-}Ar_{22}]$, O, and S;

when $X_{21}$ is $C(Ar_{23})(Ar_{25})$, $X_{22}$ is selected from $C(Ar_{24})(Ar_{26})$, O, and S;

when $X_{21}$ is O, $X_{22}$ is selected from $N(L_{22})_{a22}$-$Ar_{22}$], $C(Ar_{24})(Ar_{26})$, and S; and when $X_{21}$ is S, $X_{22}$ is selected from $N(L_{22})_{a22}$-$Ar_{22}$], $C(Ar_{24})(Ar_{26})$, and O, $X_{31}$ is selected from $N[(L_{31})_{a31}$-$Ar_{31}]$, $C(Ar_{34})(Ar_{37})$, O, and S; $X_{32}$ is selected from $N(L_{32})_{a32}$-$Ar_{32}$], $C(Ar_{35})(Ar_{38})$, O, and S; $X_{33}$ is selected from $N[(L_{33})_{a33}$-$Ar_{33}]$, $C(Ar_{36})(Ar_{39})$, O, and S, when $X_{31}$ is $N[(L_{31})_{a31}$-$Ar_{31}]$, $X_{32}$ is $N(L_{32})_{a32}$-$Ar_{32}$], and $X_{33}$ is selected from $N[(L_{33})_{a33}$-$Ar_{33}]$, O, and S;

when $X_{31}$ is $C(Ar_{34})(Ar_{37})$, $X_{32}$ is $C(Ar_{35})(Ar_{38})$, and $X_{33}$ is selected from $C(Ar_{36})(Ar_{39})$, O, and S; and when $X_{31}$ is O, $X_{32}$ is S, and $X_{33}$ is selected from $N[(L_{33})_{a33}$-$Ar_{33}]$ and $C(Ar_{35})(Ar_{38})$, $A_{11}$ to $A_{13}$, $A_{21}$ to $A_{24}$, and $A_{31}$ to $A_{36}$ may be each independently selected from a $C_5$-$C_{20}$ cyclic group and a $C_1$-$C_{20}$ heterocyclic group, $L_1$, $L_{11}$, $L_{12}$, $L_{21}$ to $L_{25}$, and $L_{31}$ to $L_{36}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1, a11, a12, a21 to a25, and a31 to a36 may be each independently an integer selected from 0 to 3, $Ar_1$ may be selected from a group represented by Formula 1-1, a group represented by Formula 1-2, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $Ar_{11}$ to $Ar_{16}$, $Ar_{21}$ to $Ar_{26}$, and $Ar_{31}$ to $Ar_{39}$ may be each independently selected from a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $Ar_{27}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group, $R_1$, $R_{11}$ to $R_{13}$, $R_{21}$ to $R_{24}$, and $R_{31}$ to $R_{36}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_4)(Q_5)$, and —$B(Q_6)(Q_7)$, b1 may be an integer selected from 0 to 9, b11 to b13, b21 to b24, and b31 to b36 may be each independently an integer selected from 0 to 6, c1 may be an integer selected from 1 to 4, and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —$Si(Q_{11})(Q_{12})(Q_{13})$, —$N(Q_{14})(Q_{15})$, and —$B(Q_{16})(Q_{17})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$), wherein $Q_1$ to $Q_7$, $Q_{11}$ to $Q_{17}$, $Q_{21}$ to $Q_{27}$, and $Q_{31}$ to $Q_{37}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and

* indicates a binding site to an adjacent atom.

BRIEF DESCRIPTION OF THE DRAWINGS

These and/or other aspects will become apparent and more readily appreciated from the following description of the embodiments, taken in conjunction with the accompanying drawing, which is a schematic view of an organic light-emitting device according to an embodiment of the present disclosure.

DETAILED DESCRIPTION

Reference will now be made in more detail to embodiments, examples of which are illustrated in the accompanying drawing, wherein like reference numerals refer to like elements throughout. In this regard, the present embodiments may have different forms and should not be construed as being limited to the descriptions set forth herein. Accordingly, the embodiments are merely described below, by referring to the drawing, to explain aspects of the present description. Expressions such as "at least one of", "one of," and "selected from," when preceding a list of elements, modify the entire list of elements and do not modify the individual elements of the list. Further, the use of "may" when describing embodiments of the present invention refers to "one or more embodiments of the present invention."

The drawing illustrates a schematic view of an organic light-emitting device 10 according to an embodiment. The organic light-emitting device 10 may include a first electrode 110, an organic layer 150, and a second electrode 190.

Hereinafter, the structure of an organic light-emitting device according to an embodiment and a method of manufacturing an organic light-emitting device according to an embodiment will be described in connection with the drawing.

In the drawing, a substrate may be additionally disposed (e.g., positioned) under the first electrode 110 or above the second electrode 190. The substrate may be a glass substrate or transparent plastic substrate, each with excellent mechanical strength, thermal stability, transparency, surface smoothness, ease of handling, and/or water resistance.

The first electrode 110 may be formed by depositing or sputtering a material for forming the first electrode 110 over the substrate. When the first electrode 110 is an anode, the material for forming the first electrode 110 may be selected from materials with a high work function to facilitate hole injection. The first electrode 110 may be a reflective electrode, a semi-transmissive electrode, or a transmissive electrode. The material for forming the first electrode 110 may be a transparent and highly conductive material. Non-limiting examples of such material may include indium tin oxide (ITO), indium zinc oxide (IZO), tin oxide ($SnO_2$), and zinc oxide (ZnO). When the first electrode 110 is a semi-transmissive electrode or a reflective electrode, as a material for forming the first electrode 110, at least one selected from magnesium (Mg), aluminum (Al), aluminum-lithium (Al—Li), calcium (Ca), magnesium-indium (Mg—In), and magnesium-silver (Mg—Ag) may be used.

The first electrode 110 may have a single-layer structure, or a multi-layer structure including a plurality of layers. In some embodiments, the first electrode 110 may have a triple-layer structure of ITO/Ag/ITO, but embodiments are not limited thereto.

The organic layer 150 may be positioned over (e.g., on) the first electrode 110. The organic layer 150 may include an emission layer.

The organic layer 150 may include a first compound represented by Formula 1 and a second compound represented by one of Formulae 2 and 3:

Formula 1

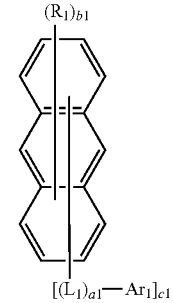

-continued

Formula 1-1

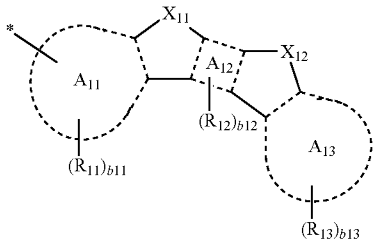

Formula 1-2

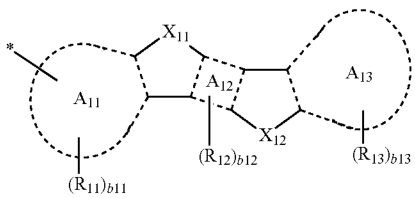

Formula 2

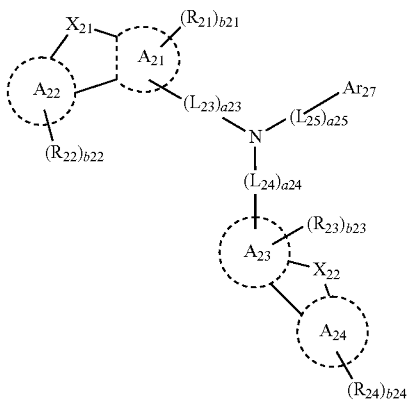

Formula 3

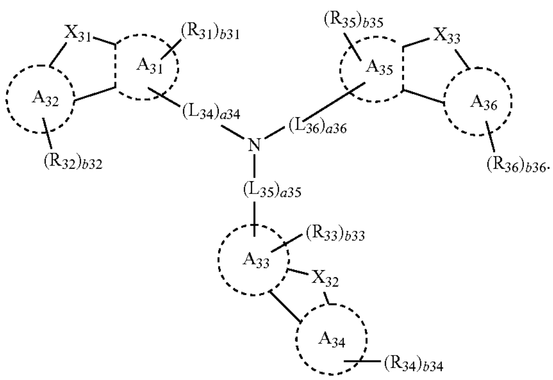

In Formulae 1-1 and 1-2, $X_{11}$ may be selected from $N[(L_{11})_{a11}\text{-}Ar_{11}]$, $C(Ar_{13})(Ar_{15})$, O, and S, and $X_{12}$ may be selected from $N[(L_{12})_{a12}\text{-}Ar_{12}]$, $C(Ar_{14})(Ar_{16})$, O, and S.

In some embodiments, in Formulae 1-1 and 1-2, $X_{11}$ may be selected from $C(Ar_{13})(Ar_{15})$, O, and S, and $X_{12}$ may be selected from $C(Ar_{14})(Ar_{16})$, O, and S.

According to another embodiment, in Formulae 1-1 and 1-2, $X_{11}$ and $X_{12}$ may be identical to or different from each other.

In Formula 2, $X_{21}$ may be selected from $N[(L_{21})_{a21}\text{-}Ar_{21}]$, $C(Ar_{23})(Ar_{25})$, O, and S; $X_{22}$ may be selected from $N(L_{22})_{a22}\text{-}Ar_{22}]$, $C(Ar_{24})(Ar_{26})$, O, and S, and when $X_{21}$ is $N[(L_{21})_{a21}\text{-}Ar_{21}]$, $X_{22}$ may be selected from $N(L_{22})_{a22}\text{-}Ar_{22}]$, O, and S;

when $X_{21}$ is $C(Ar_{23})(Ar_{25})$, $X_{22}$ may be selected from $C(Ar_{24})(Ar_{26})$, O, and S;

when $X_{21}$ is O, $X_{22}$ may be selected from $N(L_{22})_{a22}\text{-}Ar_{22}]$, $C(Ar_{24})(Ar_{26})$, and S; and when $X_{21}$ is S, $X_{22}$ may be selected from $N(L_{22})_{a22}\text{-}Ar_{22}]$, $C(Ar_{24})(Ar_{26})$, and O.

In some embodiments, in Formula 2, $X_{21}$ may be $N[(L_{21})_{a21}\text{-}Ar_{21}]$, and $X_{22}$ may be selected from $N(L_{22})_{a22}\text{-}Ar_{22}]$, O, and S;

$X_{21}$ may be O, and $X_{22}$ may be selected from $N(L_{22})_{a22}\text{-}Ar_{22}]$, $C(Ar_{24})(Ar_{26})$, and S; or $X_{21}$ may be S, and $X_{22}$ may be selected from $N(L_{22})_{a22}\text{-}Ar_{22}]$, $C(Ar_{24})(Ar_{26})$, and O.

In Formula 3, $X_{31}$ may be selected from $N[(L_{31})_{a31}\text{-}Ar_{31}]$, $C(Ar_{34})(Ar_{37})$, O, and S; $X_{32}$ may be selected from $N(L_{32})_{a32}\text{-}Ar_{32}]$, $C(Ar_{35})(Ar_{38})$, O, and S; $X_{33}$ may be selected from $N[(L_{33})_{a33}\text{-}Ar_{33}]$, $C(Ar_{36})(Ar_{39})$, O, and S, and when $X_{31}$ is $N[(L_{31})_{a31}\text{-}Ar_{31}]$, $X_{32}$ may be $N(L_{32})_{a32}\text{-}Ar_{32}]$, and $X_{33}$ may be selected from $N[(L_{33})_{a33}\text{-}Ar_{33}]$, O, and S;

when $X_{31}$ is $C(Ar_{34})(Ar_{37})$, $X_{32}$ may be $C(Ar_{35})(Ar_{38})$, and $X_{33}$ may be selected from $C(Ar_{36})(Ar_{39})$, O, and S; and when $X_{31}$ is O, $X_{32}$ may be S, and $X_{33}$ may be selected from $N[(L_{33})_{a33}\text{-}Ar_{33}]$ and $C(Ar_{35})(Ar_{38})$.

In some embodiments, in Formula 3, $X_{31}$ may be $N[(L_{31})_{a31}\text{-}Ar_{31}]$, $X_{32}$ may be $N(L_{32})_{a32}\text{-}Ar_{32}]$, and $X_{33}$ may be selected from O and S;

$X_{31}$ may be $C(Ar_{34})(Ar_{37})$, $X_{32}$ may be $C(Ar_{35})(Ar_{38})$, and $X_{33}$ may be selected from O and S; or $X_{31}$ may be O, $X_{32}$ may be S, and $X_{33}$ may be selected from $N[(L_{33})_{a33}\text{-}Ar_{33}]$ and $C(Ar_{35})(Ar_{38})$.

In Formulae 1-1, 1-2, 2, and 3, $A_{11}$ to $A_{13}$, $A_{21}$ to $A_{24}$, and $A_{31}$ to $A_{36}$ may be each independently selected from a $C_5$-$C_{20}$ cyclic group and a $C_1$-$C_{20}$ heterocyclic group.

In some embodiments, in Formulae 1-1, 1-2, 2, and 3, $A_{11}$ to $A_{13}$, $A_{21}$ to $A_{24}$, and $A_{31}$ to $A_{36}$ may be each independently selected from a benzene, a naphthalene, a phenanthrene, an anthracene, a pyridine, a pyrazine, a pyrimidine, a pyridazine, a quinoline, an isoquinoline, a quinoxaline, and a quinazoline.

In some embodiments, in Formulae 1-1, 1-2, 2, and 3, $A_{11}$ to $A_{13}$, $A_{21}$ to $A_{24}$, and $A_{31}$ to $A_{36}$ may be each independently selected from a benzene, a naphthalene, a phenanthrene, and an anthracene.

According to some embodiments, in Formulae 1-1, 1-2, 2, and 3, $A_{11}$ to $A_{13}$, $A_{21}$ to $A_{24}$, and $A_{31}$ to $A_{36}$ may each be a benzene.

In Formulae 1, 1-1, 1-2, 2, and 3, $L_1$, $L_{11}$, $L_{12}$, $L_{21}$ to $L_{25}$, and $L_{31}$ to $L_{36}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In some embodiments, in Formulae 1, 1-1, 1-2, 2, and 3, $L_1$, $L_{11}$, $L_{12}$, $L_{21}$ to $L_{25}$, and $L_{31}$ to $L_{36}$ may be each independently selected from a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group.

According to another embodiment, in Formulae 1, 1-1, 1-2, 2, and 3, $L_1$, $L_{11}$, $L_{12}$, $L_{21}$ to $L_{25}$, and $L_{31}$ to $L_{36}$ may be each independently selected from groups represented by Formulae 3-1 to 3-15:

3-1

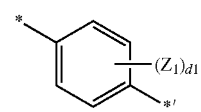

3-2

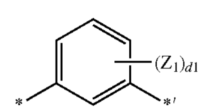

3-3

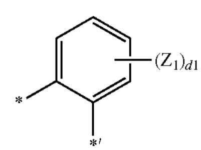

3-4

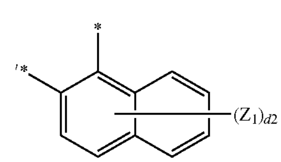

3-5

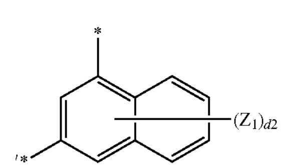

-continued 3-6

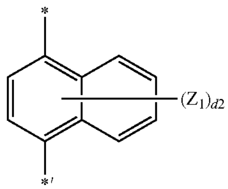

3-7

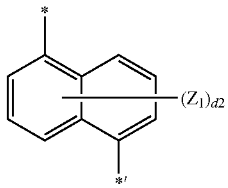

3-8

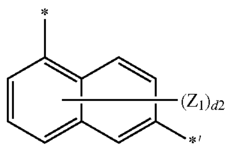

3-9

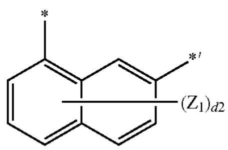

3-10

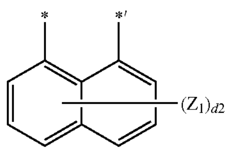

3-11

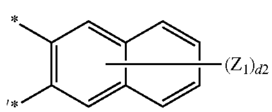

3-12

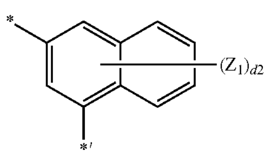

3-13

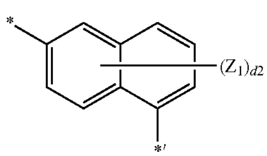

3-14

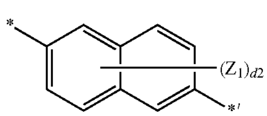

3-15

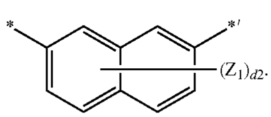

In Formulae 3-1 to 3-15, $Z_1$ may be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, an anthracenyl group, a pyrenyl group, and a phenanthrenyl group, d1 may be selected from 1, 2, 3, and 4, d2 may be selected from 1, 2, 3, 4, 5, and 6, and

* and *' each indicate a binding site to an adjacent atom.

According to some embodiments, in Formulae 1, 1-1, 1-2, 2, and 3, $(L_1)_{a1}$, $(L_{11})_{a11}$, $(L_{12})_{a12}$, $(L_{21})_{a21}$ to $(L_{25})_{a25}$, and $(L_{31})_{a31}$ to $(L_{36})_{a36}$ may be each independently selected from a single bond and a group represented by any of Formulae 4-1 to 4-20:

4-1

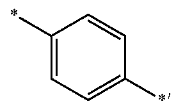

4-2

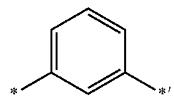

4-3

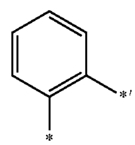

4-4

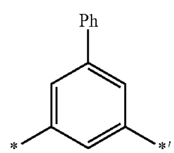

4-5

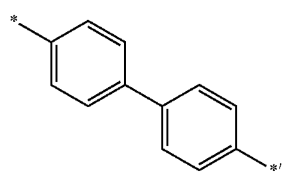

4-6

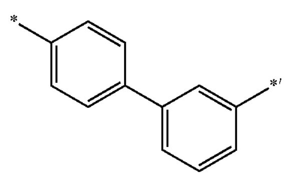

4-7

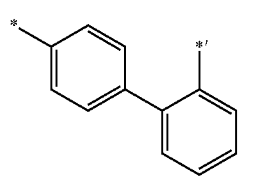

4-8

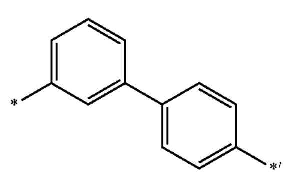

-continued 4-9

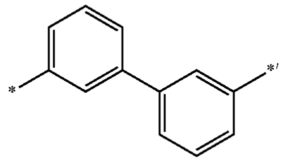

4-10

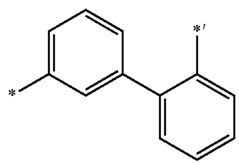

4-11

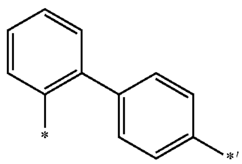

4-12

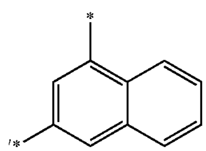

4-13

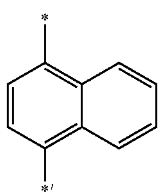

4-14

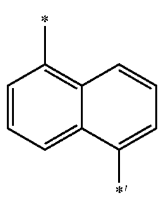

4-15

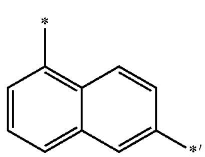

4-16

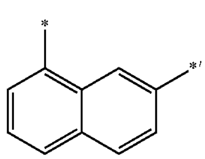

4-17

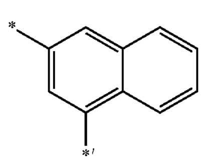

-continued 4-18

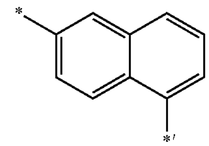

4-19

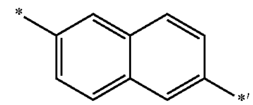

4-20

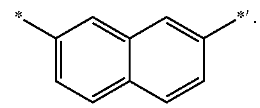

In Formulae 4-1 to 4-20,

"Ph" represents a phenyl group, and

* and *' each indicate a binding site to an adjacent atom.

In Formulae 1, 1-1, 1-2, 2, and 3, a1, a11, a12, a21 to a25, and a31 to a36 may be each independently an integer selected from 0 to 3.

a1 indicates the number of $L_1$(s). When a1 is 0, $-(L_1)_{a1}-$ may be a single bond. When a1 is 2 or greater, a plurality of $L_1$(s) may be identical to or different from each other. Descriptions for a11, a12, a21 to a25, and a31 to a36 may each independently be understood by referring to the description of a1 and corresponding Formulae 1, 1-1, 1-2, 2, and 3.

In some embodiments, in Formulae 1, 1-1, 1-2, 2, and 3, a1, a11, a12, a21, a22, and a31 to a33 may be each independently selected from 0 and 1, a23 and a34 may be each independently selected from 0, 1, and 2, and a24, a25, a35, and a36 may be each independently selected from 0 and 1.

In some embodiments, in Formula 2, a23 may be 1, a24 may be 0, and a25 may be 0;

a23 may be 1, a24 may be 1, and a25 may be 0;

a23 may be 1, a24 may be 0, and a25 may be 1;

a23 to a25 may each be 1;

a23 may be 2, a24 may be 0, and a25 may be 1;

a23 may be 2, and a24 and a25 may both be 0;

a23 to a25 may each be 0; or a23 may be 0, a24 may be 1, and a25 may be 0, but embodiments of the present disclosure are not limited thereto.

In Formulae 1, 1-1, 1-2, 2, and 3, An may be selected from a group represented by Formula 1-1, a group represented by Formula 1-2, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $Ar_{11}$ to $Ar_{16}$, $Ar_{21}$ to $Ar_{26}$, and $Ar_{31}$ to $Ar_{39}$ may be each independently selected from a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $Ar_{27}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group.

In some embodiments, in Formulae 1, 1-1, 1-2, 2, and 3, $Ar_1$ may be selected from a group represented by Formula 1-1, a group represented by Formula 1-2, a substituted or unsubstituted $C_6$-$C_{60}$ aryl group, a substituted or unsubstituted monovalent non-aromatic condensed polycyclic group, and a substituted or unsubstituted monovalent non-aromatic condensed heteropolycyclic group, $Ar_{11}$, $Ar_{12}$, $Ar_{21}$ to $Ar_{26}$, and $Ar_{31}$ to $Ar_{39}$ may be each independently selected from a substituted or unsubstituted $C_1$-$C_{20}$ alkyl group, a substituted or unsubstituted $C_1$-$C_{20}$ alkoxy group, a substituted or unsubstituted $C_6$-$C_{60}$ aryl group, a substituted or unsubstituted monovalent non-aromatic condensed polycyclic group, and a substituted or unsubstituted monovalent non-aromatic condensed heteropolycyclic group, and $Ar_{27}$ may be a substituted or unsubstituted $C_6$-$C_{60}$ aryl group, but embodiments are not limited thereto.

According to another embodiment, in Formulae 1, 1-1, 1-2, 2, and 3, $Ar_1$ may be selected from the group consisting of:

a group represented by Formula 1-1, a group represented by Formula 1-2, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and —Si($Q_{31}$)($Q_{32}$)($Q_{33}$), $Ar_{11}$, $Ar_{12}$, $Ar_{21}$ to $Ar_{26}$, and $Ar_{31}$ to $Ar_{39}$ may be each independently selected from the group consisting of:

a $C_1$-$C_{20}$ alkyl group and a $C_1$-$C_{20}$ alkoxy group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and —Si($Q_{31}$)($Q_{32}$)($Q_{33}$), and $Ar_{27}$ may be selected from the group consisting of: a phenyl group, a biphenyl group, a terphenyl group, a naphthyl group, a phenanthrenyl group, an anthracenyl group, a triphenylenyl group, a pyrenyl group, and a chrysenyl group; and a phenyl group, a biphenyl group, a terphenyl group, a naphthyl group, a phenanthrenyl group, an anthracenyl group, a triphenylenyl group, a pyrenyl group, and a chrysenyl group, each substituted with at least one selected from deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, and —Si($Q_{31}$)($Q_{32}$)($Q_{33}$), wherein $Q_{31}$ to $Q_{33}$ may each independently selected from a $C_1$-$C_{10}$ alkyl group, a $C_1$-$C_{10}$ alkoxy group, a phenyl group, a biphenyl group, a terphenyl group, and a naphthyl group.

According to some embodiments, a group represented by Formula 1-1 may be selected from groups represented by Formulae 1-1(1) to 1-1(3), and a group represented by Formula 1-2 may be selected from groups represented by Formulae 1-2(1) and 1-2(2):

1-1(1)

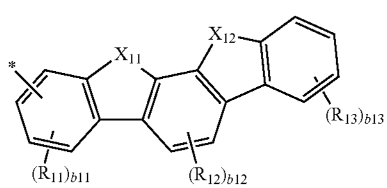

1-1(2)

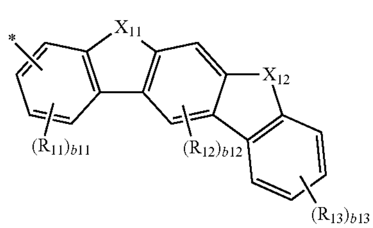

1-1(3)

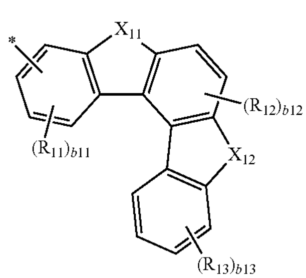

-continued 1-2(1)

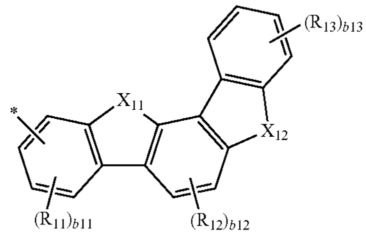

1-2(2)

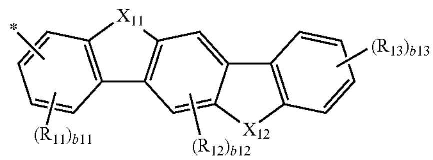

In Formulae 1-1(1) to 1-1(3), 1-2(1), and 1-2(2), $X_{11}$, $X_{12}$, and $R_{11}$ to $R_{13}$ may be the same as described herein, b11 may be an integer selected from 0 to 3, b12 may be an integer selected from 0 to 2, b13 may be an integer selected from 0 to 4, and * indicates a binding site to an adjacent atom.

In Formulae 1, 1-1, 1-2, 2, and 3, $R_1$, $R_{11}$ to $R_{13}$, $R_{21}$ to $R_{24}$, and $R_{31}$ to $R_{36}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_4$)($Q_5$), and —B($Q_6$)($Q_7$). $Q_1$ to $Q_7$ may be the same as described herein.

In some embodiments, in Formulae 1, 1-1, 1-2, 2, and 3, $R_1$, $R_{11}$ to $R_{13}$, $R_{21}$ to $R_{24}$, and $R_{31}$ to $R_{36}$ may be each independently selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a substituted or unsubstituted $C_6$-$C_{60}$ aryl group, a substituted or unsubstituted monovalent non-aromatic condensed polycyclic group, and a substituted or unsubstituted monovalent non-aromatic condensed heteropolycyclic group; and —Si($Q_1$)($Q_2$)($Q_3$), wherein $Q_1$ to $Q_3$ may be each independently selected from a $C_1$-$C_{10}$ alkyl group, a $C_1$-$C_{10}$ alkoxy group, a phenyl group, a biphenyl group, a terphenyl group, and a naphthyl group.

According to another embodiment, in Formulae 1, 1-1, 1-2, 2, and 3, $R_1$, $R_{11}$ to $R_{13}$, $R_{21}$ to $R_{24}$, and $R_{31}$ to $R_{36}$ may be each independently selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, and —Si($Q_1$)($Q_2$)($Q_3$);

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a naphthacenyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a naphthacenyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group, wherein $Q_1$ to $Q_3$ may be each independently selected from a $C_1$-$C_{10}$ alkyl group, a $C_1$-$C_{10}$ alkoxy group, a phenyl group, a biphenyl group, a terphenyl group, and a naphthyl group, but embodiments are not limited thereto.

In some embodiments, in Formulae 1, 1-1, 1-2, 2, and 3

$Ar_1$ may be selected from a group represented by Formula 1-1, a group represented by Formula 1-2, and a group represented by any of Formulae 5-1 to 5-13, $Ar_{11}$, $Ar_{12}$, $Ar_{21}$ to $Ar_{26}$, and $Ar_{31}$ to $Ar_{39}$ may be each independently selected from a $C_1$-$C_{20}$ alkyl group, a $C_1$-$C_{20}$ alkoxy group, and a group represented by any of Formulae 5-1 to 5-13, $Ar_{27}$ may be selected from groups represented by Formulae 5-1 to 5-9, and $R_1$, $R_{11}$ to $R_{13}$, $R_{21}$ to $R_{24}$, and $R_{31}$ to $R_{36}$ may be each independently selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group; and a group represented by any of Formulae 5-1 to 5-13:

5-1

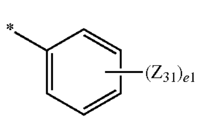

-continued 5-2

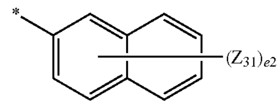

5-3

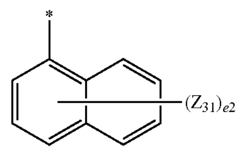

5-4

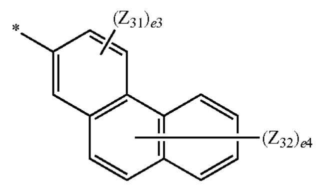

5-5

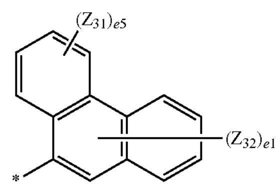

5-6

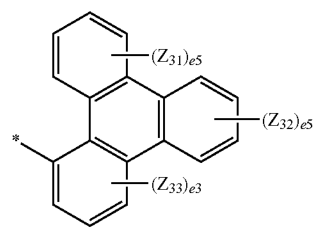

5-7

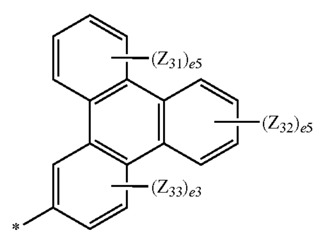

5-8

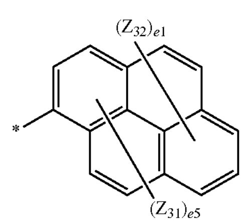

5-9

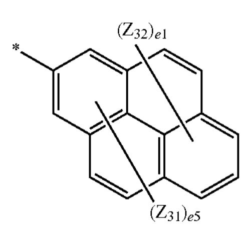

-continued 5-10

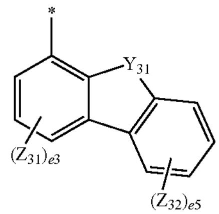

5-11

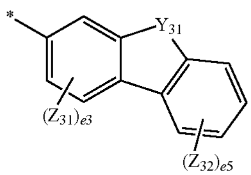

5-12

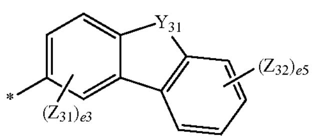

5-13

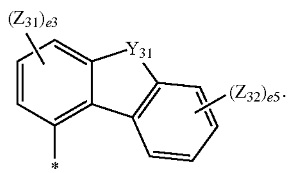

In Formulae 5-1 to 5-13, $Y_{31}$ may be selected from $C(Z_{34})(Z_{35})$, O, and S, and $Z_{31}$ to $Z_{35}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, and $—Si(Q_{31})(Q_{32})(Q_{33})$, wherein $Q_{31}$ to $Q_{33}$ may be each independently selected from a $C_1$-$C_{10}$ alkyl group, a $C_1$-$C_{10}$ alkoxy group, a phenyl group, a biphenyl group, a terphenyl group, and a naphthyl group, e1 may be an integer selected from 1 to 5, e2 may be an integer selected from 1 to 7, e3 may be an integer selected from 1 to 3, e4 may be an integer selected from 1 to 6, and e5 may be an integer selected from 1 to 4.

In Formula 1, b1 may be an integer selected from 0 to 9.

In Formula 1, b1 indicates the number of $R_1$(s). When b1 is 2 or greater, a plurality of $R_1$(s) may be identical to or different from each other.

In Formulae 1-1, 1-2, 2, and 3, b11 to b13, b21 to b24, and b31 to b36 may be each independently an integer selected from 0 to 6.

b11 indicates the number of $R_{11}$(s). When b11 is 2 or greater, a plurality of $R_{11}$(s) may be identical to or different from each other. Descriptions of b12, b13, b21 to b24, and b31 to b36 may be each independently understood by referring to the description of b11 and the corresponding Formulae 1-1, 1-2, 2, and 3.

In Formula 1, c1 may be an integer selected from 1 to 4.

In Formula 1, c1 indicates the number of $-[(L_1)_{a1}-Ar_1]$(s). When c1 is 2 or greater, a plurality of $-[(L_1)_{a1}-Ar_1]$(s) may be identical to or different from each other.

In some embodiments, in Formula 1, c1 may be 1 or 2, but embodiments are not limited thereto.

According to an embodiment, the first compound may be represented by Formula 1A:

Formula 1A

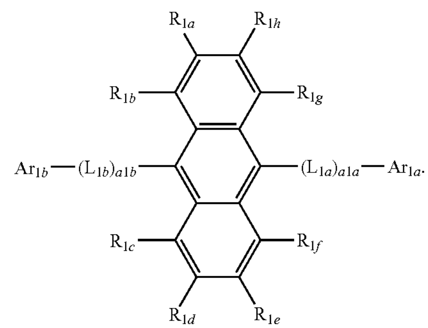

In Formula 1A, descriptions of $L_{1a}$ and $L_{1b}$ may be each independently the same as the description provided herein in connection with $L_1$; descriptions of a1a and a1b may be each independently the same as the description provided herein in connection with a1; descriptions of $Ar_{1a}$ and $Ar_{1b}$ may be each independently the same as the description provided herein in connection with $Ar_1$; and descriptions of $R_{1a}$ to $R_{1h}$ may be each independently the same as the description provided herein in connection with $R_1$.

In some embodiments, in Formula 1A, $R_{1a}$ to $R_{1h}$ may be each independently selected from deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, and $—Si(Q_{31})(Q_{32})(Q_{33})$, $L_{1a}$ and $L_{1b}$ may be each independently selected from groups represented by Formulae 3-1 to 3-15, a1a and a1b may be each independently selected from 0 and 1, and $Ar_{1a}$ and $Ar_{1b}$ may be each independently selected from groups represented by Formulae 5-1 to 5-13, but embodiments of the present disclosure are not limited thereto.

In some embodiments, the second compound may be represented by one of Formulae 2A to 2E and 3A to 3D:
Formula 2A
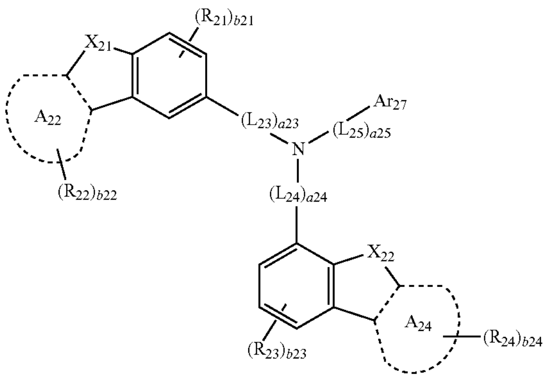
Formula 2B
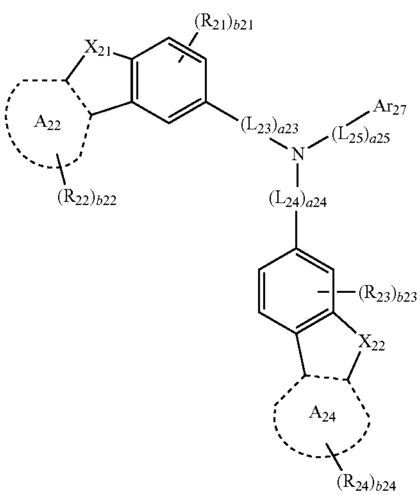
Formula 2C
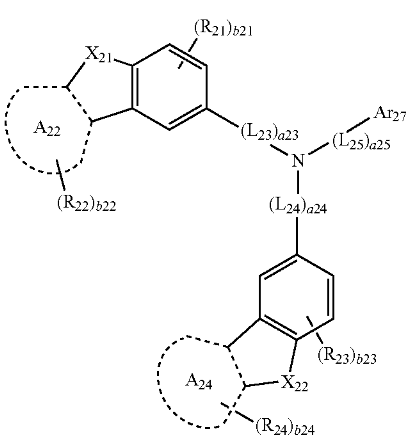
-continued
Formula 2D
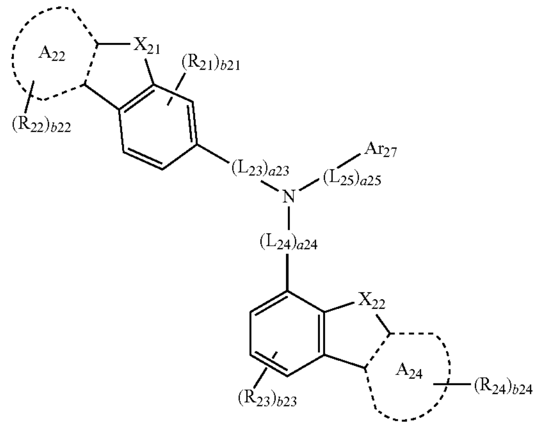
Formula 2E
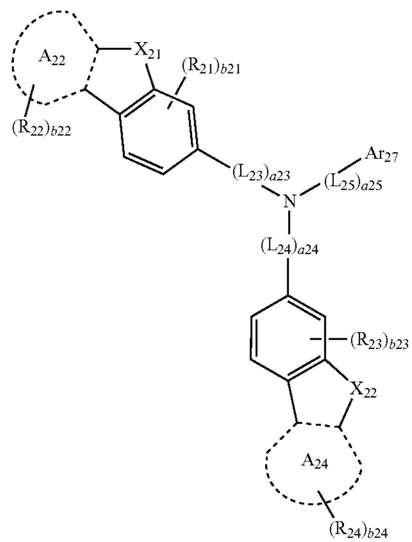
Formula 3A
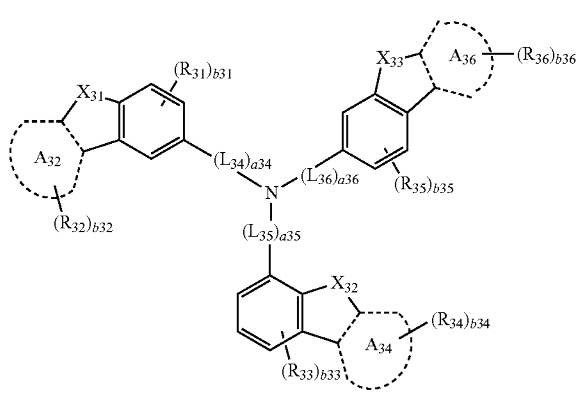

-continued

Formula 3B

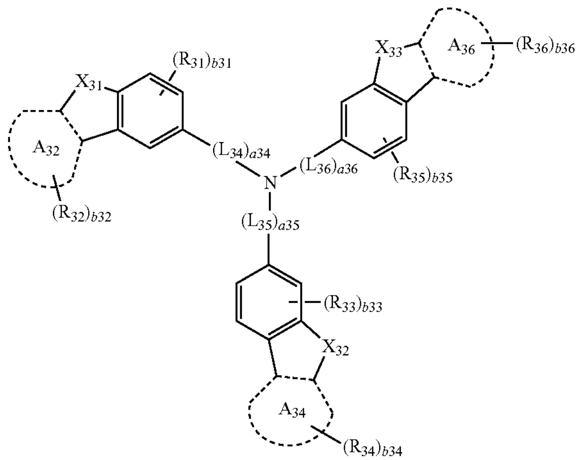

Formula 3C

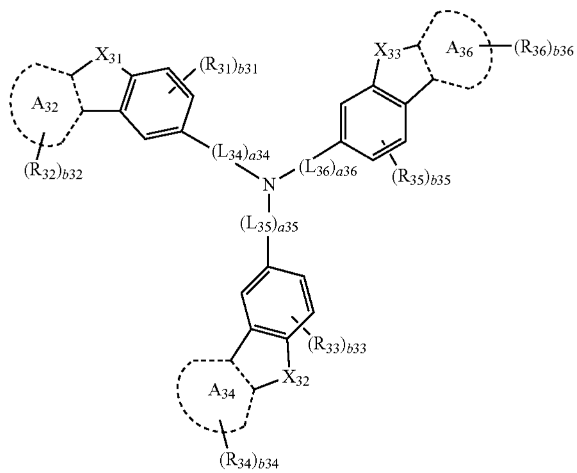

-continued

Formula 3D

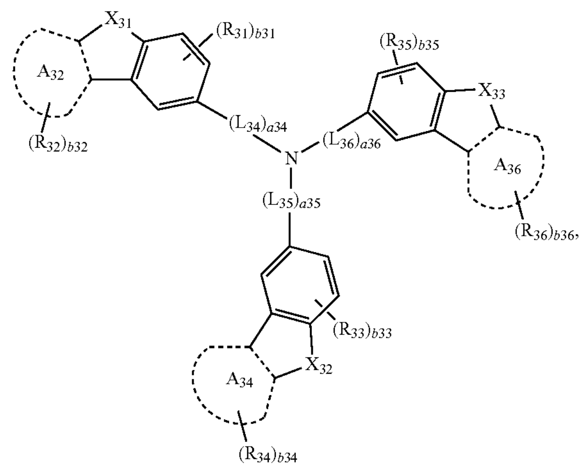

wherein, in Formulae 2A to 2E and 3A to 3D, $X_{21}$, $X_{22}$, $X_{31}$ to $X_{33}$, $A_{22}$, $A_{24}$, $A_{32}$, $A_{34}$, $A_{36}$, $L_{23}$ to $L_{25}$, $L_{34}$ to $L_{36}$, a23 to a25, a34 to a36, $Ar_{27}$, $R_{21}$ to $R_{24}$, b22, b24, $R_{31}$ to $R_{36}$, b32, b34, and b36 may be the same as described herein, and b21, b23, b31, b33, and b35 may be each independently an integer selected from 0 to 3.

In some embodiments, in Formulae 2A to 2E and 3A to 3D, $A_{22}$, $A_{24}$, $A_{32}$, $A_{34}$, and $A_{36}$ may be each independently selected from a benzene, a naphthalene, a phenanthrene, an anthracene, a pyridine, a pyrazine, a pyrimidine, a pyridazine, a quinoline, an isoquinoline, a quinoxaline, and a quinazoline.

According to another embodiment, in Formulae 2A to 2E and 3A to 3D, $A_{22}$, $A_{24}$, $A_{32}$, $A_{34}$, and $A_{36}$ may each be a benzene, but embodiments are not limited thereto.

According to an embodiment, the first compound may be selected from Compounds H1 to H49, and the second compound may be selected from Compounds A1 to A83, B1 to B74, C1 to C15, and D1 to D65:

H1

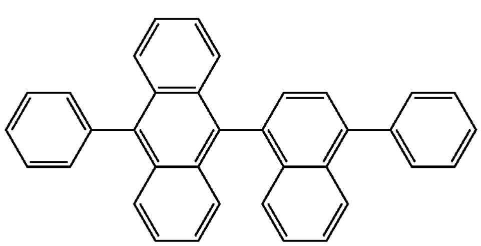

H2

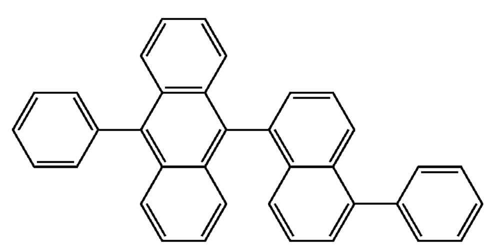

H3

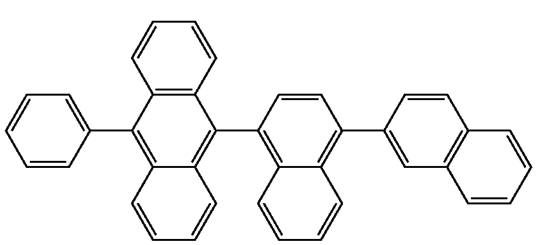

H4

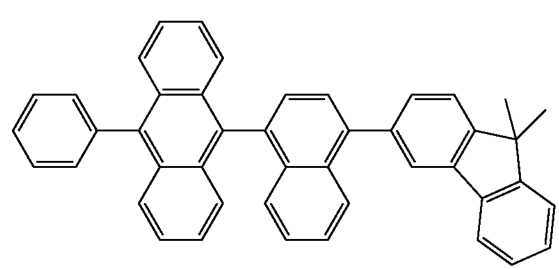

-continued
H5
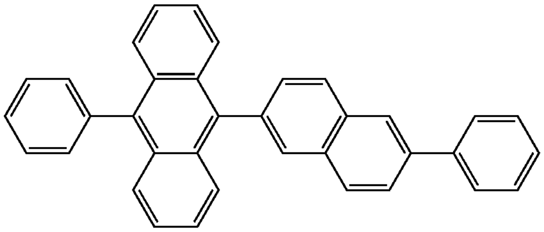
H6
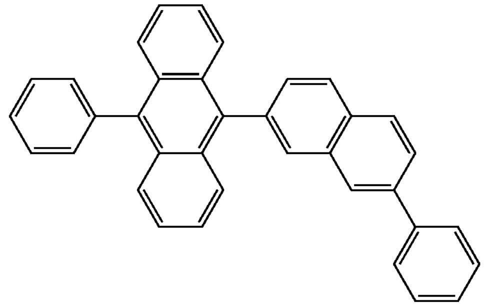
H7
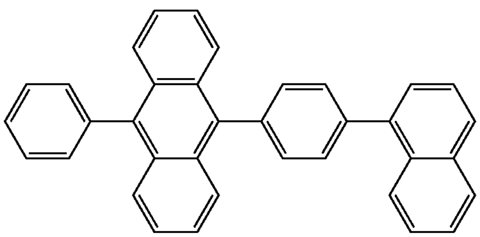
H8
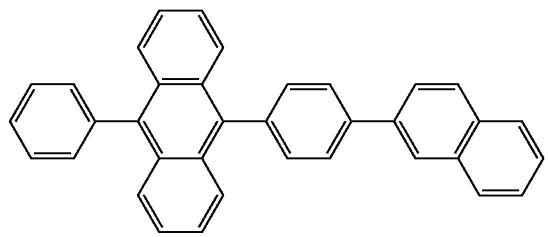
H9
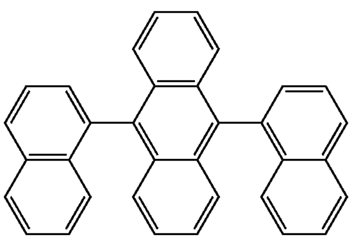
H10
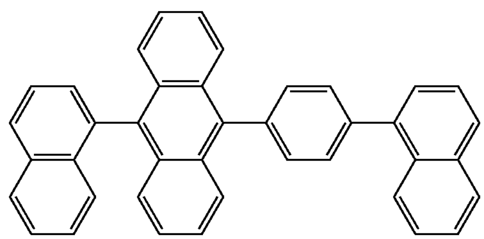
H11
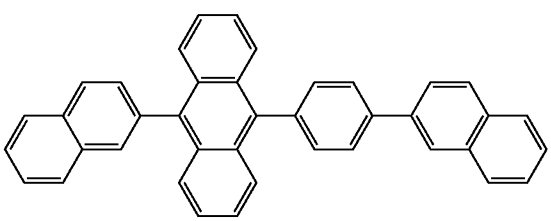
H12
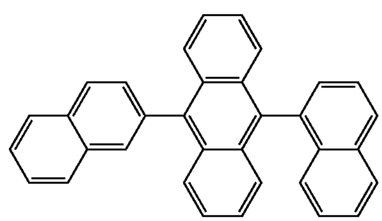
H13
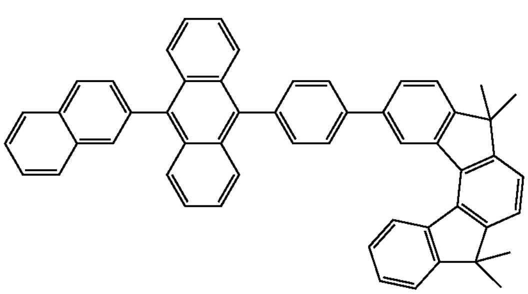
H14
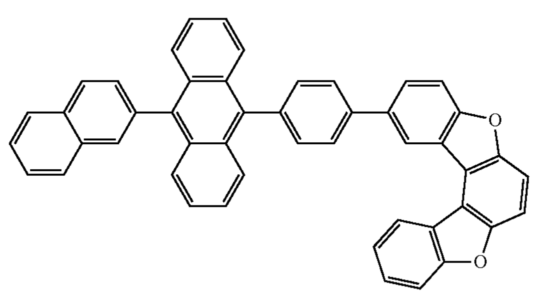

-continued
H15
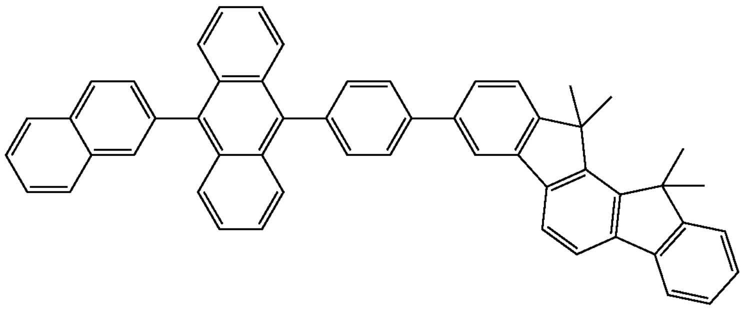
H16
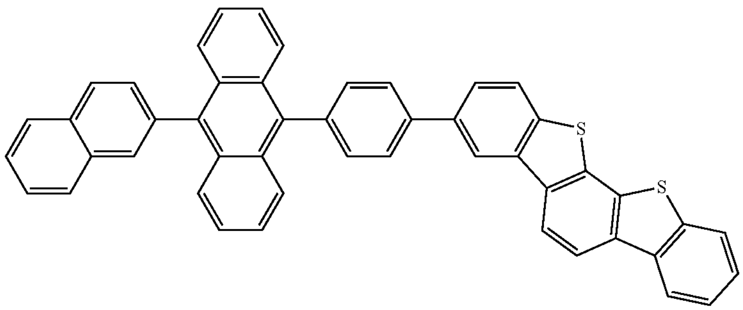
H17
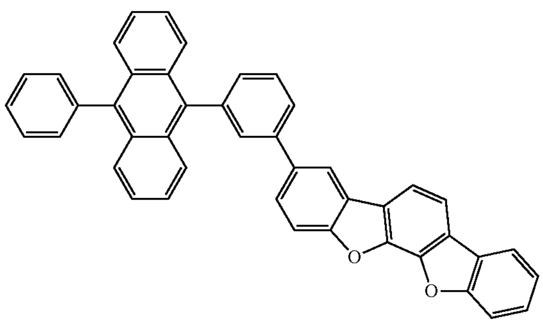
H18
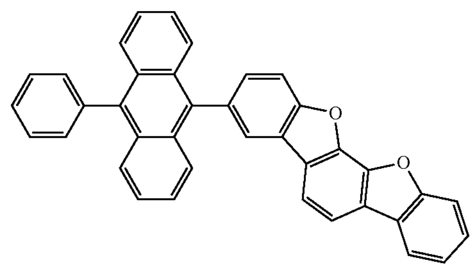
H19
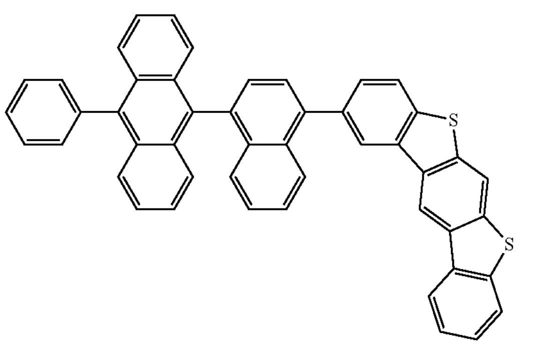
H20
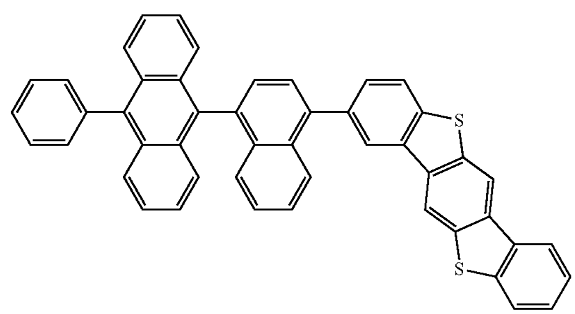
H21
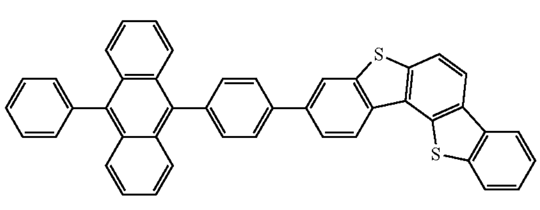
H22
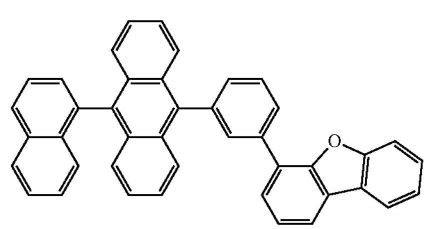

-continued
H23
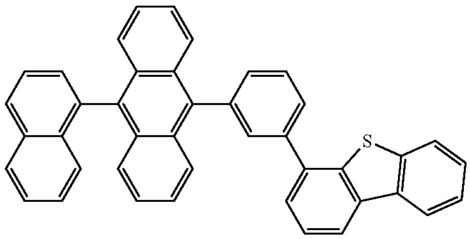
H24
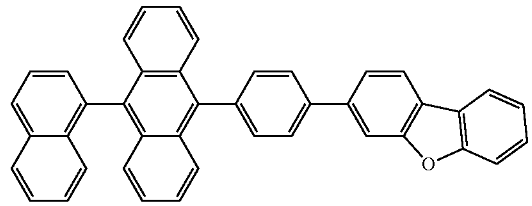
H25
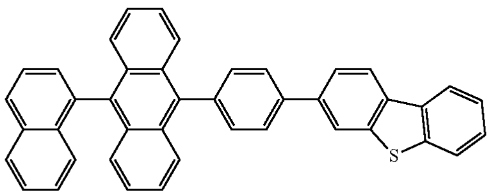
H26
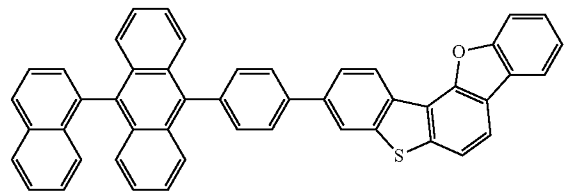
H27
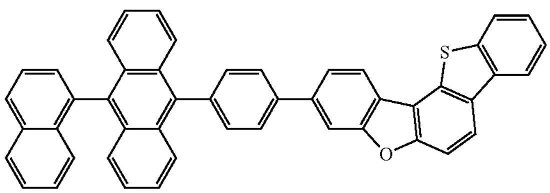
H28
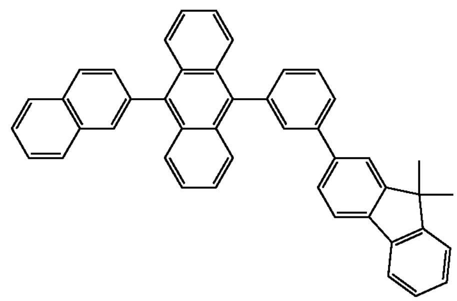
H29
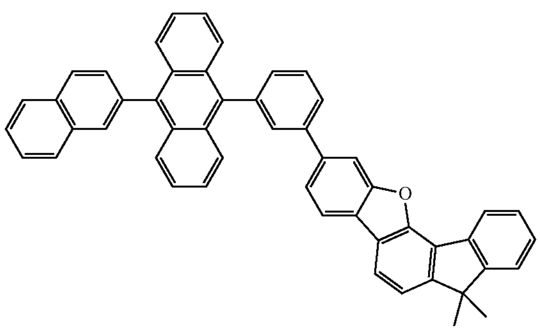
H30
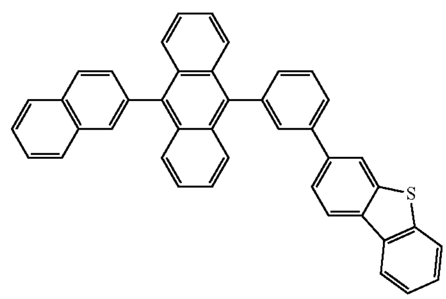
H31
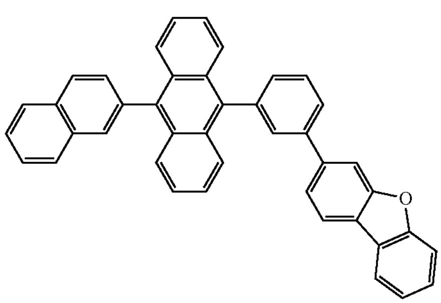
H32
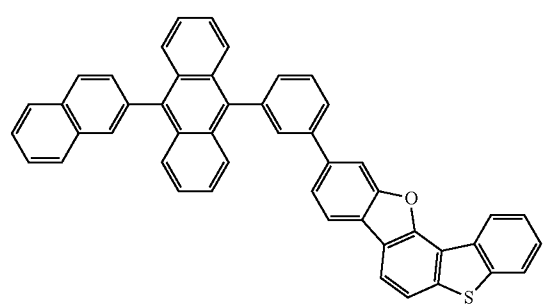

-continued
H33
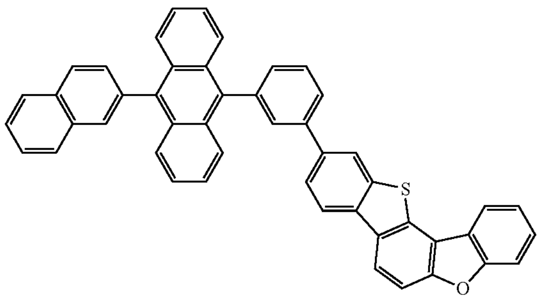
H34
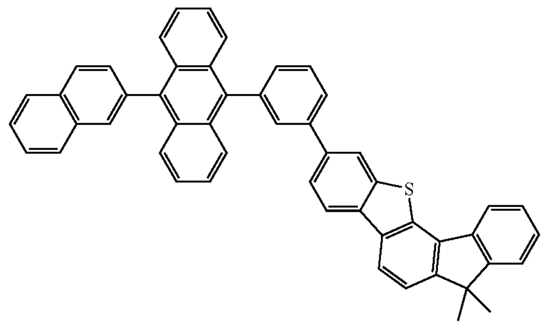
H35
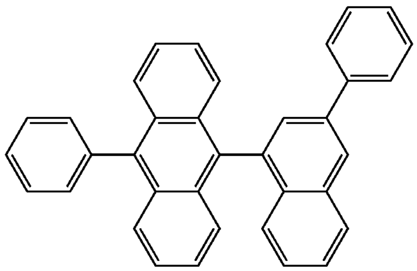
H36
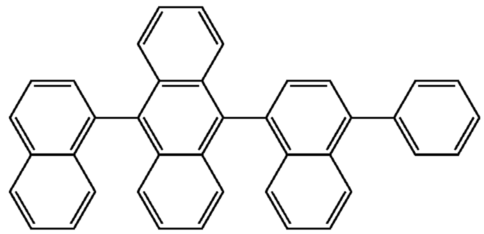
H37
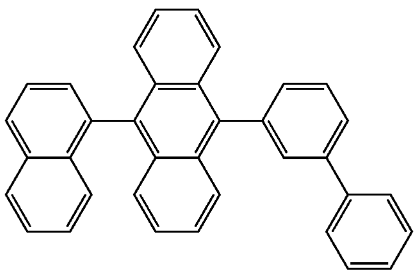
H38
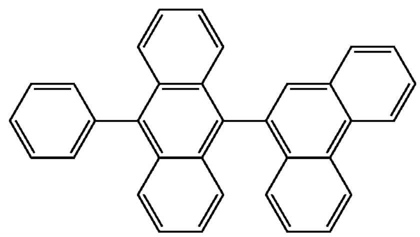
H39
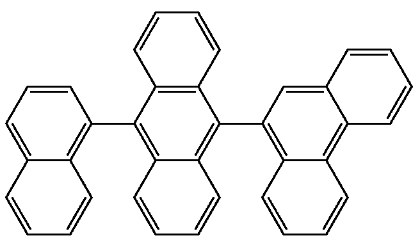
H40
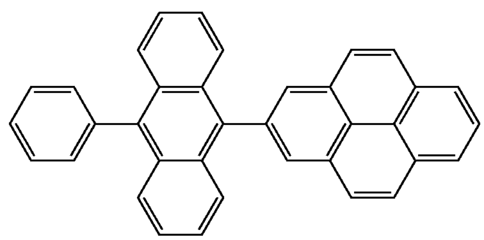
H41
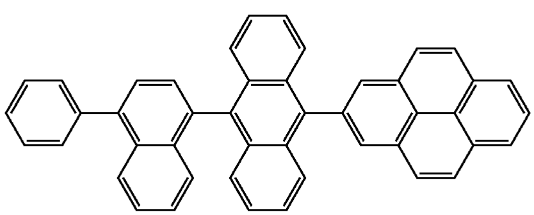
H42
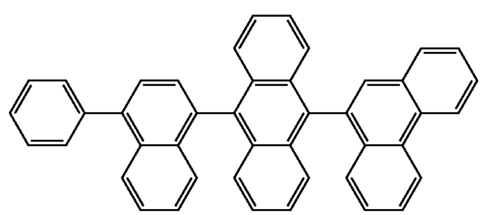
H43
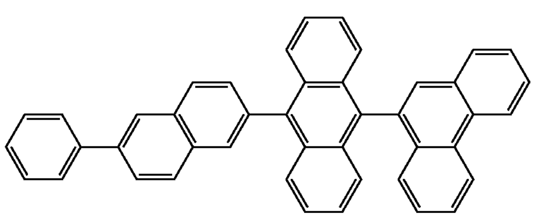
H44
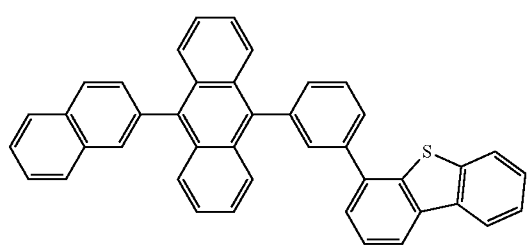

-continued
H45
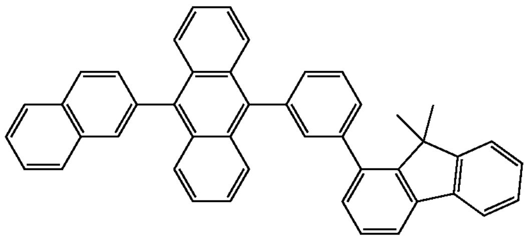
H46
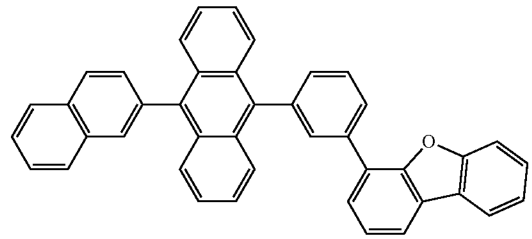
H47
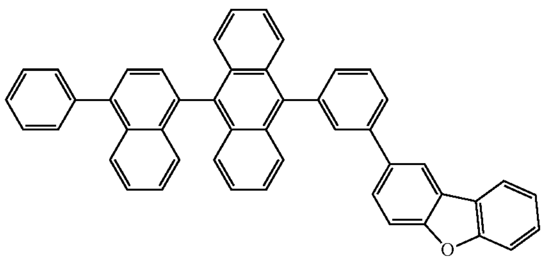
H48
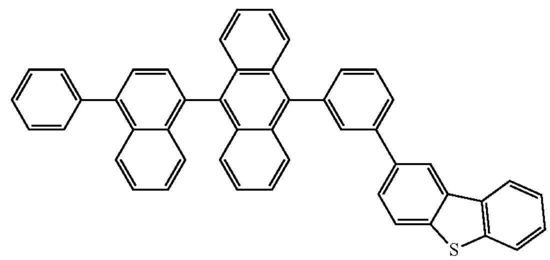
H49
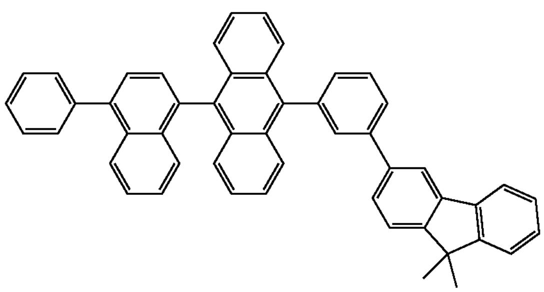
A1
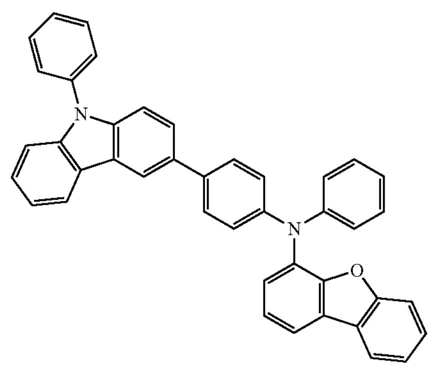
A2
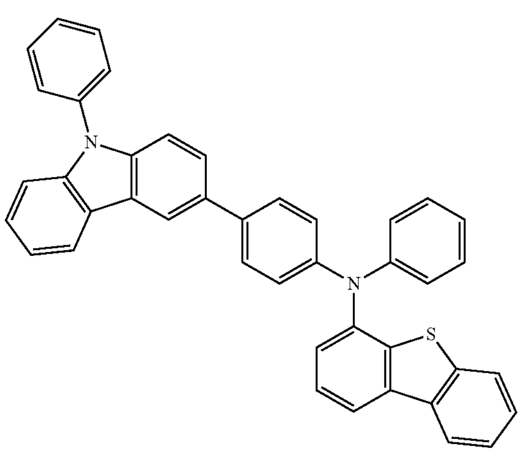
A3
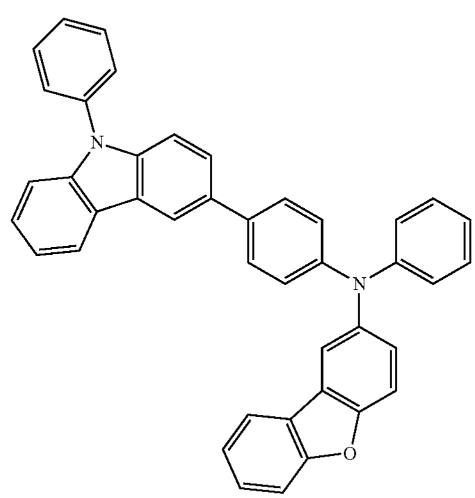

-continued
A4
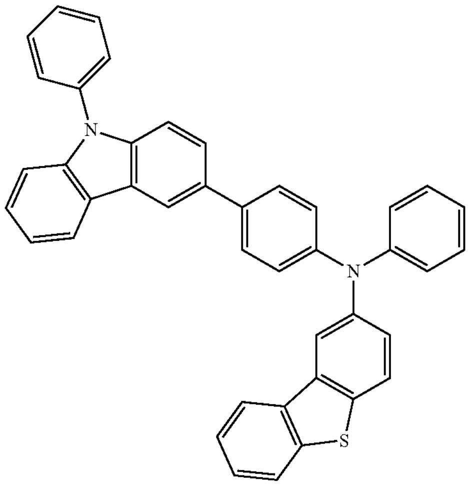
A5
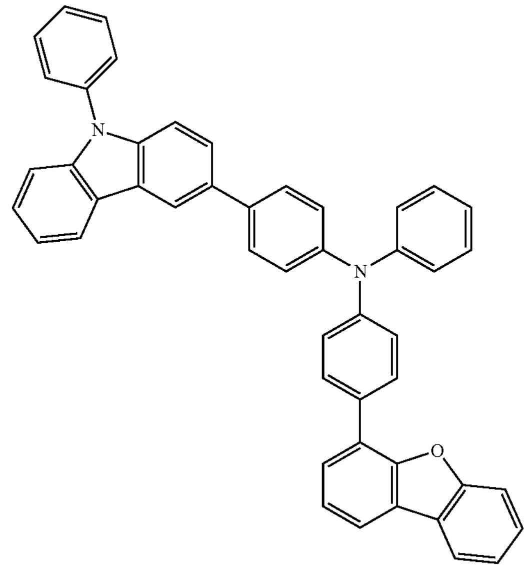
A6
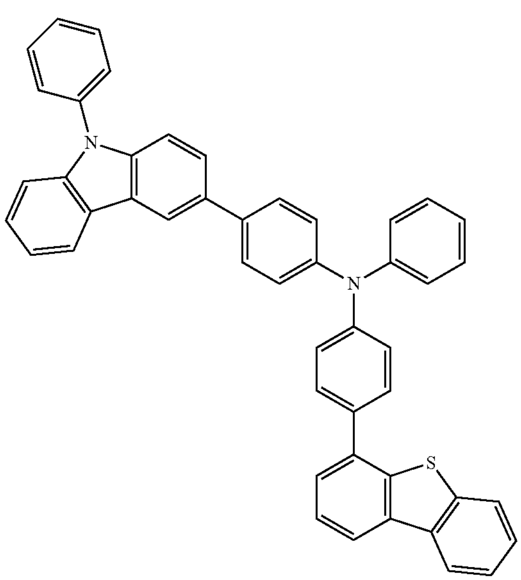
A7
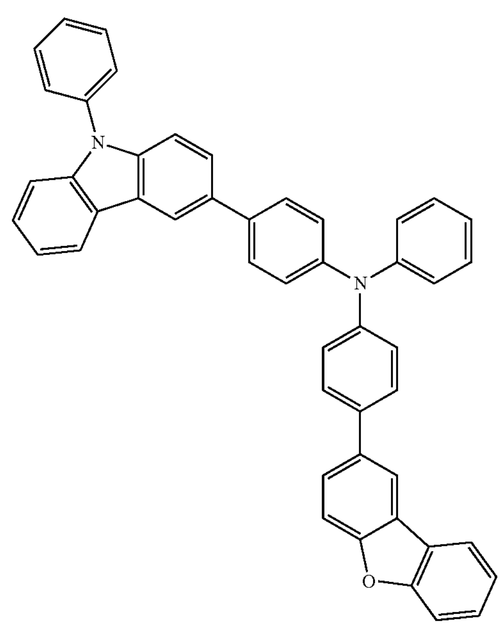

-continued
A8
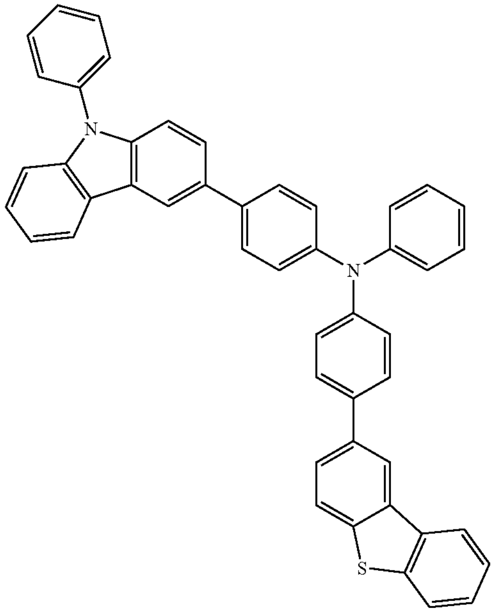
A9
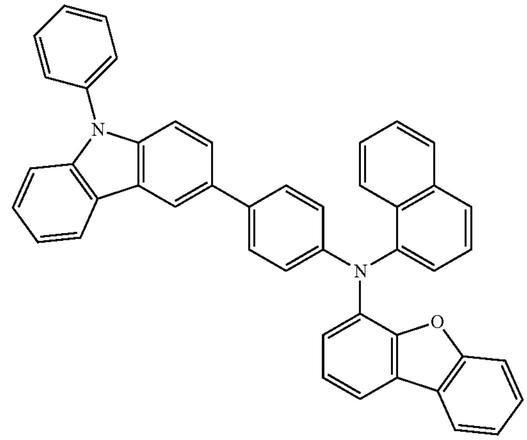
A10
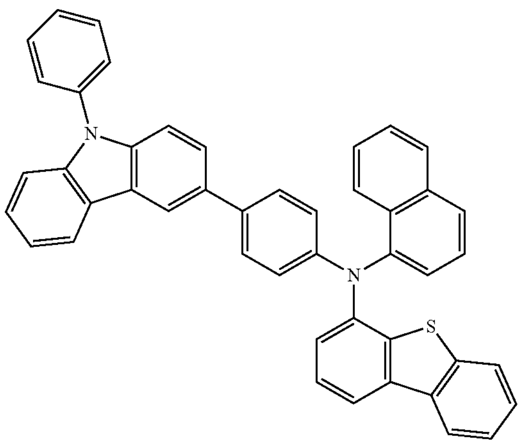
A11
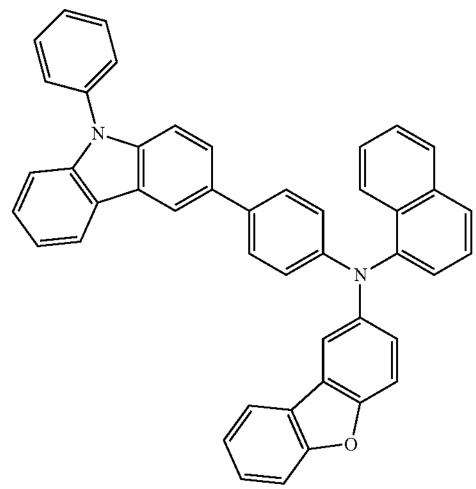
A12
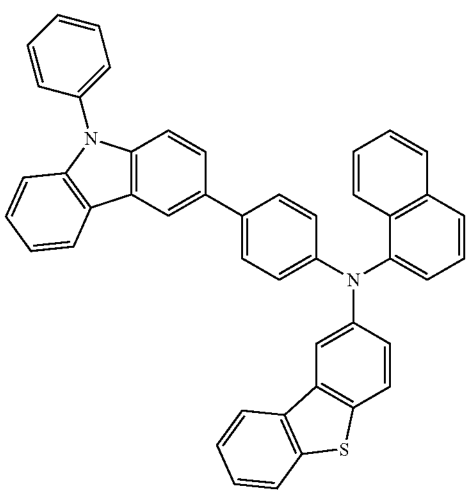
A13
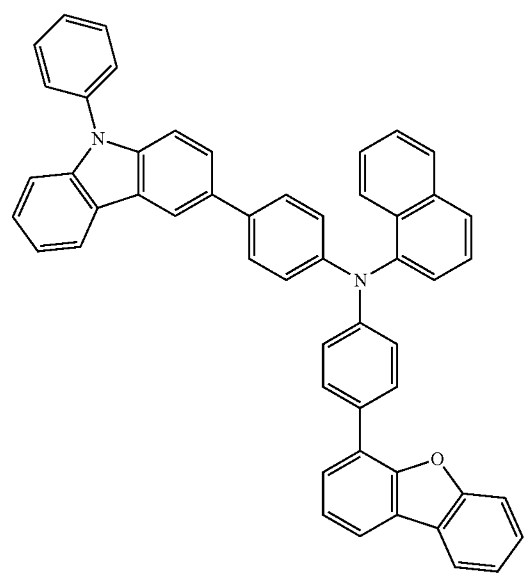

-continued
A14
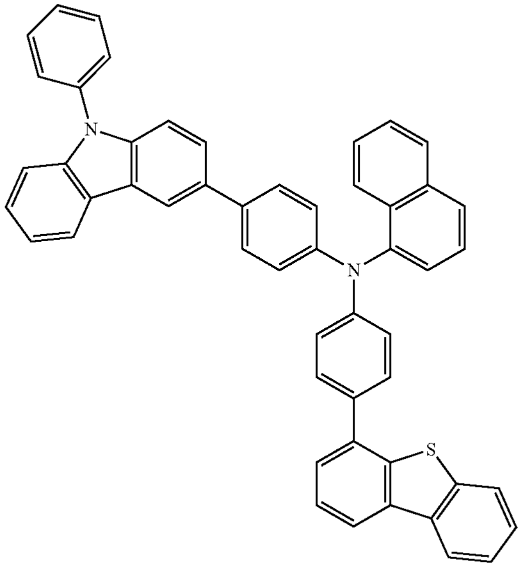
A15
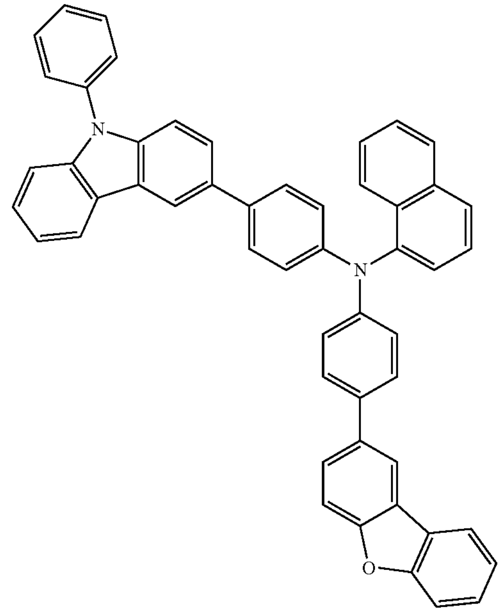
A16
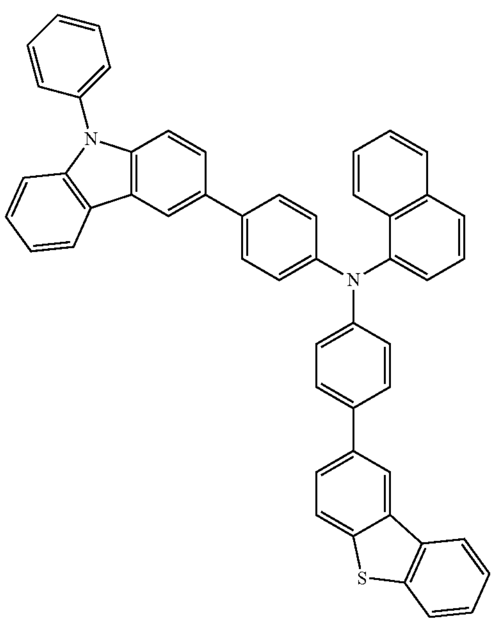
A17
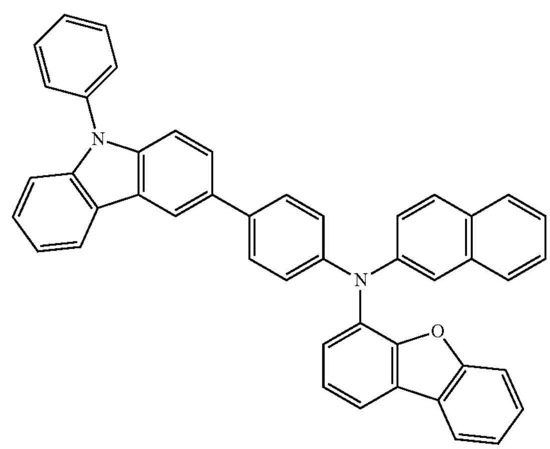

-continued
A18
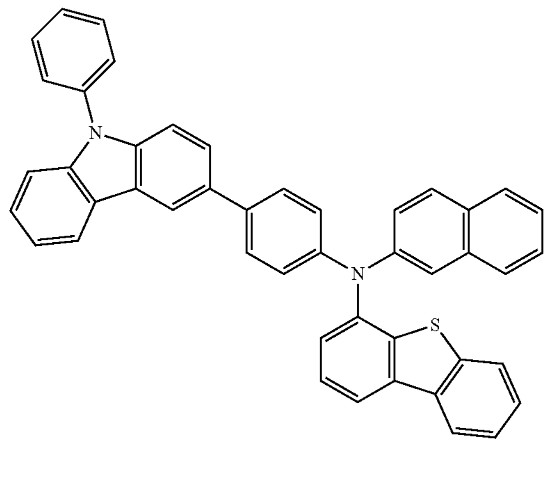
A19
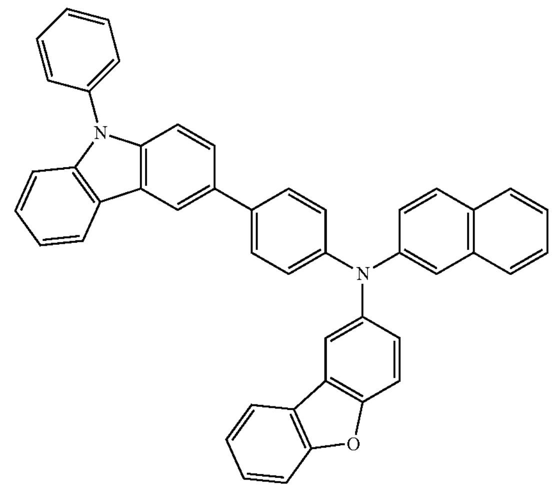
A20
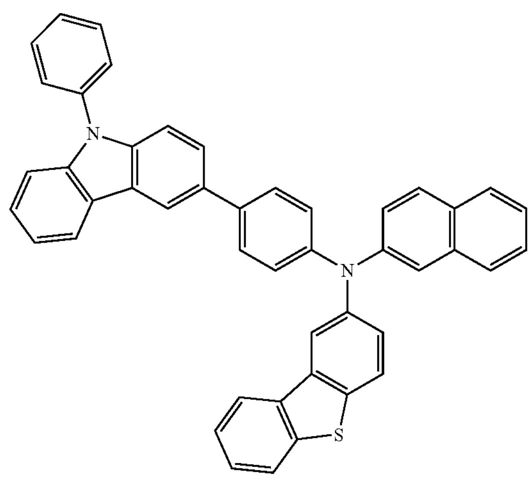
A21
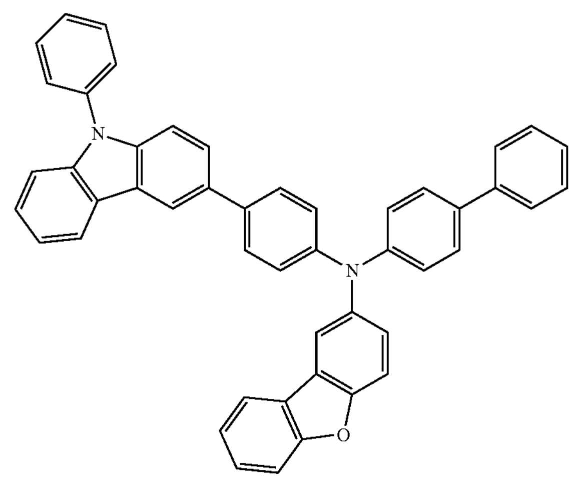
A22
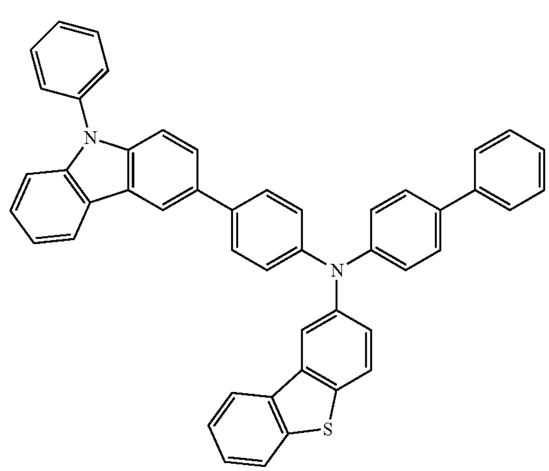
A23
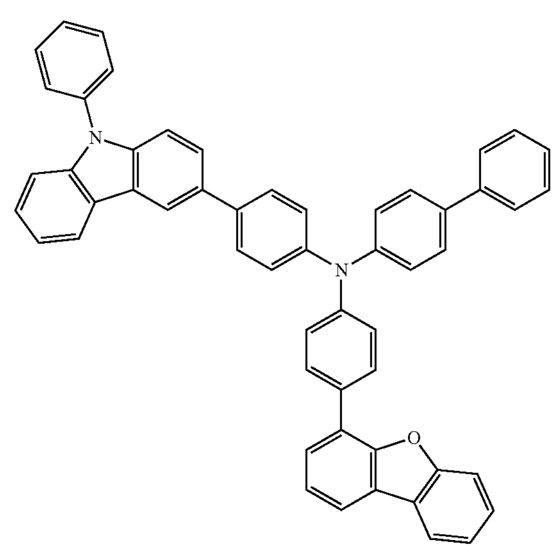

-continued
A24
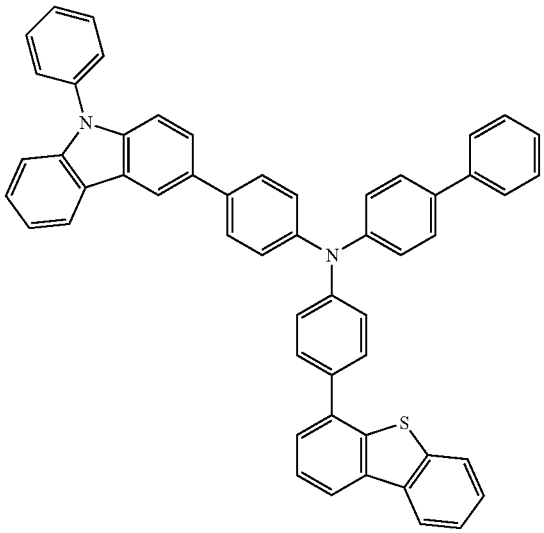
A25
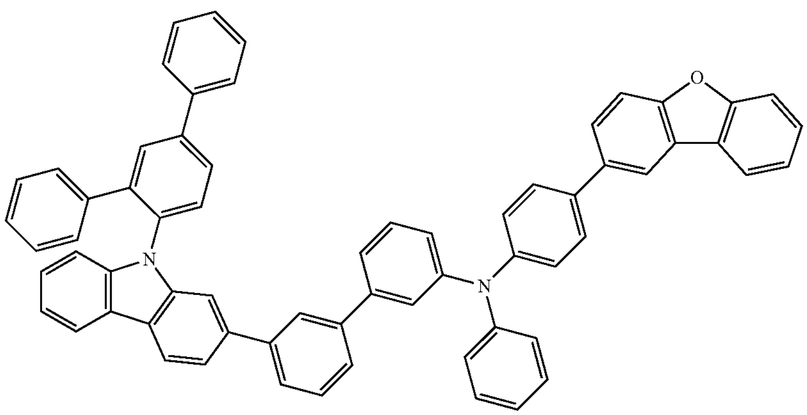
A26
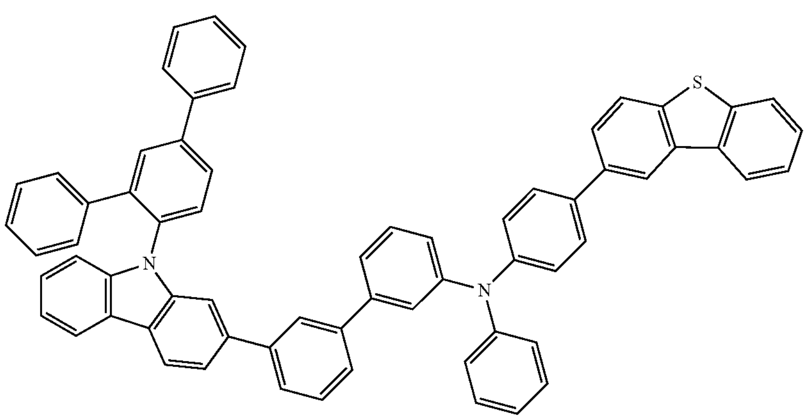

-continued
A27
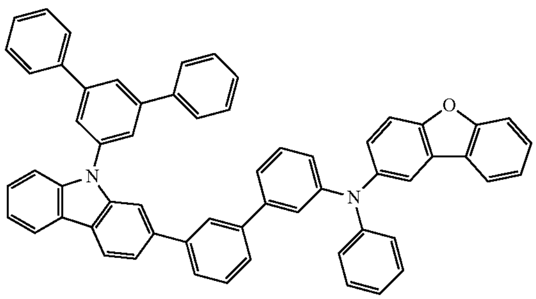
A28
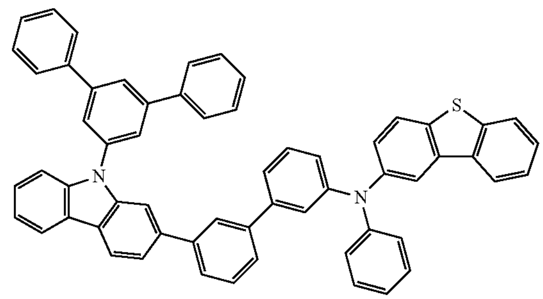
A29
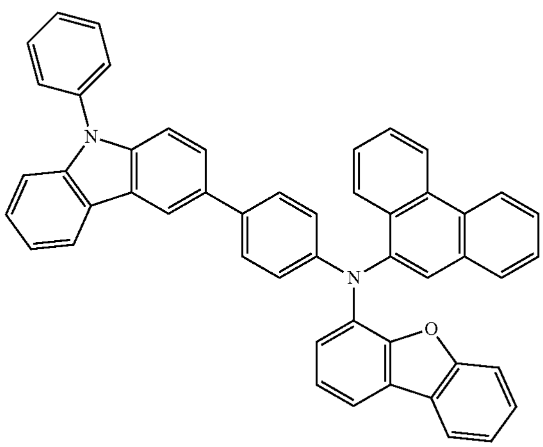
A30
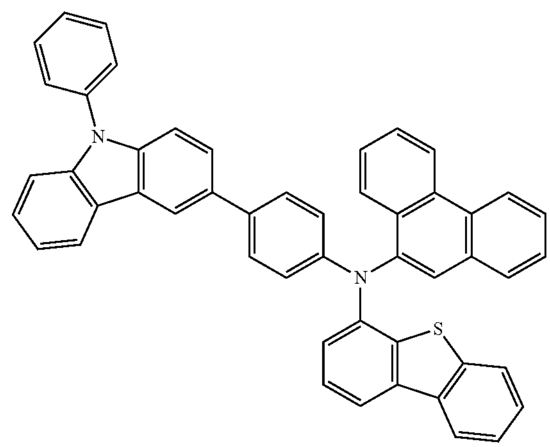
A31
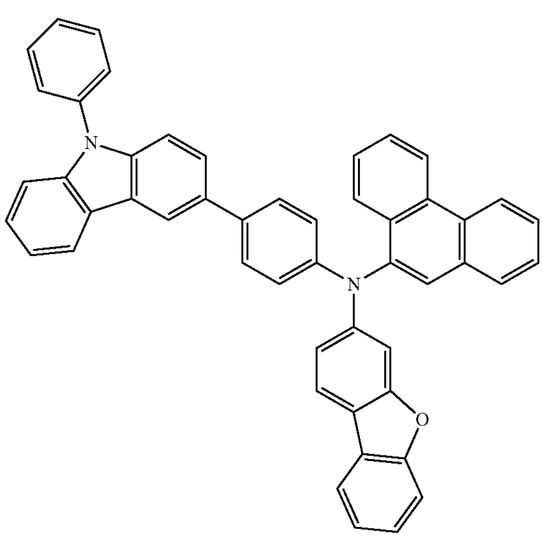
A32
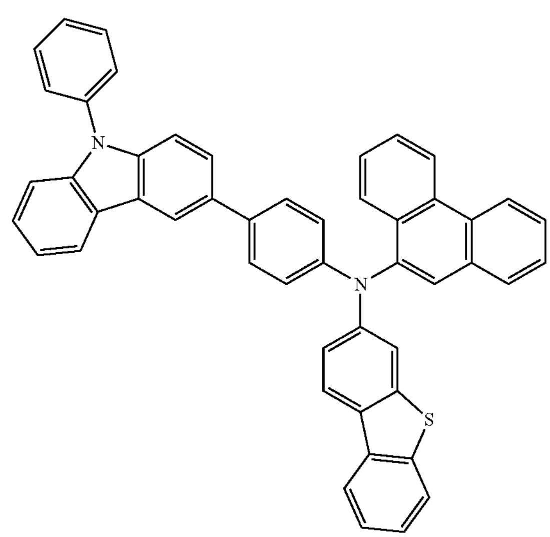

-continued
A33
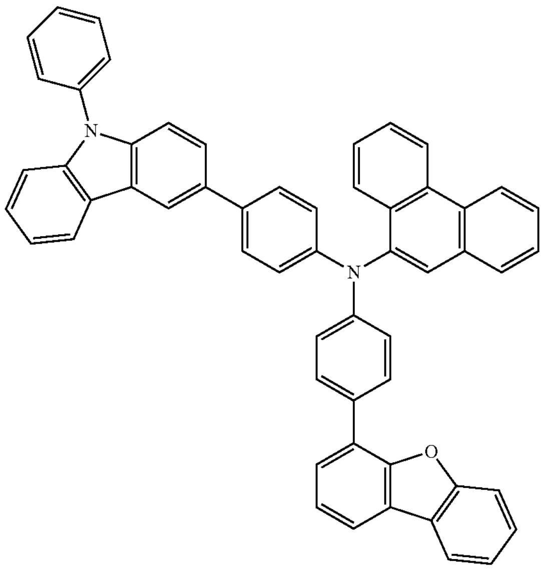
A34
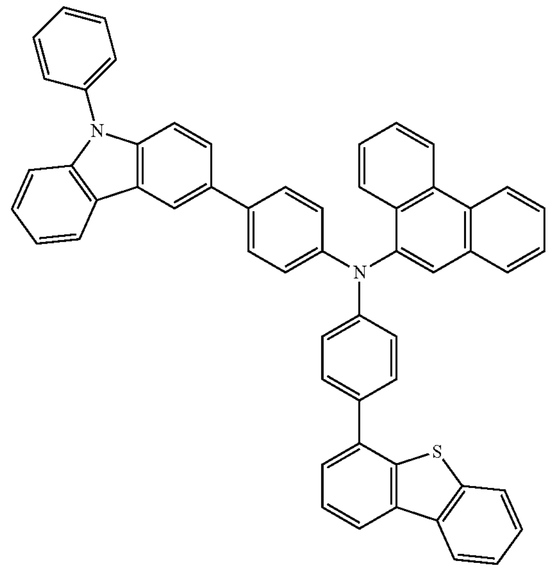
A35
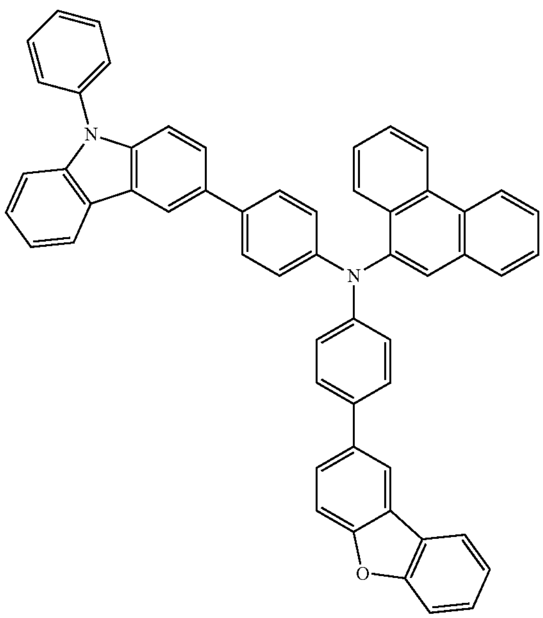
A36
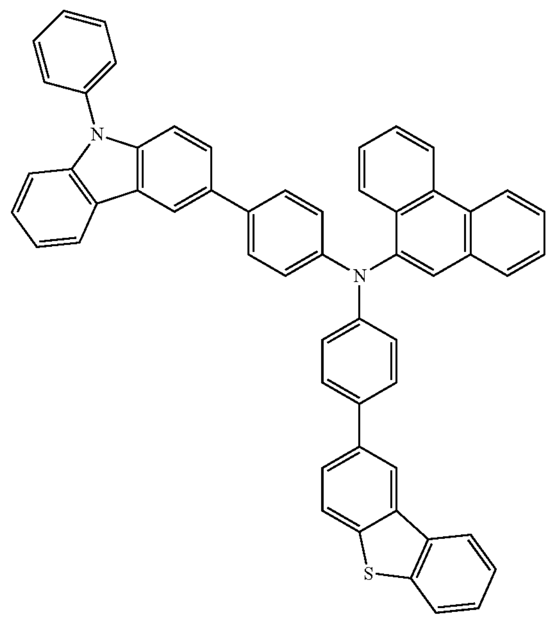
A37
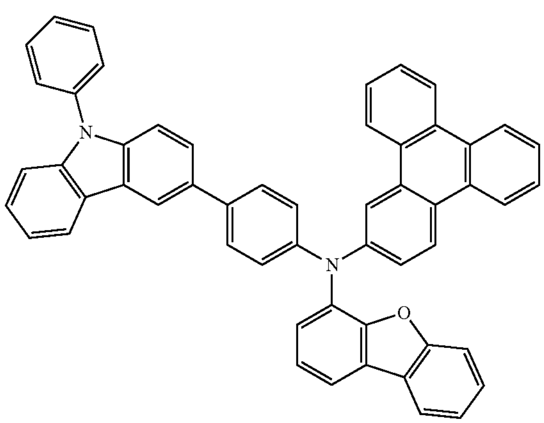
A38
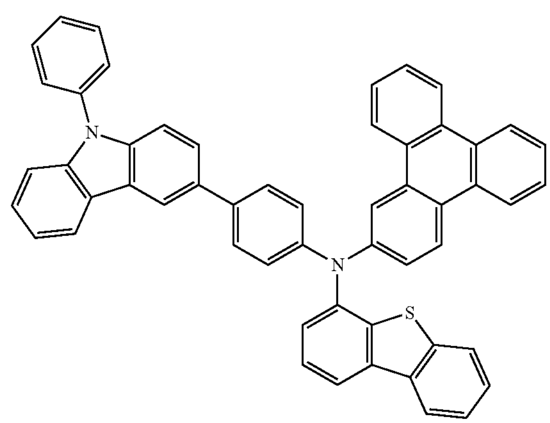

-continued
A39
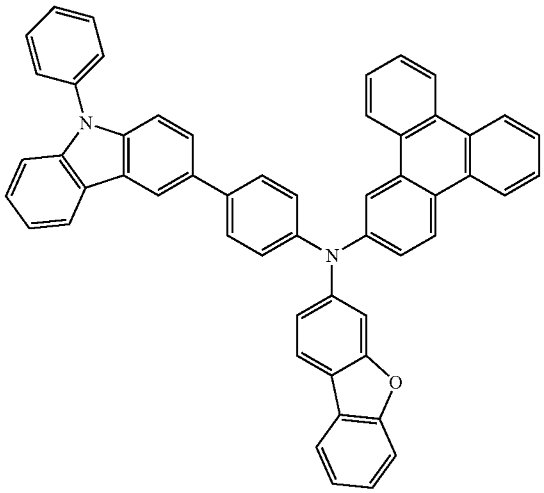
A40
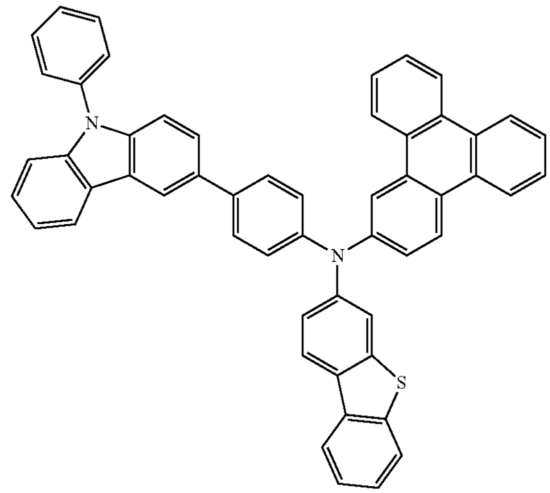
A41
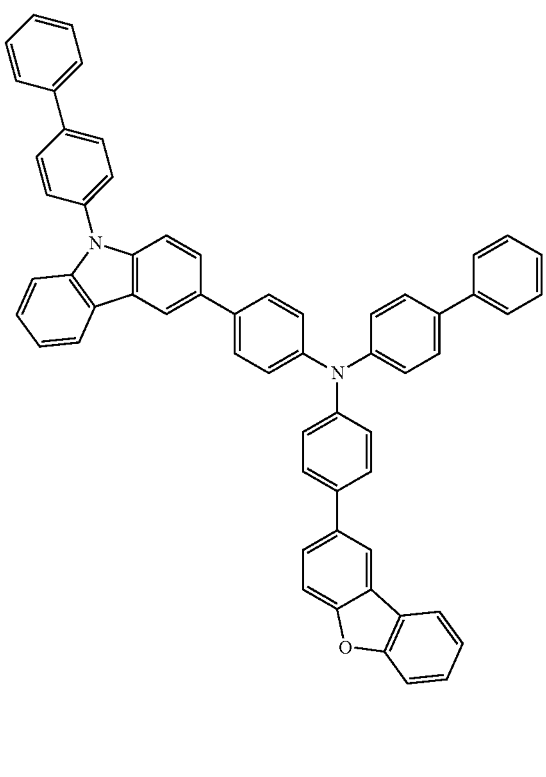
A42
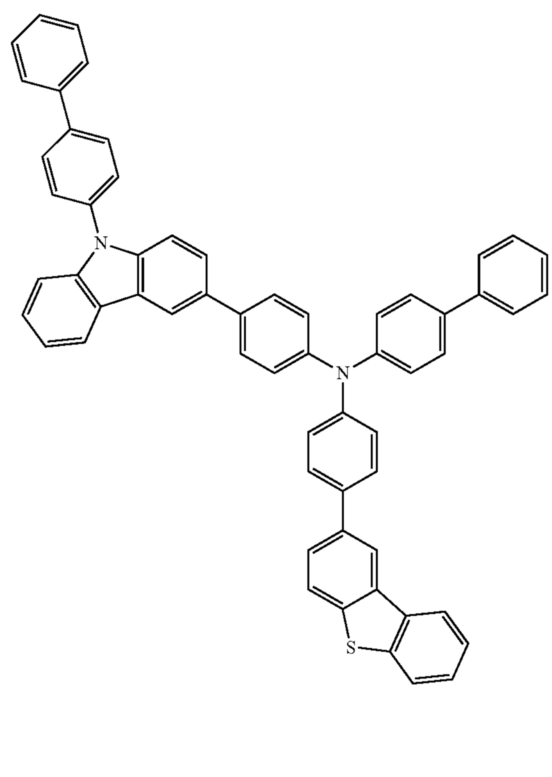

-continued
A43
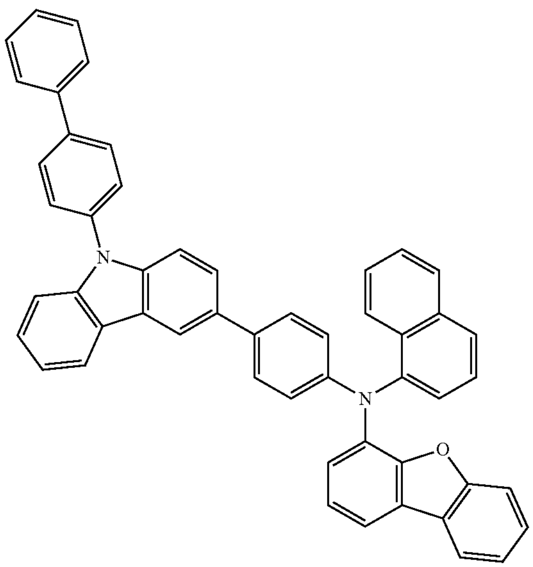
A44
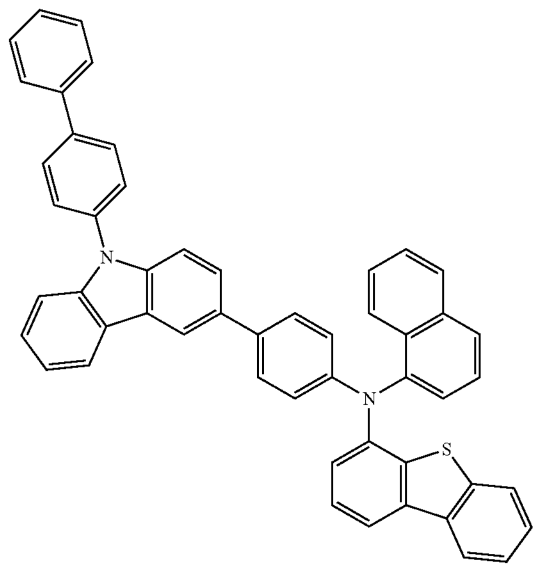
A45
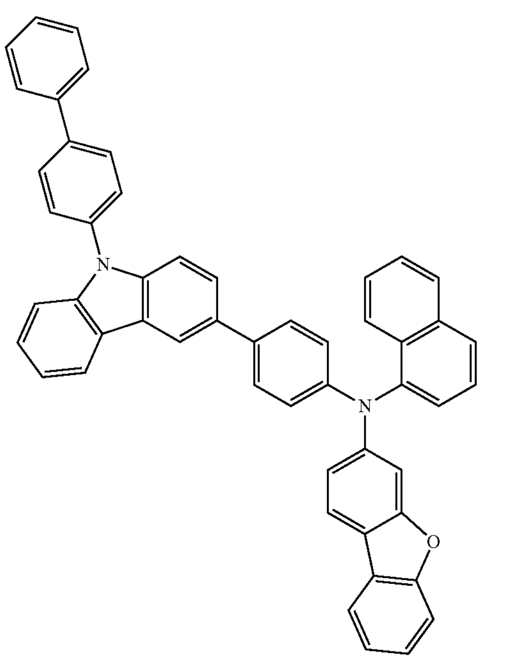
A46
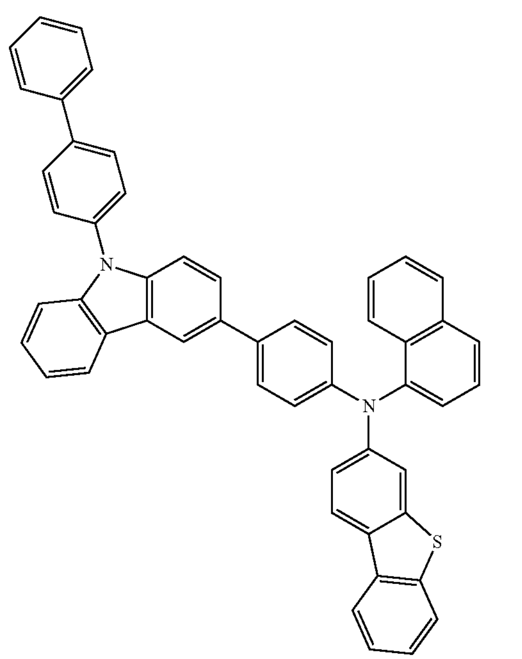

-continued
A47
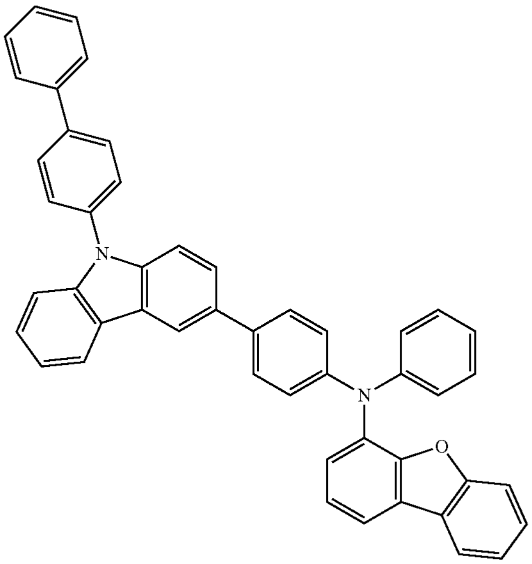
A48
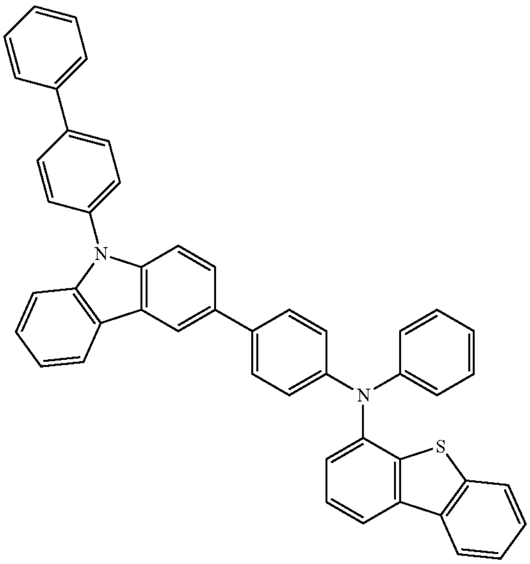
A49
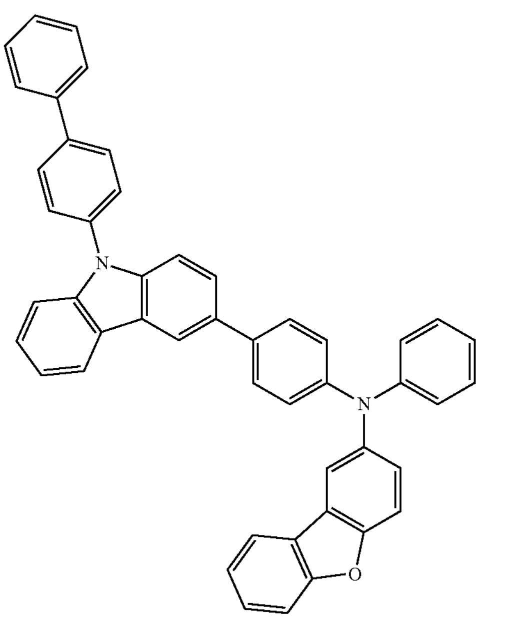
A50
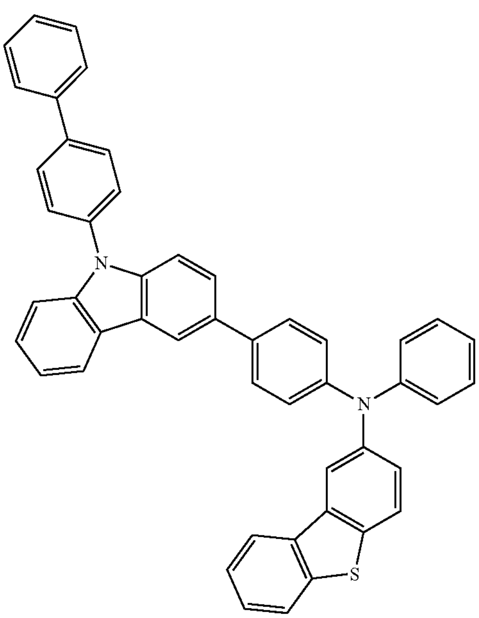

-continued
A51
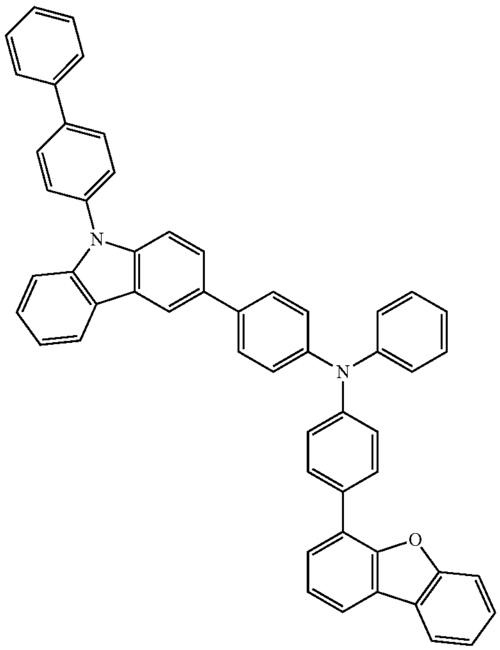
A52
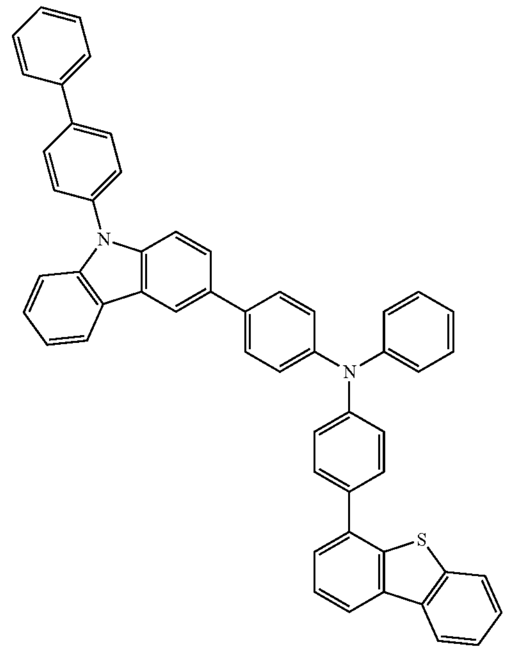
A53
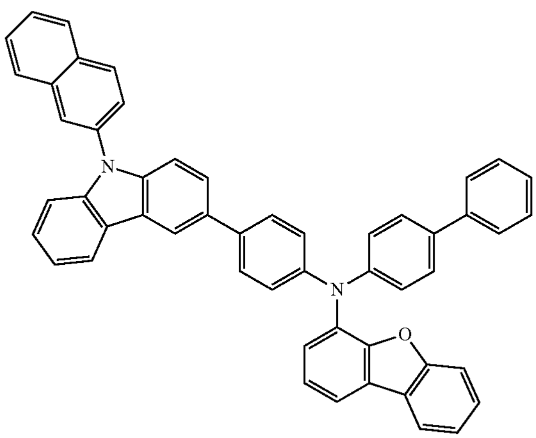
A54
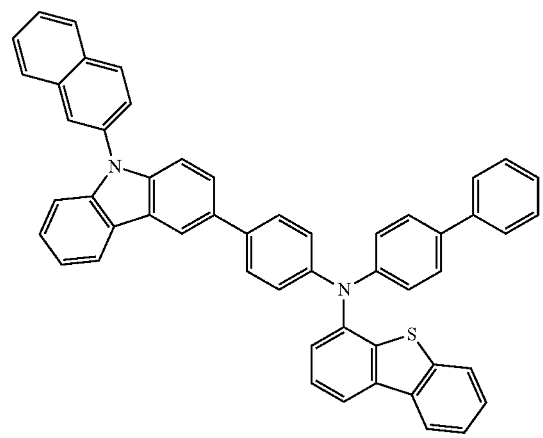
A55
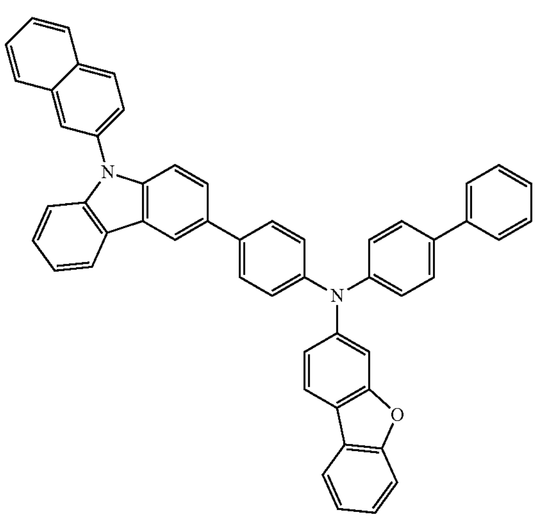
A56
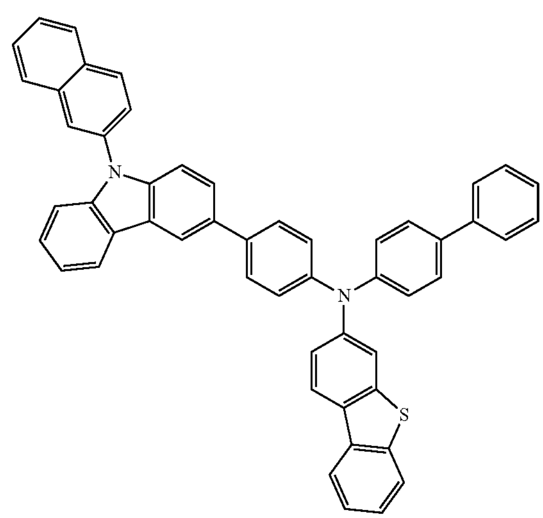

-continued
A57
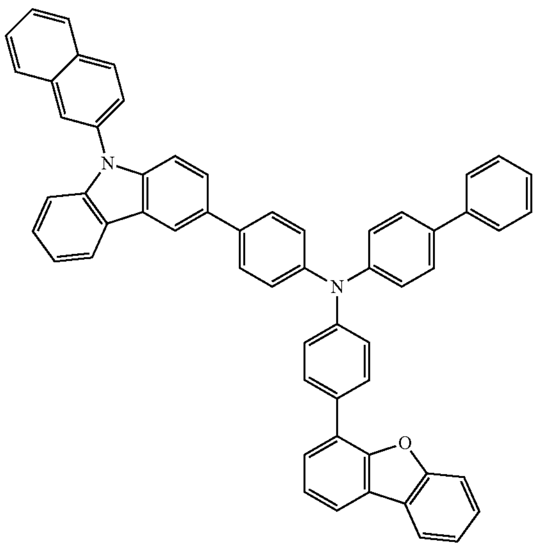
A58
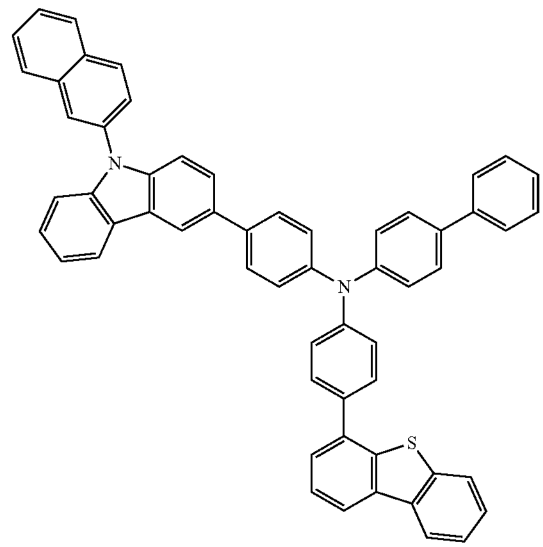
A59
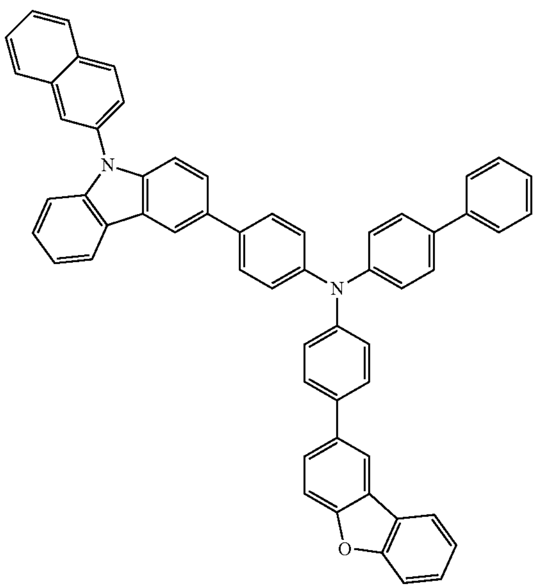
A60
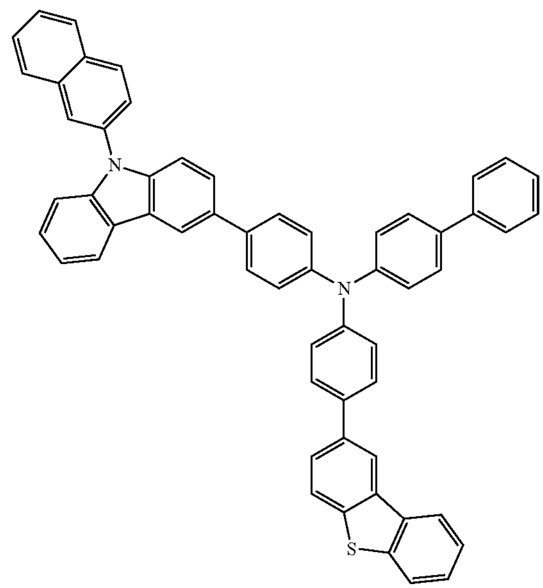
A61
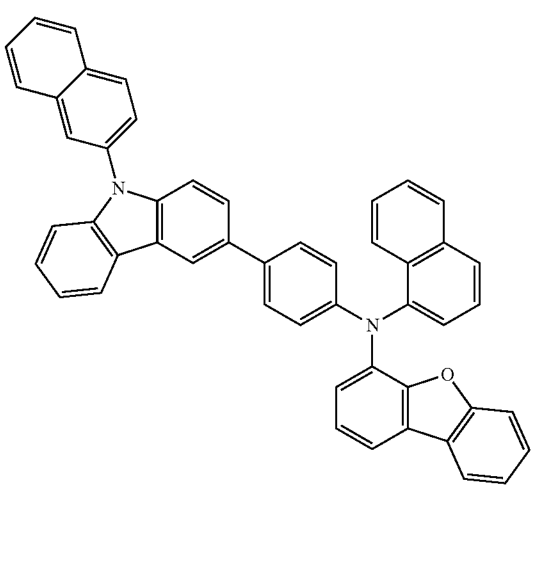
A62
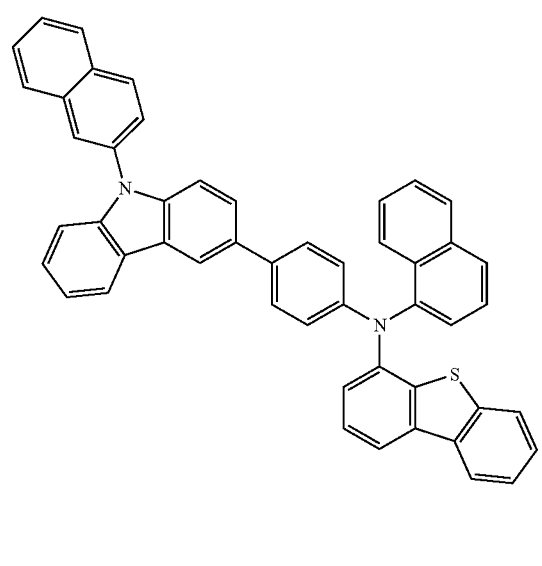

-continued
A63
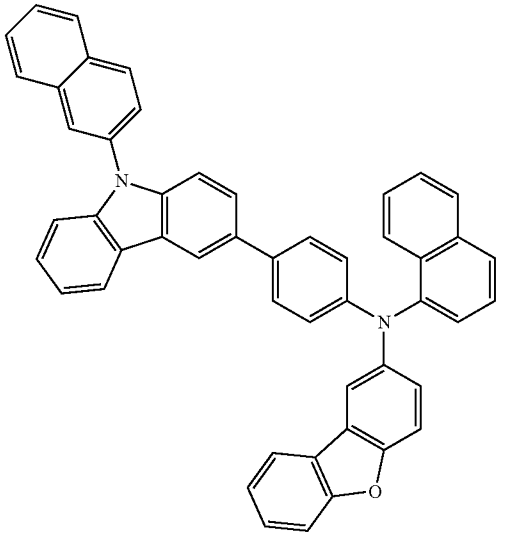
A64
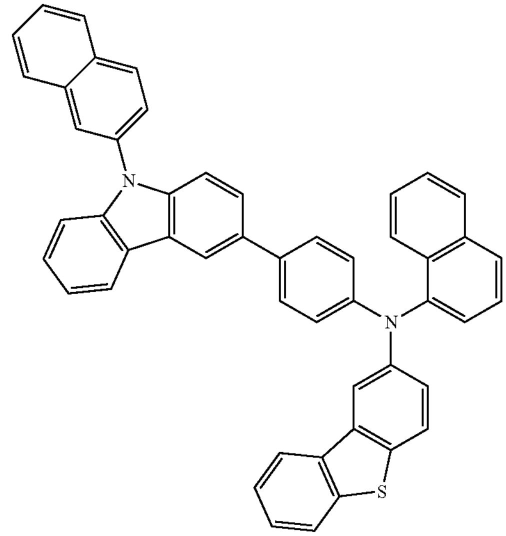
A65
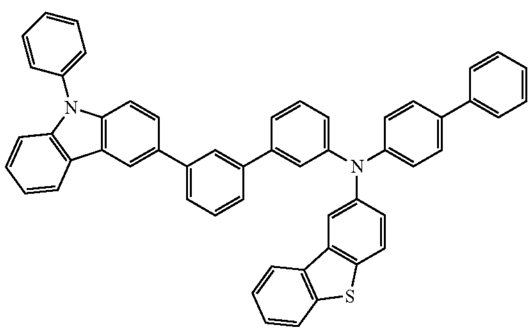
A66
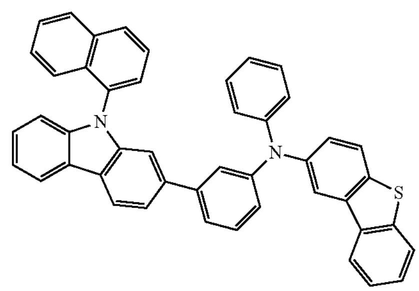
A67
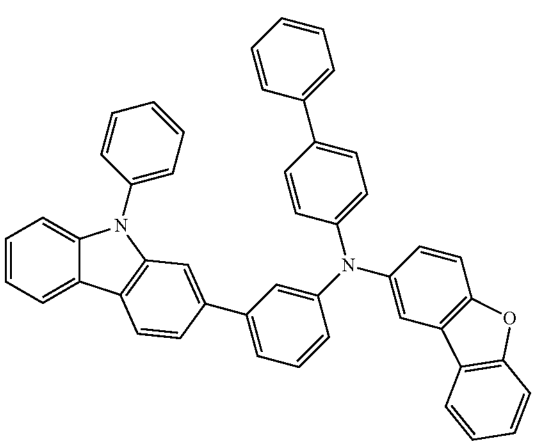

-continued
A68
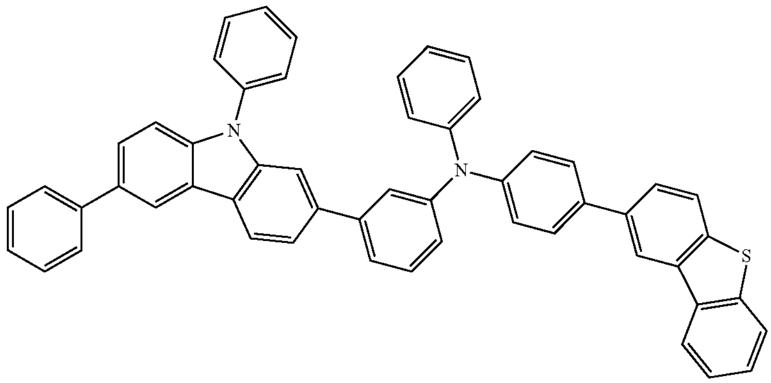
A69
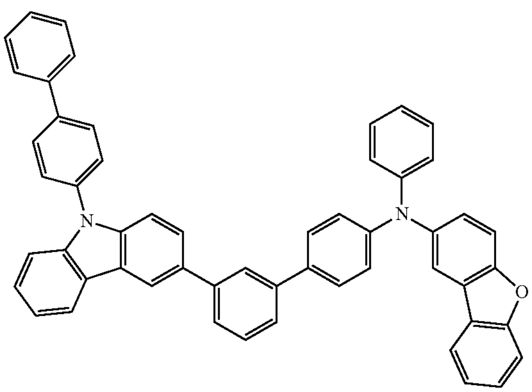
A70
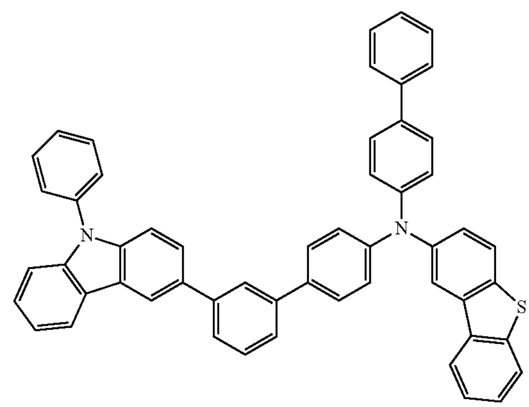
A71
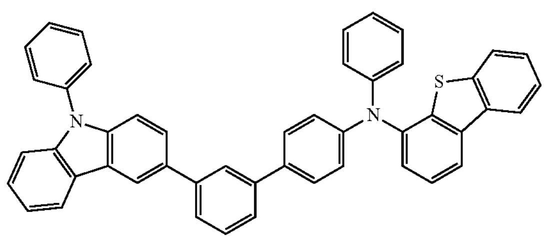
A72
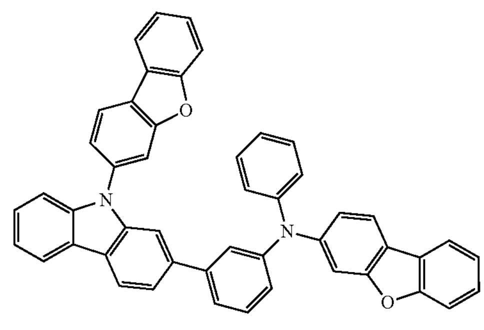
A73
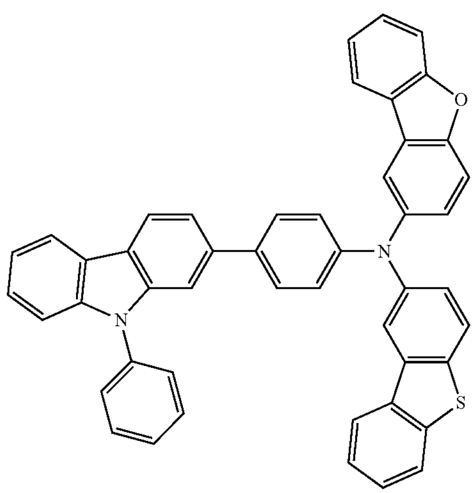
A74
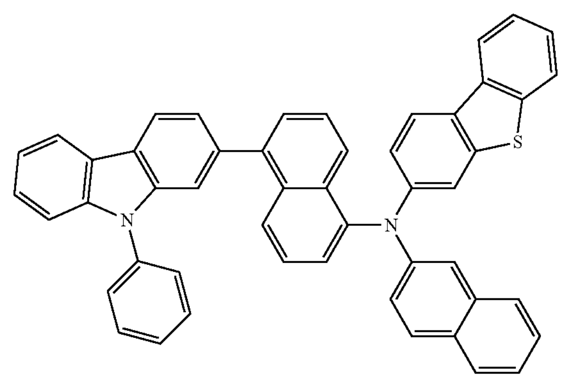

-continued
A75
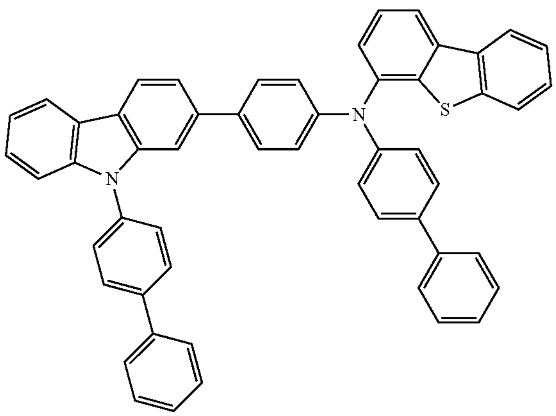
A76
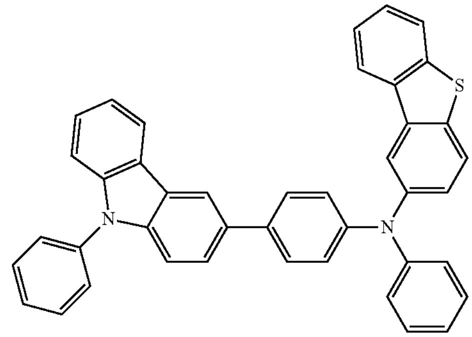
A77
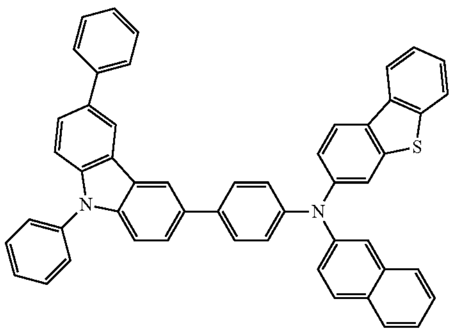
A78
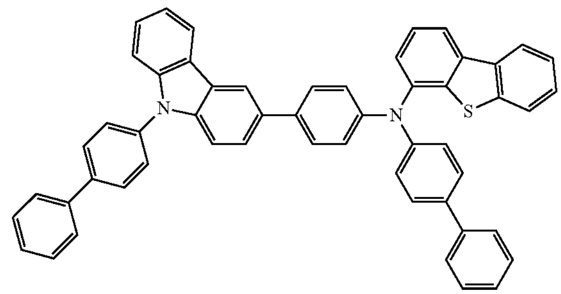
A79
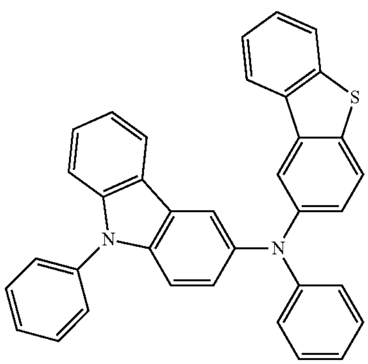
A80
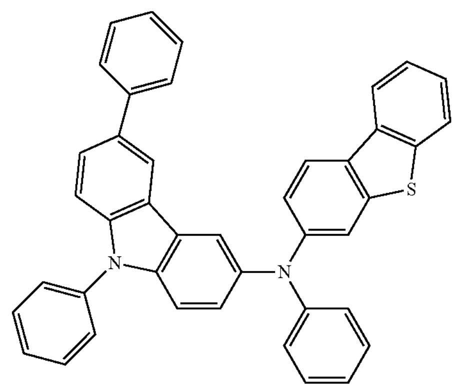
A81
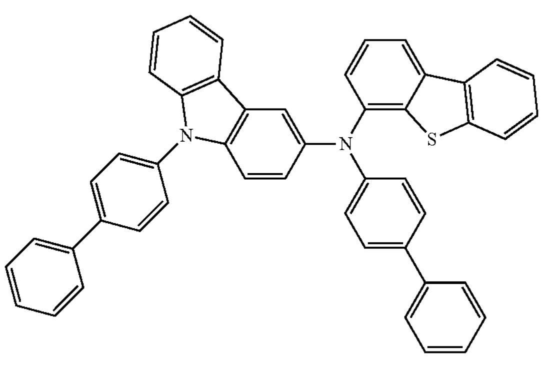
A82
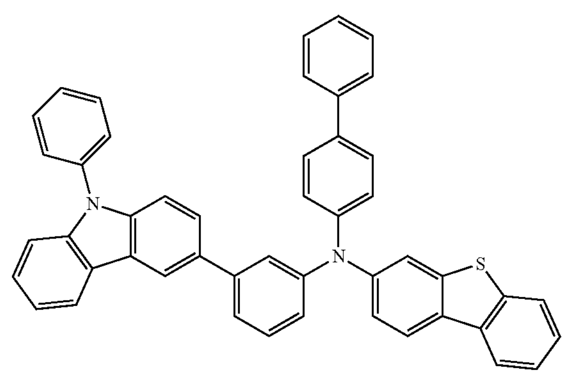

-continued
A83
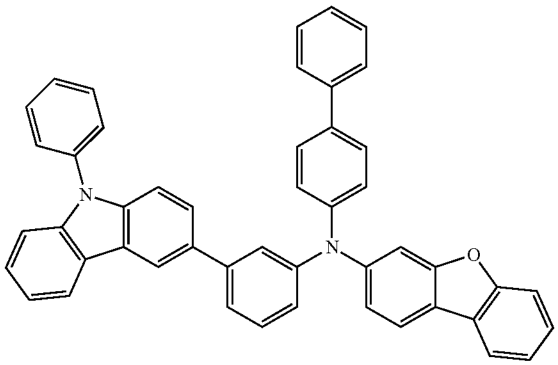
B1
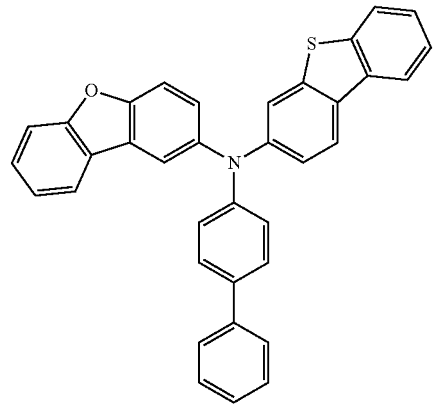
B2
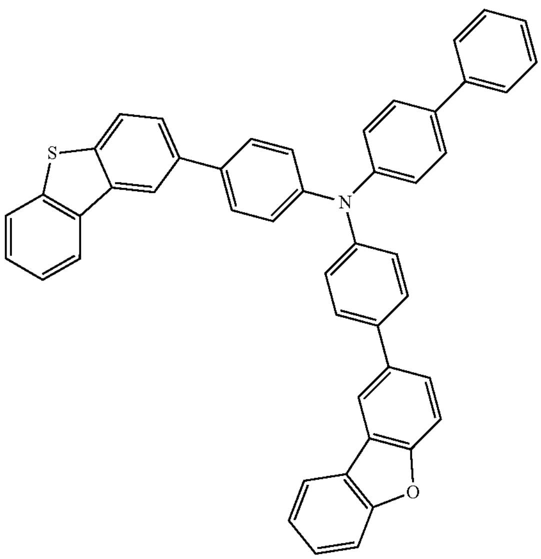
B3
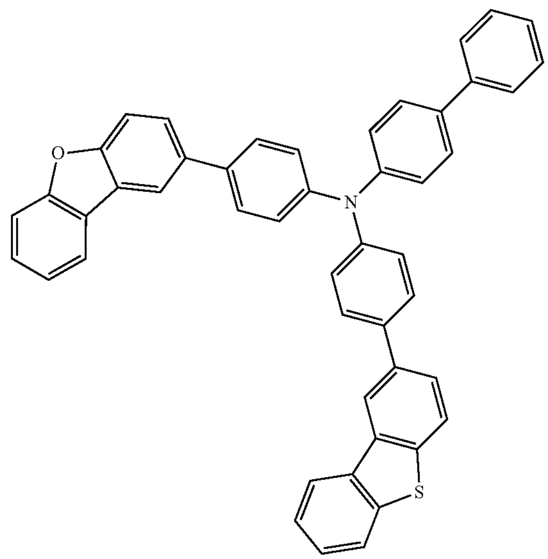
B4
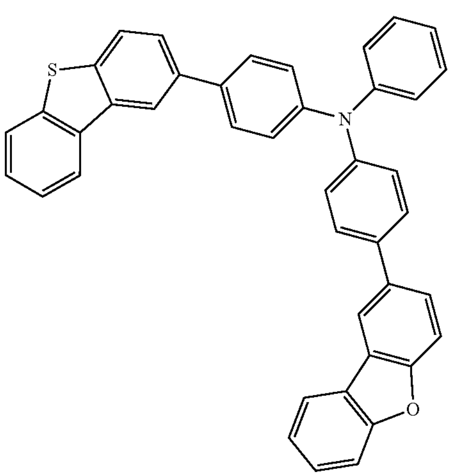
B5
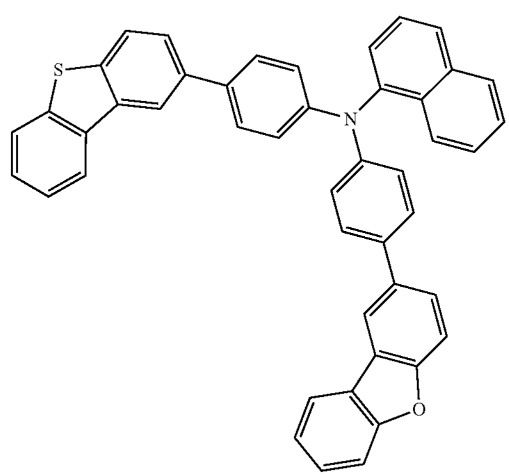

-continued
B6
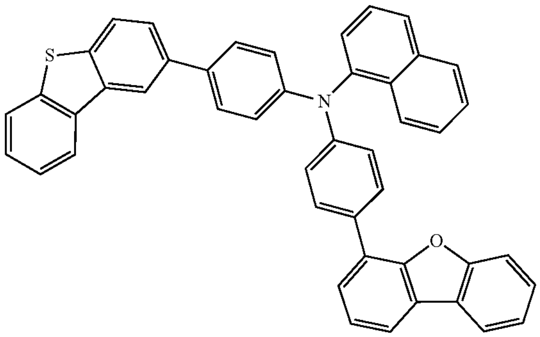
B7
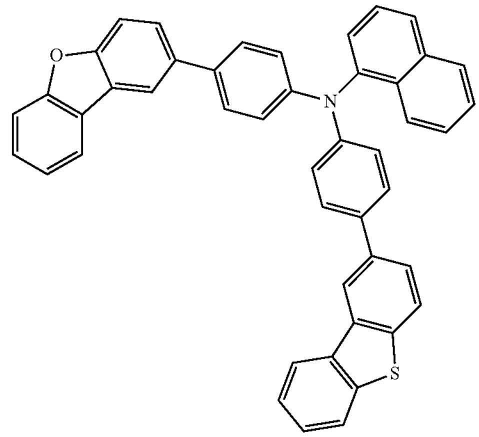
B8
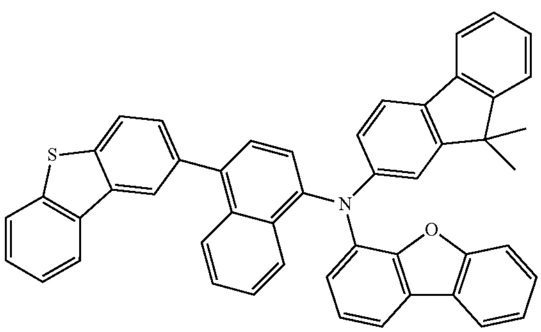
B9
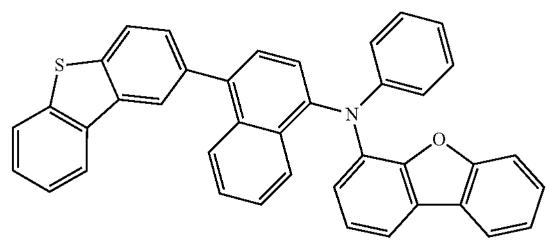
B10
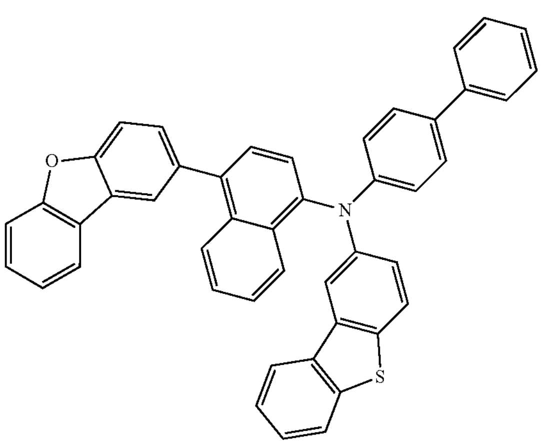
B11
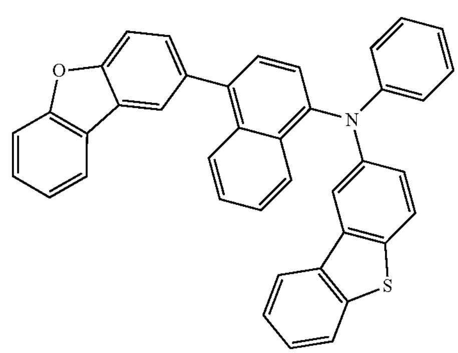

-continued
B12
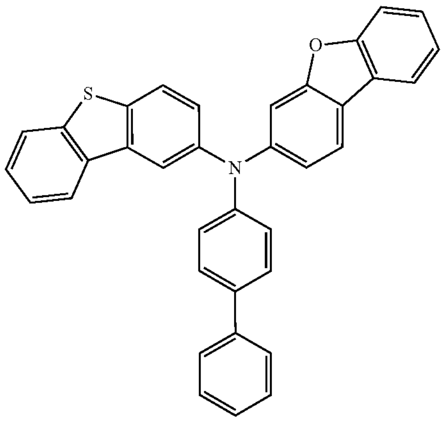
B13
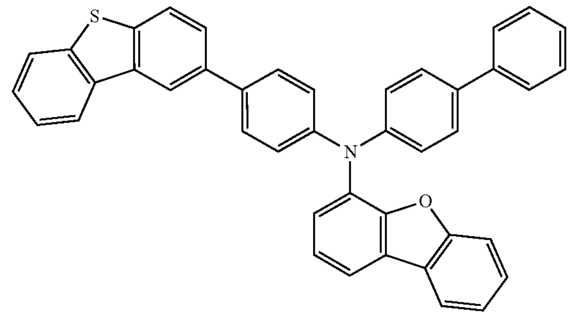
B14
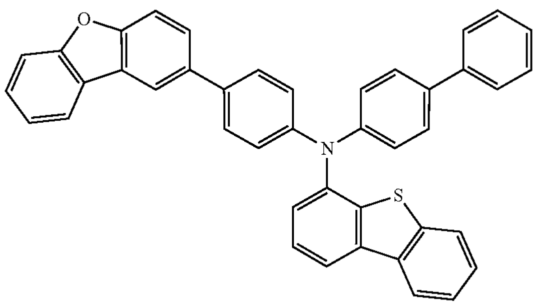
B15
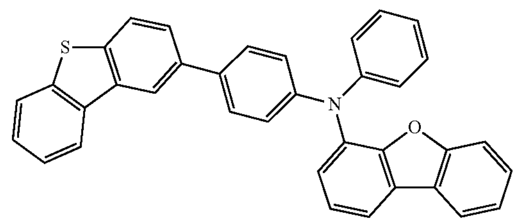
B16
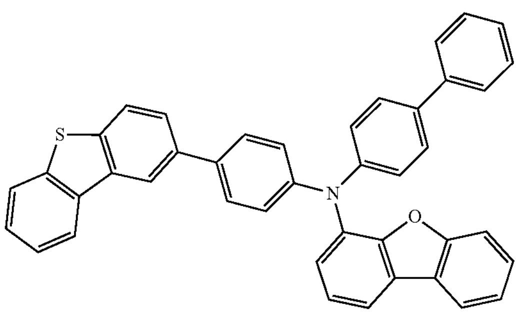
B17
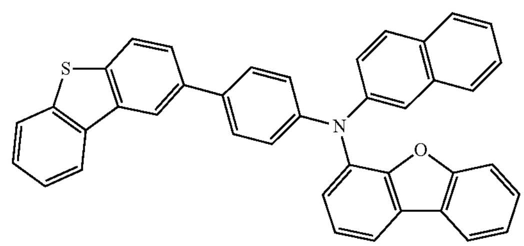
B18
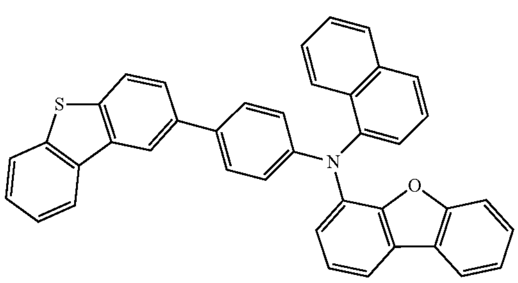
B19
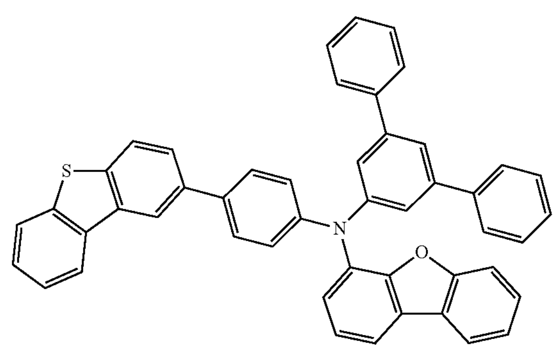

-continued
B20
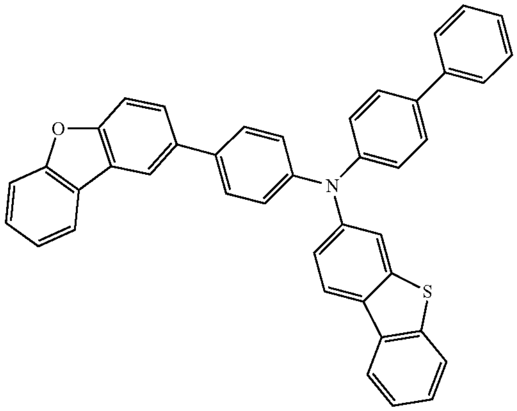
B21
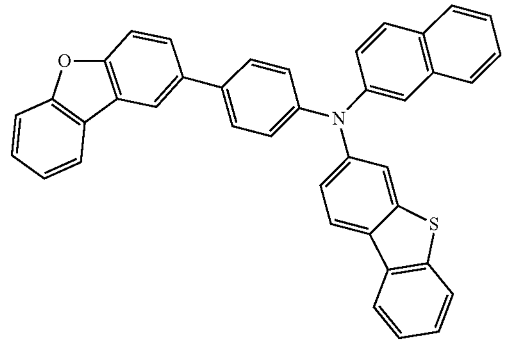
B22
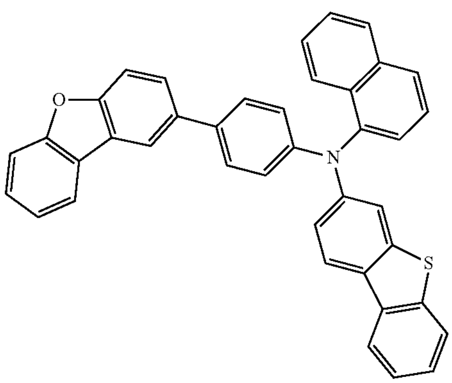
B23
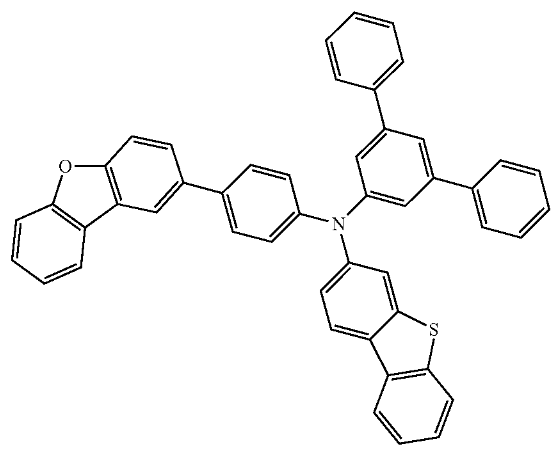
B24
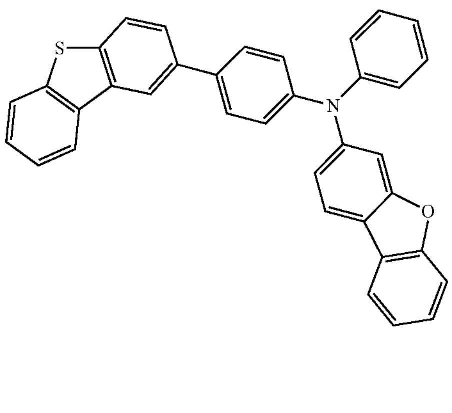
B25
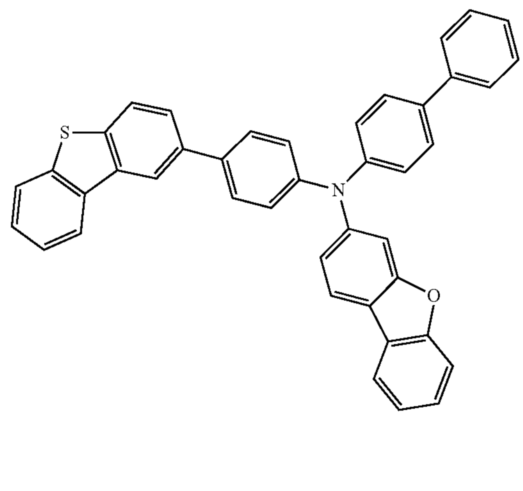

-continued
B26
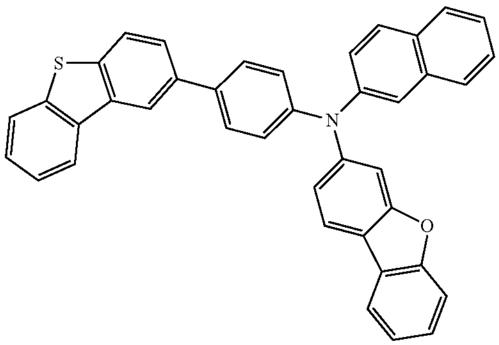
B27
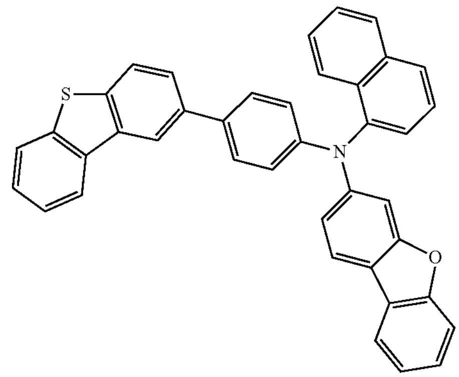
B28
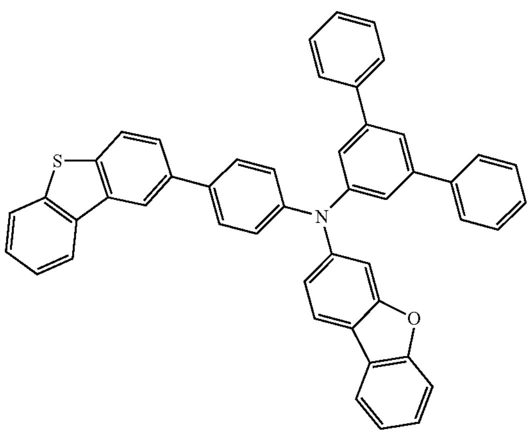
B29
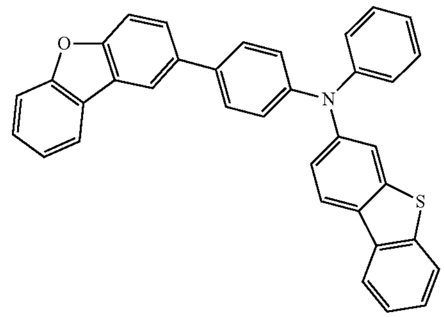
B30
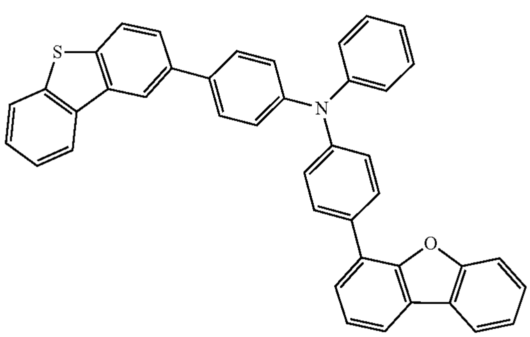
B31
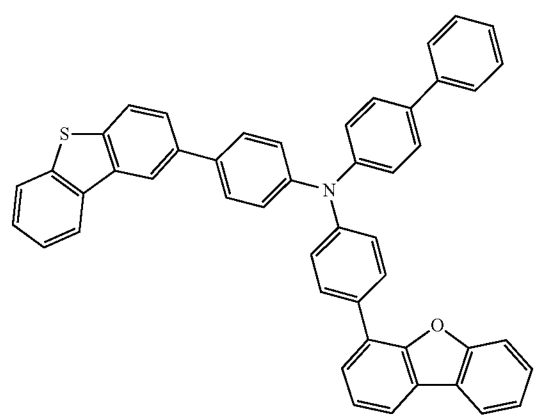

-continued
B32
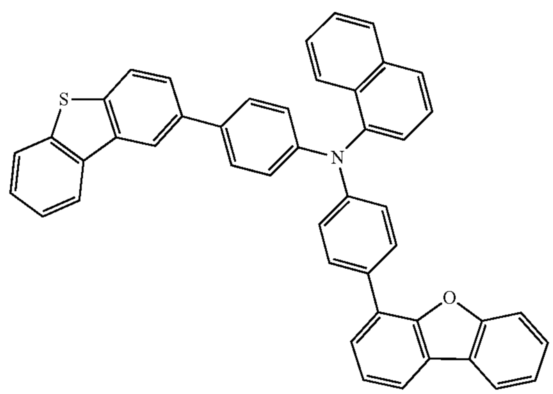
B33
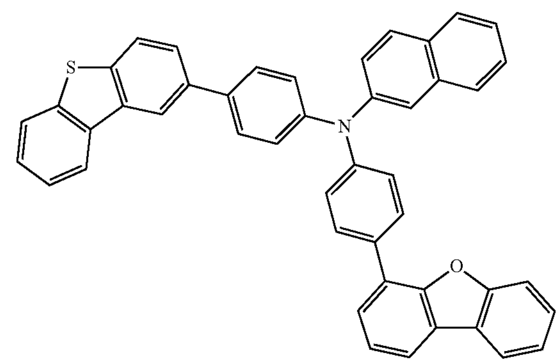
B34
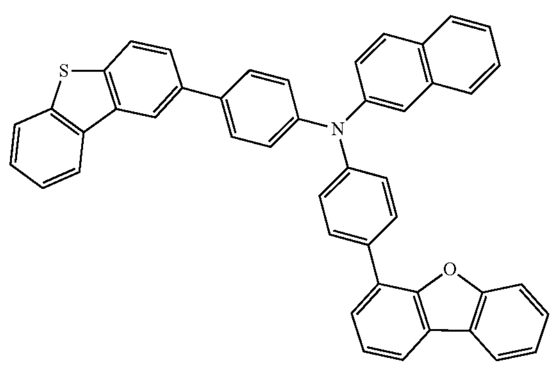
B35
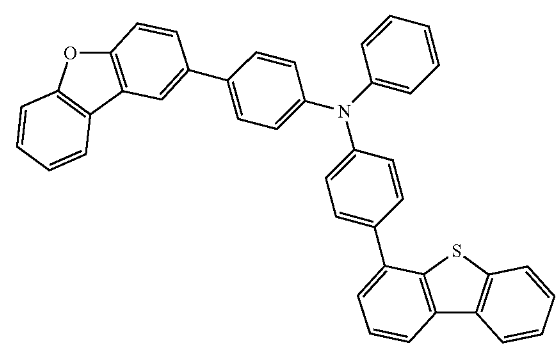
B36
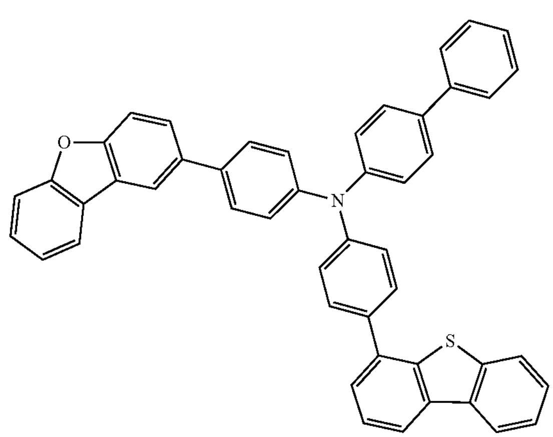
B37
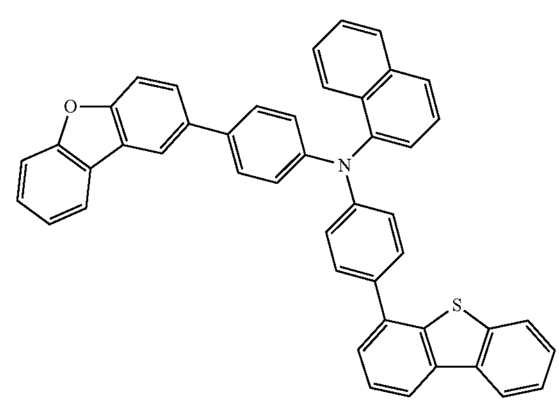

-continued
B38
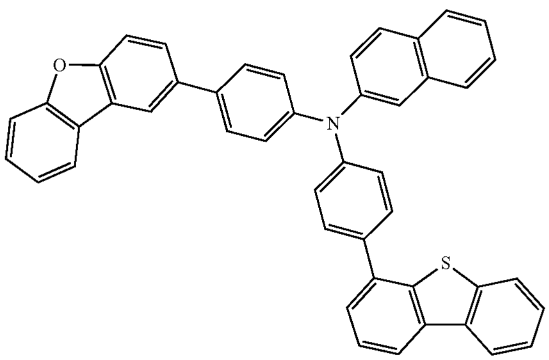
B39
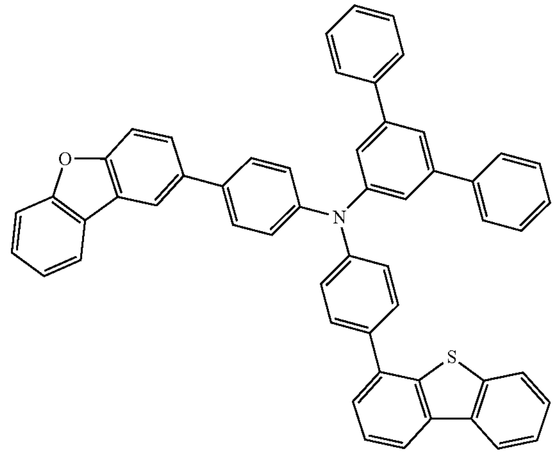
B40
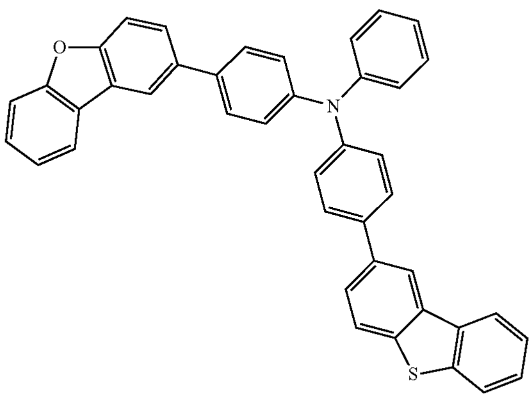
B41
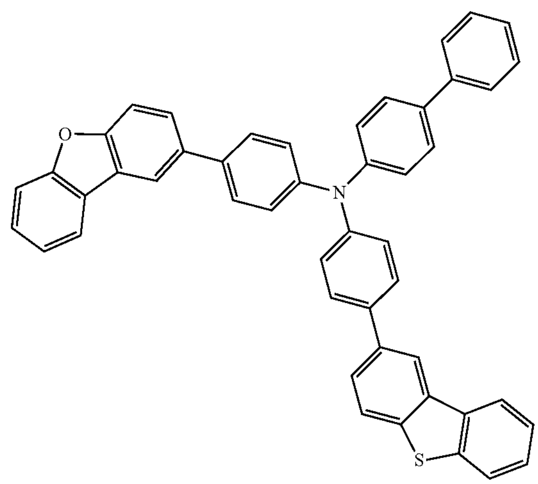
B42
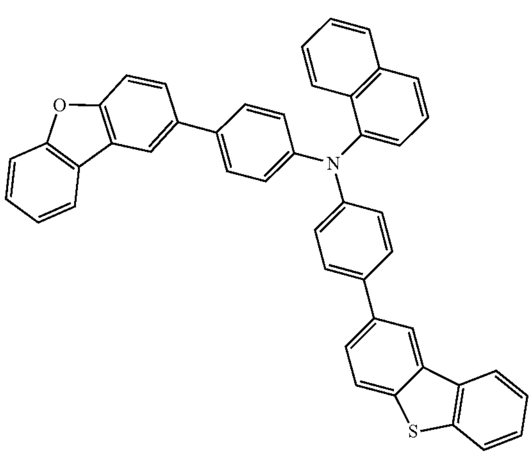
B43
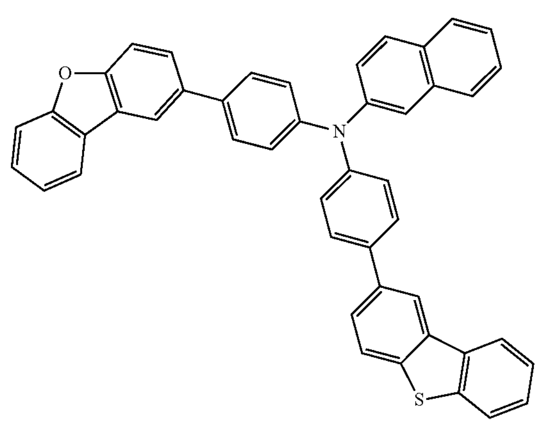

-continued
B44
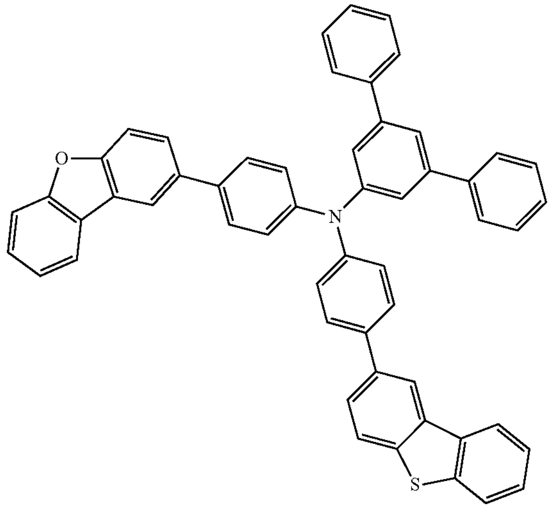
B45
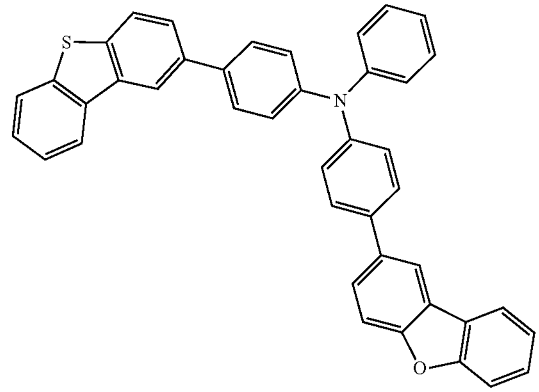
B46
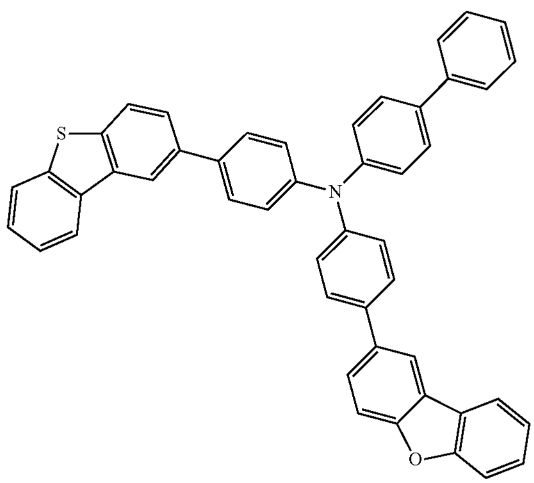
B47
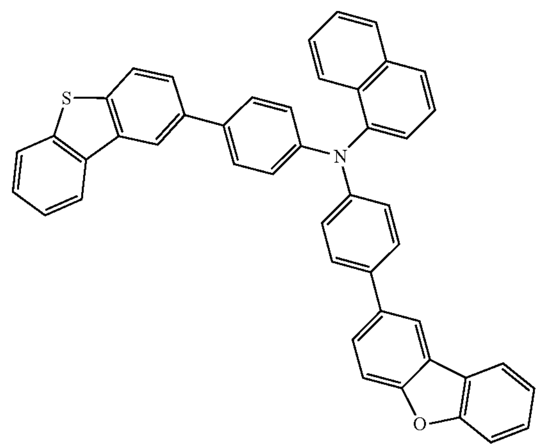
B48
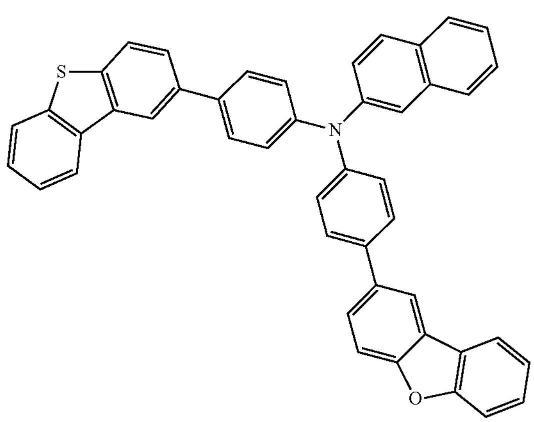
B49
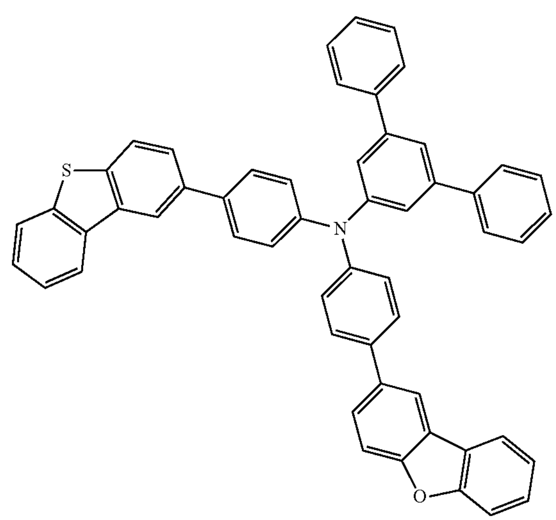

-continued
B50
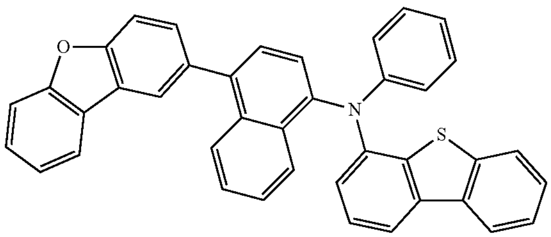
B51
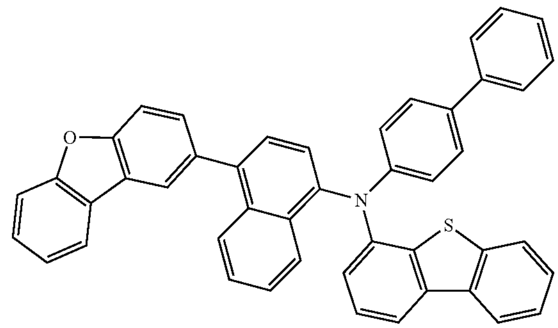
B52
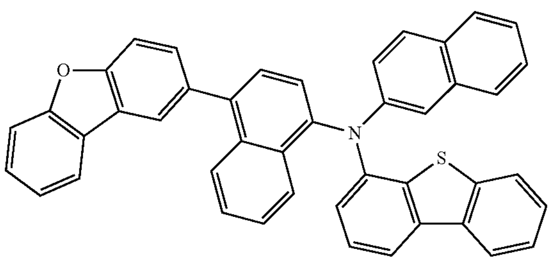
B53
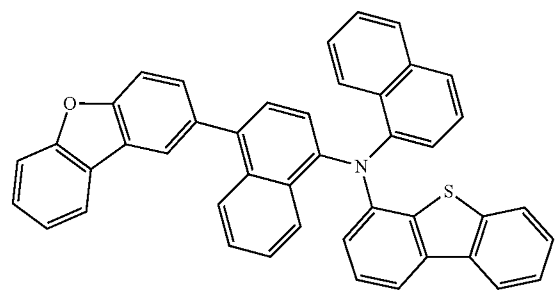
B54
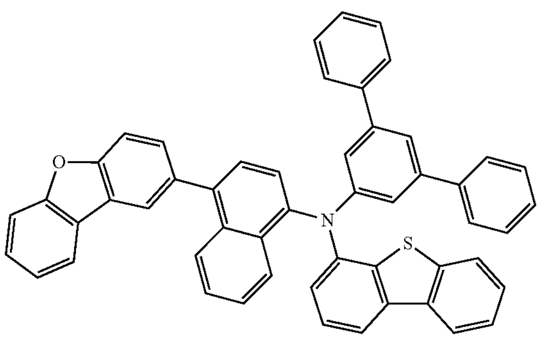
B55
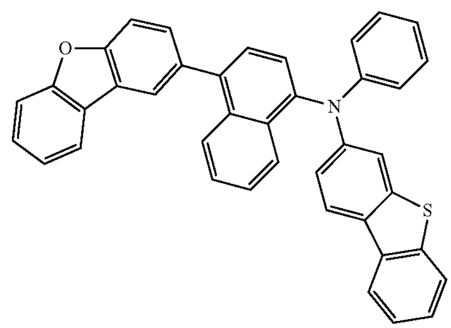
B56
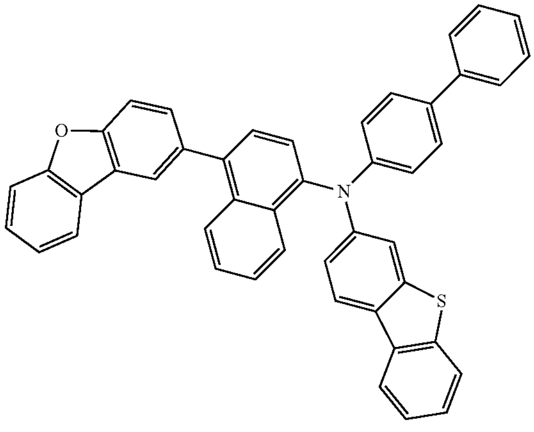
B57
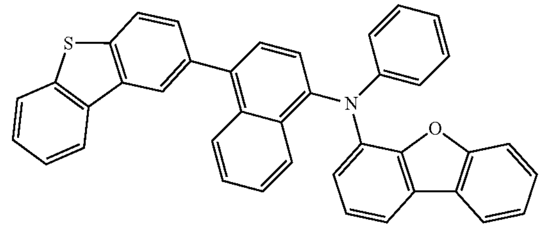

-continued
B58
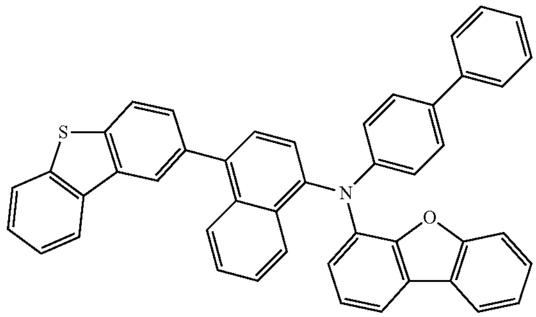
B59
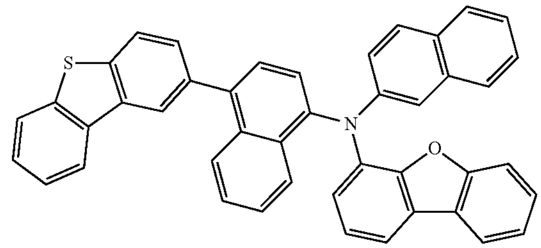
B60
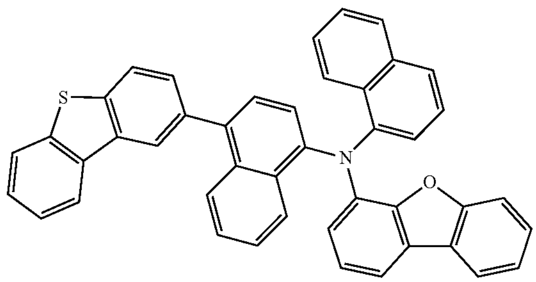
B61
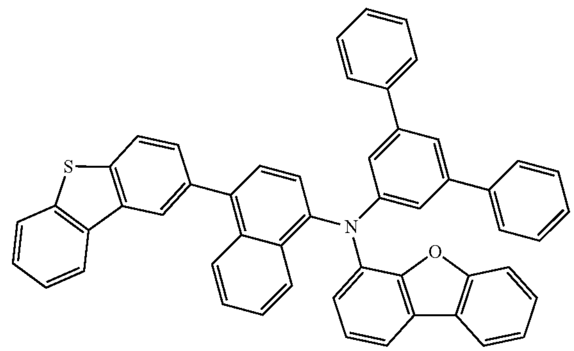
B62
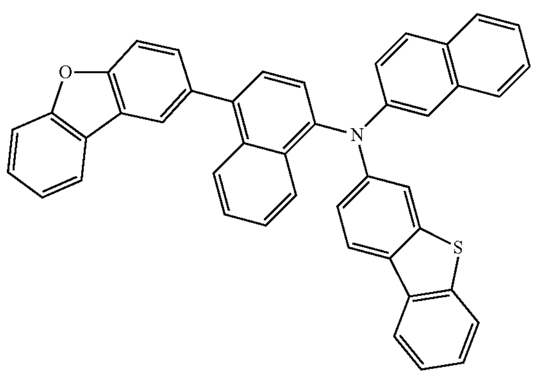
B63
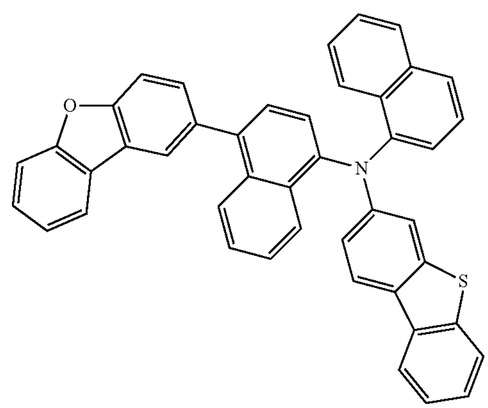
B64
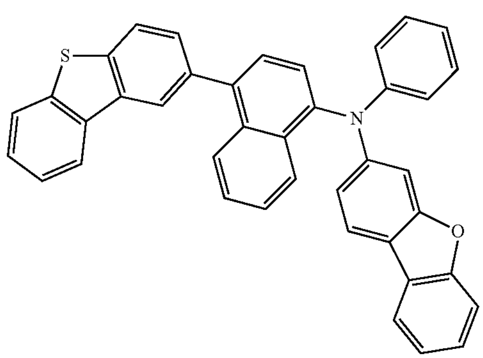
B65
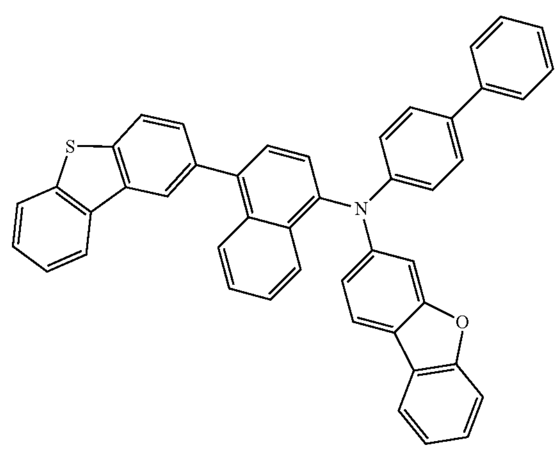

-continued
B66
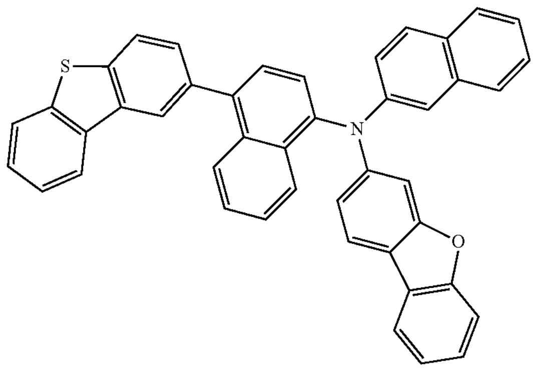
B67
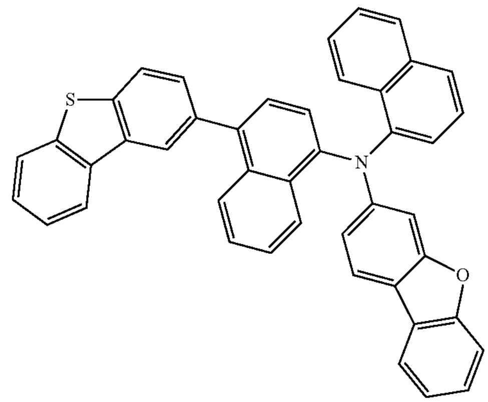
B68
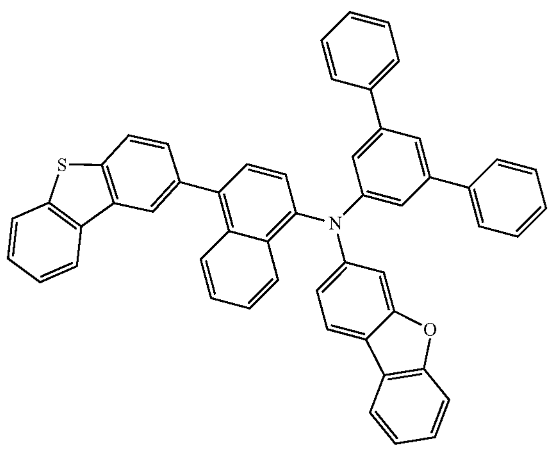
B69
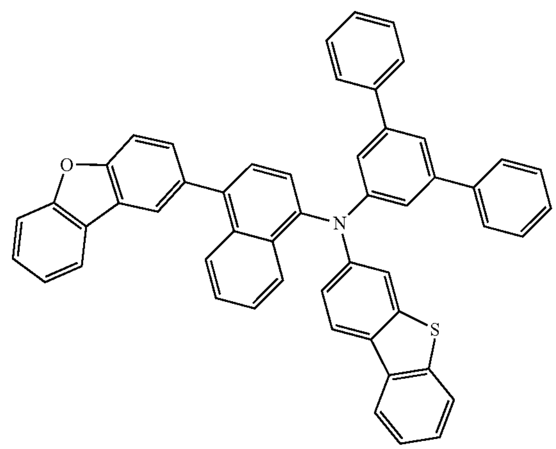
B70
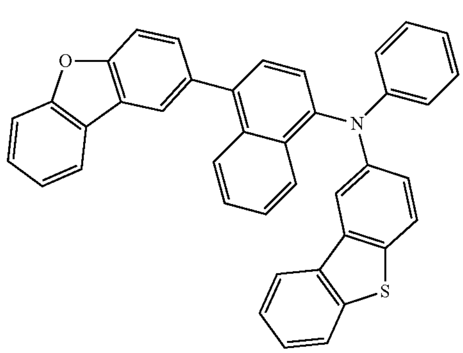
B71
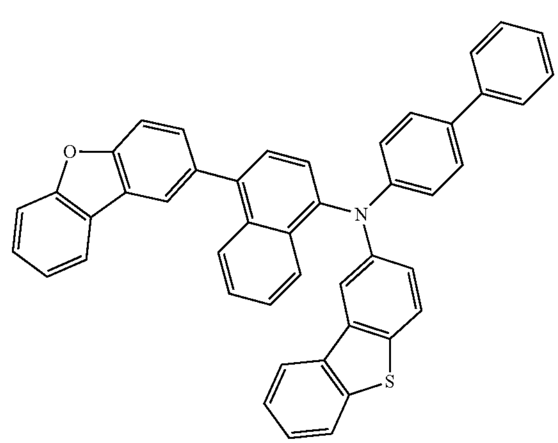

-continued
B72
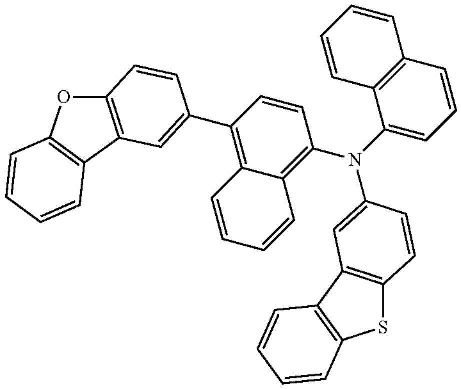
B73
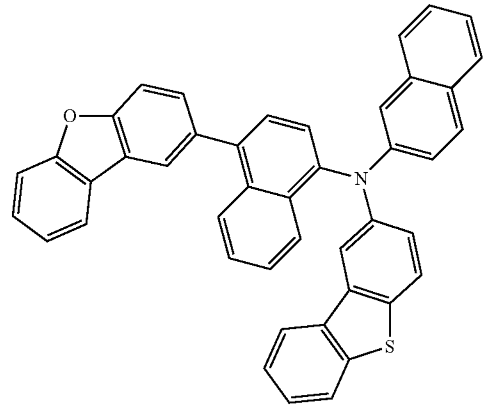
B74
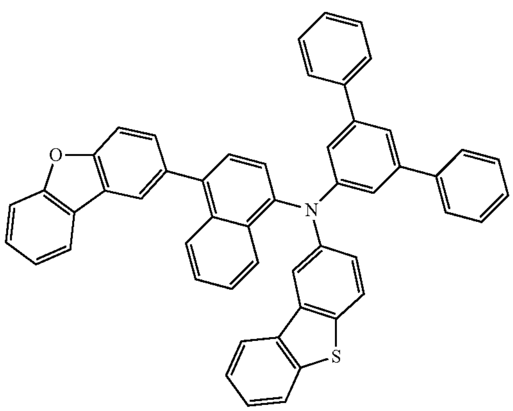
C1
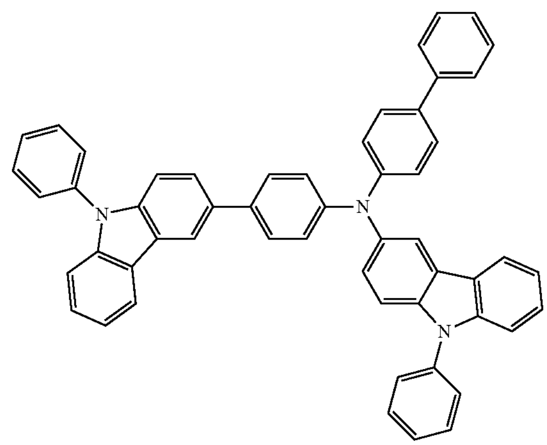
C2
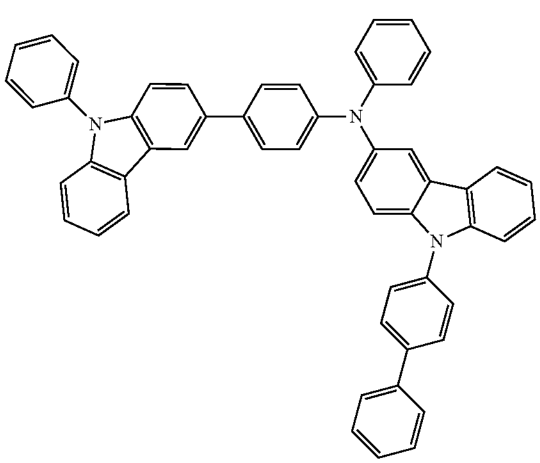
C3
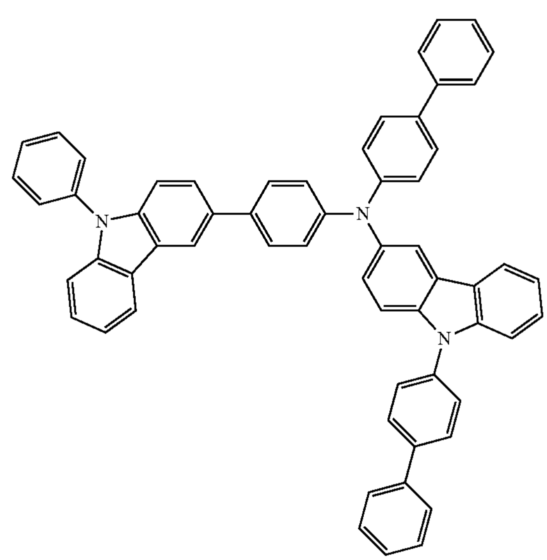

-continued
C4
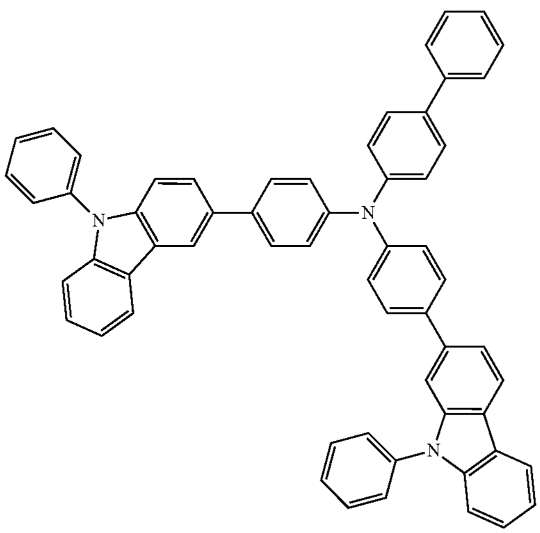
C5
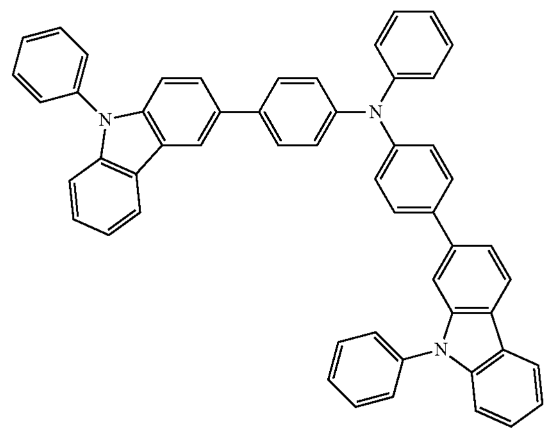
C6
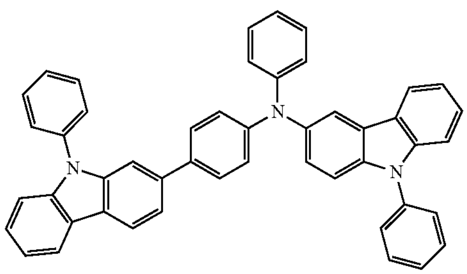
C7
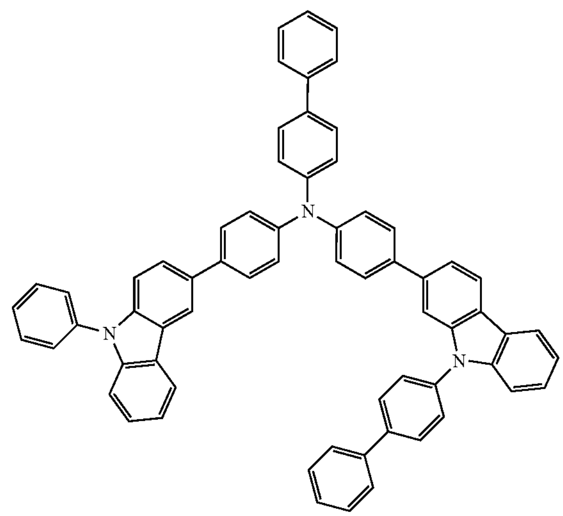
C8
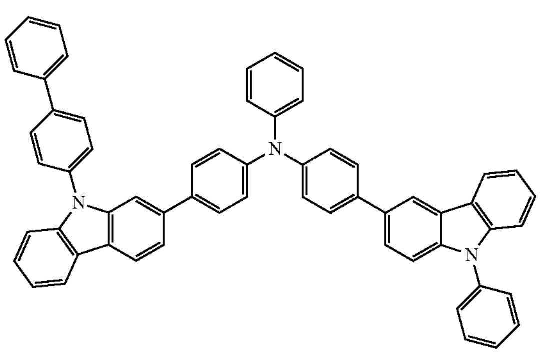
C9
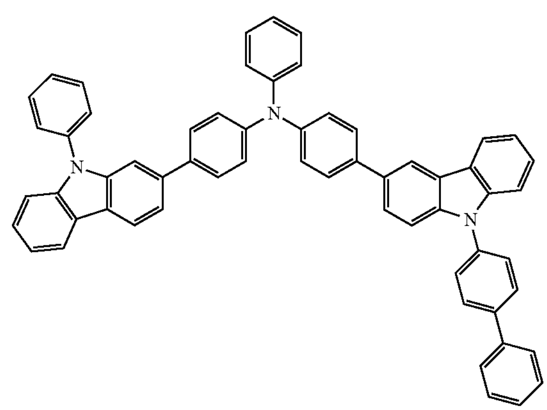

-continued
C10
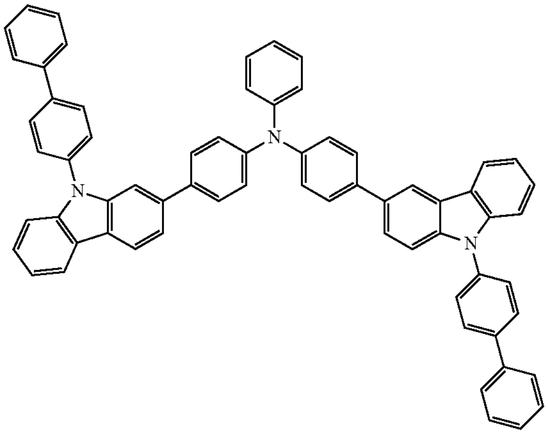
C11
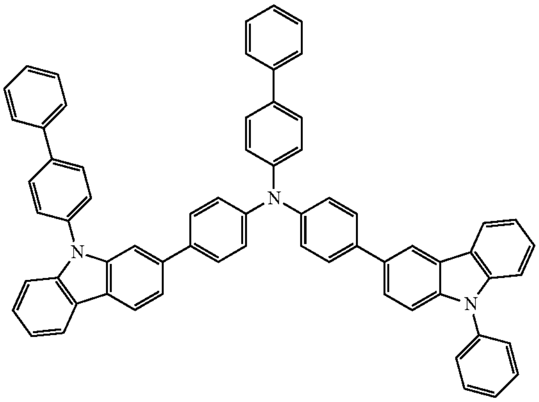
C12
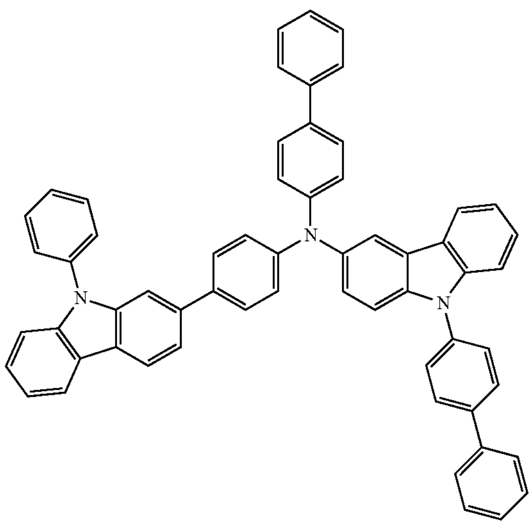
C13
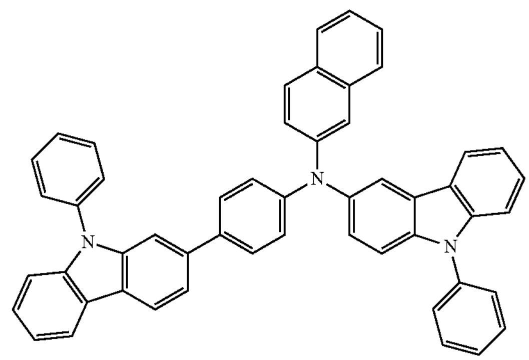
C14
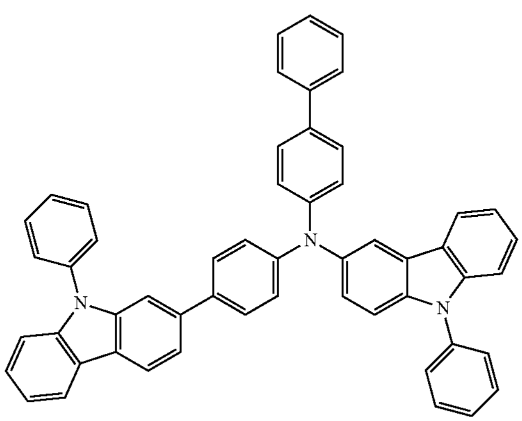
C15
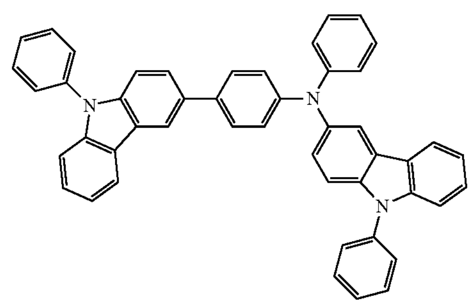

-continued
D1
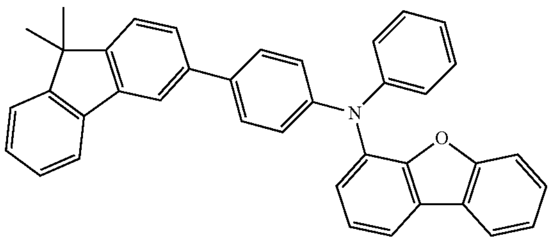
D2
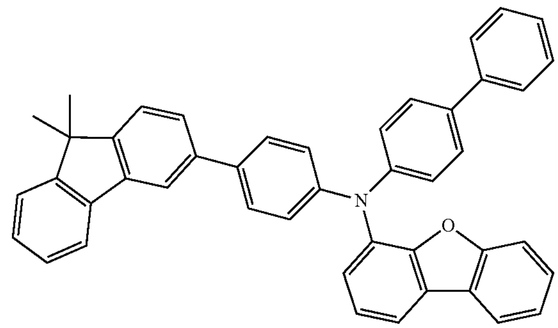
D3
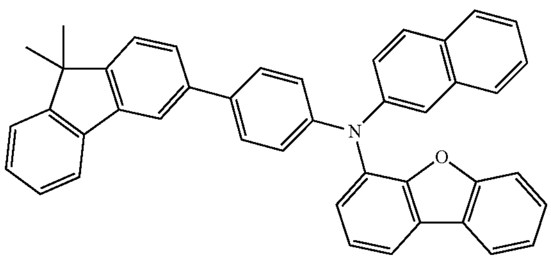
D4
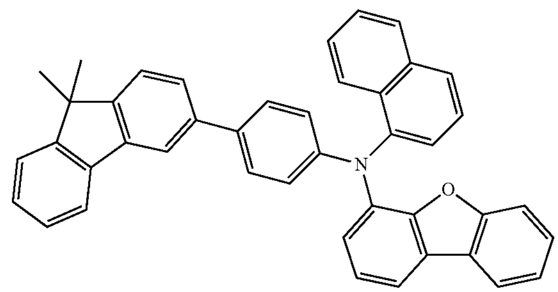
D5
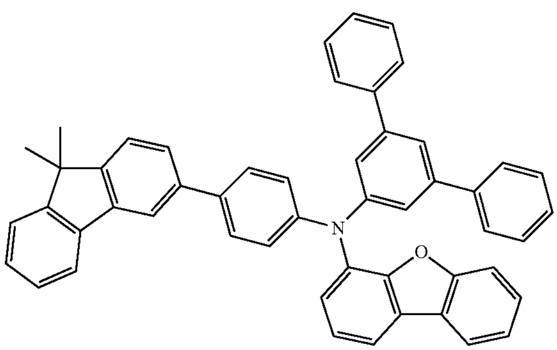
D6
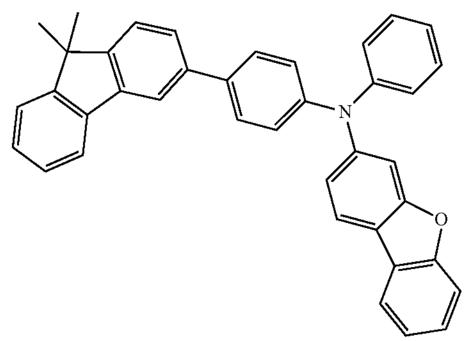
D7
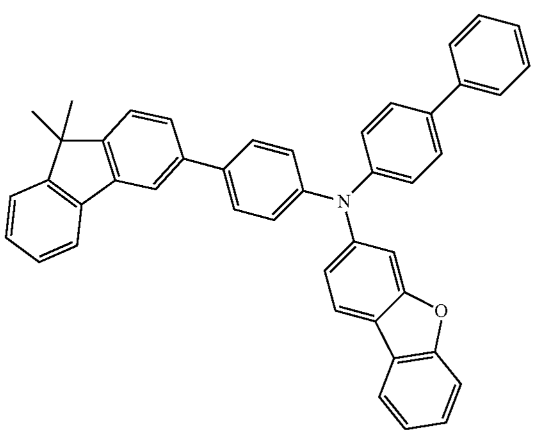
D8
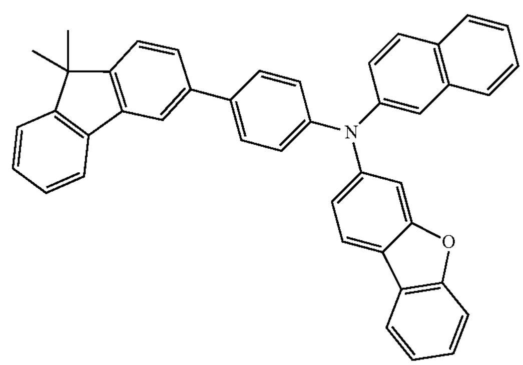

-continued
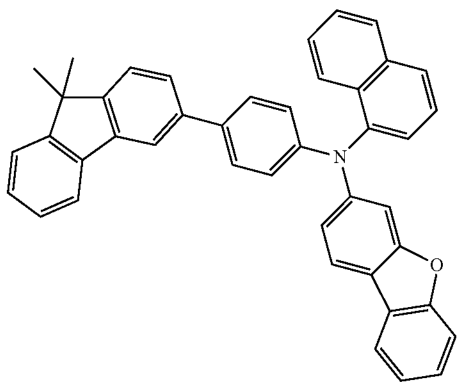
D9
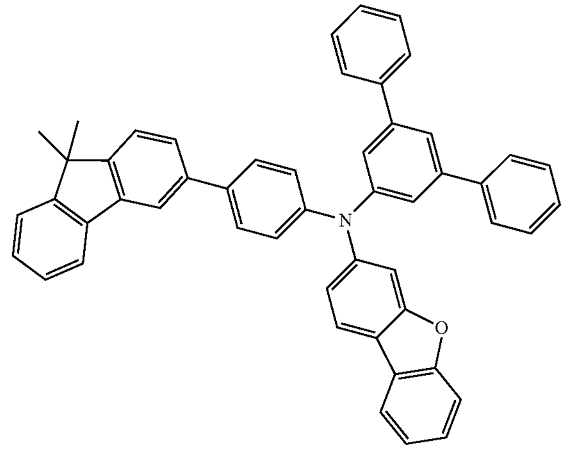
D10
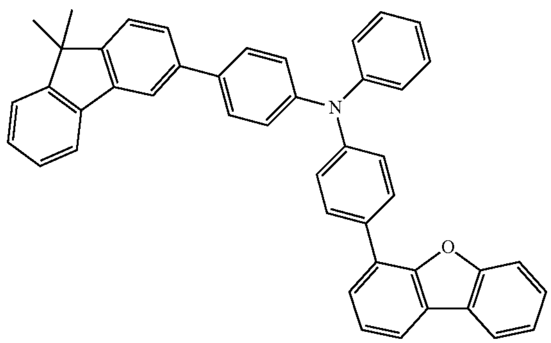
D11
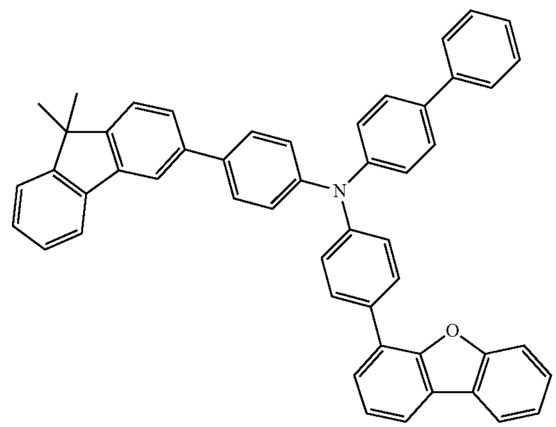
D12
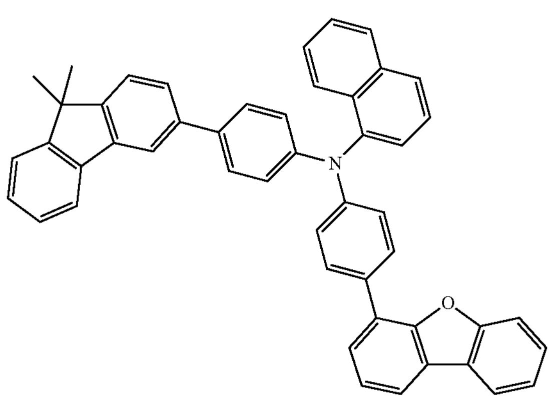
D13
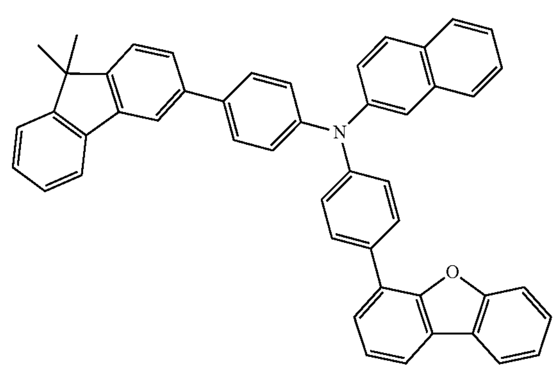
D14

-continued
D15
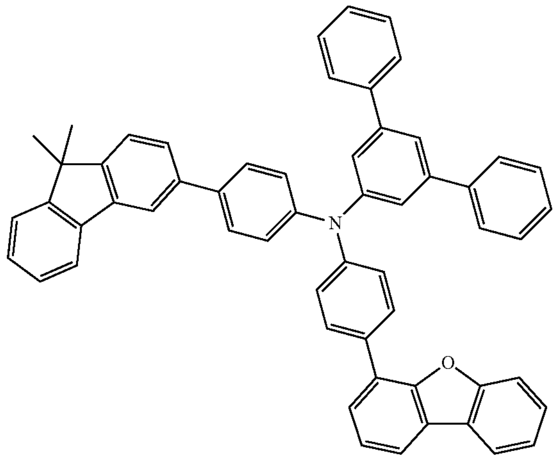
D16
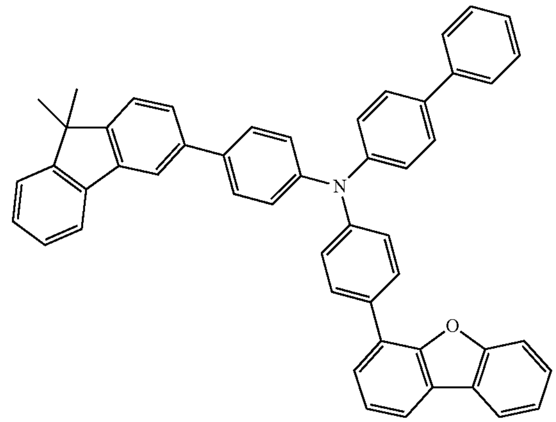
D17
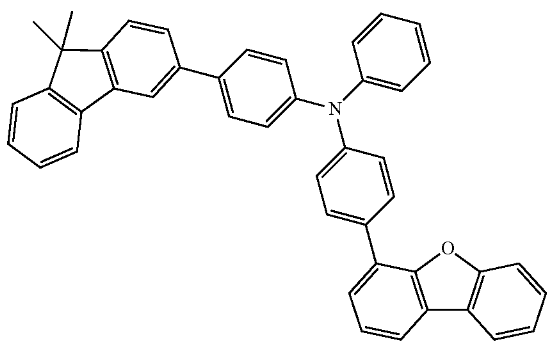
D18
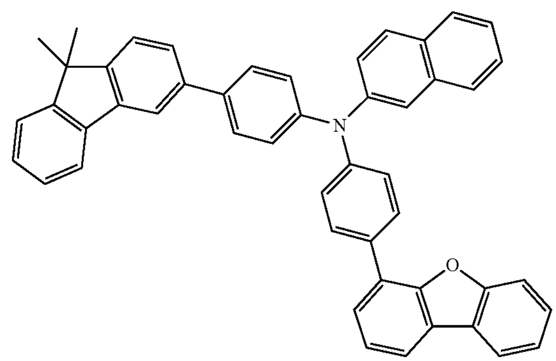
D19
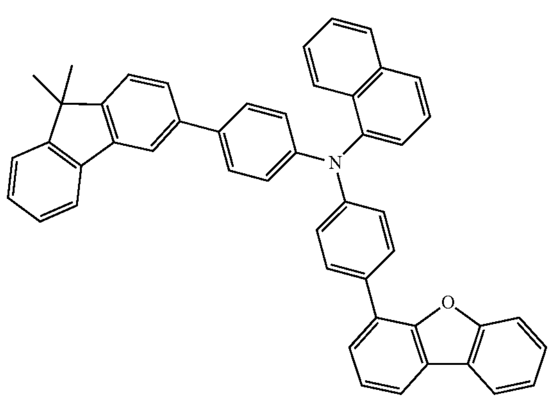
D20
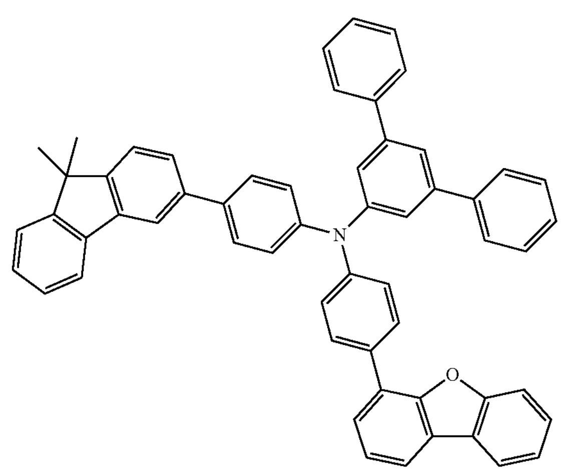

-continued
D21
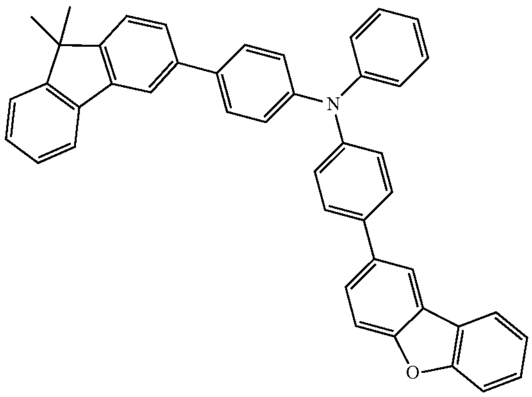
D22
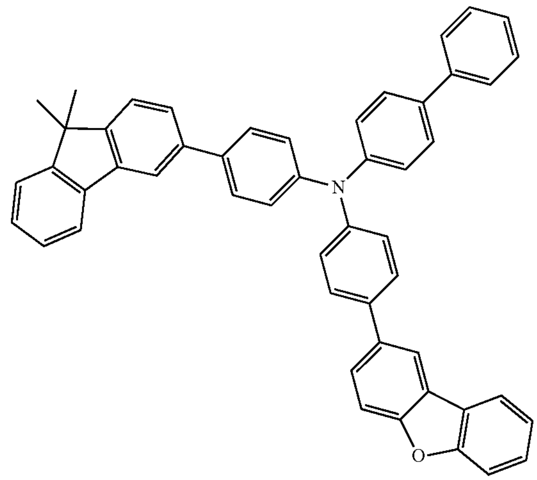
D23
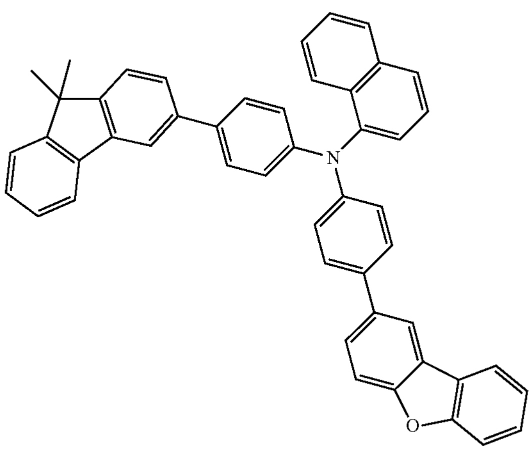
D24
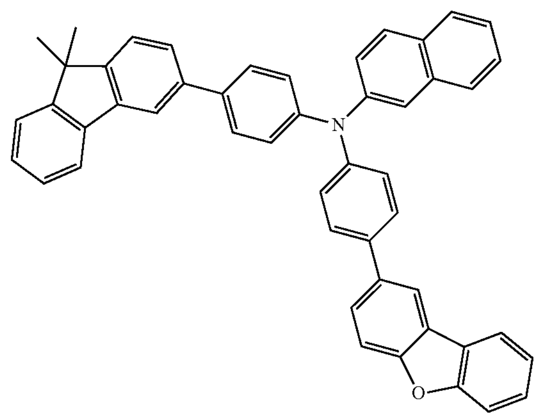
D25
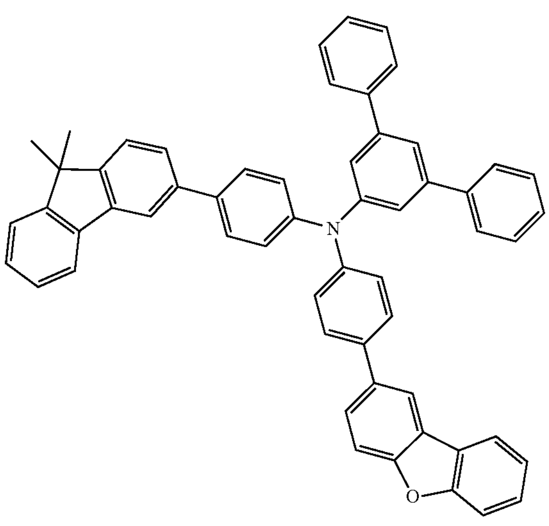
D26
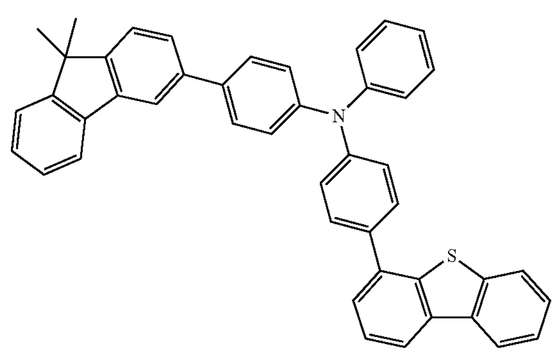

-continued
D27
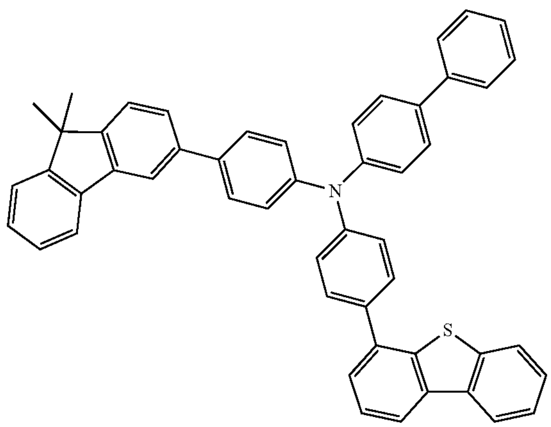
D28
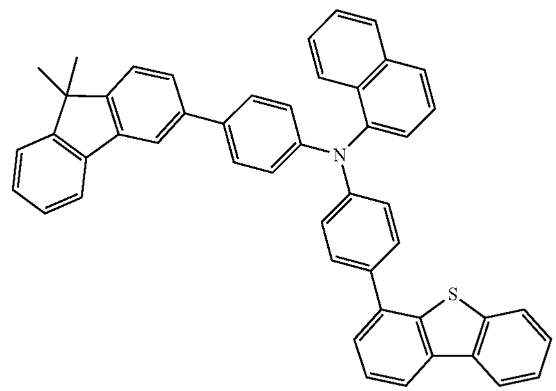
D29
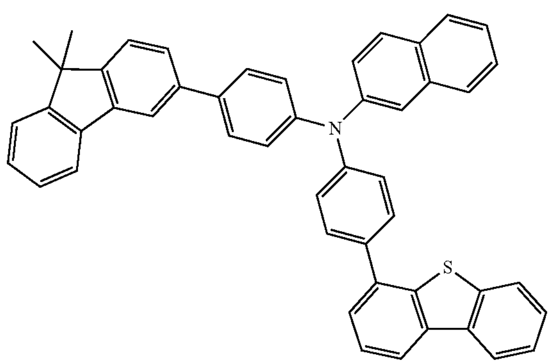
D30
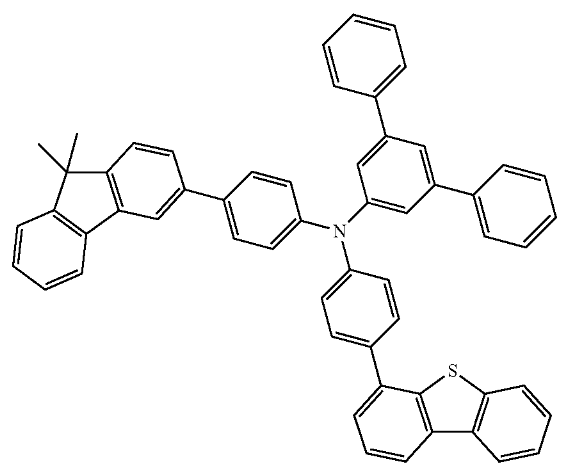
D31
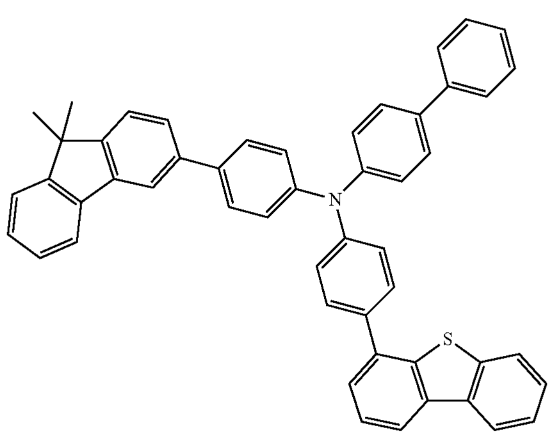
D32
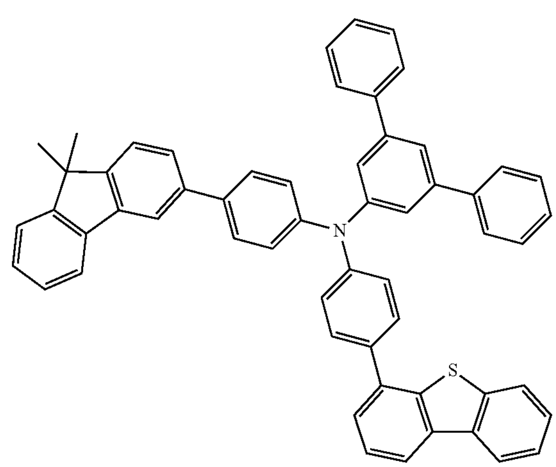

-continued
D33
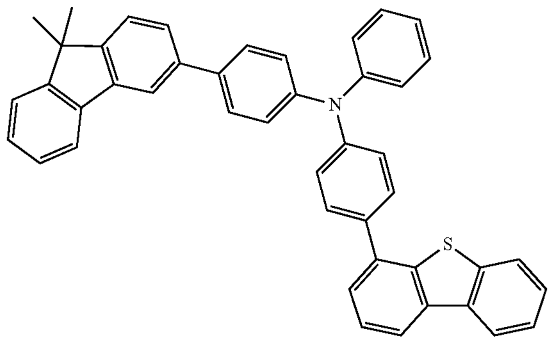
D34
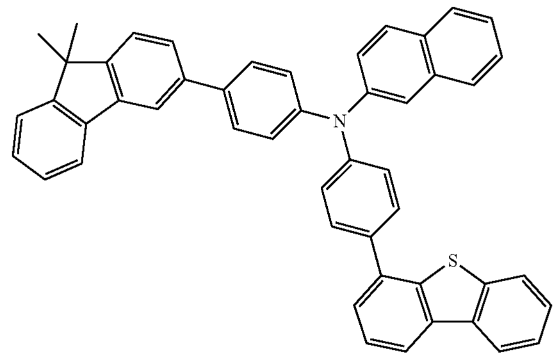
D35
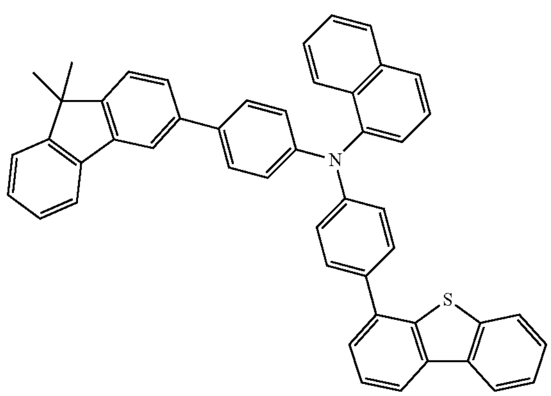
D36
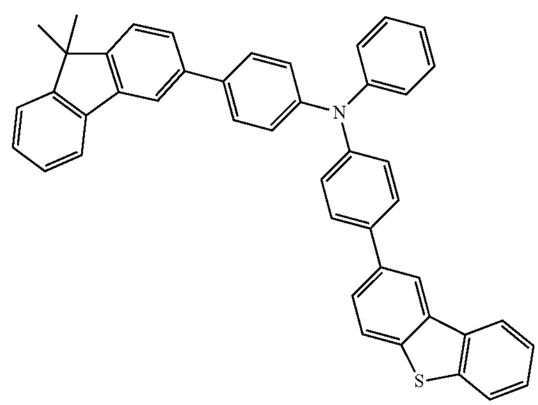
D37
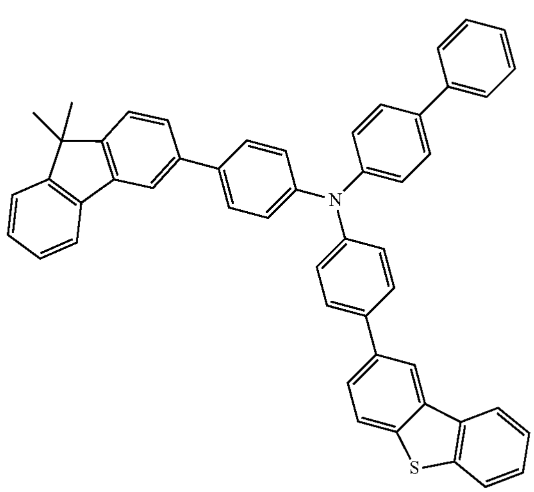
D38
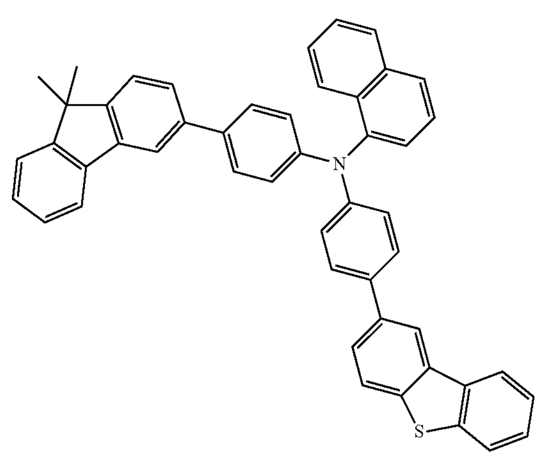

-continued
D39
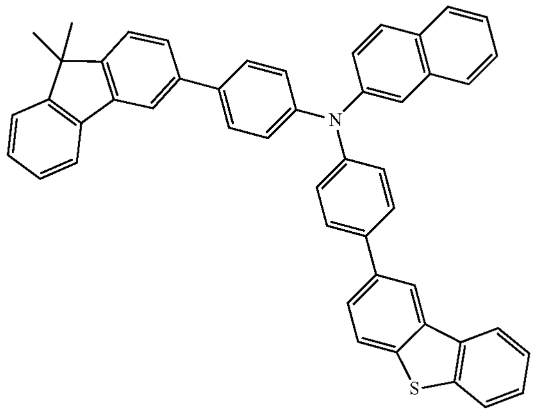
D40
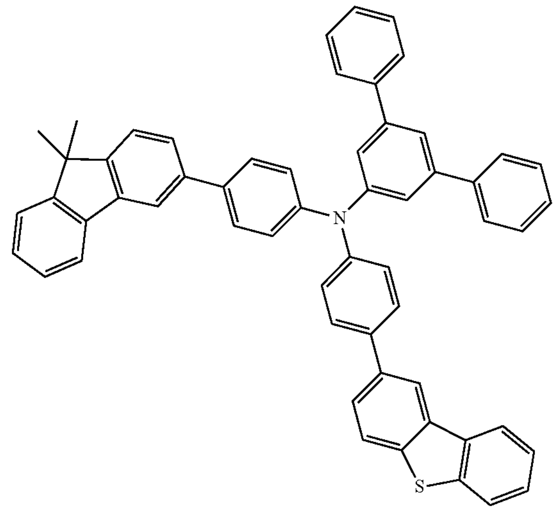
D41
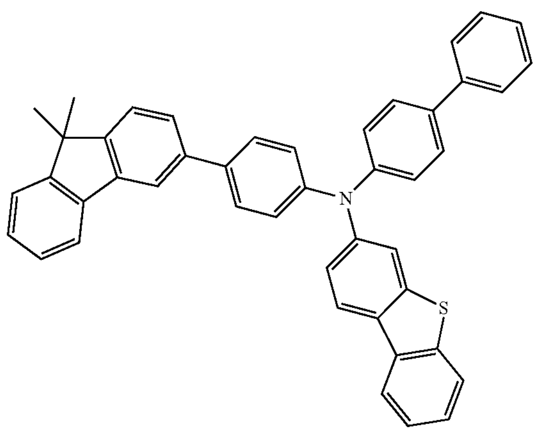
D42
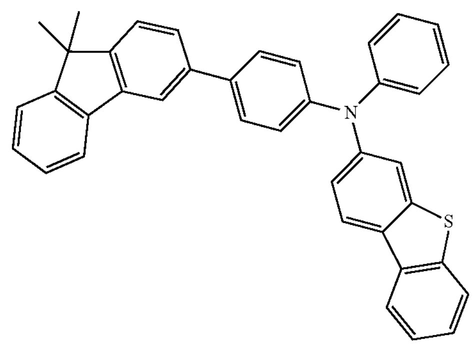
D43
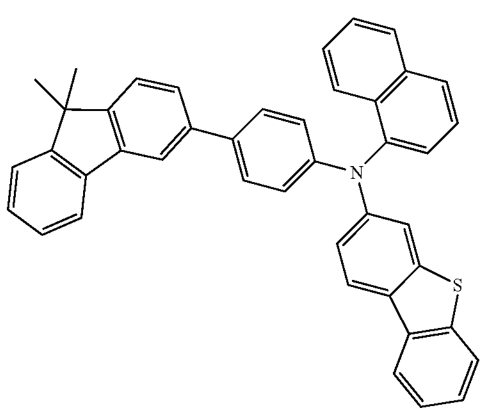
D44
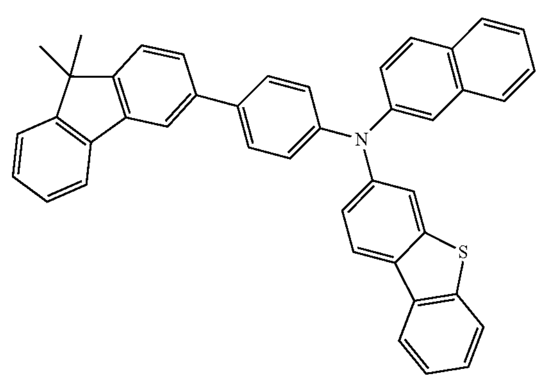

-continued
D45
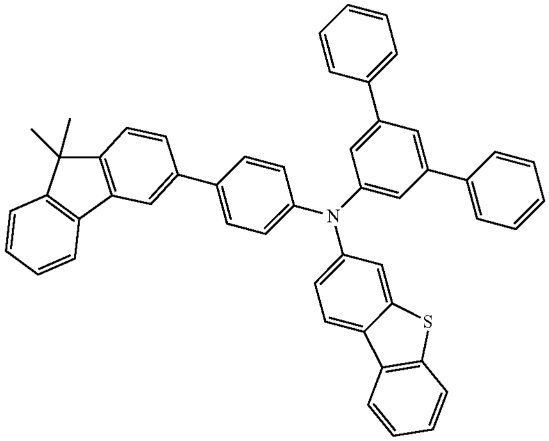
D46
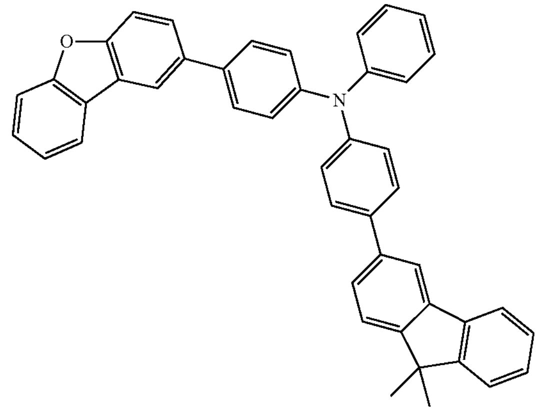
D47
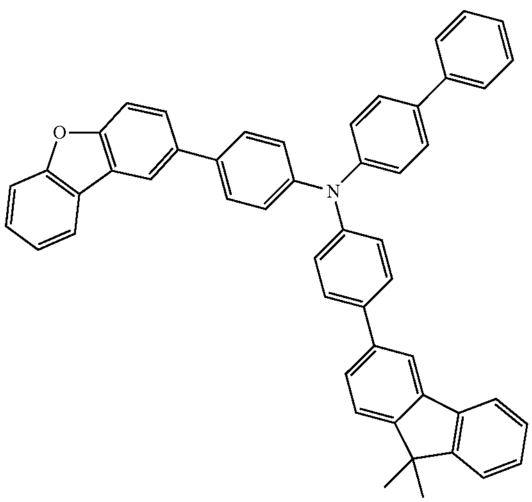
D48
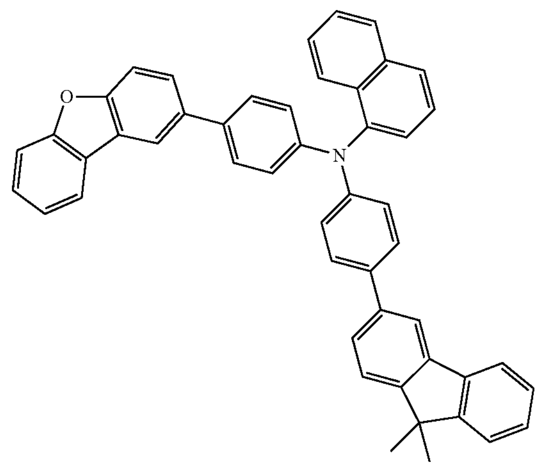
D49
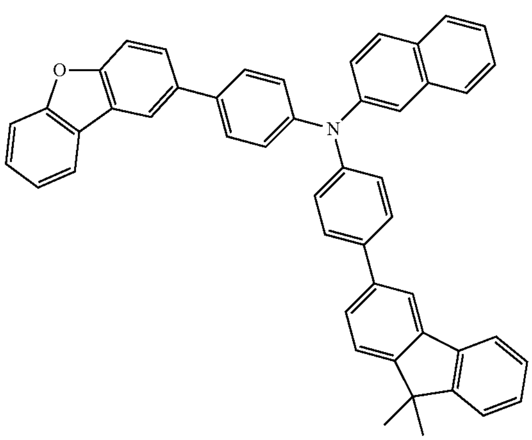
D50
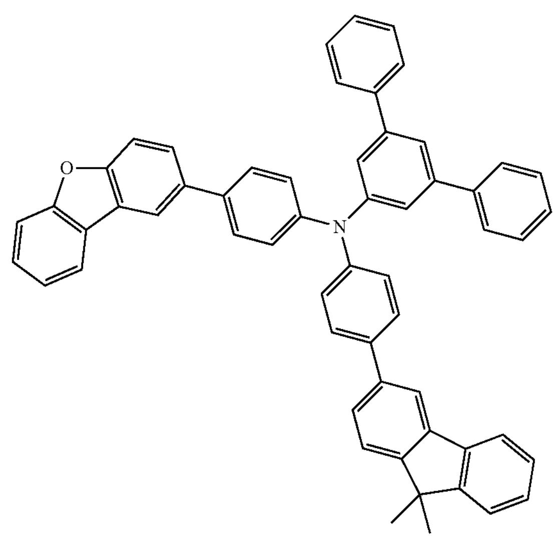

-continued
D51
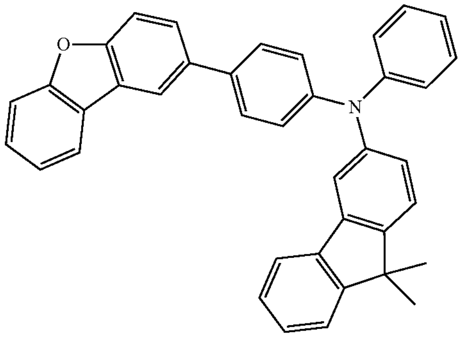
D52
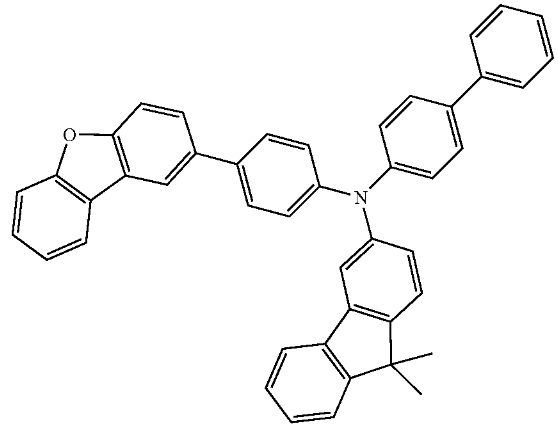
D53
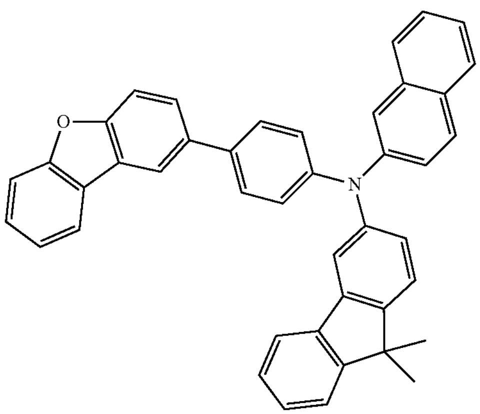
D54
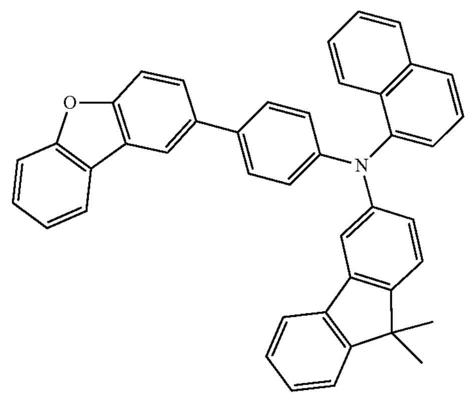
D55
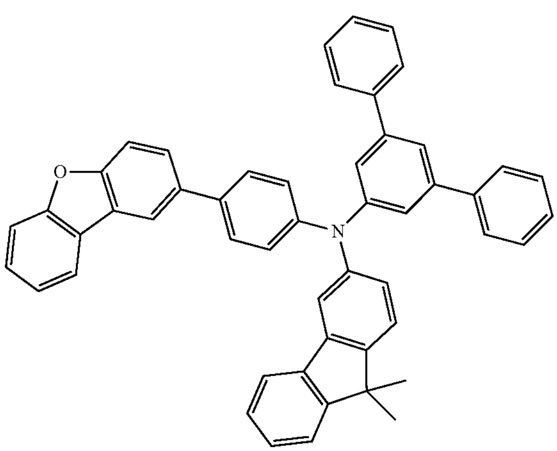
D56
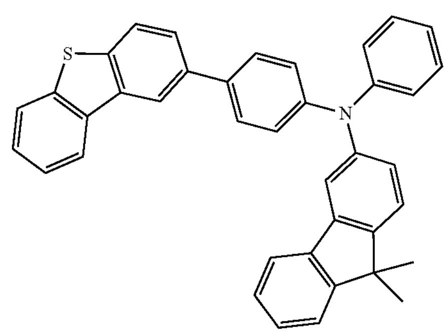

-continued
D57
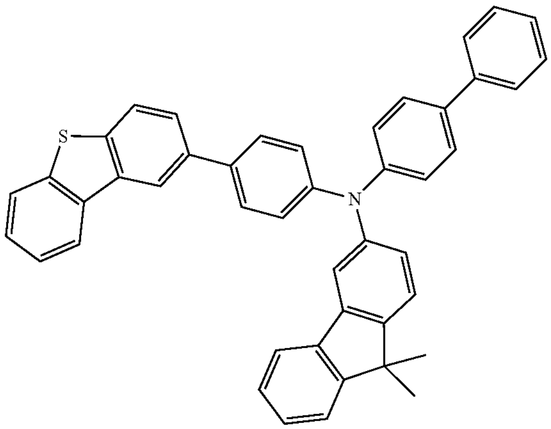
D58
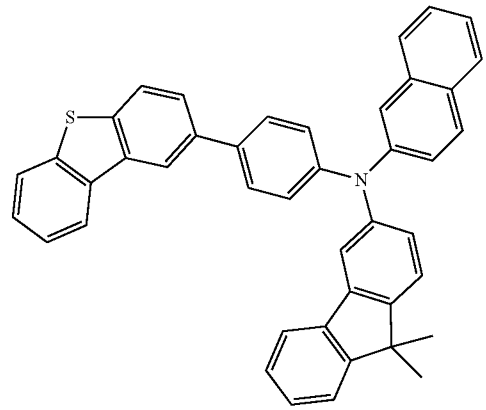
D59
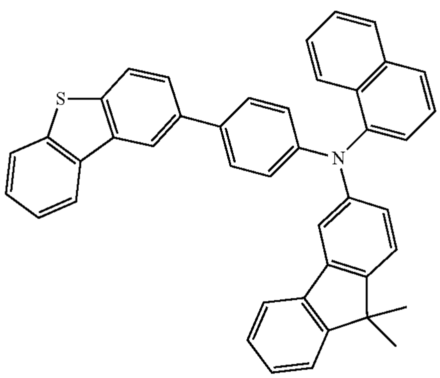
D60
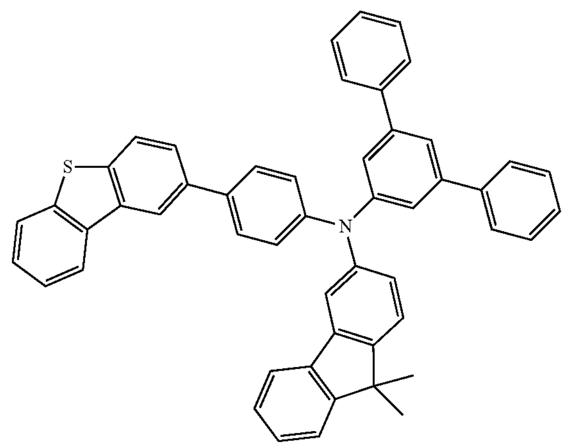
D61
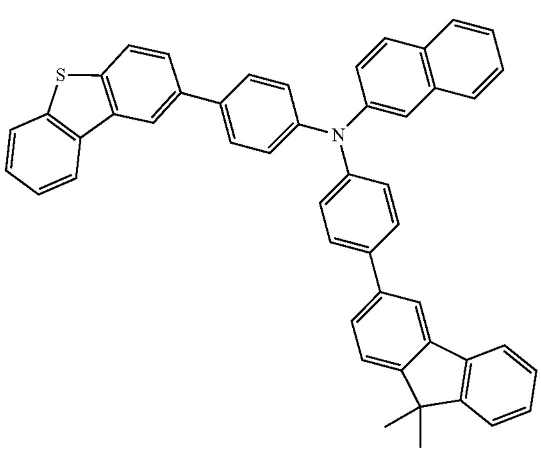
D62
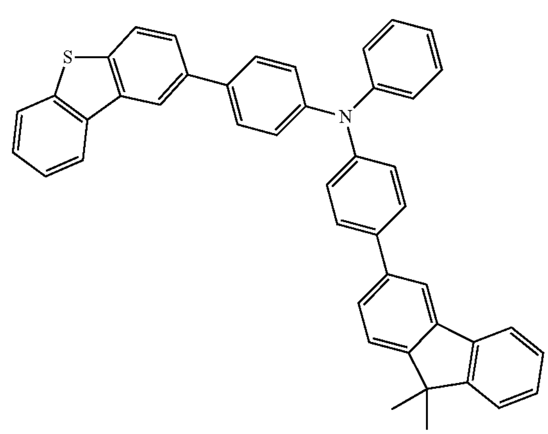

-continued

D63

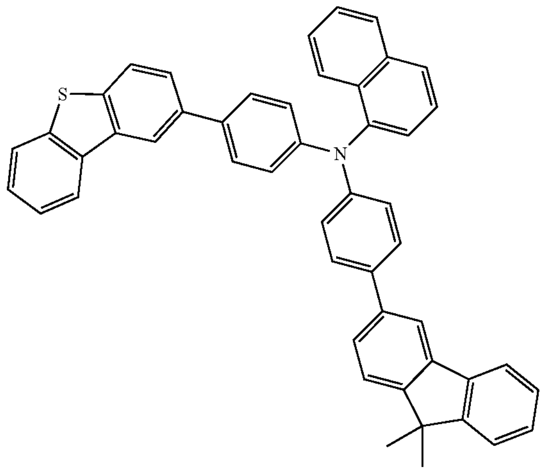

D64

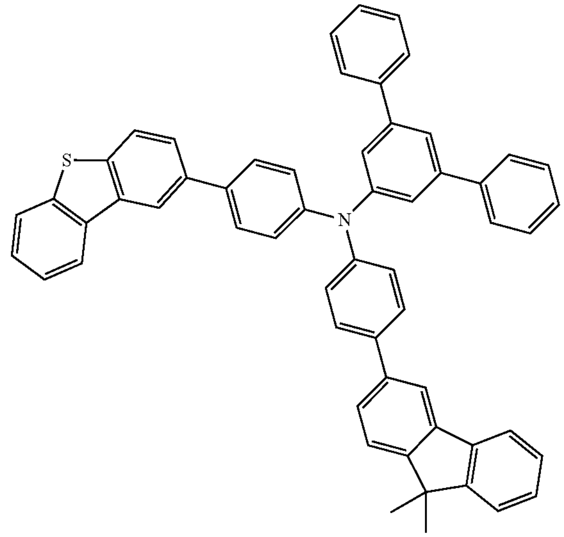

D65

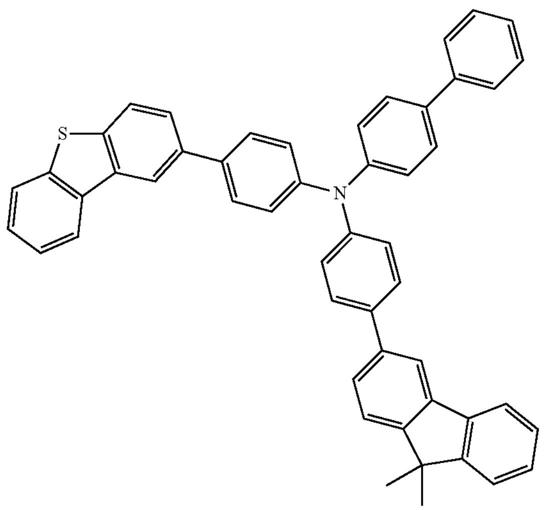

In an organic light-emitting device not including the second compound but including the first compound, hole injection into an emission layer may be difficult (e.g., insufficient), and electrons may leak out from the emission layer to a hole transport layer. As current and voltage increase, the efficiency of the organic light-emitting device may substantially decrease.

However, when an organic light-emitting device includes both the first compound and the second compound, for example, when an emission layer includes the first compound, and a fluorescent assistant layer (described in more detail below) includes the second compound, leakage of electrons from an emission layer to a hole transport layer may be effectively prevented or substantially reduced. Furthermore, holes may be effectively (or suitably) injected into the emission layer, and excitons thus generated in the emission layer may contribute to emission, thereby obtaining an organic light-emitting device having high efficiency and long lifespan.

The organic layer 150 may further include a hole transport region between the first electrode 110 and the emission layer. The organic layer 150 may further include an electron transport region between the emission layer and the second electrode 190.

The hole transport region may have a single-layer structure, or a multi-layer structure including two or more layers. For example, the hole transport region may include a single material or 2 or more different materials.

The hole transport region may include at least one selected from a hole injection layer (HIL), a hole transport layer (HTL), a buffer layer, an electron blocking layer (EBL), and a fluorescent assistant layer (FAL). The electron transport region may include at least one selected from a hole blocking layer (HBL), an electron transport layer (ETL), and an electron injection layer (EIL), but embodiments are not limited thereto.

The hole transport region may have a structure of hole injection layer/hole transport layer, a structure of hole injection layer/hole transport layer/fluorescent assistant layer, a structure of hole injection layer/hole transport layer/buffer layer/fluorescent assistant layer, a structure of hole injection layer/fluorescent assistant layer, a structure of hole injection layer/buffer layer/fluorescent assistant layer, a structure of hole transport layer/fluorescent assistant layer, and a structure of hole transport layer/buffer layer/fluorescent assistant layer, wherein the layers of each structure are sequentially stacked from the first electrode 110 in this stated order, but embodiments are not limited thereto.

In some embodiments, the hole transport region may include a hole transport layer and a fluorescent assistant layer, and the fluorescent assistant layer may be disposed (e.g., positioned) between the hole transport layer and an emission layer.

When the hole transport region includes a hole injection layer, the hole injection layer may be formed over (e.g., on) the first electrode 110 by using one or more suitable methods, such as vacuum deposition, spin coating, casting, a Langmuir-Blodgett (LB) method, ink-jet printing, laser printing, and/or laser-induced thermal imaging (LITI). Methods of forming the hole transport layer, fluorescent assistant layer, and buffer layer may be understood by referring to the method of forming the hole injection layer.

When the hole injection layer is formed by vacuum deposition, for example, the vacuum deposition may be performed at a temperature of about 100° C. to about 500° C., at a vacuum degree of about $10^{-8}$ Torr to about $10^{-3}$ Torr, and at a vacuum deposition rate in a range of about 0.01 Angstroms per second (Å/sec) to about 100 Å/sec, depending on the compound for forming the hole injection layer, and the structure of the hole injection layer to be formed.

When a hole injection layer is formed by spin coating, for example, the spin coating may be performed at a coating rate of about 2,000 revolutions per minute (rpm) to about 5,000 rpm, and at a temperature of about 80° C. to 200° C., by taking into account the compound for forming the hole injection layer to be deposited, and the structure of the hole injection layer to be formed.

In some embodiments, the hole transport region may include the second compound.

In some embodiments, the hole transport region may include a hole transport layer and a fluorescent assistant layer, and the fluorescent assistant layer may include the second compound.

The hole transport region may further include, in addition to the second compound, at least one selected from m-MTDATA, TDATA, 2-TNATA, NPB, β-NPB, TPD, a spiro-TPD, a spiro-NPB, methylated NPB, TAPC, HMTPD, DNTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), (polyaniline)/poly(4-styrenesulfonate) (PANI/PSS), and compounds represented by Formula 201 and 202:

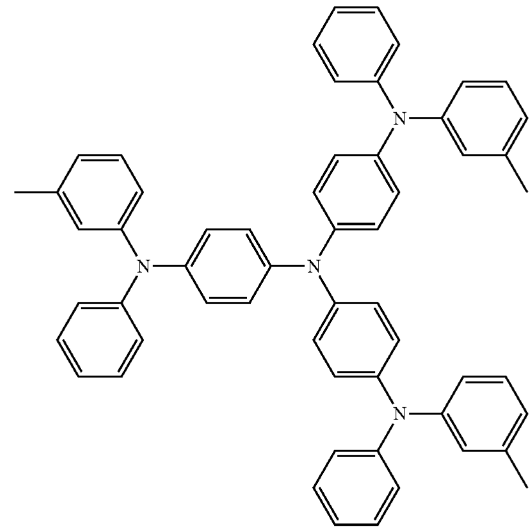

m-MTDATA

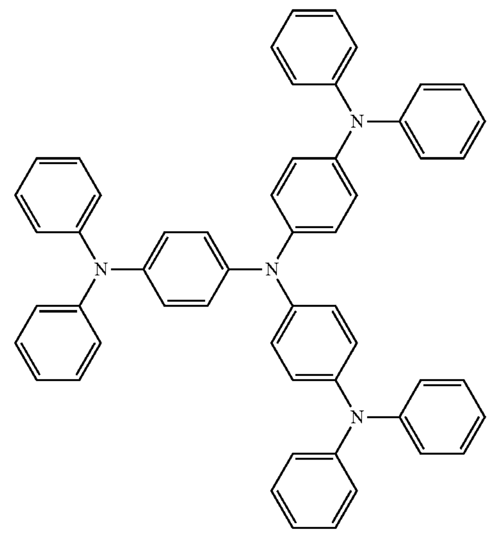

TDATA

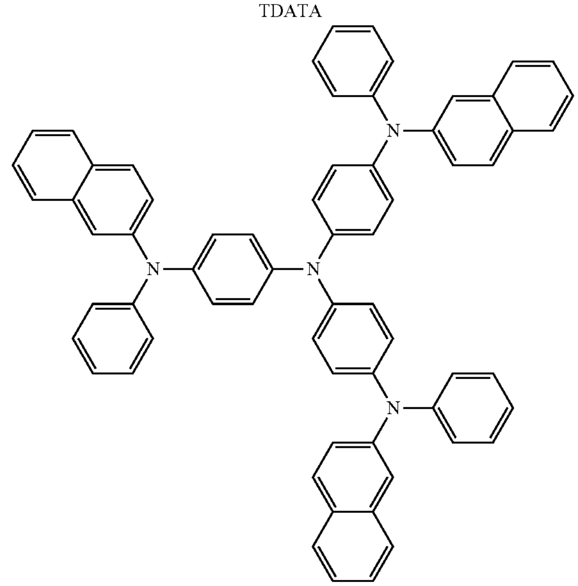

2-TNATA

-continued
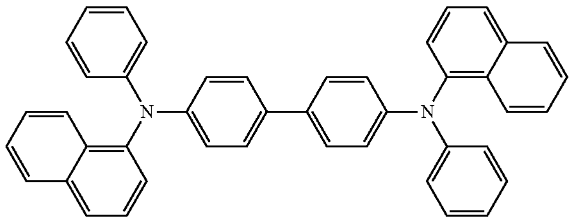
NPB
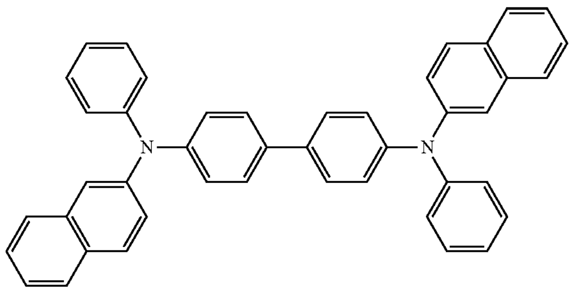
β-NPB
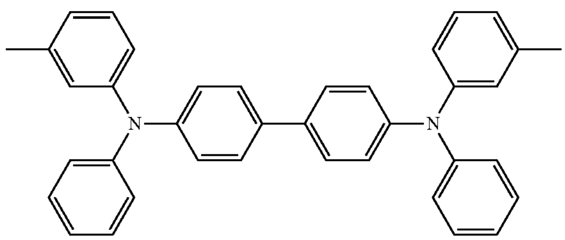
TPD
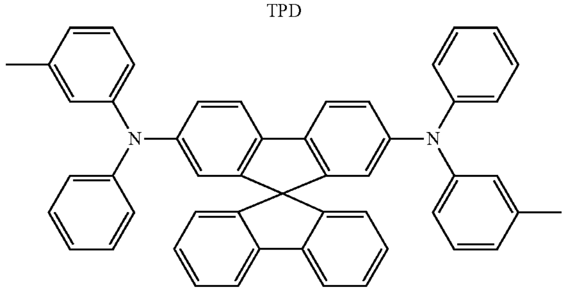
Spiro-TPD
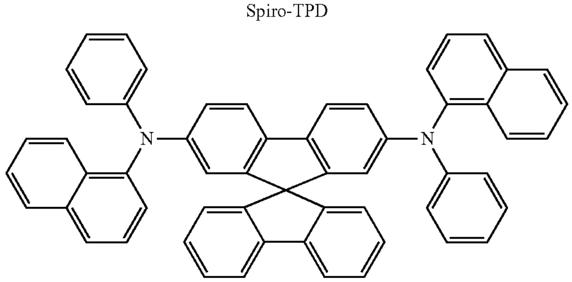
Spiro-NPD
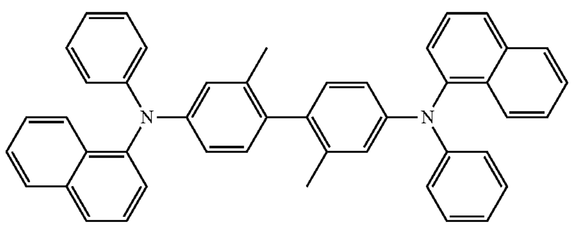
methylated NPD
-continued
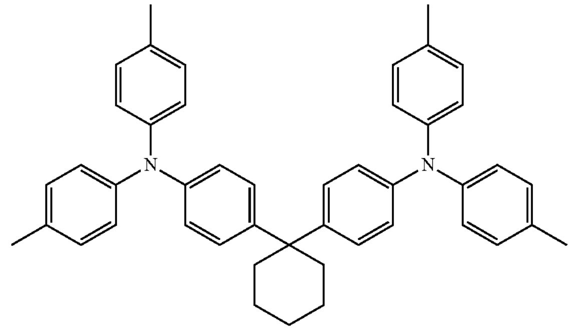
TAPC
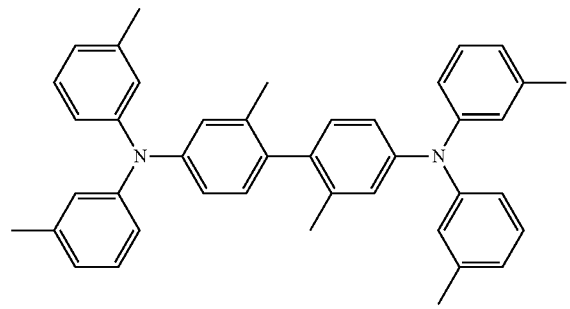
HMTPD
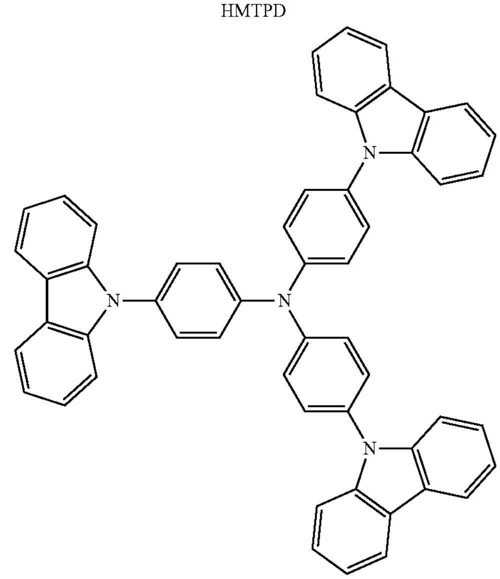
TCTA
Formula 201
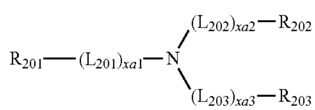
Formula 202
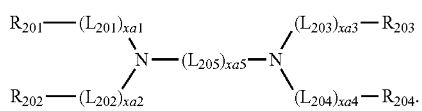
In Formulae 201 and 202,
descriptions of $L_{201}$ to $L_{205}$ may be each independently the same as the description provided herein in connection with $L_1$,
xa1 to xa4 may be each independently selected from 0, 1, 2, and 3,
xa5 may be selected from 1, 2, 3, 4, and 5, and $R_{201}$ to $R_{204}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formulae 201 and 202, $L_{201}$ to $L_{205}$ may be each independently selected from the group consisting of:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group, xa1 to xa4 may be each independently selected from 0, 1, and 2, xa5 may be selected from 1, 2, and 3, and $R_{201}$ to $R_{204}$ may be each independently selected from the group consisting of:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but embodiments of the present disclosure are not limited thereto.

The compound represented by Formula 201 may be represented by Formula 201A:

Formula 201A

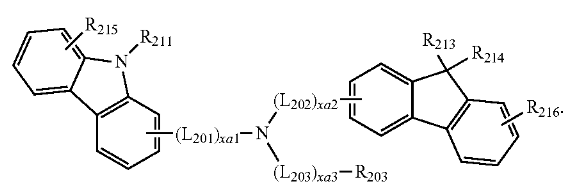

In some embodiments, the compound represented by Formula 201 may be represented by Formula 201A-1, but embodiments are not limited thereto:

Formula 201A-1

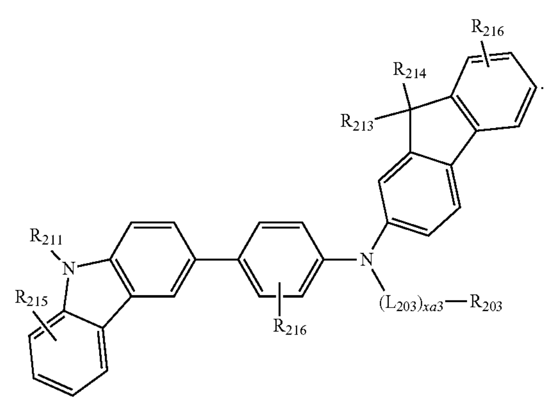

In some embodiments, the compound represented by Formula 202 may be represented by Formula 202A, but embodiments are not limited thereto:

Formula 202A

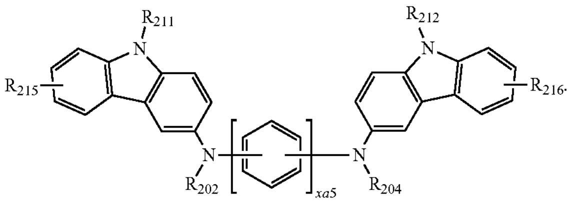

In Formulae 201A, 201A-1, and 202A, $L_{201}$ to $L_{203}$, xa1 to xa3, xa5, and $R_{202}$ to $R_{204}$ may be the same as described herein; descriptions of $R_{211}$ and $R_{212}$ may be each independently the same as the description provided herein in connection with $R_{203}$; and $R_{213}$ to $R_{216}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group.

In some embodiments, in Formulae 201A, 201A-1, and 202A, $L_{201}$ to $L_{203}$ may be each independently selected from the group consisting of:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, xa1 to xa3 may be each independently selected from 0 and 1, $R_{203}$, $R_{204}$, $R_{211}$, and $R_{212}$ may be each independently selected from the group consisting of:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, $R_{213}$ and $R_{214}$ may be each independently selected from the group consisting of:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, $R_{215}$ and $R_{216}$ may be each independently selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and xa5 may be selected from 1 and 2.

In Formulae 201A and 201A-1, $R_{213}$ and $R_{214}$ may be bound (e.g., linked) to each other to form a saturated ring or an unsaturated ring.

The compound represented by Formula 201 and the compound represented by Formula 202 may each independently include any of Compounds HT1 to HT20, but embodiments are not limited thereto:

HT1

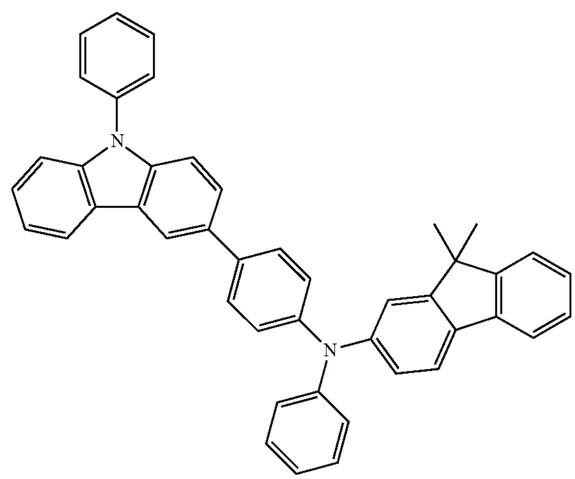

HT2

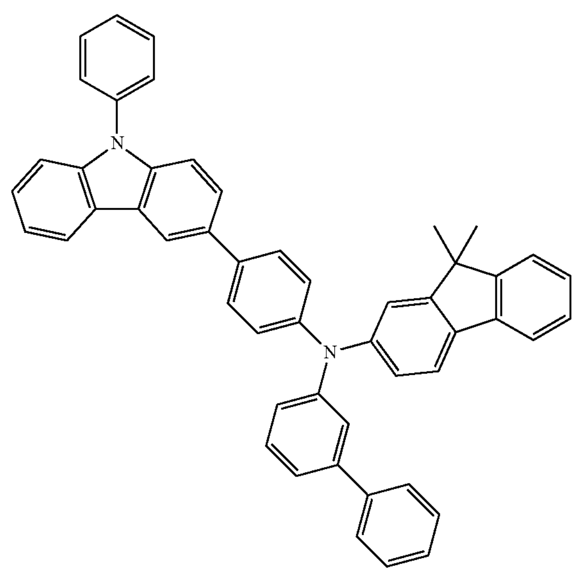

-continued
HT3
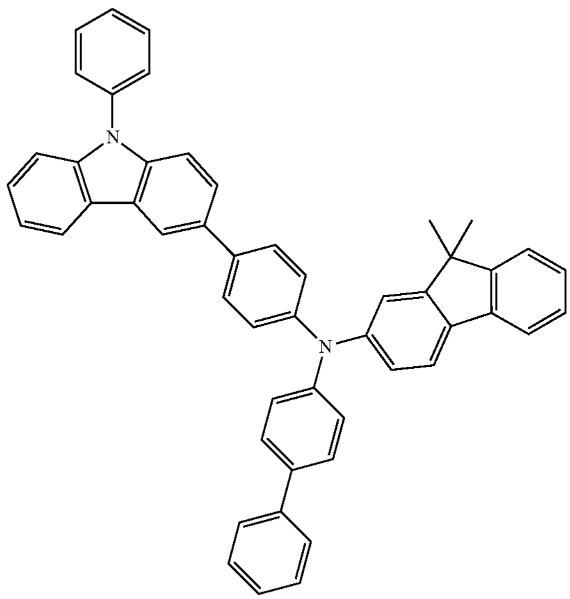
HT4
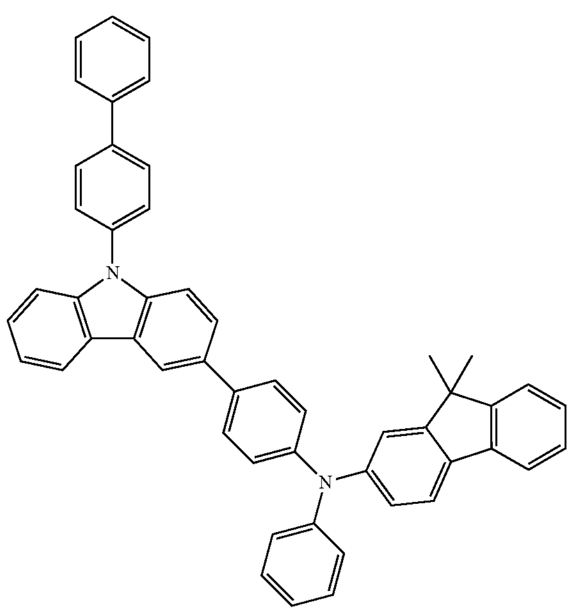
-continued
HT5
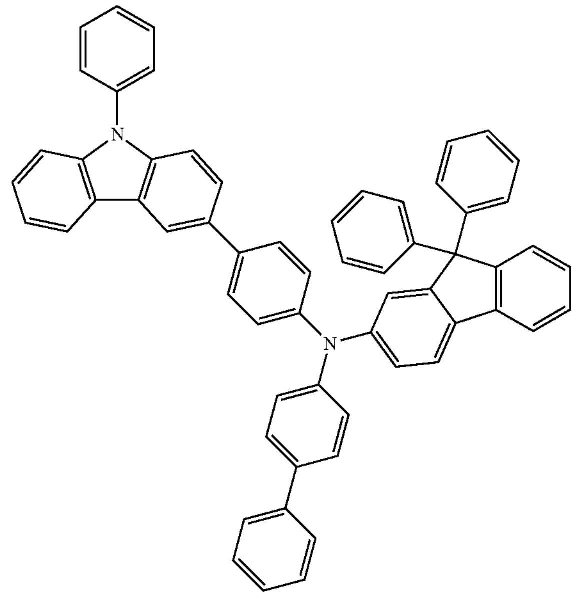
HT6
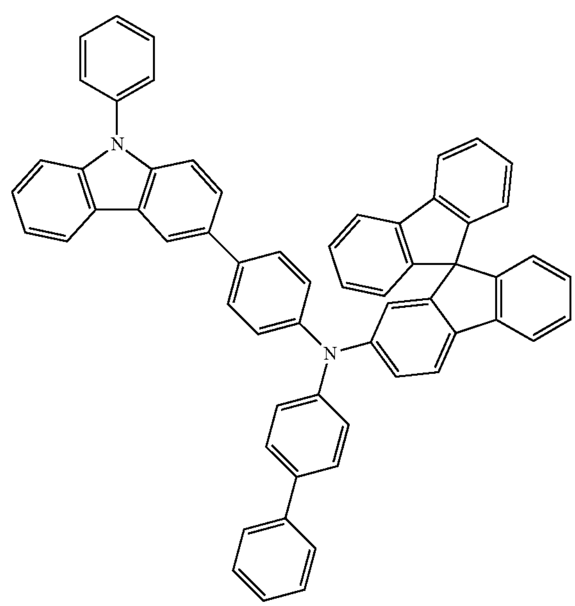

-continued
HT7
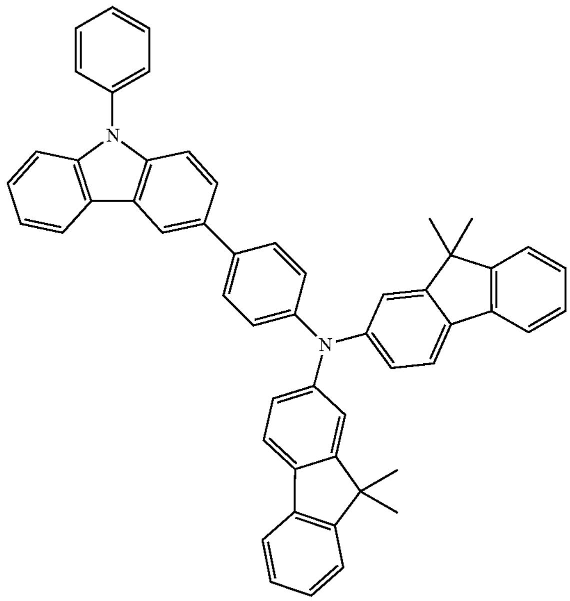
HT8
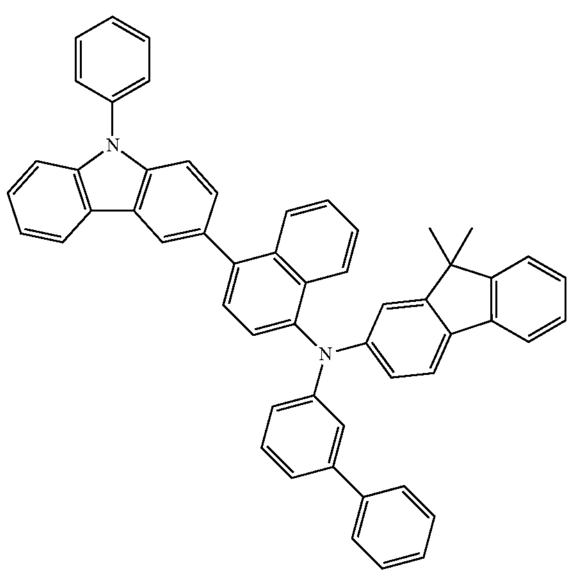
-continued
HT9
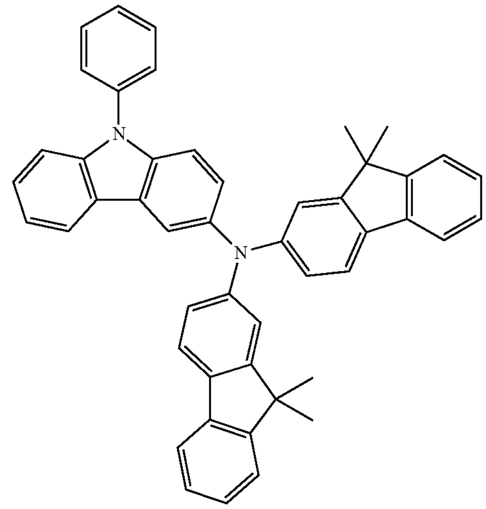
HT10
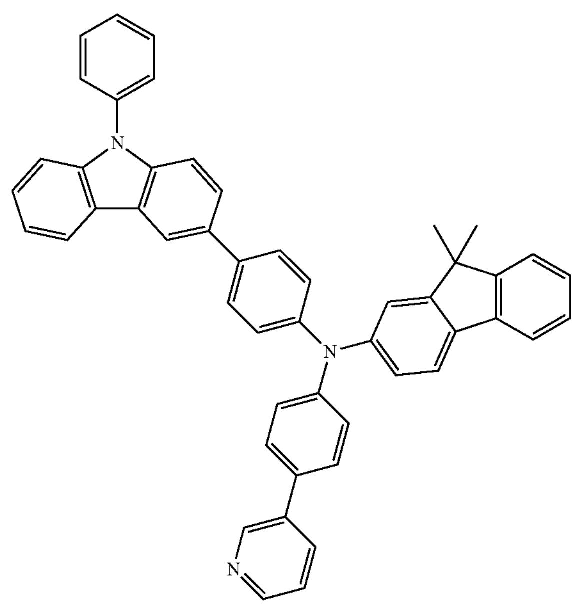

-continued
HT11
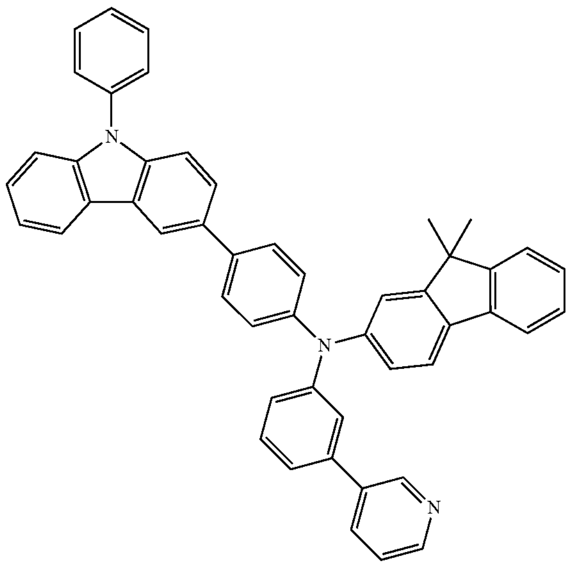
HT12
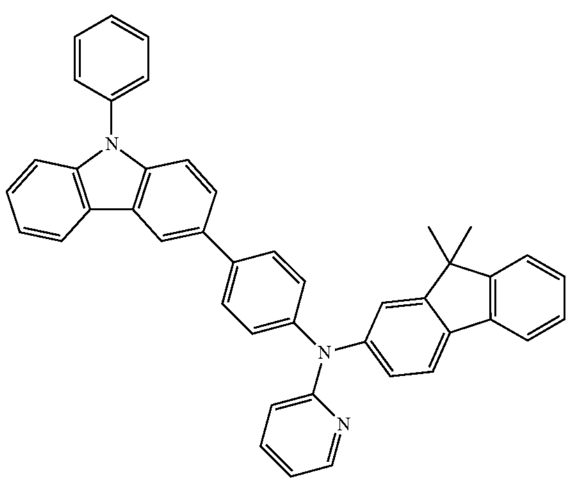
HT13
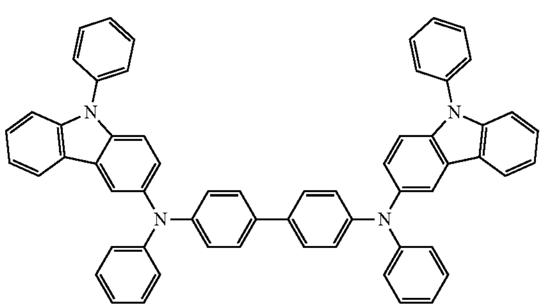
-continued
HT14
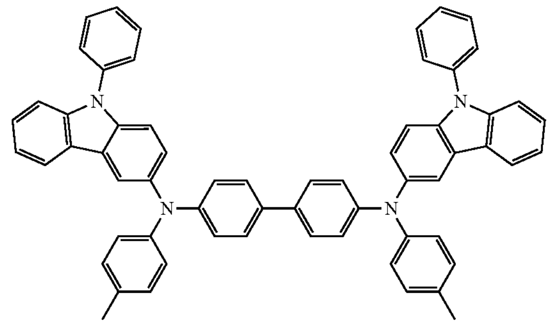 [SMILES: c1ccc(N(c2ccc(-c3ccc(N(c4ccccc4)c4ccc5c(c4)c4ccccc4n5-c4ccccc4)cc3)cc2)c2ccc3c(c2)c2ccccc2n3-c2ccccc2)cc1 ; "HT13"]
HT15
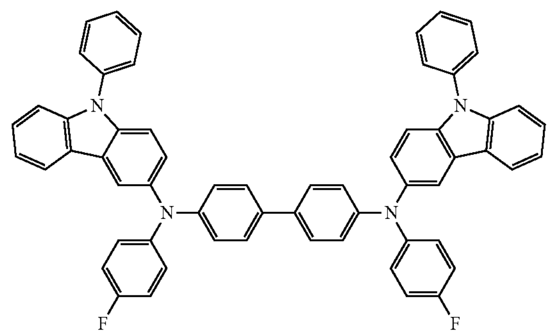
HT16
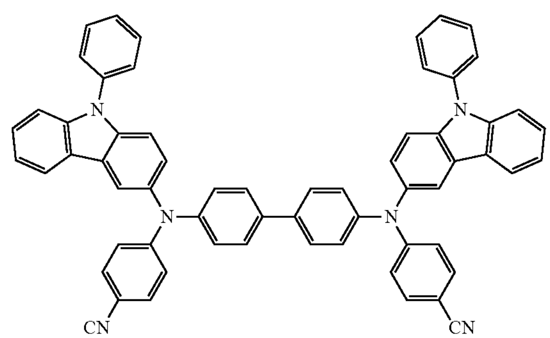
HT17
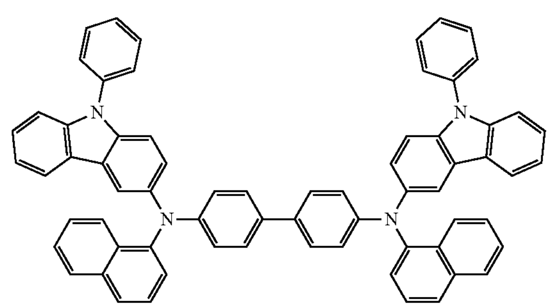

-continued

HT18

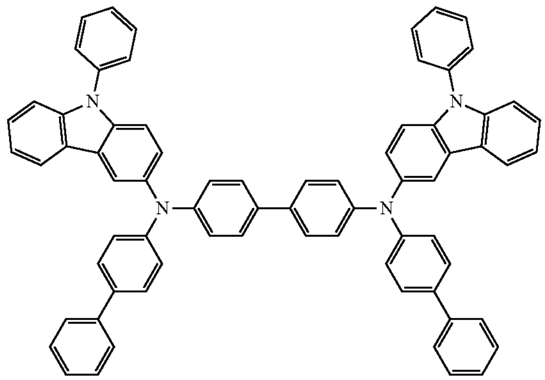

HT19

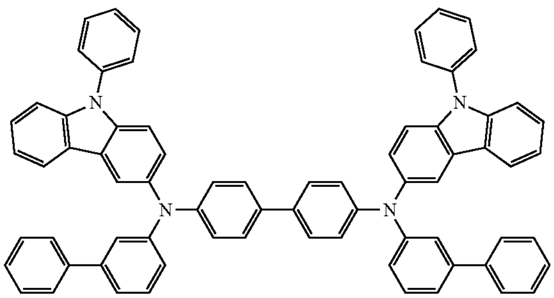

HT20

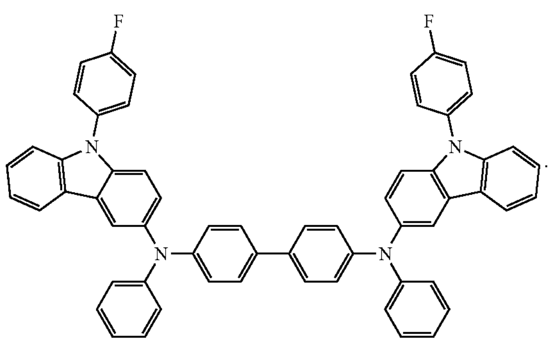

The thickness of the hole transport region may be in a range of about 100 Å to about 10,000 Å, and in some embodiments, about 100 Å to about 1,000 Å. When the hole transport region includes a hole injection layer and a hole transport layer, the thickness of the hole injection layer may be in a range of about 100 Å to about 10,000 Å, and in some embodiments, about 100 Å to about 1,000 Å, and the thickness of the hole transport layer may be in a range of about 50 Å to about 2,000 Å, and in some embodiments, about 100 Å to about 1,500 Å. When the thicknesses of the hole transport region, the hole injection layer, and the hole transport layer are within any of these ranges, excellent (or suitable) hole transport characteristics may be obtained without a substantial increase in driving voltage.

When the hole transport region includes the fluorescent assistant layer, the thickness of the fluorescent assistant layer may be in a range of about 10 Å to about 1,000 Å, for example, about 30 Å to about 500 Å. When the thickness of the fluorescent assistant is within any of these ranges, excellent (or suitable) hole transport characteristics may be achieved without a substantial increase in driving voltage.

The hole transport region may include a charge-generating material, in addition to the materials mentioned above, to improve conductive properties. The charge-generating material may be homogeneously or non-homogeneously dispersed throughout the hole transport region.

The charge-generating material may be, for example, a p-dopant. The p-dopant may be selected from a quinone derivative, a metal oxide, and a cyano group-containing compound, but embodiments are not limited thereto. Non-limiting examples of the p-dopant may include quinone derivatives (such as tetracyanoquinonedimethane (TCNQ) and/or Compound HT-D2); metal oxides (such as tungsten oxide and/or molybdenum oxide); and Compound HT-D1, but embodiments are not limited thereto:

Compound HT-D1

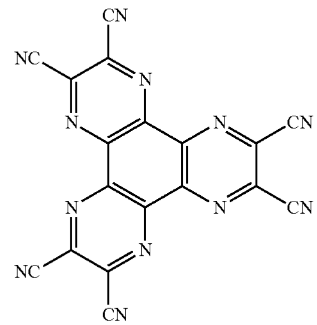

Compound HT-D2

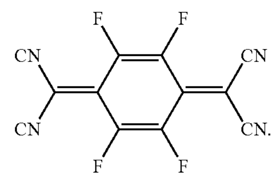

The hole transport region may further include, in addition to the hole injection layer and the hole transport layer, at least one selected from a buffer layer, a fluorescent assistant layer, and an electron blocking layer. Since the buffer layer may compensate for an optical resonance distance according to a wavelength of light emitted from the emission layer, the light-emission efficiency of the resulting organic light-emitting device may be improved. Any of the materials included in the hole transport region may be used as a material included in the buffer layer. In some embodiments, the electron blocking layer may function to prevent or reduce the injection of electrons from the electron transport region.

When the hole transport region includes the fluorescent assistant layer, the fluorescent assistant layer may directly contact the emission layer, but embodiments are not limited thereto.

An emission layer may be formed over (e.g., on) the first electrode 110 or the hole transport region by using one or more suitable methods, such as vacuum deposition, spin coating, casting, an LB method, ink-jet printing, laser printing, and/or LITI. When the emission layer is formed by vacuum deposition and/or spin coating, deposition and coating conditions for the emission layer may be determined by referring to the deposition and coating conditions for the hole injection layer.

When the organic light-emitting device 10 is a full color organic light-emitting device, the emission layer 150 may be patterned into a red emission layer, a green emission layer, and/or a blue emission layer, according to a sub-pixel. In some embodiments, the emission layer 150 may have a stacked structure of a red emission layer, a green emission layer, and a blue emission layer, or may include a red-light emission material, a green-light emission material, and a blue-light emission material, which are mixed with each other in a single layer, to emit white light.

The emission layer 150 may include a host and a dopant.

In some embodiments, the host may be the first compound.

The emission layer may further include, in addition to the first compound, at least one selected from TPBi, TBADN, ADN, CBP, CDBP, and TCP:

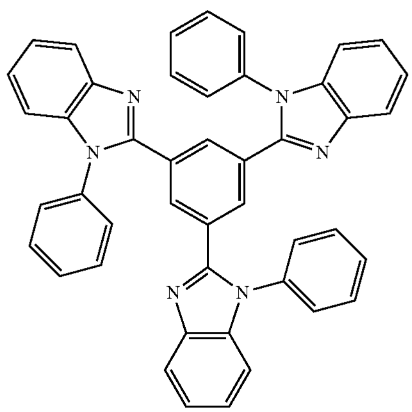

TPBi

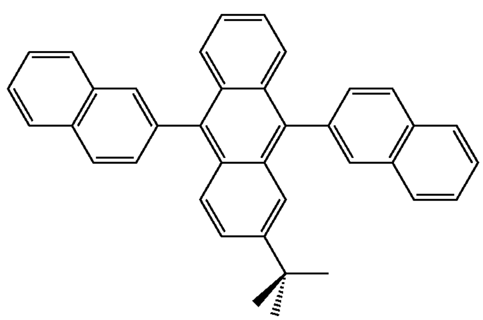

TBADN

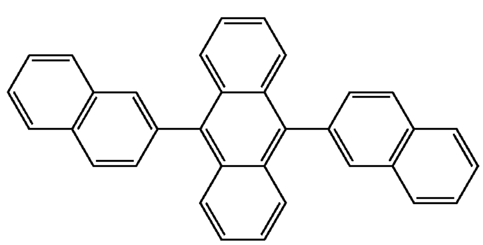

ADN

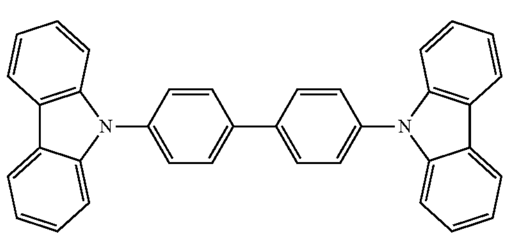

CBP

-continued

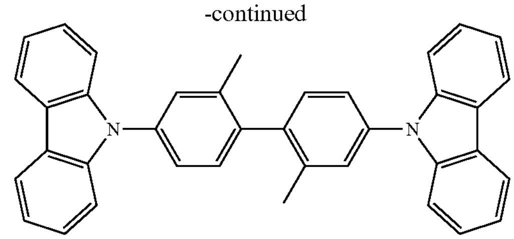

CDBP

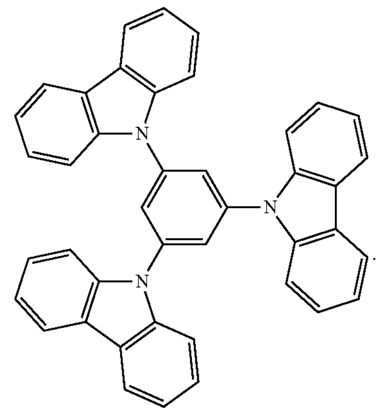

TCP

The dopant may include at least one selected from a fluorescent dopant and a phosphorescent dopant.

In some embodiments, the fluorescent dopant may include a compound represented by Formula 501:

Formula 501

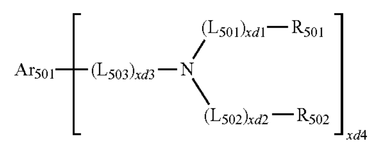

In Formula 501, $Ar_{501}$ may be selected from a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-bifluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, and —Si($Q_{501}$)($Q_{502}$)($Q_{503}$), wherein $Q_{501}$ to $Q_{503}$ may be each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group, descriptions of $L_{501}$ to $L_{503}$ may be each independently the same as the description provided herein in connection with $L_{201}$, $R_{501}$ and $R_{502}$ may be each independently selected from the group consisting of:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, xd1 to xd3 may be each independently selected from 0, 1, 2, and 3, and xd4 may be selected from 1, 2, 3, and 4.

The fluorescent dopant may include at least one selected from Compounds FD1 to FD9:

FD1

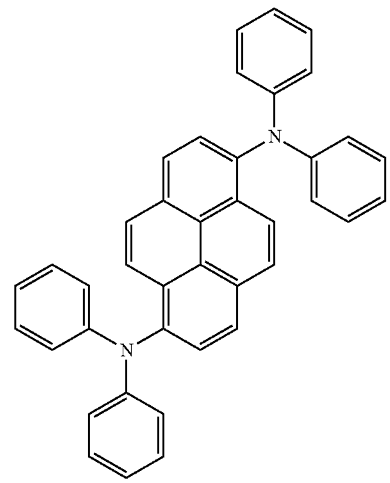

FD2

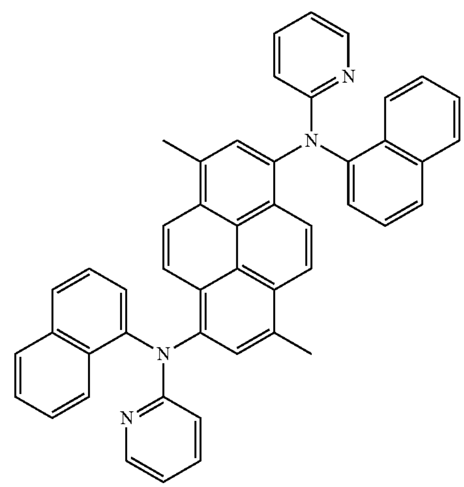

FD3

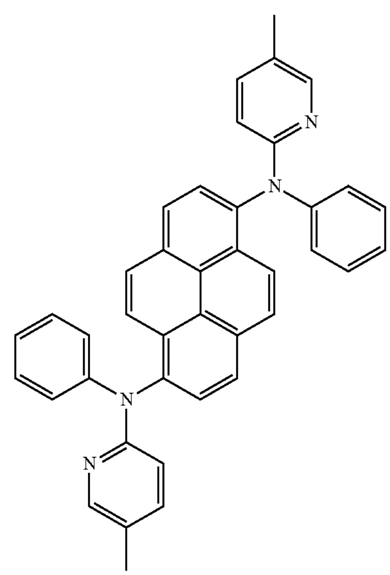

-continued

FD4

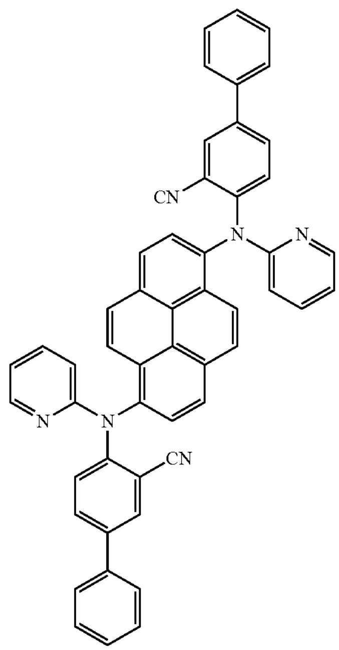

FD5

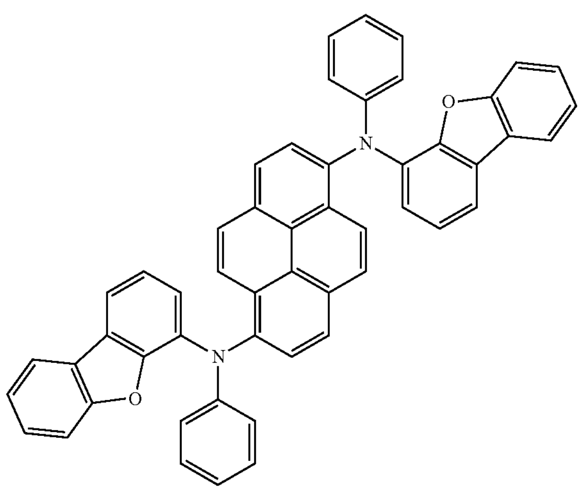

FD6

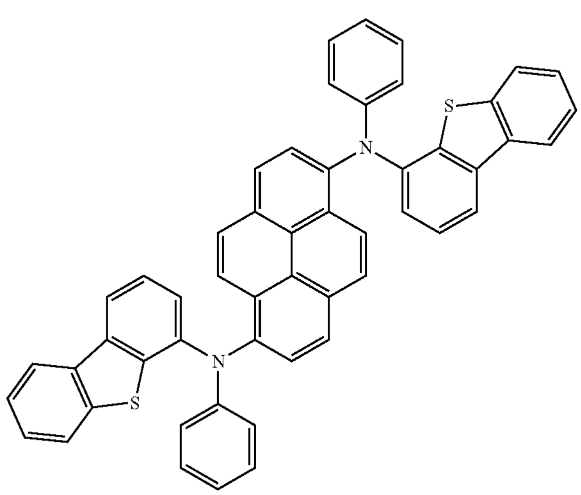

-continued

FD7

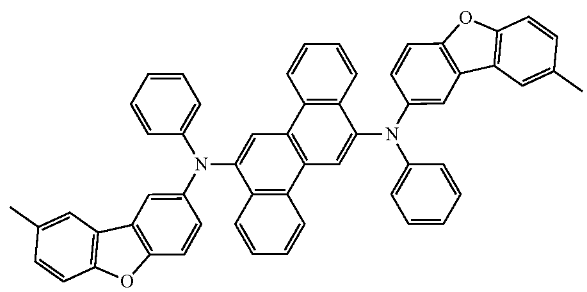

FD8

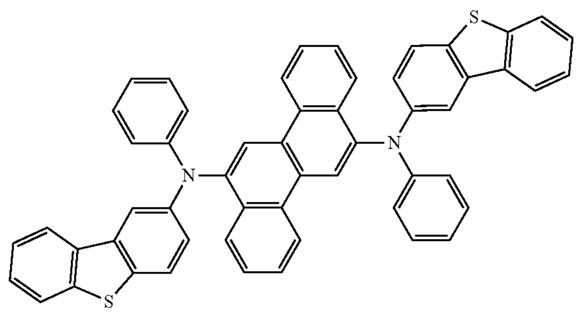

FD9

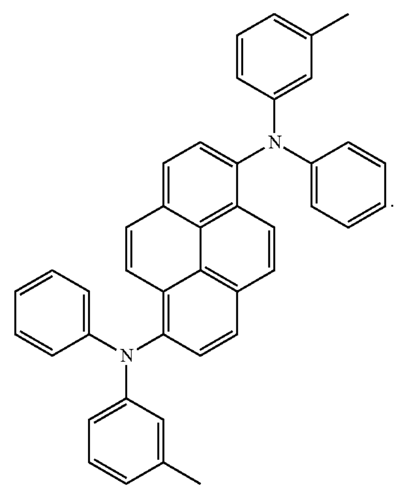

The amount of the dopant in the emission layer may be, for example, in a range of about 0.01 part by weight to about 15 parts by weight based on 100 parts by weight of the host, but embodiments are not limited thereto.

The thickness of the emission layer may be in a range of about 100 Å to about 1,000 Å, and in some embodiments, about 200 Å to about 600 Å. When the thickness of the emission layer is within any of these ranges, excellent (or suitable) light-emission characteristics may be achieved without a substantial increase in driving voltage.

An organic light-emitting device according to an embodiment may satisfy Equations 1 to 3:

$$E_{HTL,HOMO} > E_{FAL,HOMO} > E_{host,HOMO} \quad \text{Equation 1}$$

$$E_{host/dopant,LUMO} < E_{FAL,LUMO} \quad \text{Equation 2}$$

$$\mu_{h,FAL} \leq \mu_{h,HTL}, \quad \text{Equation 3}$$

wherein, in Equations 1 to 3, $E_{HTL,\ HOMO}$ refers to an actual measurement value of energy level of highest occupied molecular orbital (HOMO)

of a material for a hole transport layer; $E_{FAL,\ HOMO}$ indicates an actual measurement value of energy level of HOMO of the second compound in a fluorescent assistant layer; $E_{host,\ HOMO}$ indicate an actual measurement value of energy level of HOMO of the first compound (as a host); $E_{host/dopant,\ LUMO}$ indicates an actual measurement value of energy level of lowest unoccupied molecular orbital (LUMO) of each of the first compound (as a host) and the dopant; $E_{FAL,\ LUMO}$ indicate an actual measurement value of energy level of LUMO of the second compound in a fluorescent assistant layer; $\mu_{h,FAL}$ indicates a hole mobility of the second compound in a fluorescent assistant layer, and $\mu_{h,HTL}$ indicates a hole mobility of a material for a hole transport layer.

When an organic light-emitting device satisfies Equations 1 to 3, holes may be effectively (or suitably) injected into the emission layer, the balance of holes and electrons in the emission layer may improve, and leakage of excitons may be suppressed or reduced. Thus, the organic light-emitting device may have high efficiency and long lifespan.

An electron transport region may be positioned over the emission layer.

In some embodiments, the electron transport region may include the second compound.

The electron transport region may include at least one selected from a hole blocking layer, an electron transport layer (ETL), and an electron injection layer, but embodiments are not limited thereto.

When the electron transport region includes a hole blocking layer, the hole blocking layer may be formed over the emission layer by using one or more suitable methods, such as vacuum deposition, spin coating, casting, an LB method, ink-jet printing, laser printing, and/or LITI. When the hole blocking layer is formed by vacuum deposition and/or spin coating, deposition and coating conditions for the hole blocking layer may be determined by referring to the deposition and coating conditions for the hole injection layer.

The hole blocking layer may include, for example, at least one selected from BCP and Bphen, but embodiments are not limited thereto:

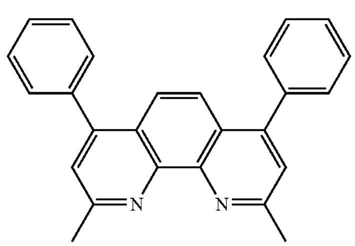

BCP

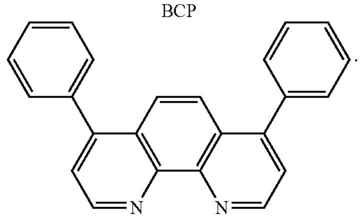

Bphen

The thickness of the hole blocking layer may be in a range of about 20 Å to about 1,000 Å, and in some embodiments, about 30 Å to about 300 Å. When the thickness of the hole blocking layer is within any of these ranges, excellent (or suitable) hole blocking characteristics may be achieved without a substantial increase in driving voltage.

The electron transport region may include an electron transport layer. The electron transport layer may be formed over the emission layer or the hole blocking layer by using one or more suitable methods, such as vacuum deposition, spin coating, casting, an LB method, ink-jet printing, laser printing, and/or LITI. When the electron transport layer is formed by using vacuum deposition and/or spin coating, deposition and coating conditions for the electron transport layer may be determined by referring to the deposition and coating conditions for the hole injection layer.

The electron transport layer may include at least one selected from BCP, Bphen, $Alq_3$, BAlq, TAZ, and NTAZ:

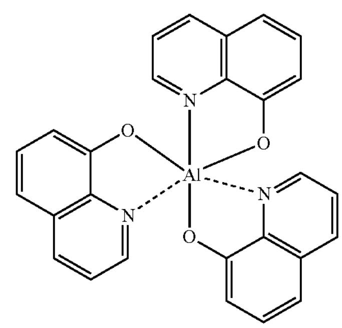

$Alq_3$

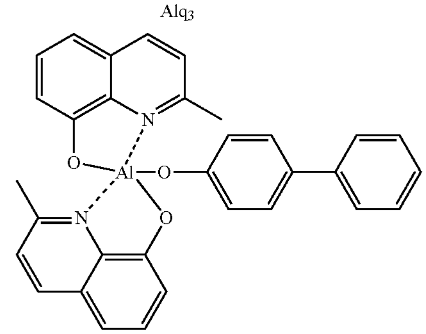

BAlq

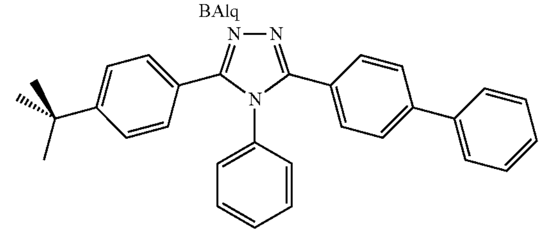

TAZ

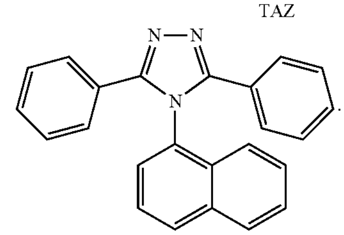

NTAZ

In some embodiments, the electron transport layer may include at least one selected from the compounds represented by Formula 601:

$$Ar_{601}\text{-}[(L_{601})_{xe1}\text{-}E_{601}]_{xe2}. \qquad \text{Formula 601}$$

In Formula 601, description of $Ar_{601}$ may be the same as the description provided herein in connection with $Ar_{301}$, description of $L_{601}$ may be the same as the description provided herein in connection with $L_{201}$, $E_{601}$ may be selected from the group consisting of:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, xe1 may be selected from 0, 1, 2, and 3, and xe2 may be selected from 1, 2, 3, and 4.

In some embodiments, the electron transport layer may include at least one selected from compounds represented by Formula 602:

Formula 602

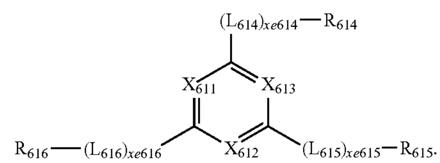

In Formula 602, $X_{611}$ may be N or C-$(L_{611})_{xe611}$-$R_{611}$, $X_{612}$ may be N or C-$(L_{612})_{xe612}$-$R_{612}$, $X_{613}$ may be N or C-$(L_{613})_{xe613}$-$R_{613}$, and at least one selected from $X_{611}$ to $X_{613}$ may be N, descriptions of $L_{611}$ to $L_{616}$ may be each independently the same as the description provided herein in connection with $L_{201}$, $R_{611}$ to $R_{616}$ may be each independently selected from the group consisting of:

a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a biphenyl group, a terphenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, and xe611 to xe616 may be each independently selected from 0, 1, 2, and 3.

The compound represented by Formula 601 and the compound represented by Formula 602 may each independently include one selected from Compounds ET1 to ET15:

-continued
ET1
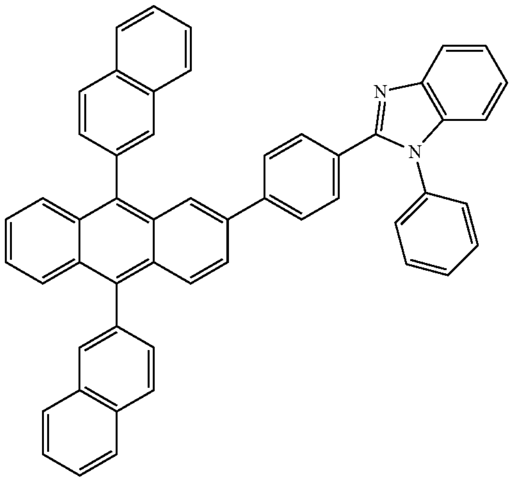
ET2
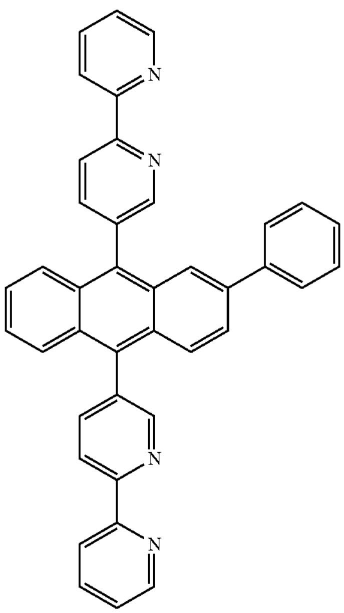
ET3
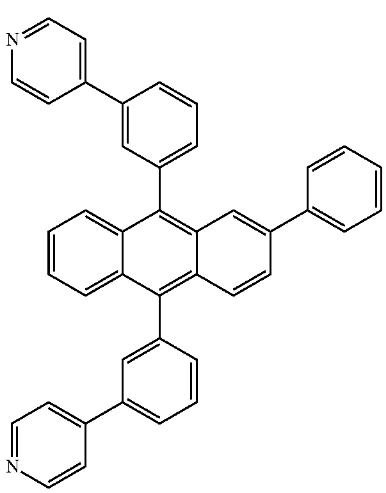
ET4
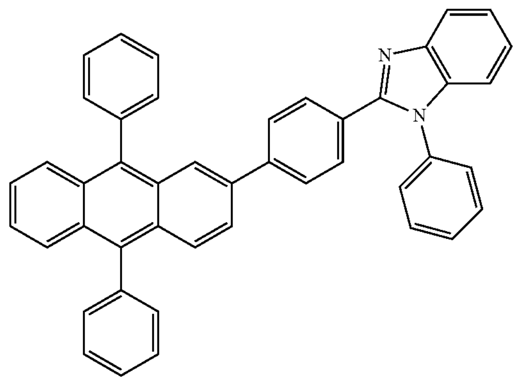
ET5
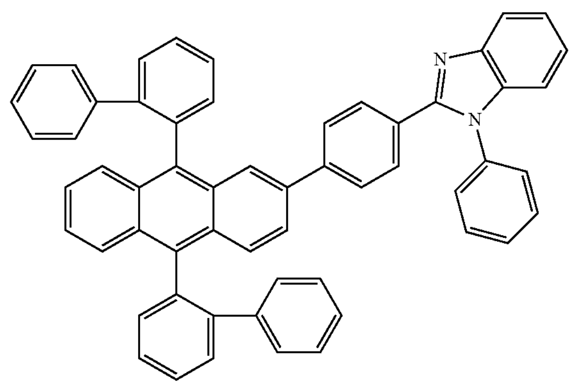
ET6
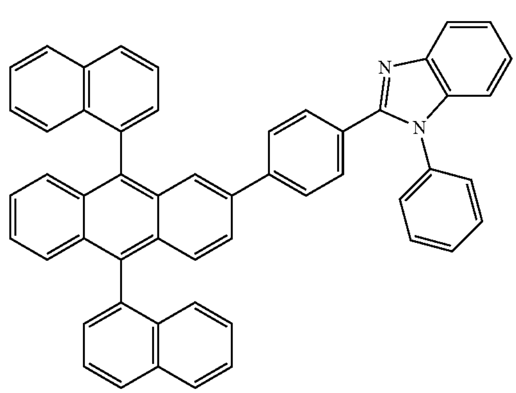

ET7
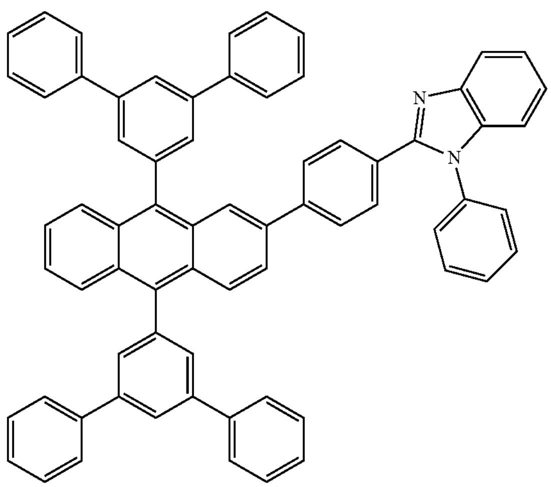
ET8
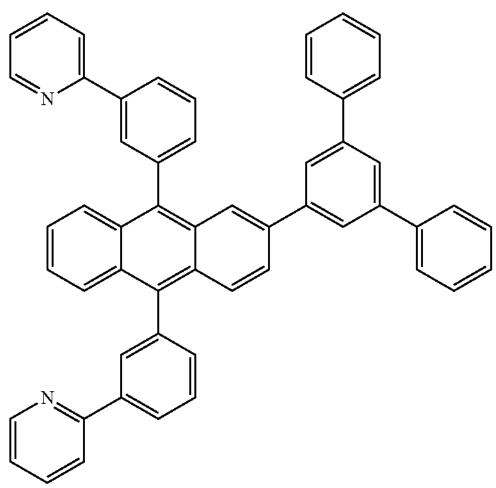
ET9
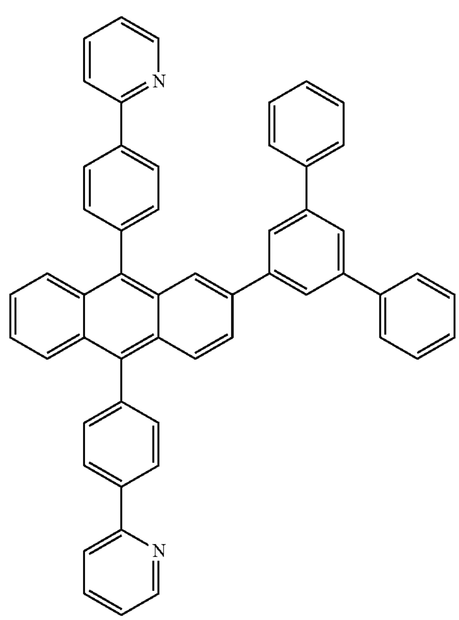
ET10
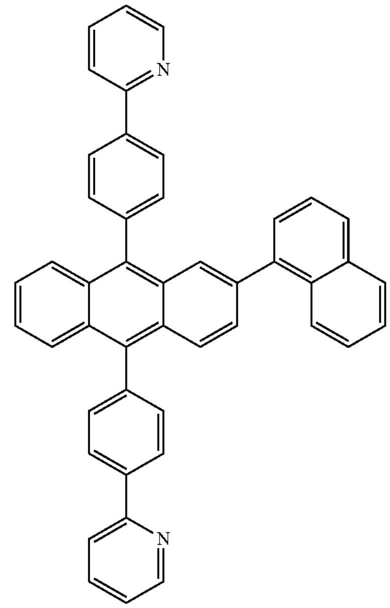
ET11
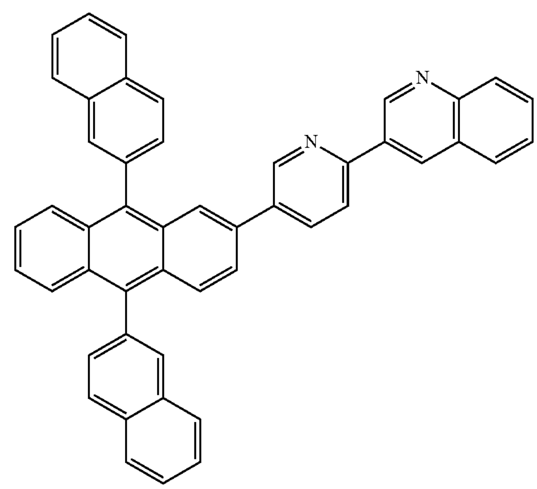
ET12
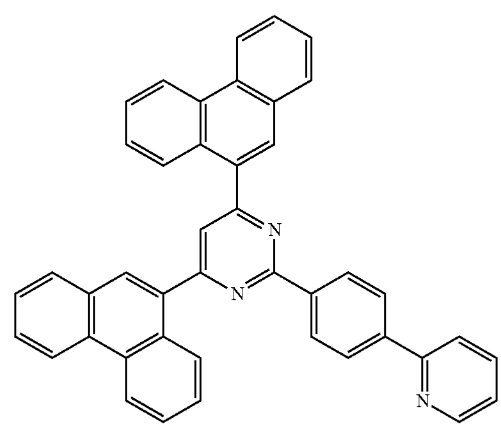

-continued

ET13

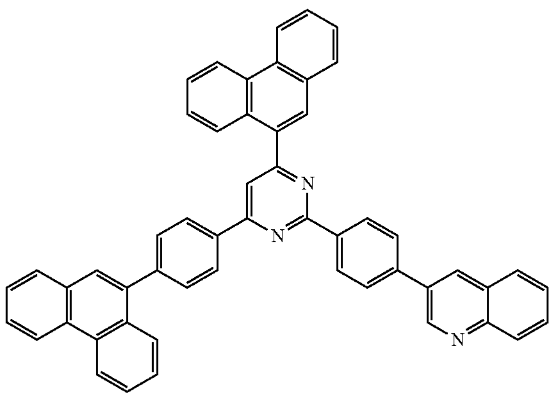

ET14

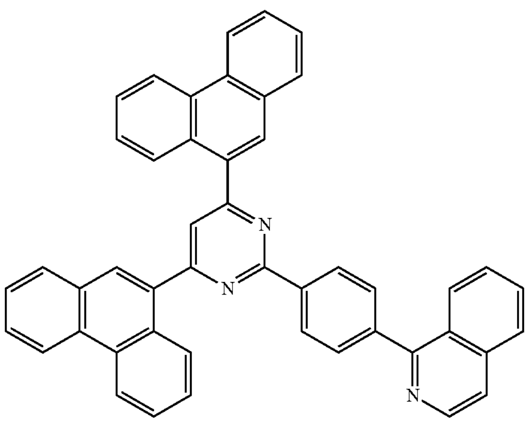

ET15

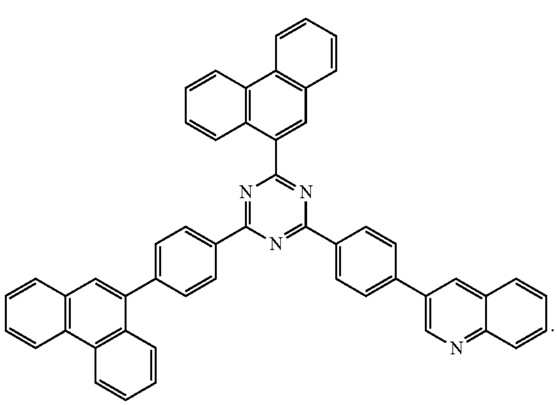

The thickness of the electron transport layer may be in a range of about 100 Å to about 1,000 Å, and in some embodiments, about 150 Å to about 500 Å. When the thickness of the electron transport layer is within any of these ranges, excellent (or suitable) electron transport characteristics may be achieved without a substantial increase in driving voltage.

The electron transport layer may further include a metal-containing material, in addition to the materials described above.

The metal-containing material may include a Li complex. The Li complex may include, for example, Compound ET-D1 (lithium quinolate, LiQ) and/or Compound ET-D2:

ET-D1

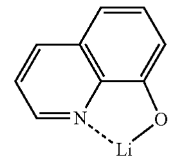

ET-D2

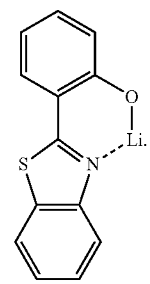

The electron transport region may include an electron injection layer that facilitates electron injection from the second electrode 190.

The electron injection layer may be formed over the electron transport layer by using one or more suitable methods, such as vacuum deposition, spin coating, casting, an LB method, ink-jet printing, laser printing, and/or LITI. When the electron injection layer is formed by vacuum deposition and/or spin coating, vacuum deposition and coating conditions for the electron injection layer may be determined by referring to the vacuum deposition and coating conditions for the hole injection layer.

The electron injection layer may include at least one selected from LiF, NaCl, CsF, $Li_2O$, BaO, and LiQ.

The thickness of the electron injection layer may be in a range of about 1 Å to about 100 Å, and in some embodiments, about 3 Å to about 90 Å. When the thickness of the electron injection layer is within any of these ranges, excellent (or suitable) electron injection characteristics may be achieved without a substantial increase in driving voltage.

The second electrode 190 may be positioned over the organic layer 150. The second electrode 190 may be a cathode (that is an electron injection electrode). In this regard, a material for forming the second electrode 190 may be a material having a low work function, for example, a metal, an alloy, an electrically conductive compound, or a mixture thereof. Non-limiting examples of the material for forming the second electrode 190 may include lithium (Li), magnesium (Mg), aluminum (Al), aluminum-lithium (Al—Li), calcium (Ca), magnesium-indium (Mg—In), and magnesium-silver (Mg—Ag). In some embodiments, the material for forming the second electrode 190 may be ITO and/or IZO. The second electrode 190 may be a reflective electrode, a semi-transmissive electrode, or a transmissive electrode.

Hereinbefore the organic light-emitting device 10 has been described with reference to the drawing, but embodiments of the present disclosure are not limited thereto.

The term "$C_1$-$C_{60}$ alkyl group" as used herein may refer to a linear or branched aliphatic hydrocarbon monovalent group having 1 to 60 carbon atoms. Non-limiting examples thereof may include a methyl group, an ethyl group, a propyl group, an iso-butyl group, a sec-butyl group, a tert-butyl group, a pentyl group, an iso-amyl group, and a hexyl group. The term "$C_1$-$C_{60}$ alkylene group" as used herein may refer to a divalent group having the same structure as the $C_1$-$C_{60}$ alkyl group.

The term "$C_1$-$C_{60}$ alkoxy group" as used herein may refer to a monovalent group represented by —$OA_{101}$ (where $A_{101}$ is the $C_1$-$C_{60}$ alkyl group). Non-limiting examples thereof may include a methoxy group, an ethoxy group, and an isopropoxy group.

The term "$C_2$-$C_{60}$ alkenyl group" as used herein may refer to a hydrocarbon group having at least one carbon-carbon double bond at one or more positions along the hydrocarbon chain of the $C_2$-$C_{60}$ alkyl group (e.g., in the middle and/or at either terminus of the $C_2$-$C_{60}$ alkyl group). Non-limiting examples thereof may include an ethenyl group, a propenyl group, and a butenyl group. The term "$C_2$-$C_{60}$ alkenylene group" as used herein may refer to a divalent group having the same structure as the $C_2$-$C_{60}$ alkenyl group.

The term "$C_2$-$C_{60}$ alkynyl group" as used herein may refer to a hydrocarbon group having at least one carbon-carbon triple bond at one or more positions along the hydrocarbon chain of the $C_2$-$C_{60}$ alkyl group (e.g., in the middle and/or at either terminus of the $C_2$-$C_{60}$ alkyl group). Non-limiting examples thereof may include an ethynyl group and a propynyl group. The term "$C_2$-$C_{60}$ alkynylene group" as used herein may refer to a divalent group having the same structure as the $C_2$-$C_{60}$ alkynyl group.

The term "$C_3$-$C_{10}$ cycloalkyl group" used herein may refer to a monovalent monocyclic saturated hydrocarbon group including 3 to 10 carbon atoms. Non-limiting examples thereof may include a cyclopropyl group, a cyclobutyl group, a cyclopentyl group, a cyclohexyl group, and a cycloheptyl group. The term "$C_3$-$C_{10}$ cycloalkylene group" as used herein may refer to a divalent group having the same structure as the $C_3$-$C_{10}$ cycloalkyl group.

The term "$C_1$-$C_{10}$ heterocycloalkyl group" as used herein may refer to a monovalent monocyclic group including at least one heteroatom selected from N, O, Si, P, and S as a ring-forming atom and 1 to 10 carbon atoms. Non-limiting examples thereof may include a tetrahydrofuranyl group and a tetrahydrothiophenyl group. The term "$C_1$-$C_{10}$ heterocycloalkylene group" used herein may refer to a divalent group having the same structure as the $C_1$-$C_{10}$ heterocycloalkyl group.

The term "$C_3$-$C_{10}$ cycloalkenyl group" as used herein may refer to a monovalent monocyclic group that has 3 to 10 carbon atoms and at least one double bond in its ring, and is not aromatic. Non-limiting examples thereof may include a cyclopentenyl group, a cyclohexenyl group, and a cycloheptenyl group. The term "$C_3$-$C_{10}$ cycloalkenylene group" as used herein may refer to a divalent group having the same structure as the $C_3$-$C_{10}$ cycloalkenyl group.

The term "$C_1$-$C_{10}$ heterocycloalkenyl group" as used herein may refer to a monovalent monocyclic group including at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group may include a 2,3-hydrofuranyl group and a 2,3-hydrothiophenyl group. The term "$C_1$-$C_{10}$ heterocycloalkenylene group" as used herein may refer to a divalent group having the same structure as the $C_1$-$C_{10}$ heterocycloalkenyl group.

The term "$C_6$-$C_{60}$ aryl group" as used herein may refer to a monovalent group having a carbocyclic aromatic system having 6 to 60 carbon atoms. The term "$C_6$-$C_{60}$ arylene group" as used herein may refer to a divalent group having a carbocyclic aromatic system having 6 to 60 carbon atoms. Non-limiting examples of the $C_6$-$C_{60}$ aryl group may include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each independently include a plurality of rings, the respective rings may be fused to each other.

The term "$C_1$-$C_{60}$ heteroaryl group" as used herein may refer to a monovalent group having a carbocyclic aromatic system including at least one heteroatom selected from N, O, Si, P, and S as a ring-forming atom and 1 to 60 carbon atoms. The term "$C_1$-$C_{60}$ heteroarylene group" as used herein may refer to a divalent group having a carbocyclic aromatic system including at least one heteroatom selected from N, O, Si, P, and S as a ring-forming atom and 1 to 60 carbon atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each independently include a plurality of rings, the respective rings may be fused to each other.

The term "$C_6$-$C_{60}$ aryloxy group" as used herein may refer to a group represented by —$OA_{102}$ (where $A_{102}$ is the $C_6$-$C_{60}$ aryl group). The term "$C_6$-$C_{60}$ arylthio group" as used herein may refer to a group represented by —$SA_{103}$ (where $A_{103}$ is the $C_6$-$C_{60}$ aryl group).

The term "monovalent non-aromatic condensed polycyclic group" as used herein may refer to a monovalent group that has a plurality of rings condensed (e.g., fused) to each other, and has only carbon atoms (e.g., the number of carbon atoms may be in a range of 8 to 60) as ring-forming atoms, wherein the molecular structure as a whole is non-aromatic in the entire molecular structure. A non-limiting example of the monovalent non-aromatic condensed polycyclic group may include a fluorenyl group. The term "divalent non-aromatic condensed polycyclic group" as used herein may refer to a divalent group having the same structure as the monovalent non-aromatic condensed polycyclic group.

The term "monovalent non-aromatic condensed heteropolycyclic group" as used herein may refer to a monovalent group that has two or more rings condensed (e.g., fused) to each other, has at least one heteroatom selected from N, O, Si, P, and S, other than carbon atoms (e.g., the number of carbon atoms may be in a range of 2 to 60), as ring-forming atoms, wherein the molecular structure as a whole is non-aromatic in the entire molecular structure. The monovalent non-aromatic condensed heteropolycyclic group may include a carbazolyl group. The term "divalent non-aromatic condensed hetero-polycyclic group" as used herein may refer to a divalent group having the same structure as the monovalent non-aromatic condensed hetero-polycyclic group.

In the present specification, at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$), —N($Q_{34}$)($Q_{35}$), and —B($Q_{36}$)($Q_{37}$), wherein $Q_{11}$ to $Q_{17}$, $Q_{21}$ to $Q_{27}$, and $Q_{31}$ to $Q_{37}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

"Ph" as used herein may refer to a phenyl group. "Me" as used herein may refer to a methyl group. "Et" as used herein may refer to an ethyl group. "Ter-Bu" or "$Bu^t$" as used herein may refer a tert-butyl group. "D" as used herein may refer to deuterium.

The term "biphenyl group" as used herein may refer to a monovalent group in which two benzene rings are bound (e.g., linked) to each other via a single bond. The term "terphenyl group" as used herein may refer to a monovalent group in which three benzene rings are bound (e.g., linked) via a single bond.

It will be understood that if a substituent that appears in the present disclosure is not expressly defined above, the definition of the substituent is consistent with a general definition thereof, unless stated otherwise.

Hereinafter an organic light-emitting device according to an embodiment will be described in more detail with reference to Examples. However, these examples are for illustrative purposes only and are not intended to limit the scope of the present disclosure.

EXAMPLES

Example 1

A glass substrate, on which an ITO anode was deposited at a thickness of about 1,500 Å, was cut to a size of 50 millimeters (mm)×50 mm×0.4 mm, sonicated in isopropyl alcohol and water, for 10 minutes in each, and cleaned by exposure to ultraviolet rays for 10 minutes, and then ozone. The resulting glass substrate was mounted on a vacuum-deposition device.

HT13 was deposited on the obtained anode to form a hole injection layer having a thickness of about 700 Å. HT3 was deposited on the hole injection layer to form a hole transport layer having a thickness of about 800 Å.

Compound A82 was deposited on the hole transport layer to form a fluorescent assistant layer having a thickness of about 50 Å. Compound H12 (as a host) and Compound FD9 (as a dopant) were then co-deposited on the fluorescent assistant layer at a weight ratio of about 95:5 to form an emission layer having a thickness of about 200 Å.

Thereafter, Compound ET1 and LiQ were co-deposited on the emission layer at a weight ratio of about 100:100 to form an electron transport layer having a thickness of 360 Å. LiQ was then deposited on the electron transport layer to form an electron injection layer having a thickness of 10 Å. Al was next deposited on the electron injection layer to form a cathode having a thickness of 1000 Å, thereby completing the manufacture of an organic light-emitting device.

Examples 2 to 16

Organic light-emitting devices were manufactured in the same (or substantially the same) manner as in Example 1, except that compounds as shown in Table 1 were used in the formation of a fluorescent assistant layer and an emission layer.

Comparative Examples 1 to 4

Organic light-emitting devices were manufactured in the same (or substantially the same) manner as in Example 1, except that compounds as shown in Table 1 were used in the formation of an emission layer, and a fluorescent assistant layer was not formed.

Comparative Examples 5 to 9

Organic light-emitting devices were manufactured in the same (or substantially the same) manner as in Example 1, except that compounds as shown in Table 1 were used in the formation of a fluorescent assistant layer and an emission layer.

TABLE 1

| | Host | Fluorescent assistant layer material | Dopant |
|---|---|---|---|
| Example 1 | Compound H12 | Compound A82 | FD9 |
| Example 2 | Compound H1 | Compound A82 | FD9 |
| Example 3 | Compound H8 | Compound A82 | FD9 |
| Example 4 | Compound H21 | Compound A82 | FD9 |
| Example 5 | Compound H12 | Compound B1 | FD9 |
| Example 6 | Compound H1 | Compound B1 | FD9 |
| Example 7 | Compound H8 | Compound B1 | FD9 |
| Example 8 | Compound H21 | Compound B1 | FD9 |
| Example 9 | Compound H12 | Compound B13 | FD9 |
| Example 10 | Compound H1 | Compound B13 | FD9 |
| Example 11 | Compound H8 | Compound B13 | FD9 |
| Example 12 | Compound H21 | Compound B13 | FD9 |
| Example 13 | Compound H12 | Compound C14 | FD9 |
| Example 14 | Compound H1 | Compound C14 | FD9 |
| Example 15 | Compound H8 | Compound C14 | FD9 |
| Example 16 | Compound H21 | Compound C14 | FD9 |
| Comparative Example 1 | Compound H12 | — | FD9 |
| Comparative Example 2 | Compound H1 | — | FD9 |
| Comparative Example 3 | Compound H8 | — | FD9 |
| Comparative Example 4 | Compound H21 | — | FD9 |
| Comparative Example 5 | Compound H12 | NPB | FD9 |
| Comparative Example 6 | Compound H1 | NPB | FD9 |
| Comparative Example 7 | Compound H8 | NPB | FD9 |
| Comparative Example 8 | Compound H21 | NPB | FD9 |
| Comparative Example 9 | Compound A | Compound B | Compound C |

TABLE 1-continued

| Host | Fluorescent assistant layer material | Dopant |
|---|---|---|

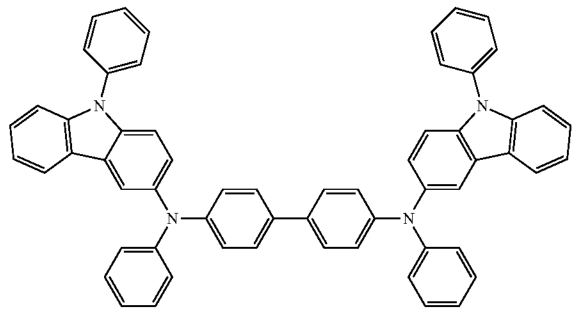

HT13

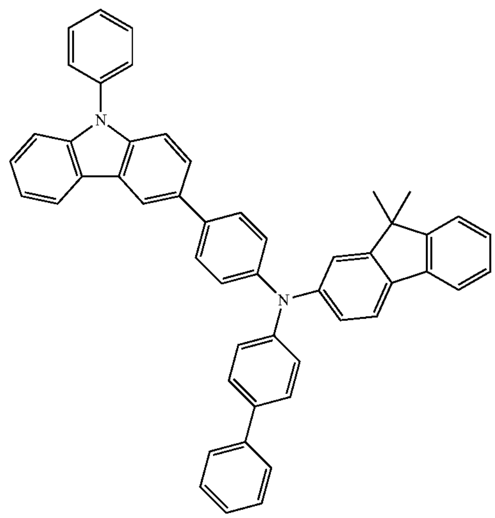

HT3

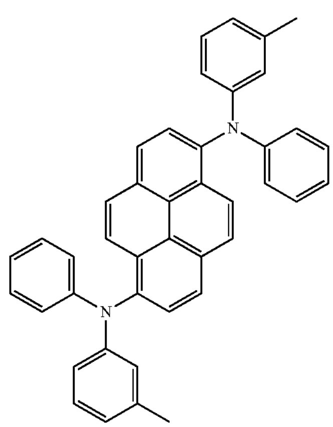

FD9

TABLE 1-continued
| Host | Fluorescent assistant layer material | Dopant |
| --- | --- | --- |
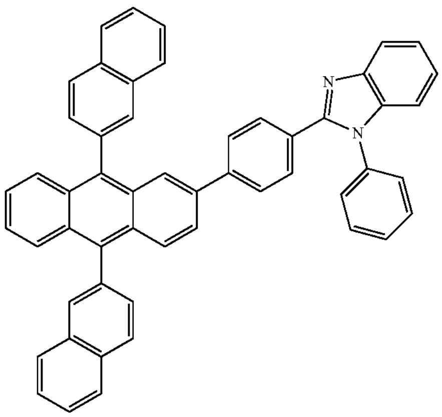
ET1
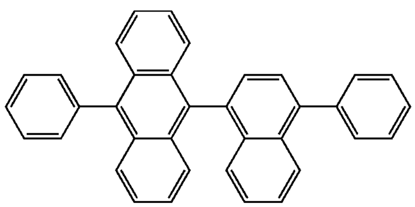
H1
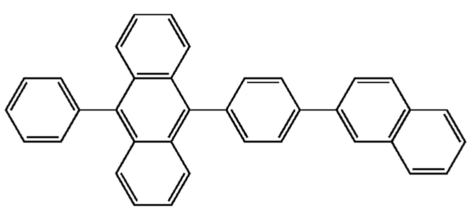
H8
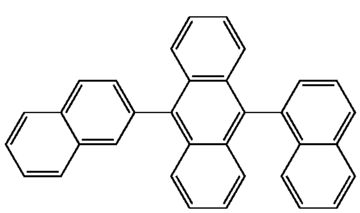
H12
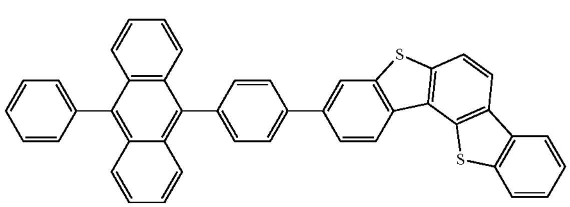
H21
TABLE 1-continued
| Host | Fluorescent assistant layer material | Dopant |
| --- | --- | --- |
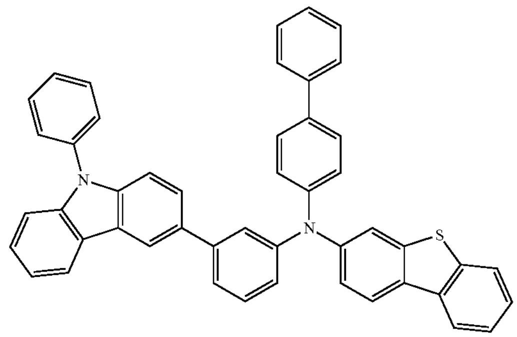
A82
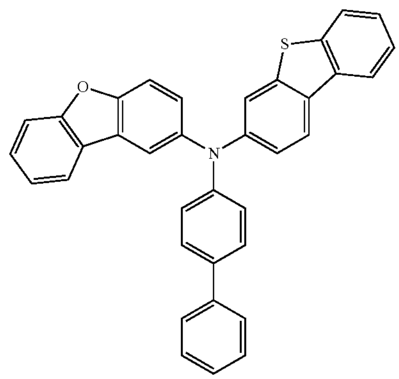
B1
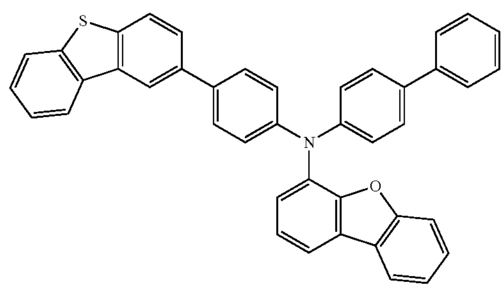
B13
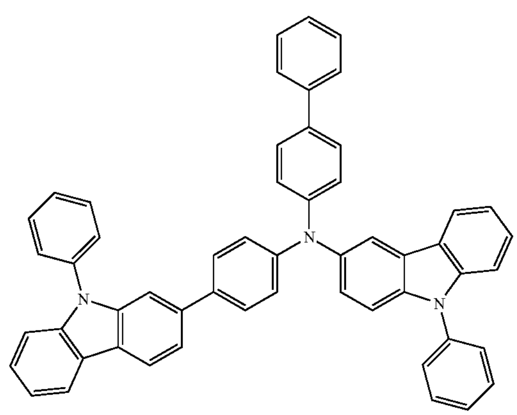
C14

TABLE 1-continued

| Host | Fluorescent assistant layer material | Dopant |
|---|---|---|

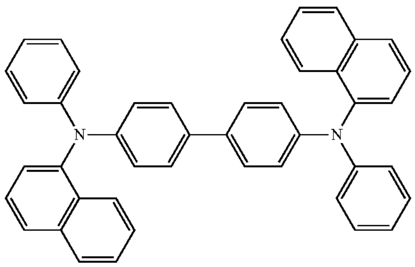

NPB

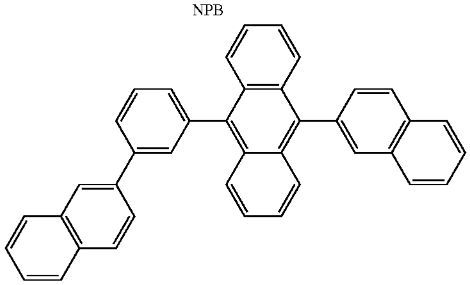

Compound A

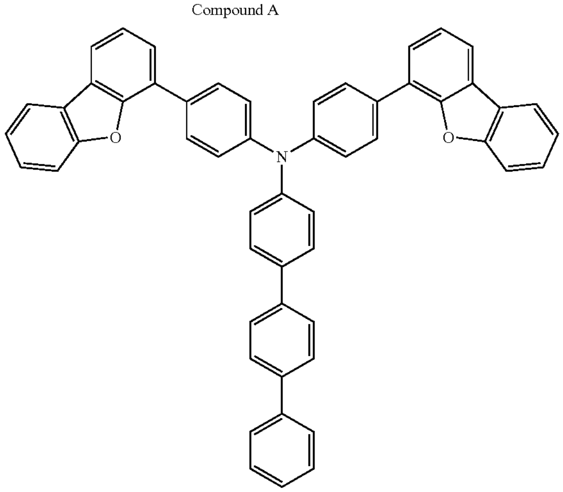

Compound B

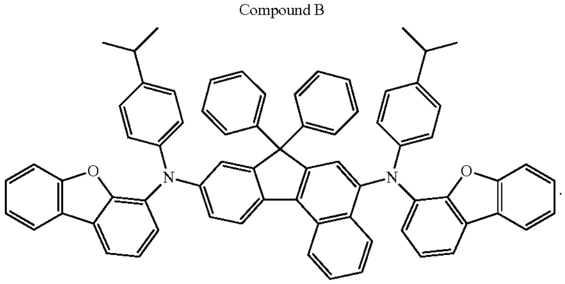

Compound C

Evaluation Example 1

Actual measurement values of LUMO/HOMO (eV) of a hole transport layer material, a fluorescent assistant layer material, host, and dopant used in the manufacture of the organic light-emitting devices manufactured in Examples 1 to 16 and Comparative Examples 1 to 9 were measured using cyclic voltammetry. The results thereof are shown in Table 2.

TABLE 2

| Actual measurement value of LUMO/HOMO (eV) | Hole transport layer material | Fluorescent assistant layer material | Host | Dopant |
|---|---|---|---|---|
| Example 1 | −2.4/−5.5 | −2.4/−5.7 | −3.0/−6.0 | −2.7/−5.4 |
| Example 2 | −2.4/−5.5 | −2.4/−5.7 | −3.0/−6.0 | −2.7/−5.4 |
| Example 3 | −2.4/−5.5 | −2.4/−5.7 | −2.9/−5.9 | −2.7/−5.4 |
| Example 4 | −2.4/−5.5 | −2.4/−5.7 | −3.1/−6.1 | −2.7/−5.4 |
| Example 5 | −2.4/−5.5 | −2.3/−5.7 | −3.0/−6.0 | −2.7/−5.4 |
| Example 6 | −2.4/−5.5 | −2.3/−5.7 | −3.0/−6.0 | −2.7/−5.4 |
| Example 7 | −2.4/−5.5 | −2.3/−5.7 | −2.9/−5.9 | −2.7/−5.4 |
| Example 8 | −2.4/−5.5 | −2.3/−5.7 | −3.1/−6.1 | −2.7/−5.4 |
| Example 9 | −2.4/−5.5 | −2.4/−5.6 | −3.0/−6.0 | −2.7/−5.4 |
| Example 10 | −2.4/−5.5 | −2.4/−5.6 | −3.0/−6.0 | −2.7/−5.4 |
| Example 11 | −2.4/−5.5 | −2.4/−5.6 | −2.9/−5.9 | −2.7/−5.4 |
| Example 12 | −2.4/−5.5 | −2.4/−5.6 | −3.1/−6.1 | −2.7/−5.4 |
| Example 13 | −2.4/−5.5 | −2.3/−5.7 | −3.0/−6.0 | −2.7/−5.4 |
| Example 14 | −2.4/−5.5 | −2.3/−5.7 | −3.0/−6.0 | −2.7/−5.4 |
| Example 15 | −2.4/−5.5 | −2.3/−5.7 | −2.9/−5.9 | −2.7/−5.4 |
| Example 16 | −2.4/−5.5 | −2.3/−5.7 | −3.1/−6.1 | −2.7/−5.4 |
| Comparative Example 1 | −2.4/−5.5 | — | −3.0/−6.0 | −2.7/−5.4 |
| Comparative Example 2 | −2.4/−5.5 | — | −3.0/−6.0 | −2.7/−5.4 |
| Comparative Example 3 | −2.4/−5.5 | — | −2.9/−5.9 | −2.7/−5.4 |
| Comparative Example 4 | −2.4/−5.5 | — | −3.1/−6.1 | −2.7/−5.4 |
| Comparative Example 5 | −2.4/−5.5 | −2.5/−5.5 | −3.0/−6.0 | −2.7/−5.4 |
| Comparative Example 6 | −2.4/−5.5 | −2.5/−5.5 | −3.0/−6.0 | −2.7/−5.4 |
| Comparative Example 7 | −2.4/−5.5 | −2.5/−5.5 | −2.9/−5.9 | −2.7/−5.4 |
| Comparative Example 8 | −2.4/−5.5 | −2.5/−5.5 | −3.1/−6.1 | −2.7/−5.4 |
| Comparative Example 9 | −2.4/−5.5 | −2.7/−5.7 | −3.0/−6.0 | −2.6/−5.4 |

Referring to the results shown in Table 2, it was found that the organic light-emitting devices of Examples 1 to 16 satisfy Equations 1 and 2, whereas the organic light-emitting devices of Comparative Examples 1 to 9 do not satisfy Equation 2.

Evaluation Example 2

The driving voltage, current density, efficiency, and lifespan of the organic light-emitting devices manufactured in Examples 1 to 16 and Comparative Examples 1 to 9 were evaluated using a Keithley 2400 source-measure unit (SMU), a Minolta Cs-1000A luminance meter, and a PR650 spectroscan spectrometer (available from PhotoResearch Inc.). $T_{97}$ lifespan indicates time that it took for 100% of the initial luminance of about 9000 cd/m$^2$ to reduce to 97% of the initial luminance. The evaluation results are shown in Table 3.

TABLE 3

| | Driving voltage (V) | Current density (mA/cm$^2$) | Efficiency (cd/A) | $T_{97}$ (hr) |
|---|---|---|---|---|
| Example 1 | 4.2 | 10 | 8.5 | 60 |
| Example 2 | 4.2 | 10 | 8.6 | 64 |
| Example 3 | 4.1 | 10 | 8.5 | 63 |

TABLE 3-continued

| | Driving voltage (V) | Current density ($mA/cm^2$) | Efficiency (cd/A) | $T_{97}$ (hr) |
|---|---|---|---|---|
| Example 4 | 3.9 | 10 | 8.4 | 55 |
| Example 5 | 4.1 | 10 | 8.3 | 65 |
| Example 6 | 4.2 | 10 | 8.5 | 69 |
| Example 7 | 4.2 | 10 | 8.6 | 61 |
| Example 8 | 4.0 | 10 | 8.4 | 57 |
| Example 9 | 4.2 | 10 | 8.6 | 63 |
| Example 10 | 4.1 | 10 | 8.5 | 59 |
| Example 11 | 4.2 | 10 | 8.4 | 67 |
| Example 12 | 3.9 | 10 | 8.5 | 59 |
| Example 13 | 4.2 | 10 | 8.4 | 66 |
| Example 14 | 4.2 | 10 | 8.7 | 65 |
| Example 15 | 4.2 | 10 | 8.6 | 63 |
| Example 16 | 4.0 | 10 | 8.5 | 57 |
| Comparative Example 1 | 4.2 | 10 | 6.1 | 30 |
| Comparative Example 2 | 4.3 | 10 | 6.2 | 27 |
| Comparative Example 3 | 4.3 | 10 | 5.9 | 31 |
| Comparative Example 4 | 4.0 | 10 | 6.0 | 22 |
| Comparative Example 5 | 4.2 | 10 | 5.8 | 28 |
| Comparative Example 6 | 4.2 | 10 | 6.0 | 27 |
| Comparative Example 7 | 4.3 | 10 | 6.1 | 29 |
| Comparative Example 8 | 4.1 | 10 | 5.9 | 25 |
| Comparative Example 9 | 4.3 | 10 | 6.9 | 38 |

Referring to the results shown in Table 3, it was found that the organic light-emitting devices manufactured in Examples 1 to 16 exhibited high efficiency and long lifespan characteristics, as compared with those of the organic light-emitting devices manufactured in Comparative Examples 1 to 9.

As described above, according to the one or more of the above embodiments, the organic light-emitting device may have high efficiency and long lifespan.

As used herein, the terms “use,” “using,” and “used” may be considered synonymous with the terms “utilize,” “utilizing,” and “utilized,” respectively.

In addition, the terms “substantially,” “about,” and similar terms are used as terms of approximation and not as terms of degree, and are intended to account for the inherent deviations in measured or calculated values that would be recognized by those of ordinary skill in the art.

It will be understood that when an element such as a layer, film, region, or substrate is referred to as being “on” or “over” another element, it can be directly on the other element or intervening elements may also be present. In contrast, when an element is referred to as being “directly on” or “directly contacting” another element, there are no intervening elements present.

Also, any numerical range recited herein is intended to include all subranges of the same numerical precision subsumed within the recited range. For example, a range of “1.0 to 10.0” is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the drawing, it will be understood by those of ordinary skill in the art that various changes in form and details may be made therein without departing from the spirit and scope of the present disclosure as defined by the following claims and equivalents thereof.

What is claimed is:

1. An organic light-emitting device comprising:

a first electrode;

a second electrode;

an organic layer between the first electrode and the second electrode, the organic layer comprising an emission layer, and a hole transport region between the first electrode and the emission layer, wherein the hole transport region comprises a hole transport layer (HTL) and a fluorescent assistant layer (FAL) and does not comprise compound DNTPD, the fluorescent assistant layer is between the hole transport layer and the emission layer, the emission layer comprises a host and a dopant, the host comprises a first compound represented by Formula 1, and the fluorescent assistant layer comprises a second compound represented by one of Formulae 2 and 3, and the dopant is represented by Formula 501:

<DNTPD>

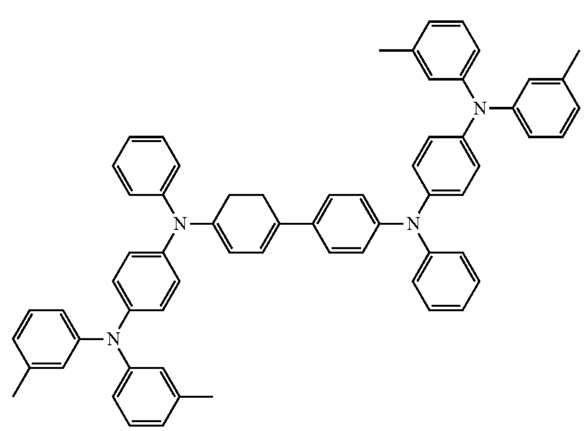

Formula 1

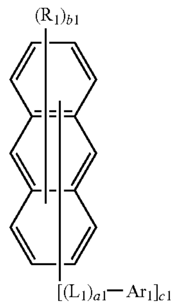

Formula 1-1

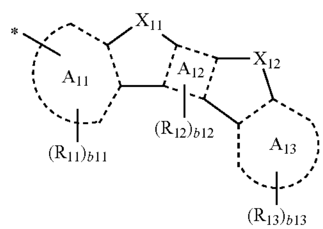

Formula 1-2

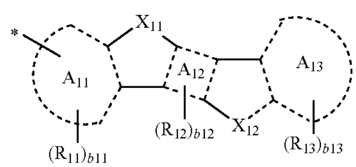

Formula 2

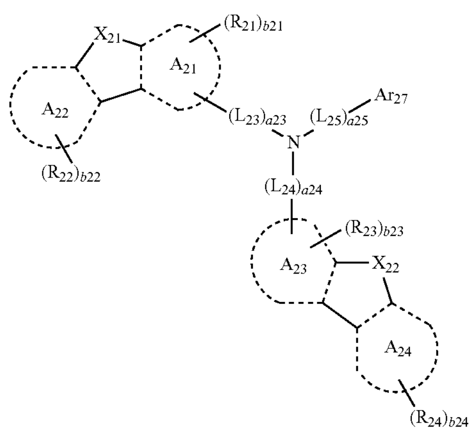

Formula 3

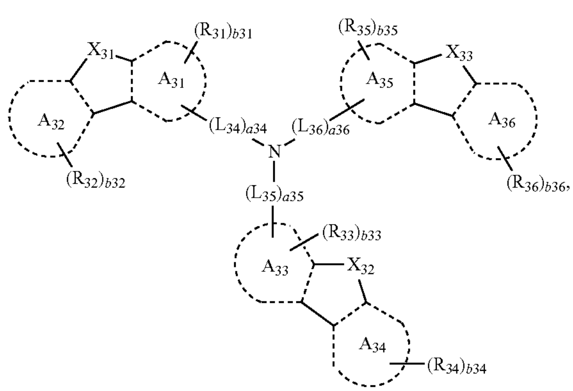

wherein, in Formulae 1, 1-1, 1-2, 2, and 3, $X_{11}$ is selected from $N[(L_{11})_{a11}\text{-}Ar_{11}]$, $C(Ar_{13})(Ar_{15})$, O, and S, $X_{12}$ is selected from $N[(L\text{-}_{12})_{a12}\text{-}Ar_{12}]$, $C(Ar_{14})(Ar_{16})$, O, and S, wherein $X_{11}$ is $C(Ar_{13})(Ar_{15})$ and/or $X_{12}$ is $C(Ar_{14})(Ar_{16})$, $X_{21}$ is selected from $N[(L_{21})_{a21}\text{-}Ar_{21}]$, $C(Ar_{23})(Ar_{25})$, O, and S, $X_{22}$ is selected from $N(L_{22})_{a22}\text{-}Ar_{22}]$, $C(Ar_{24})(Ar_{26})$, O, and S, wherein when $X_{21}$ is $N[(L_{21})_{a21}\text{-}Ar_{21}]$, $X_{22}$ is selected from $N(L_{22})_{a22\text{-}Ar22}]$, O, and S;

when $X_{21}$ is $C(Ar_{23})(Ar_{25})$, $X_{22}$ is selected from $C(Ar_{24})(Ar_{26})$, O, and S;

when $X_{21}$ is O, $X_{22}$ is selected from $N(L_{22})_{a22}\text{-}Ar_{22}]$, $C(Ar_{24})(Ar_{26})$, and S; and when $X_{21}$ is S, $X_{22}$ is selected from $N(L_{22})_{a22}\text{-}Ar_{22}]$, $C(Ar_{24})(Ar_{26})$, and O, $X_{31}$ is selected from $N[(L_{31})_{a31}\text{-}Ar_{31}]$, $C(Ar_{34})(Ar_{37})$, O, and S, $X_{32}$ is selected from $N(L_{32})_{a32}\text{-}Ar_{32}]$, $C(Ar_{35})(Ar_{38})$, O, and S, $X_{33}$ is selected from $N[(L_{33})_{a33}\text{-}Ar_{33}]$, $C(Ar_{36})(Ar_{39})$, O, and S, wherein when $X_{31}$ is $N[(L_{31})_{a31}\text{-}Ar_{31}]$, $X_{32}$ is $N(L_{32})_{a32}\text{-}Ar_{32}]$, and $X_{33}$ is selected from $N[(L_{33})_{a33}\text{-}Ar_{33}]$, O, and S;

when $X_{31}$ is $C(Ar_{34})(Ar_{37})$, $X_{32}$ is $C(Ar_{35})(Ar_{38})$, and $X_{33}$ is selected from $C(Ar_{36})(Ar_{39})$, O, and S; and when $X_{31}$ is O, $X_{32}$ is S, and $X_{33}$ is selected from $N[(L_{33})_{a33}\text{-}Ar_{33}]$ and $C(Ar_{35})(Ar_{38})$, $A_{11}$ to $A_{13}$, $A_{21}$ to $A_{24}$, and $A_{31}$ to $A_{36}$ are each independently selected from a $C_5\text{-}C_{20}$ cyclic group and a $C_1\text{-}C_{20}$ heterocyclic group, $L_1$, $L_{11}$, $L_{12}$, $L_{21}$ to $L_{25}$, and $L_{31}$ to $L_{36}$ are each independently selected from a substituted or unsubstituted $C_3\text{-}C_{10}$ cycloalkylene group, a substituted or unsubstituted $C_1\text{-}C_{10}$ heterocycloalkylene group, a substituted or unsubstituted $C_3\text{-}C_{10}$ cycloalkenylene group, a substituted or unsubstituted $C_1\text{-}C_{10}$ heterocycloalkenylene group, a substituted or unsubstituted $C_6\text{-}C_{60}$ arylene group, a substituted or unsubstituted $C_1\text{-}C_{60}$ heteroarylene group, a substituted or unsubstituted divalent non-aromatic condensed polycyclic group, and a substituted or unsubstituted divalent non-aromatic condensed heteropolycyclic group, a1, a11, a12, a21 to a25, and a31 to a36 are each independently an integer selected from 0 to 3, $Ar_1$ is selected from a group represented by Formula 1-1, a group represented by Formula 1-2, a substituted or unsubstituted $C_3\text{-}C_{10}$ cycloalkyl group, a substituted or unsubstituted $C_1\text{-}C_{10}$ heterocycloalkyl group, a substituted or unsubstituted $C_3\text{-}C_{10}$ cycloalkenyl group, a substituted or unsubstituted $C_1\text{-}C_{10}$ heterocycloalkenyl group, a substituted or unsubstituted $C_6\text{-}C_{60}$ aryl group, a substituted or unsubstituted $C_6\text{-}C_{60}$ aryloxy group, a substituted or unsubstituted $C_6\text{-}C_{60}$ arylthio group, a substituted or unsubstituted $C_1\text{-}C_{60}$ heteroaryl group, a substituted or unsubstituted monovalent non-aromatic condensed polycyclic group, and a substituted or unsubstituted monovalent non-aromatic condensed heteropolycyclic group, wherein at least one $Ar_1$ is represented by Formula 1-1, Formula 1-2, or one of Formulae 5-10 to 5-13:

5-10

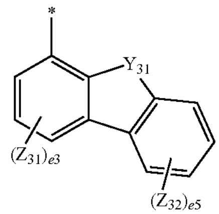

5-11

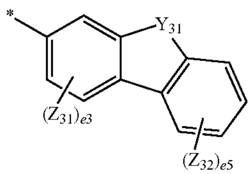

5-12

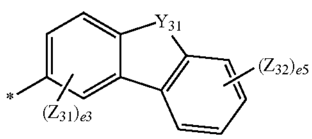

5-13

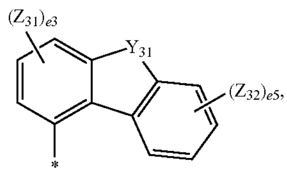

wherein, in Formulae 5-10 to 5-13, $Y_{31}$ is selected from $C(Z_{34})(Z_{35})$, O, and S, and $Z_{31}$, $Z_{32}$, $Z_{34}$, and $Z_{35}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, and —$Si(Q_{31})(Q_{32})(Q_{33})$, wherein $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, and a naphthyl group, e3 is an integer selected from 1 to 3, e5 is an integer selected from 1 to 4, and * indicates a binding site to an adjacent atom, $Ar_{11}$ to $Ar_{16}$, $Ar_{21}$ to $Ar_{26}$, and $Ar_{31}$ to $Ar_{39}$ are each independently selected from a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $Ar_{27}$ is selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, and a substituted or unsubstituted $C_1$-$C_{60}$ heteroaryl group, $R_1$, $R_{11}$ to $R_{13}$, $R_{21}$ to $R_{24}$, and $R_{31}$ to $R_{36}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_4)(Q_5)$, and —$B(Q_6)(Q_7)$, b1 is an integer selected from 0 to 9, b11 to b13, b21 to b24, and b31 to b36 are each independently an integer selected from 0 to 6, c1 is an integer selected from 1 to 4, Formula 501

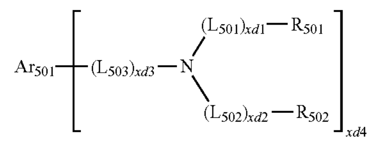

wherein, in Formula 501, $Ar_{501}$ is selected from the group consisting of:

a naphthalene, a heptalene, a fluorene, a spiro-bifluorene, a benzofluorene, a dibenzofluorene, a phenalene, a phenanthrene, a fluoranthene, a triphenylene, a pyrene, a naphthacene, a picene, a perylene, a pentaphene, and an indenoanthracene; and a naphthalene, a heptalene, a fluorene, a spiro-bifluorene, a benzofluorene, a dibenzofluorene, a phenalene, a phenanthrene, a fluoranthene, a triphenylene, a pyrene, naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$ aryl group, a $C_{12}$-$_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, and —Si($Q_{501}$)($Q_{502}$)($Q_{503}$), wherein $Q_{501}$ to $Q_{503}$ are each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group, $L_{501}$ to $_{L503}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $R_{501}$ and $R_{502}$ are each independently selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, xd1 to xd3 are each independently selected from 0, 1, 2, and 3, xd4 is selected from 1, 2, 3, and 4, and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —$Si(Q_{21})(Q_{22})(Q_{23})$, —$N(Q_{24})(Q_{25})$, and —$B(Q_{26})(Q_{27})$; and —$Si(Q_{31})(Q_{32})(Q_{33})$, —$N(Q_{34})(Q_{35})$, and —$B(Q_{36})(Q_{37})$, wherein $Q_1$ to $Q_7$, $Q_{11}$ to $Q_{17}$, $Q_{21}$ to $Q_{27}$, and $Q_{31}$ to $Q_{37}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and

* indicates a binding site to an adjacent atom, wherein the organic light-emitting device satisfies Equations 1 to 3:

$$E_{HTL,\ HOMO} > E_{FAL,HOMO} > E_{host,\ HOMO} \quad \text{Equation 1}$$

$$E_{host/dopant,\ LUMO} < E_{FAL,\ LUMO} \quad \text{Equation 2}$$

$$\mu_{h,Fal} \leq \mu_{h,HTL}, \quad \text{Equation 3}$$

wherein, in Equations 1 to 3, $E_{HTL,\ HOMO}$ indicates an actual measurement value of energy level of highest occupied molecular orbital (HOMO) of a material for the hole transport layer, $E_{FAL,\ HOMO}$ indicates an actual measurement value of energy level of HOMO of the second compound, $E_{host,\ HOMO}$ indicates an actual measurement value of energy level of HOMO of the first compound, $E_{host/dopant,\ LUMO}$ indicates an actual measurement value of energy level of lowest unoccupied molecular orbital (LUMO) of each of the first compound and the dopant, $E_{FAL,\ LUMO}$ indicates an actual measurement value of energy level of LUMO of the second compound, $\mu_{h,\ FAL}$ indicates a hole mobility of the second compound, and $\mu_{h,\ HTL}$ indicates a hole mobility of the material for the hole transport layer.

2. The organic light-emitting device of claim 1, wherein $X_{11}$ is selected from $C(Ar_{13})(Ar_{15})$, O, and S; and $X_{12}$ is selected from $C(Ar_{14})(Ar_{16})$, O, and S, wherein $X_{11}$ is $C(Ar_{13})(Ar_{15})$ and/or $_{X12}$ is $C(Ar_{14})(Ar_{16})$.

3. The organic light-emitting device of claim 1, wherein $A_{11}$ to $A_{13}$, $A_{21}$ to $A_{24}$ and $A_{31}$ to $A_{36}$ are each independently selected from a benzene, a naphthalene, a phenanthrene, an anthracene, a pyridine, a pyrazine, a pyrimidine, a pyridazine, a quinoline, an isoquinoline, a quinoxaline, and a quinazoline.

4. The organic light-emitting device of claim 1, wherein $L_1$, $L_{11}$, $L_{12}$, $L_{21}$ to $L_{25}$, and $L_{31}$ to $L_{36}$ are each independently selected from the group consisting of:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, and a dibenzocarbazolylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group.

5. The organic light-emitting device of claim 1, wherein $L_1$, $L_{11}$, $L_{12}$, $L_{21}$ to $L_{25}$, and $L_{31}$ to $L_{36}$ are each independently selected from groups represented by Formulae 3-1 to 3-15:

3-1

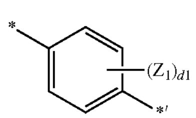

3-2

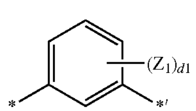

3-3

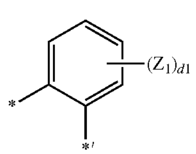

3-4

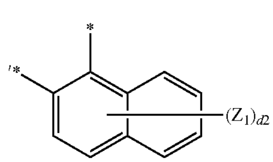

-continued 3-5

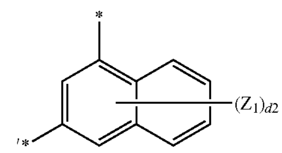

3-6

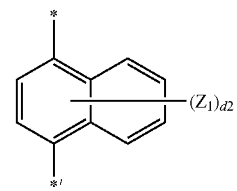

3-7

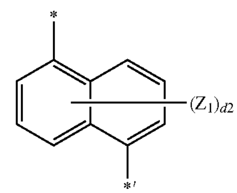

3-8

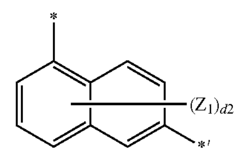

3-9

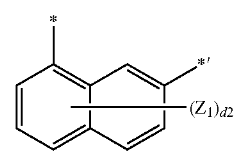

3-10

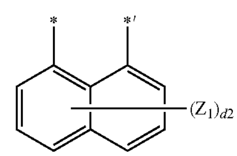

3-11

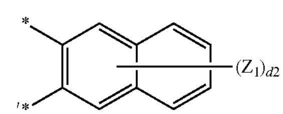

3-12

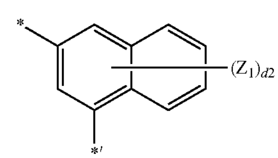

3-13

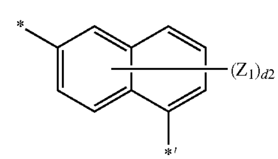

3-14

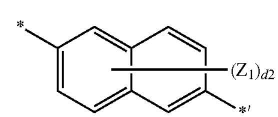

3-15

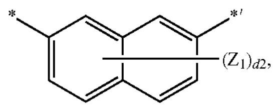

wherein, in Formulae 3-1 to 3-15, $Z_1$ is selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, an anthracenyl group, a pyrenyl group, and a phenanthrenyl group, d1 is selected from 1, 2, 3, and 4, d2 is selected from 1, 2, 3, 4, 5, and 6, and

* and *' each indicate a binding site to an adjacent atom.

6. The organic light-emitting device of claim 1, wherein $(L_1)_{a1}$, $(L_{11})_{a11}$, $(L_{12})_{a12}$, $(L_{21})_{a21}$ to $(L_{25})_{a25}$, and $(L_{31})_{a31}$ to $(L_{36})_{a36}$ are each independently selected from a single bond and a group represented by any of Formulae 4-1 to 4-20:

4-1

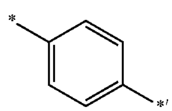

4-2

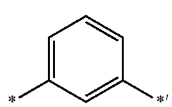

4-3

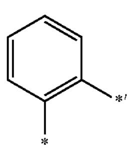

4-4

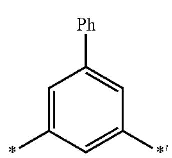

4-5

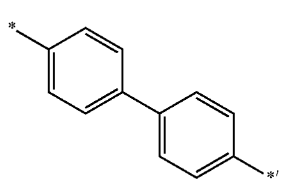

4-6

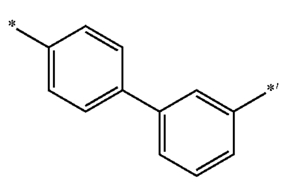

4-7

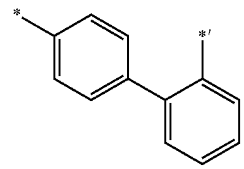

4-8

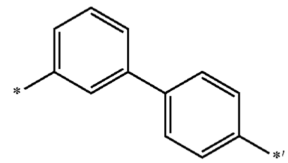

4-9

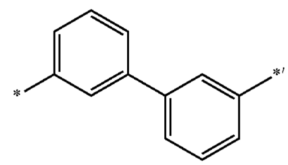

4-10

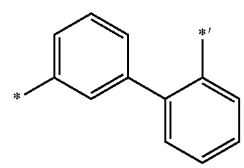

4-11

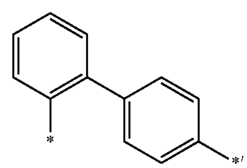

4-12

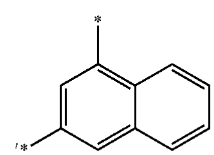

4-13

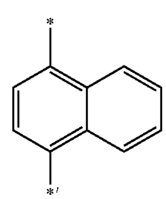

4-14

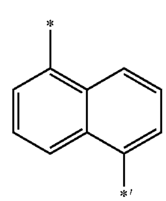

4-15

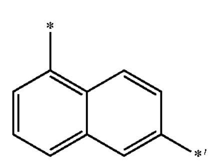

-continued 4-16

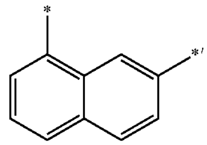

4-17

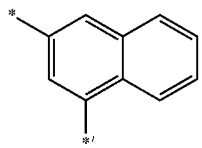

4-18

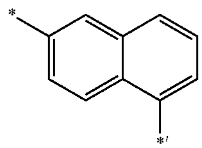

4-19

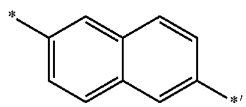

4-20

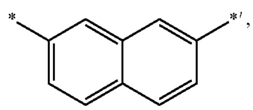

wherein, in Formulae 4-1 to 4-20,

"Ph" represents a phenyl group, and

* and *' each indicate a binding site to an adjacent atom.

7. The organic light-emitting device of claim 1, wherein a1, a11, a12, a21, a22, and a31 to a33 are each independently selected from 0 and 1; a23 and a34 are each independently selected from 0, 1, and 2; and a24, a25, a35, and a36 are each independently selected from 0 and 1.

8. The organic light-emitting device of claim 1, wherein $Ar_1$ is selected from a group represented by Formula 1-1, a group represented by Formula 1-2, a substituted or unsubstituted $C_6$-$C_{60}$ aryl group, a substituted or unsubstituted monovalent non-aromatic condensed polycyclic group, and a substituted or unsubstituted monovalent non-aromatic condensed heteropolycyclic group, wherein at least one $Ar_1$ is represented by Formula 1-1, Formula 1-2, or one of Formulae 5-10 to 5-13, $Ar_{11}$, $Ar_{12}$, $Ar_{21}$ to $Ar_{26}$, and $Ar_{31}$ to $Ar_{39}$ are each independently selected from a substituted or unsubstituted $C_1$-$C_{20}$ alkyl group, a substituted or unsubstituted $C_1$-$C_{20}$ alkoxy group, a substituted or unsubstituted $C_6$-$C_{60}$ aryl group, a substituted or unsubstituted monovalent non-aromatic condensed polycyclic group, and a substituted or unsubstituted monovalent non-aromatic condensed heteropolycyclic group, and $Ar_{27}$ is a substituted or unsubstituted $C_6$-$C_{60}$ aryl group.

9. The organic light-emitting device of claim 1, wherein $Ar_1$ is selected from the group consisting of:

a group represented by Formula 1-1, a group represented by Formula 1-2, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and —$Si(Q_{31})(Q_{32})(Q_{33})$, wherein at least one $Ar_1$ is represented by Formula 1-1, Formula 1-2, or one of Formulae 5-10 to 5-13, $Ar_{11}$, $Ar_{12}$, $Ar_{21}$ to $Ar_{26}$, and $Ar_{31}$ to $Ar_{39}$ are each independently selected from the group consisting of:

a $C_1$-$C_{20}$ alkyl group and a $C_1$-$C_{20}$ alkoxy group;

a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and —Si($Q_{31}$)($Q_{32}$)($Q_{33}$), and $Ar_{27}$ is selected from the group consisting of:

a phenyl group, a biphenyl group, a terphenyl group, a naphthyl group, a phenanthrenyl group, an anthracenyl group, a triphenylenyl group, a pyrenyl group, and a chrysenyl group; and a phenyl group, a biphenyl group, a terphenyl group, a naphthyl group, a phenanthrenyl group, an anthracenyl group, a triphenylenyl group, a pyrenyl group, and a chrysenyl group, each substituted with at least one selected from deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, and —Si($Q_{31}$)($Q_{32}$)($Q_{33}$), wherein $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, and a naphthyl group.

10. The organic light-emitting device of claim 1, wherein a group represented by Formula 1-1 is selected from groups represented by Formulae 1-1(1) to 1-1(3); and a group represented by Formula 1-2 is selected from groups represented by Formulae 1-2(1) and 1-2(2):

1-1(1)

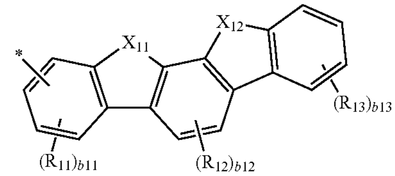

1-1(2)

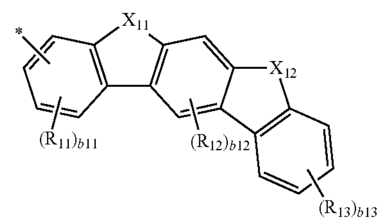

1-1(3)

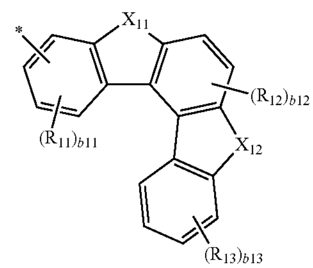

1-2(1)

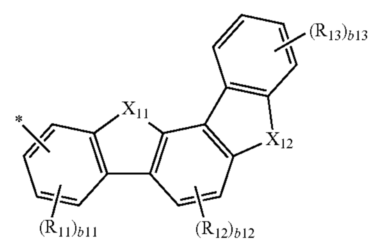

1-2(2)

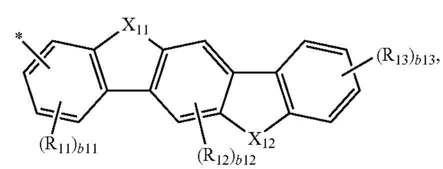

wherein, in Formulae 1-1(1) to 1-1(3), 1-2(1), and 1-2(2), b11 is an integer selected from 0 to 3; b12 is an integer selected from 0 to 2; b13is an integer selected from 0 to 4; and * indicates a binding site to an adjacent atom.

11. The organic light-emitting device of claim 1, wherein $R_1$, $R_{11}$ to $R_{13}$, $R_{21}$ to $R_{24}$, and $R_{31}$ to $R_{36}$ are each independently selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group;

a substituted or unsubstituted $C_6$-$C_{60}$ aryl group, a substituted or unsubstituted monovalent non-aromatic condensed polycyclic group, and a substituted or unsubstituted monovalent non-aromatic condensed heteropolycyclic group; and —Si($Q_1$)($Q_2$)($Q_3$), wherin $Q_1$ to $Q_3$ are each independently selected from a $C_1$-$C_{10}$ alkyl group, a $C_1$-$C_{10}$ alkoxy group, a phenyl group, a biphenyl group, a terphenyl group, and a naphthyl group.

12. The organic light-emitting device of claim 1, wherein $R_1$, $R_{11}$ to $R_{13}$, $R_{21}$ to $R_{24}$, and $R_{31}$ to $R_{36}$ are each independently selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, and —Si($Q_1$)($Q_2$)($Q_3$);

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a naphthacenyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a naphthacenyl group, a carbazolyl group, a benzofuranyl group, a benzothiophenyl group, a dibenzofuranyl group, a dibenzothiophenyl group, a benzocarbazolyl group, a dibenzocarbazolyl group, and a dibenzosilolyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, and a naphthyl group, wherin $Q_1$ to $Q_3$ are each independently selected from a $C_1$-$C_{10}$ alkyl group, a $C_{10}$-$C_{10}$ alkoxy group, a phenyl group, a biphenyl group, a terphenyl group, and a naphthyl group.

13. The organic light-emitting device of claim 1, wherein $Ar_1$ is selected from a group represented by Formula 1-1, a group represented by Formula 1-2, and a group represented by any of Formulae 5-1 to 5-13, wherein at least one $Ar_1$ is represented by Formula 1-1, Formula 1-2, or one of Formulae 5-10 to 5-13, $Ar_{11}$, $Ar_{12}$, $Ar_{21}$ to $Ar_{26}$, and $Ar_{31}$ to $Ar_{39}$ are each independently selected from a $C_1$-$C_{20}$ alkyl group, a $C_1$-$C_{20}$ alkoxy group, and a group represented by any of Formulae 5-1 to 5-13, $Ar_{27}$ is selected from groups represented by Formulae 5-1 to 5-9, and $R_1$, $R_{11}$ to $R_{13}$, $R_{21}$ to $R_{24}$, and $R_{31}$ to $R_{36}$ are each independently selected from the group consisting of:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, and a $C_1$-$C_{20}$ alkoxy group; and a group represented by any of Formulae 5-1 to 5-13:

5-1

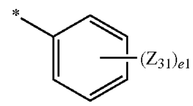

5-2

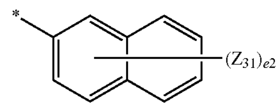

5-3

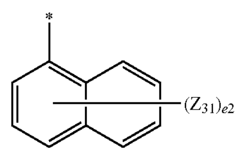

5-4

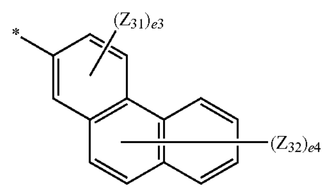

5-5

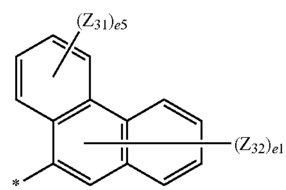

5-6

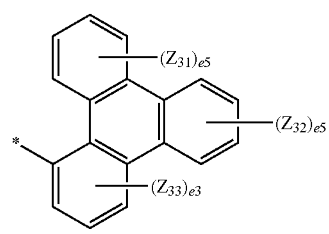

5-7

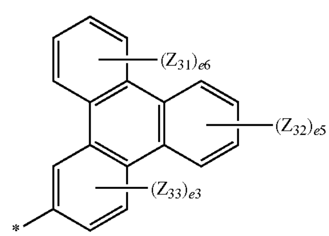

5-8

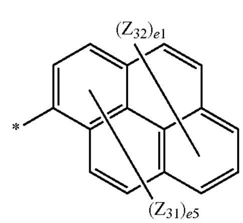

-continued 5-9

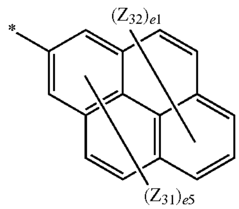

5-10

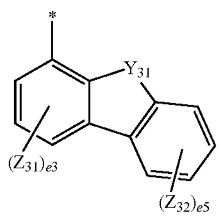

5-11

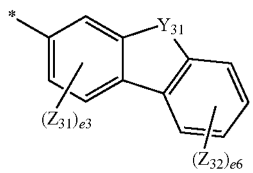

5-12

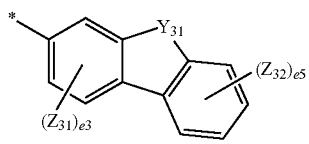

5-13

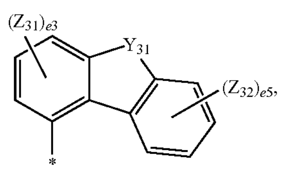

wherein, in Formulae 5-1 to 5-13, $Y_{31}$ is selected from $C(Z_{34})(Z_{35})$, O, and S, and $Z_{31}$ to $Z_{35}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, and —$Si(Q_{31})(Q_{32})(Q_{33})$, wherein $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, and a naphthyl group, e1 is an integer selected from 1 to 5, e2 is an integer selected from 1 to 7, e3 is an integer selected from 1 to 3, e4 is an integer selected from 1 to 6, e5 is an integer selected from 1 to 4, and * indicates a binding site to an adjacent atom.

14. The organic light-emitting device of claim 1, wherein the first compound is represented by Formula 1A:

Formula 1A

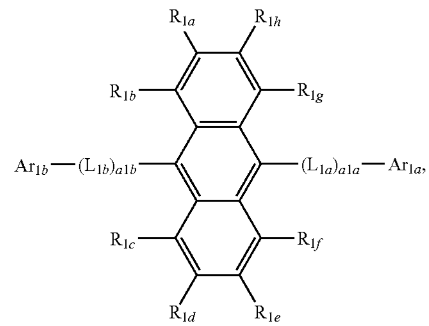

wherein, in Formula 1A, descriptions of $L_{1a}$ and $L_{1b}$ are each independently the same as the description provided in connection with $L_1$, descriptions of a1 a and a1 b are each independently the same as the description provided in connection with a1, descriptions of $Ar_{1a}$ and $Ar_{1b}$ are each independently the same as the description provided in connection with $Ar_1$, and descriptions of $R_{1a}$ to $R_{1h}$ are each independently the same as the description provided in connection with $R_1$.

15. The organic light-emitting device of claim 1, wherein the second compound is represented by one of Formulae 2A to 2E and 3A to 3D:

Formula 2A

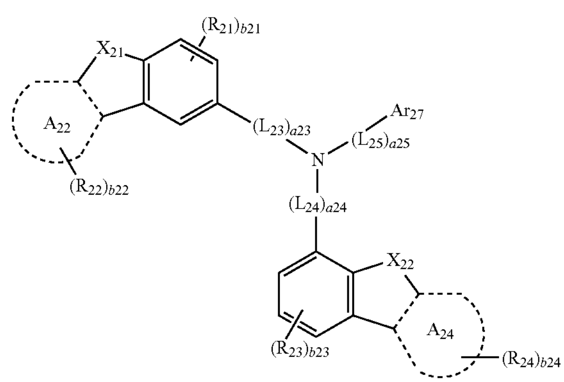

Formula 2B

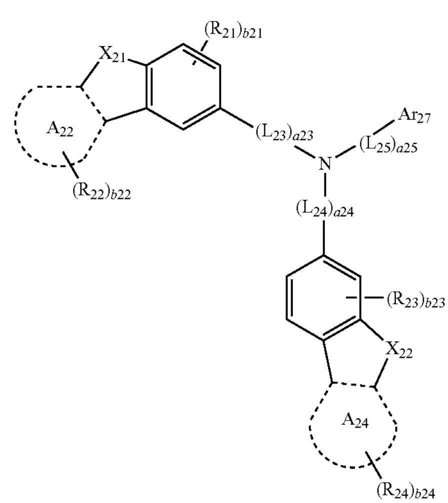

-continued
Formula 2C
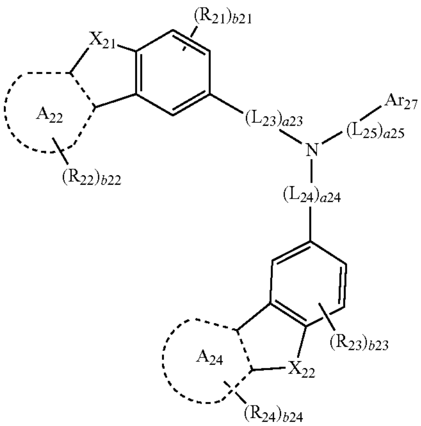
Formula 2D
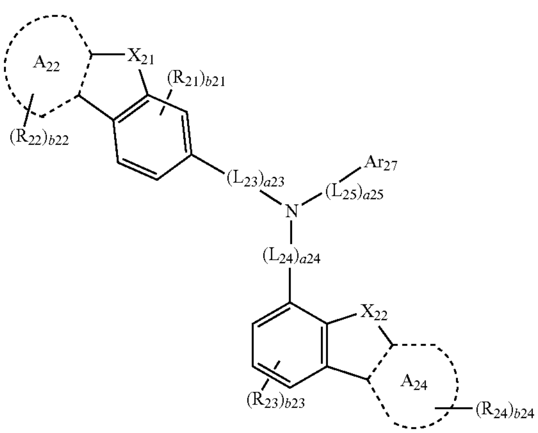
Formula 2E
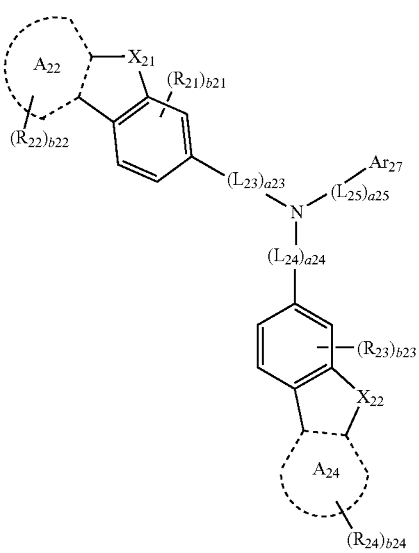
-continued
Formula 3A
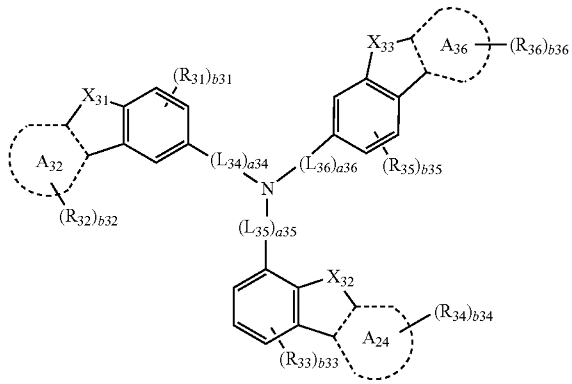
Formula 3B
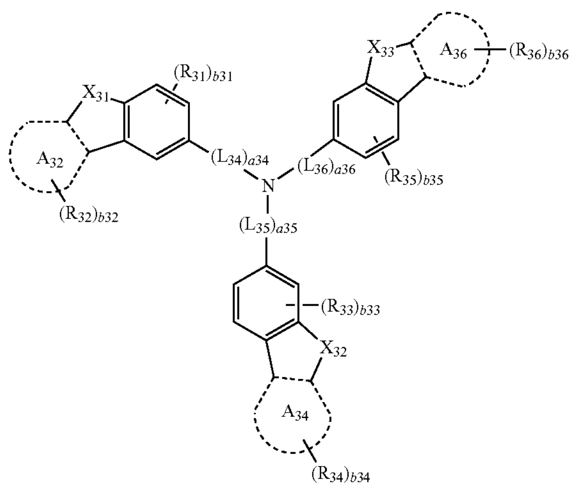
Formula 3C
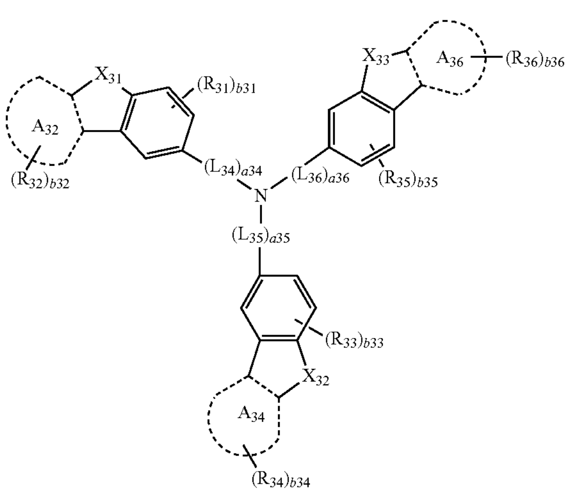

-continued
Formula 3D
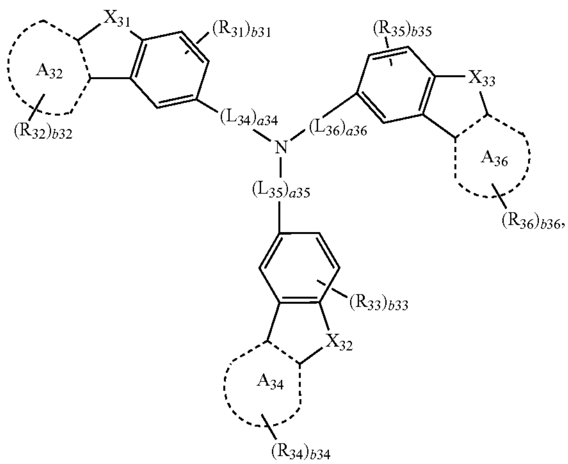
wherein, in Formulae 2A to 2E and 3A to 3D,
b21, b23, b31, b33, and b35 are each independently an integer selected from 0 to 3.
16. The organic light-emitting device of claim 1, wherein the first compound is selected from the group consisting of Compounds H4, H13 to H34 and H44 to H49; and the second compound is selected from the group consisting of Compounds A1 to A83, B1 to B74, C1 to C15, and D1 to D65:
H4
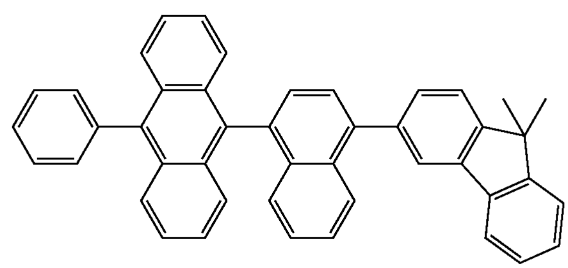
H13
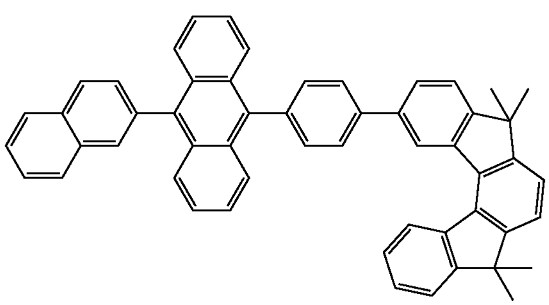
H14
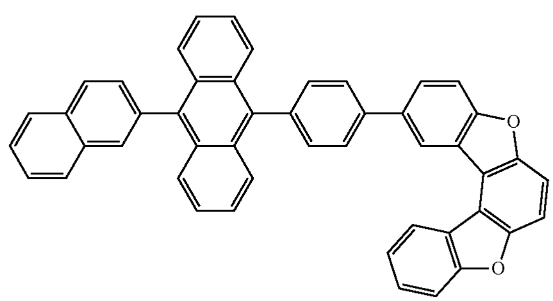
H15
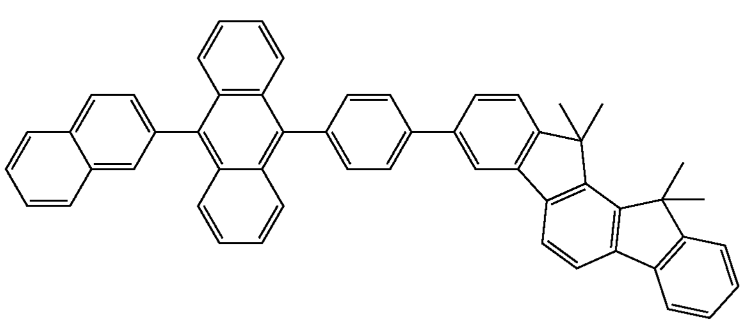

-continued
H16
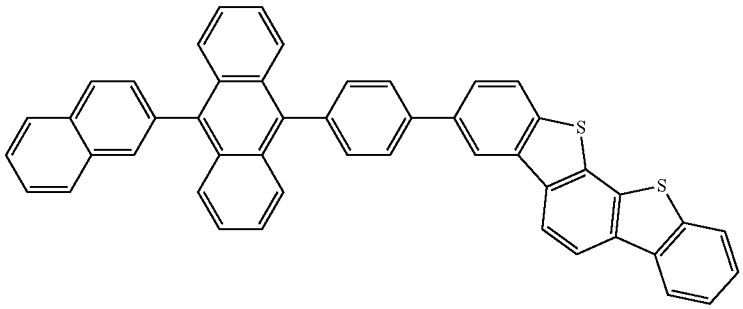
H17
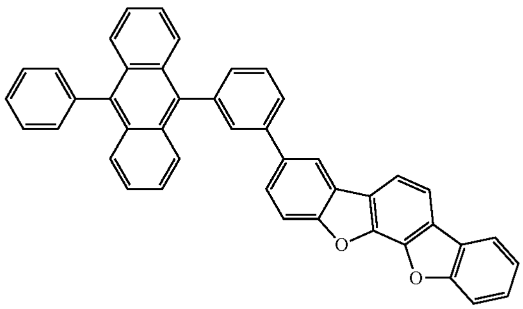
H18
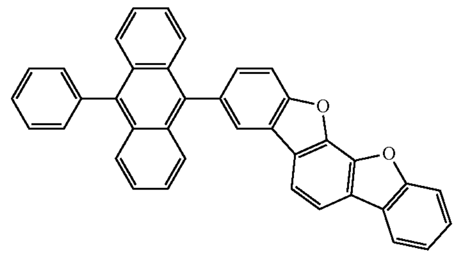
H19
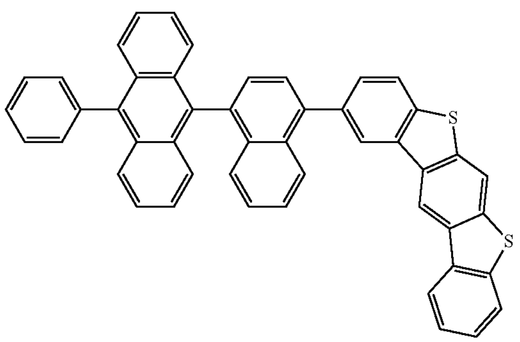
H20
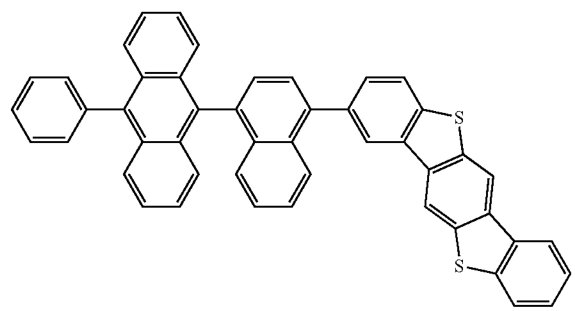
H21
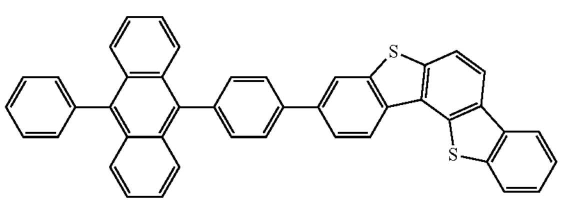
H22
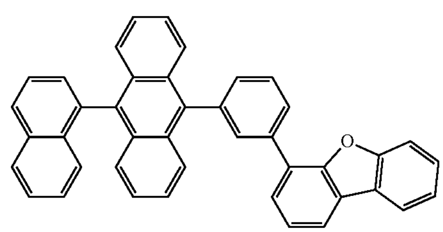
H23
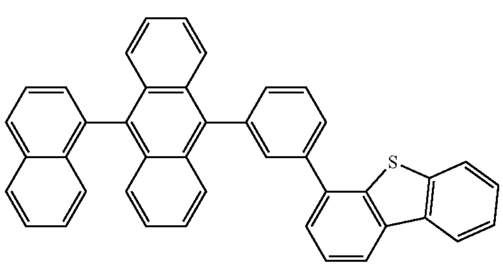
H24
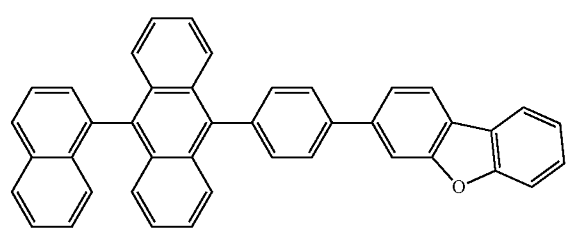

-continued
H25
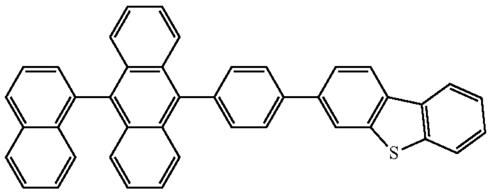
H26
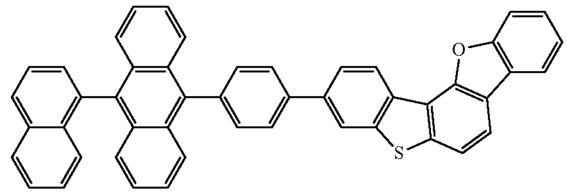
H27
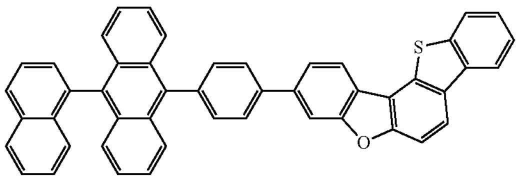
H28
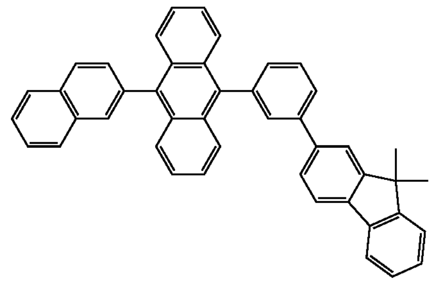
H29
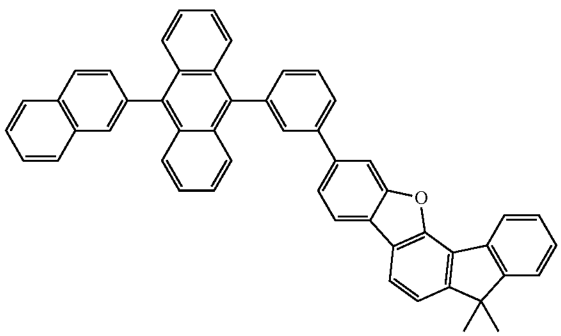
H30
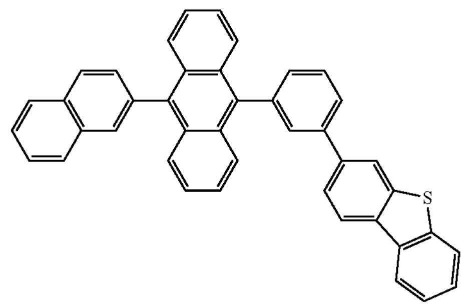
H31
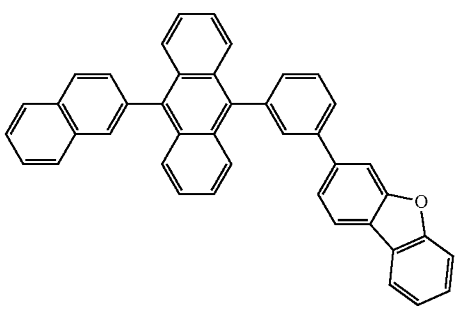
H32
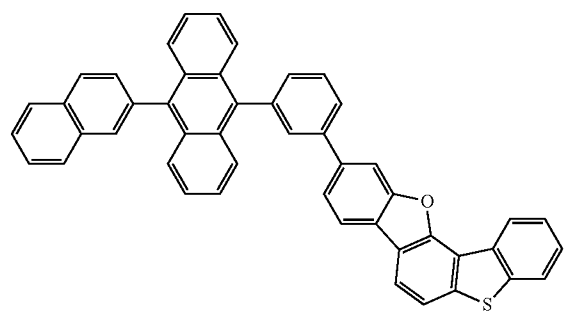
H33
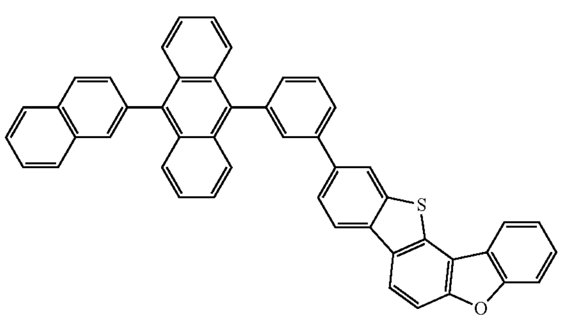
H34
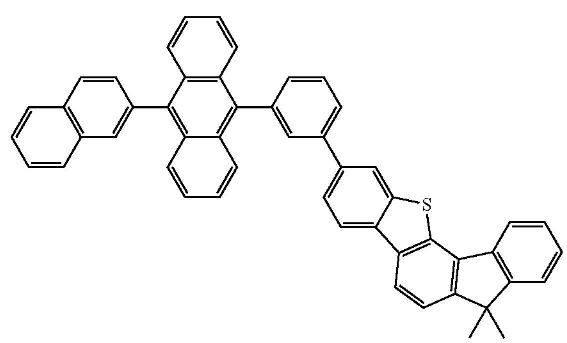

-continued
H44
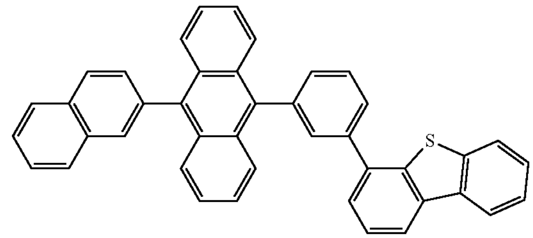
H45
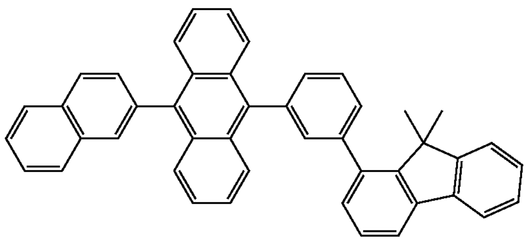
H46
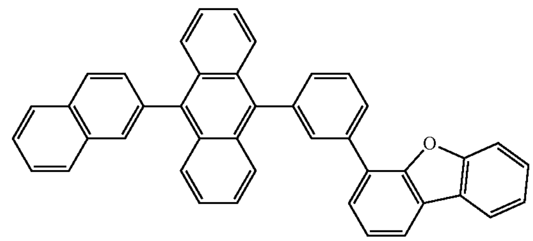
H47
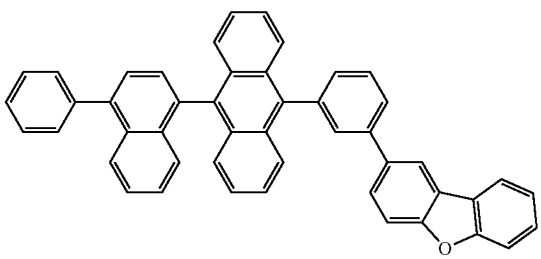
H48
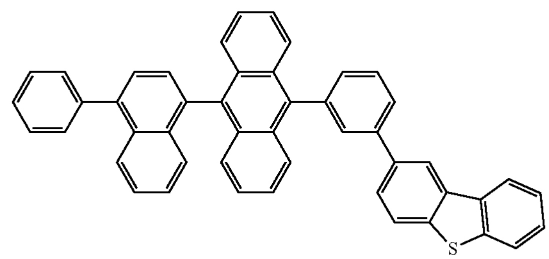
H49
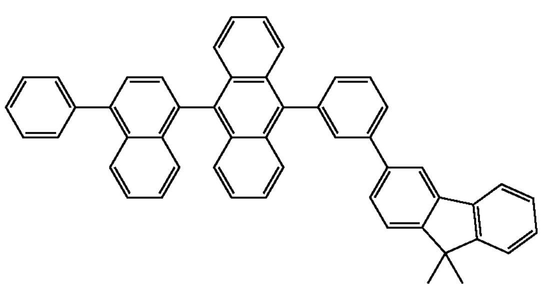
A1
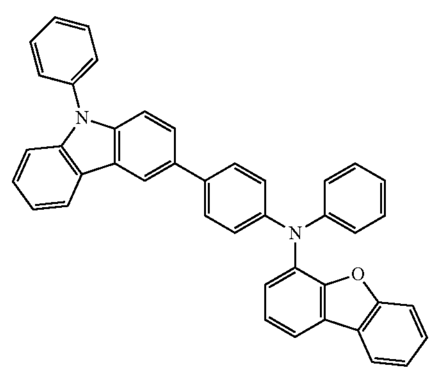

-continued
A2
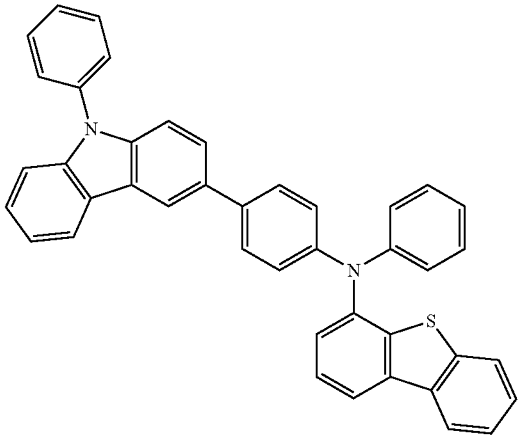
A3
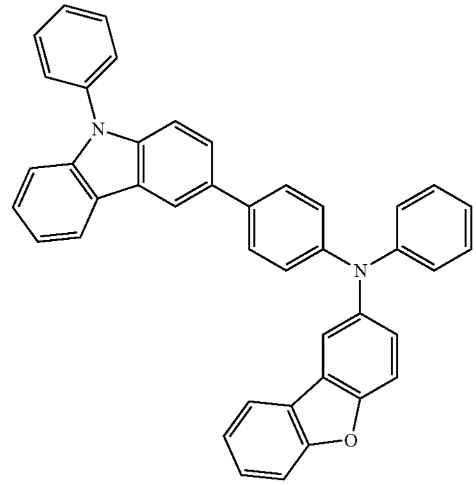
A4
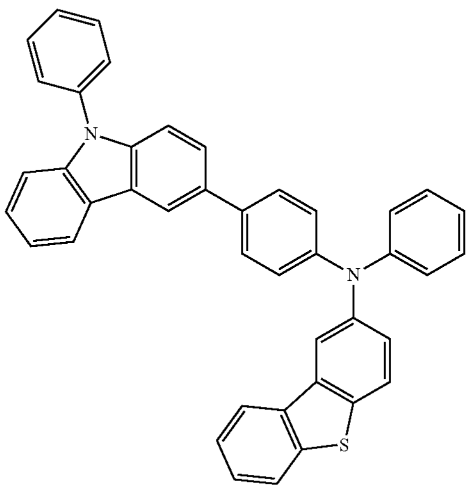
A5
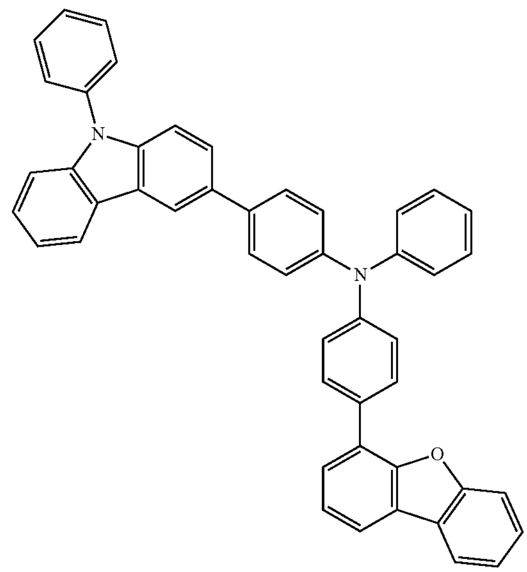
A6
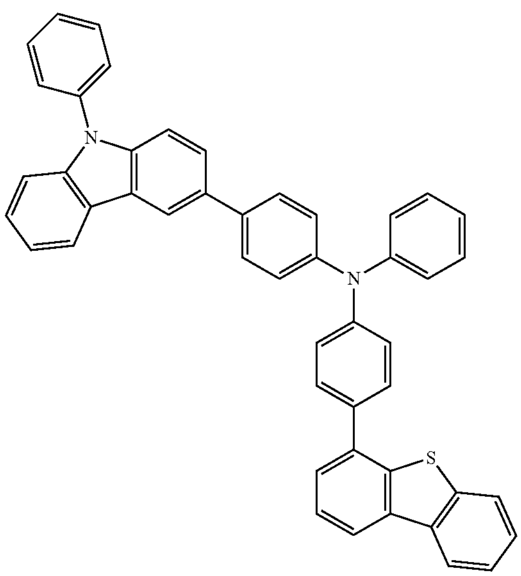
A7
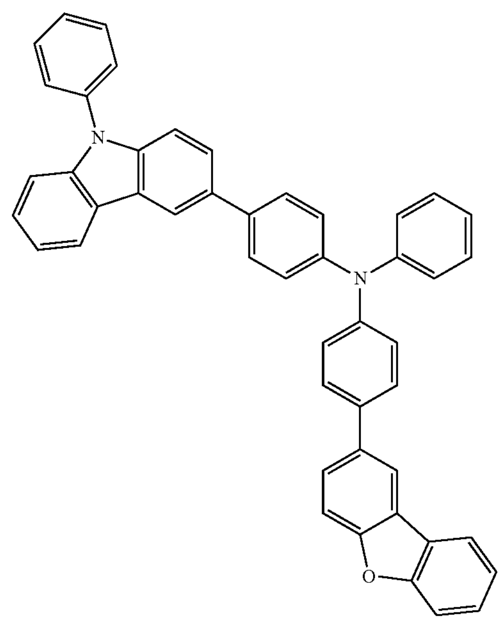

-continued
A8
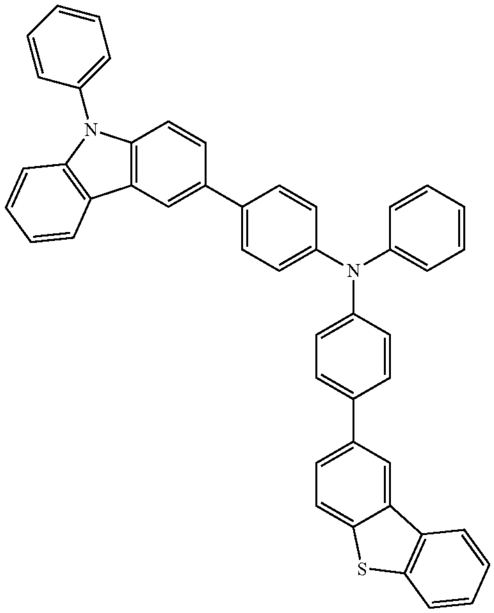
A9
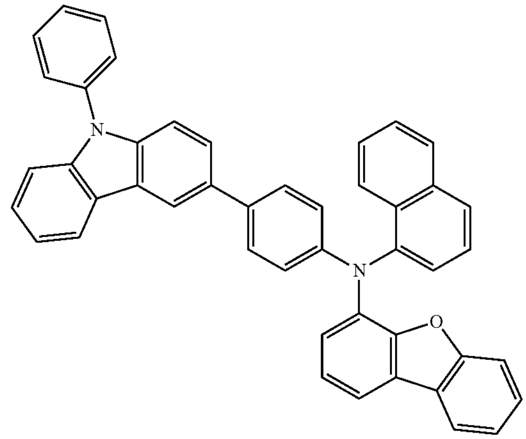
A10
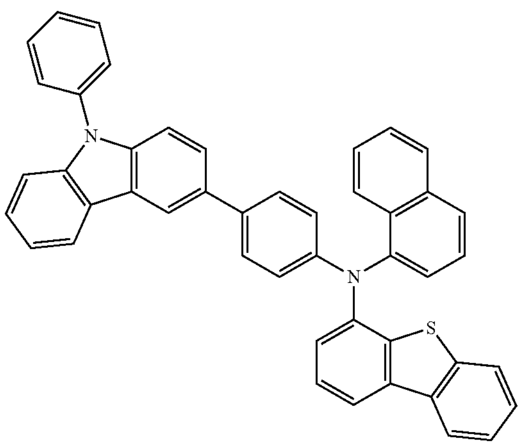
A11
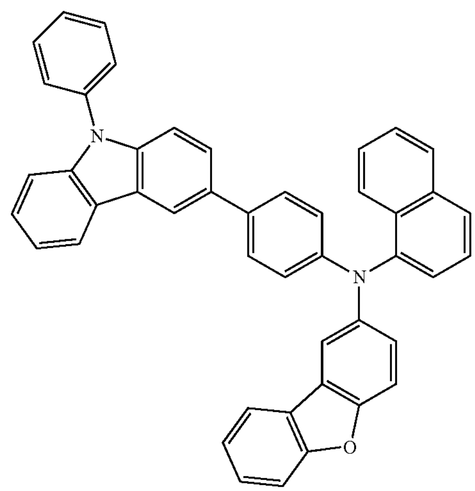
A12
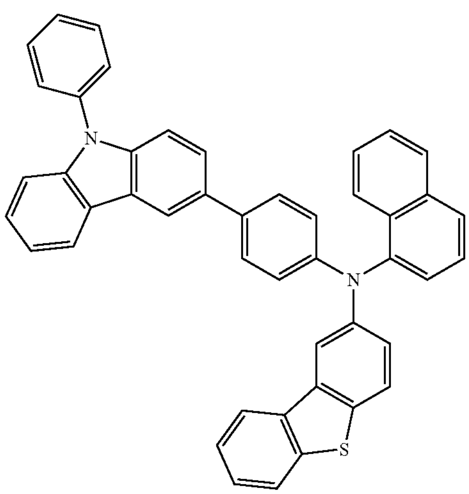
A13
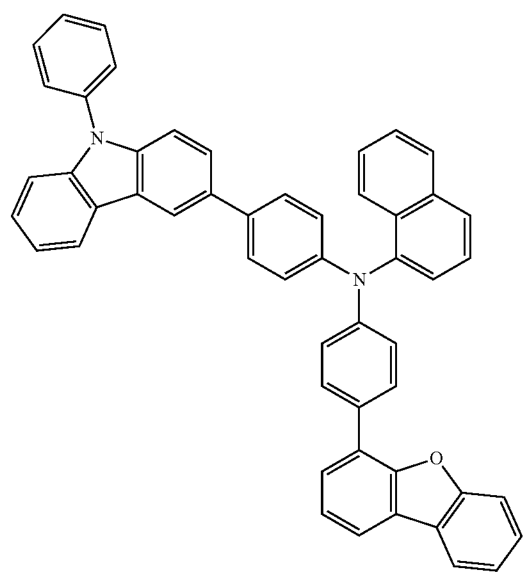

-continued
A14
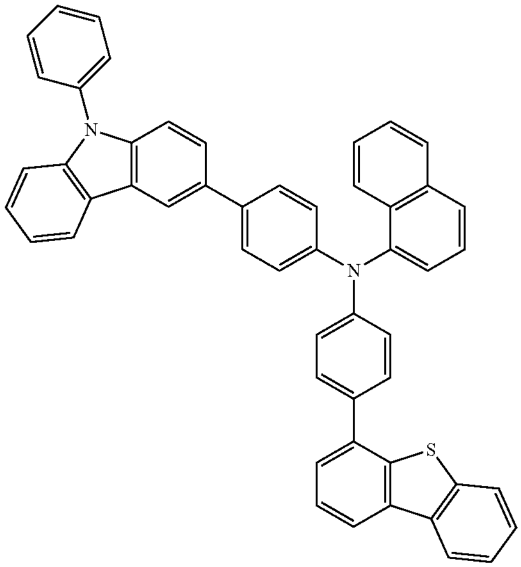
A15
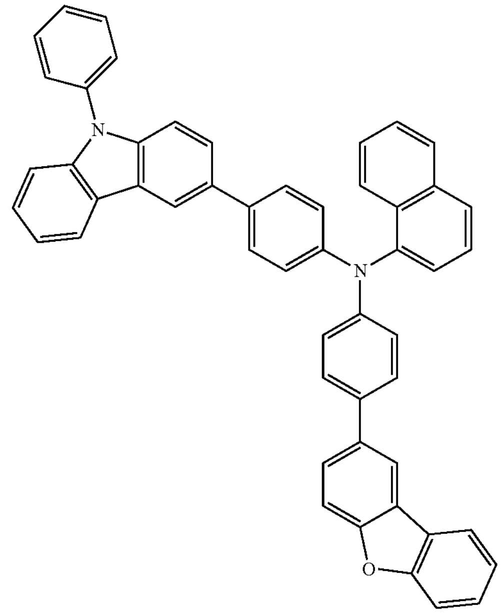
A16
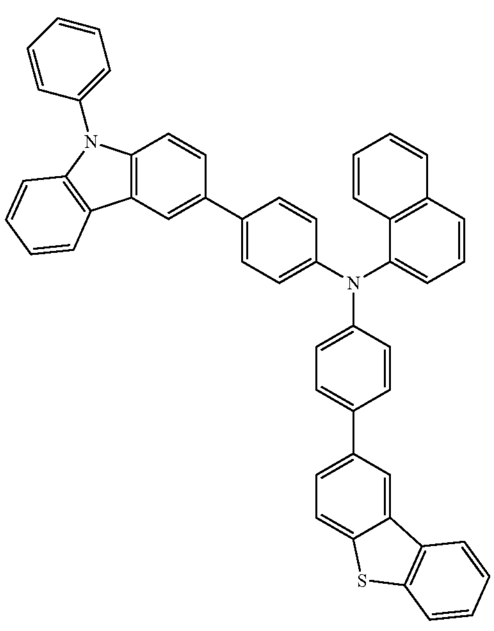
A17
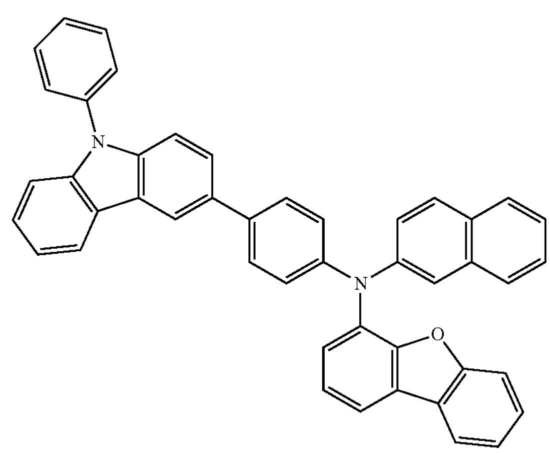

-continued
A18
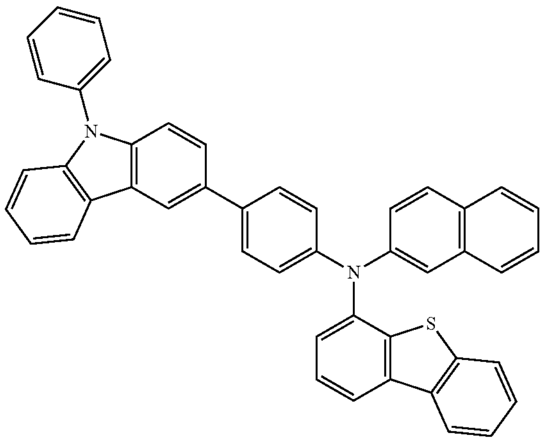
A19
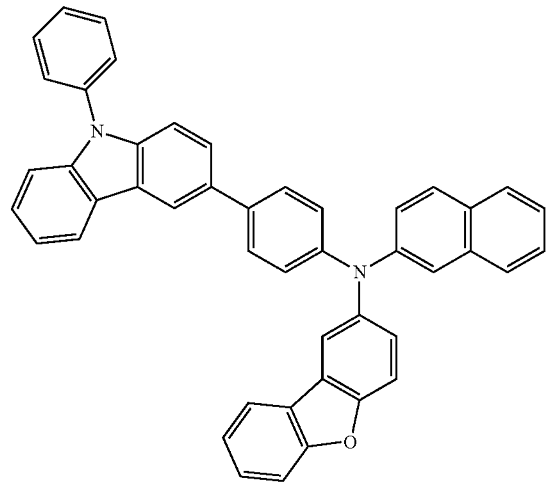
A20
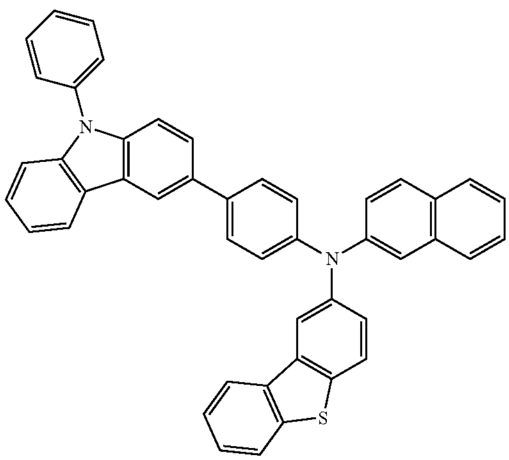
A21
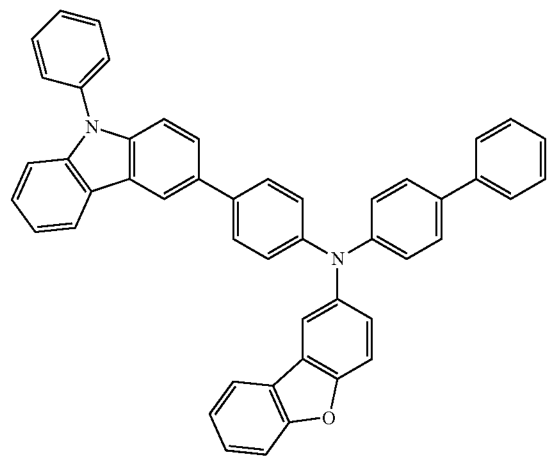
A22
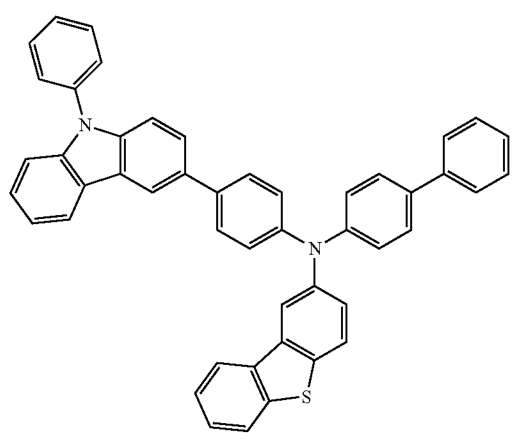
A23
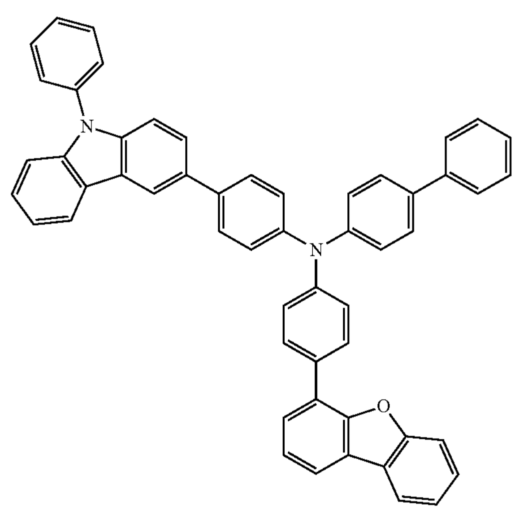

-continued
A24
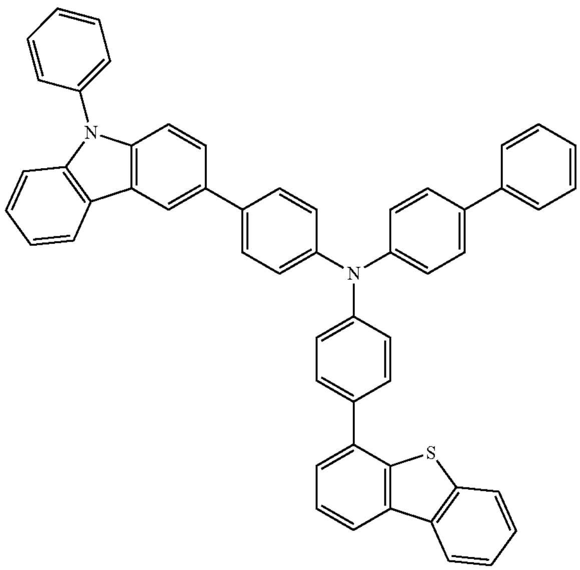
A25
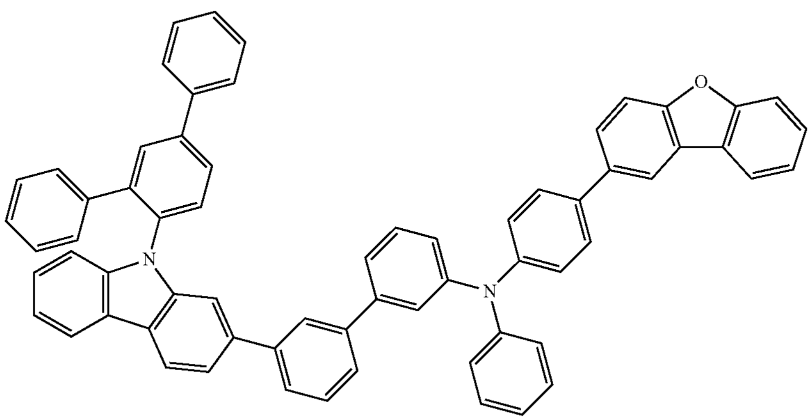
A26
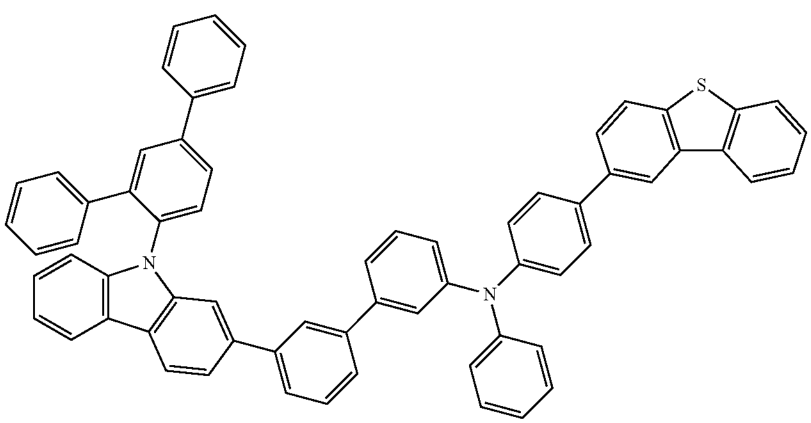

-continued
A27
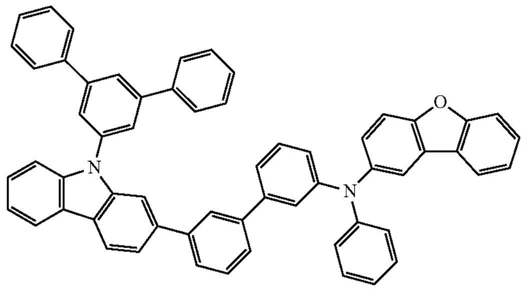
A28
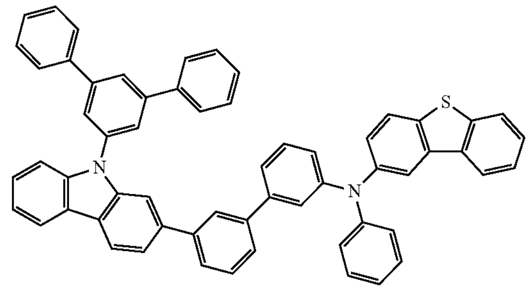
A29
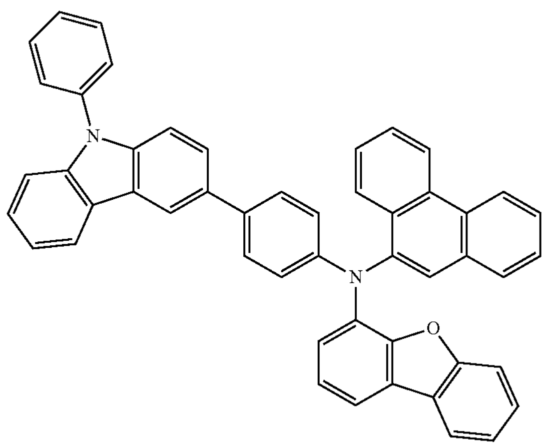
A30
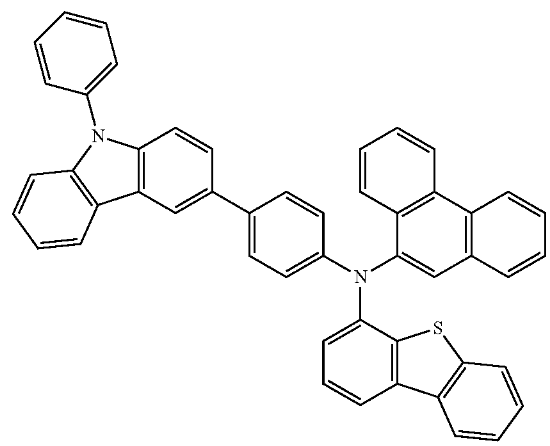
A31
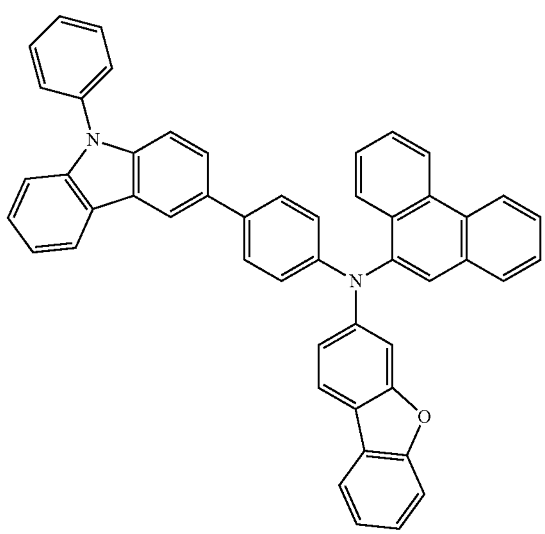
A32
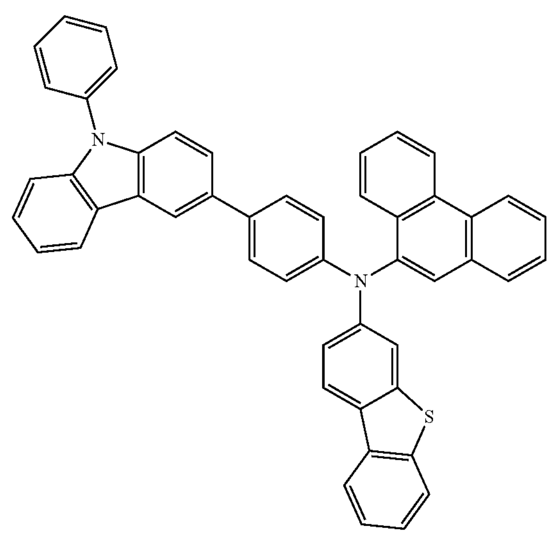

-continued
A33
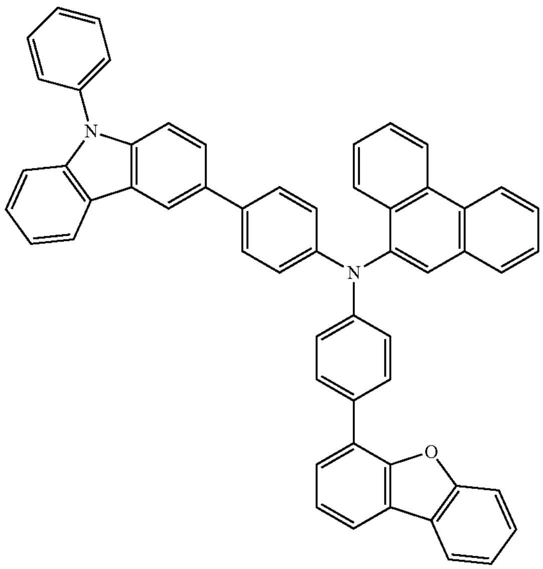
A34
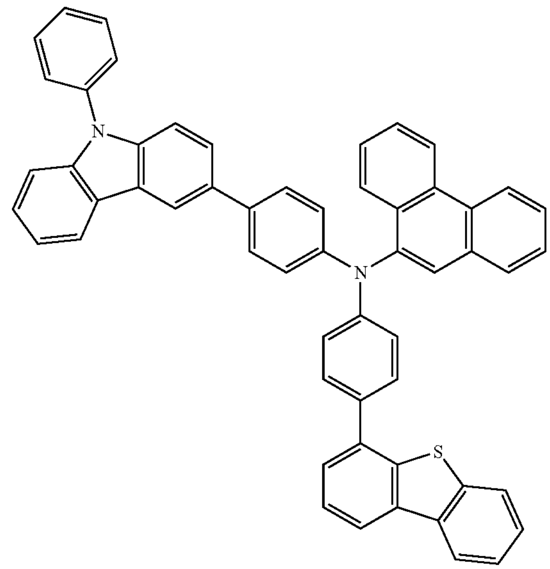
A35
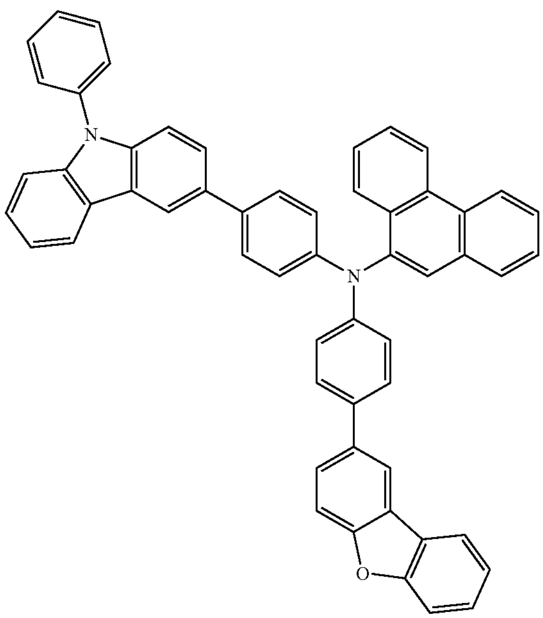
A36
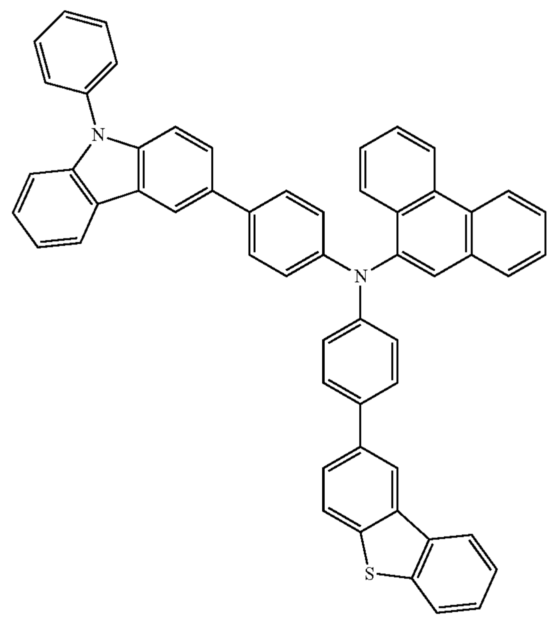
A37
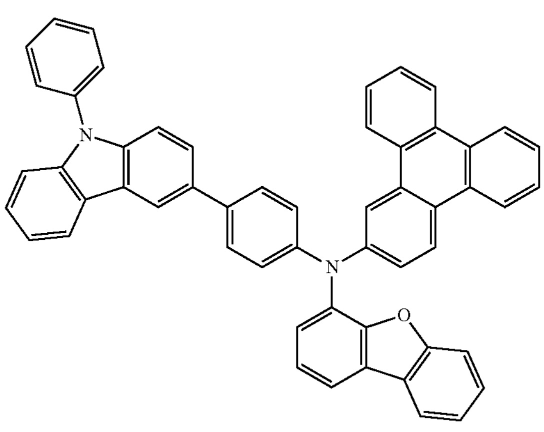
A38
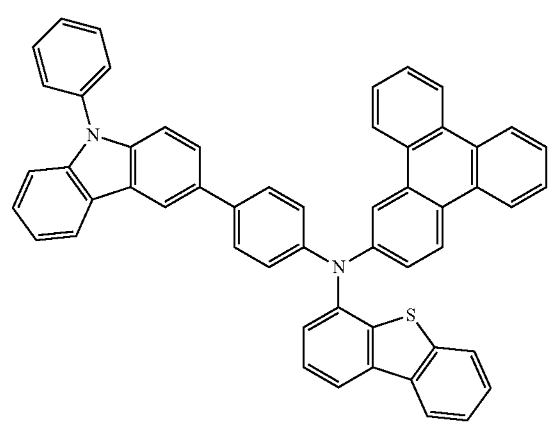

-continued
A39
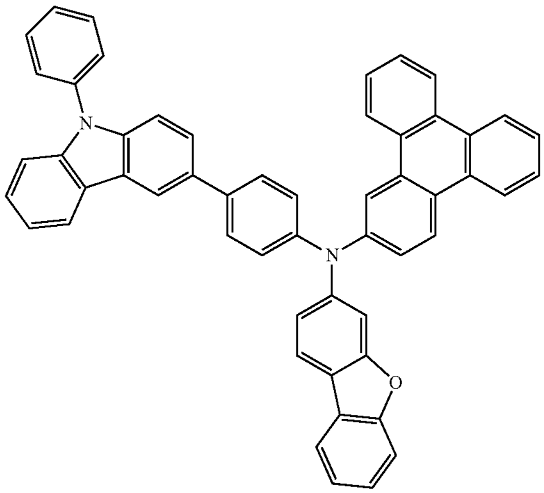
A40
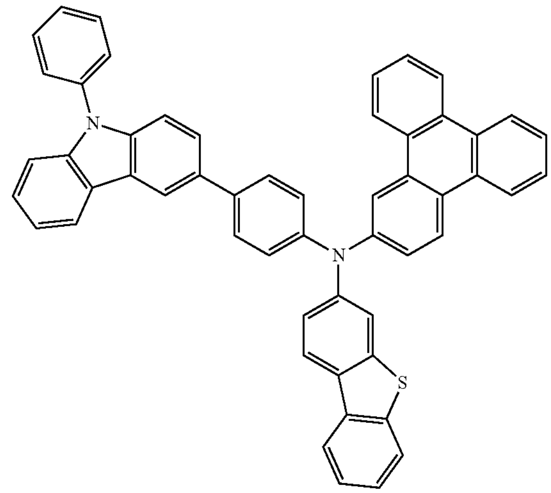
A41
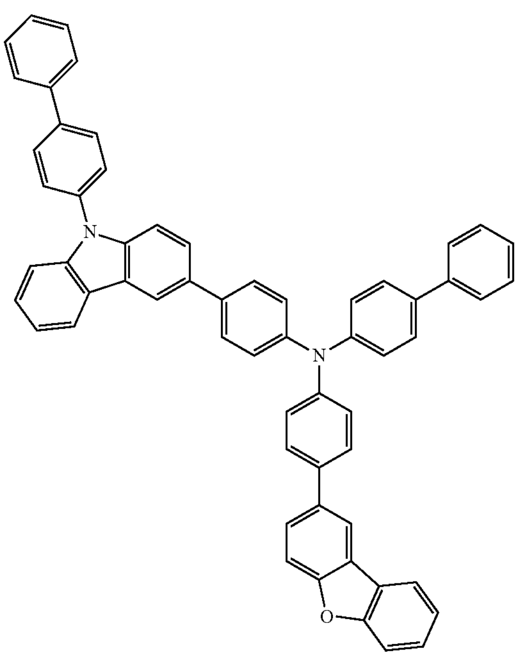
A42
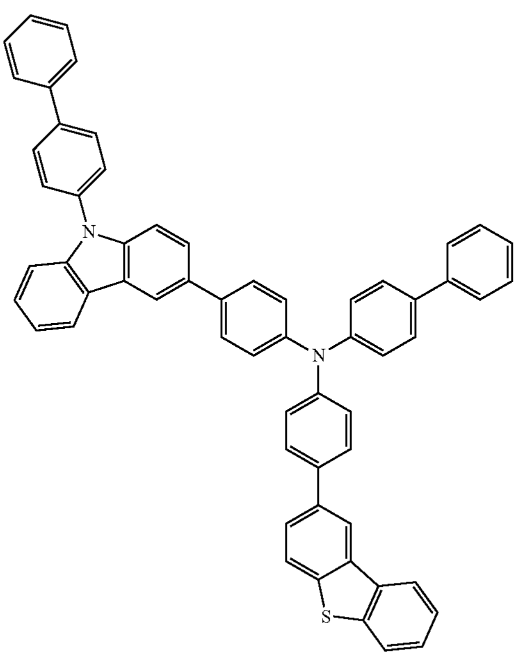

-continued
A43
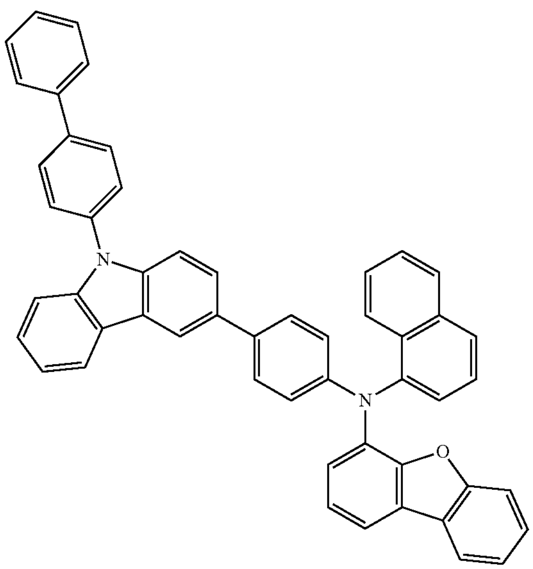
A44
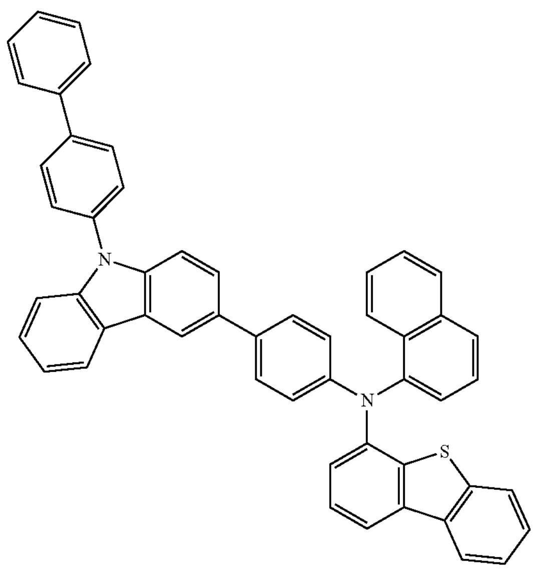
A45
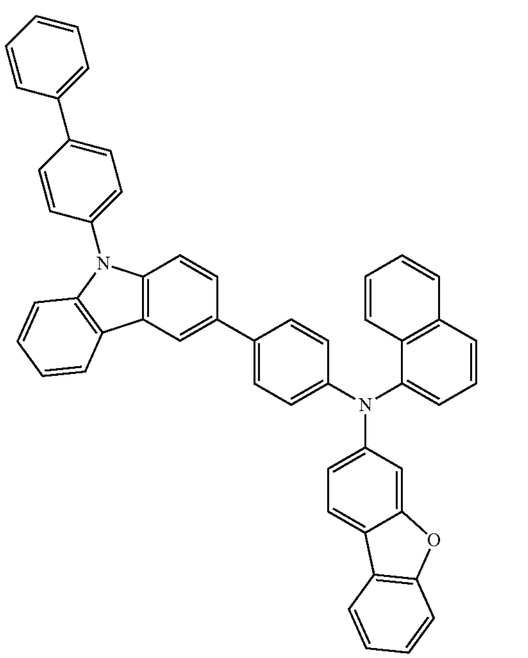
A46
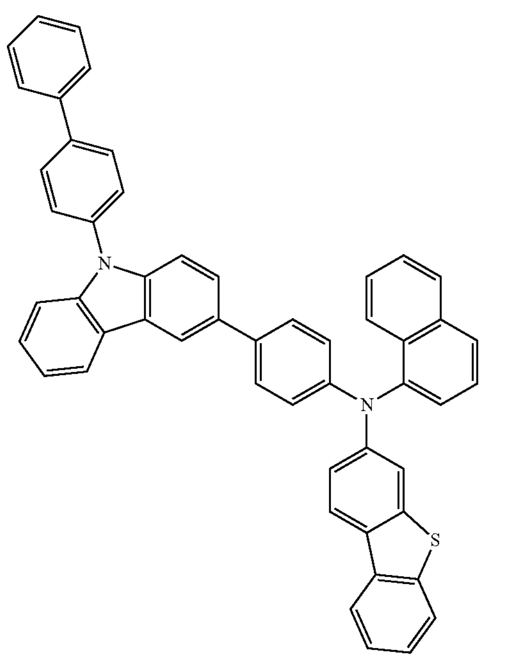

-continued
A47
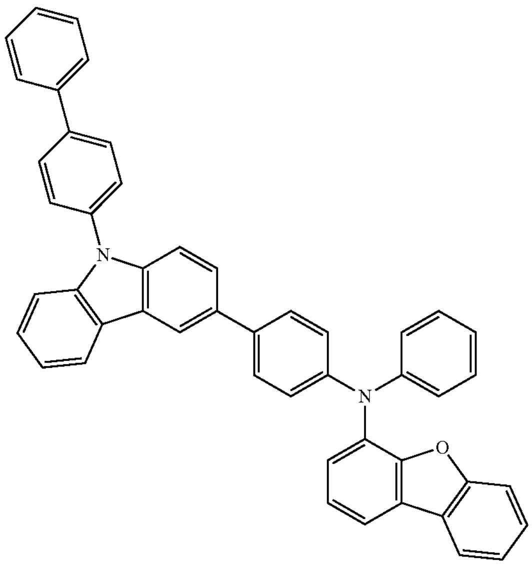
A48
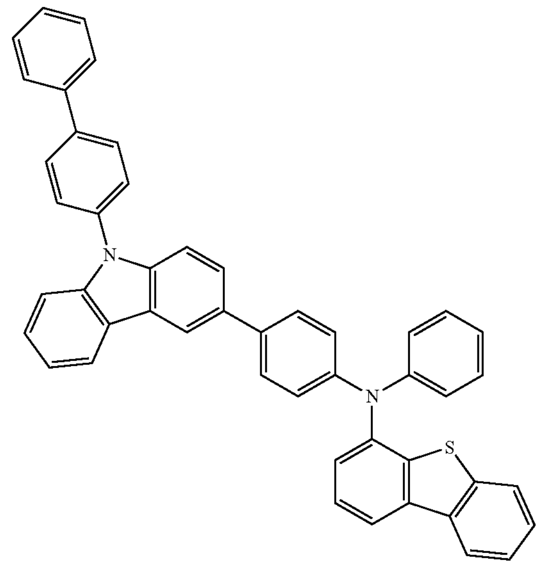
A49
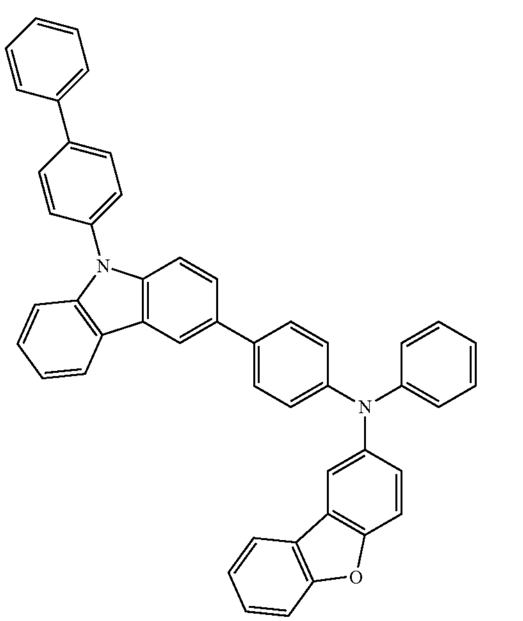
A50
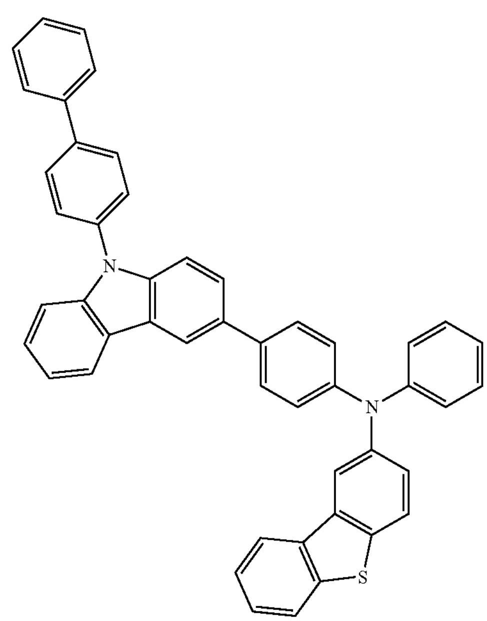

-continued
A51
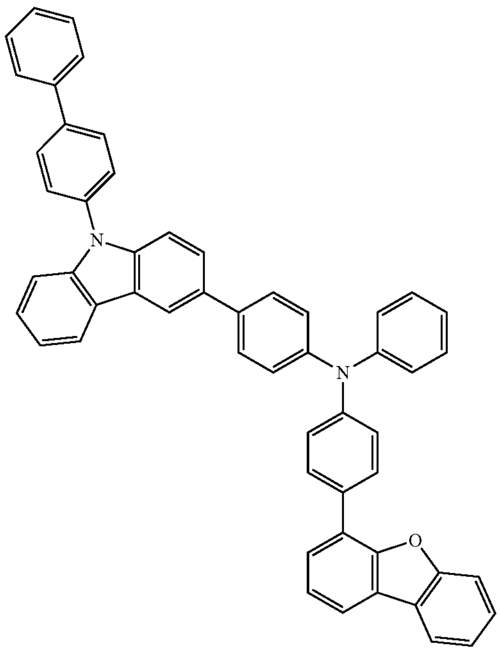
A52
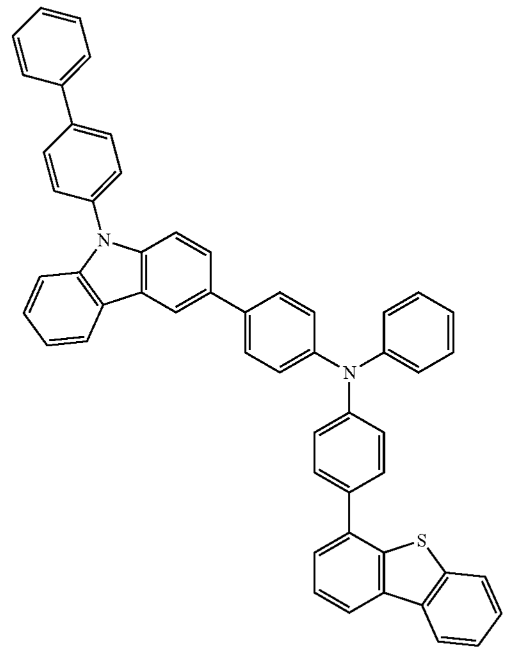
A53
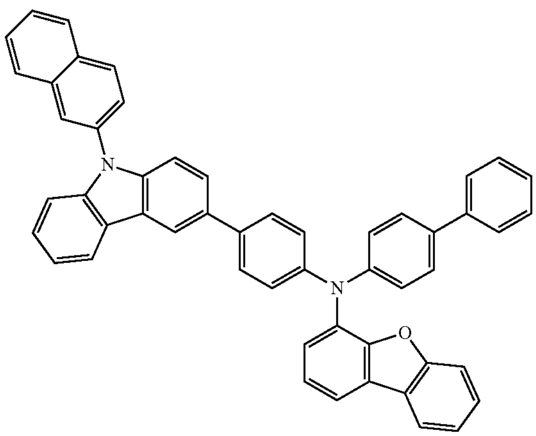
A54
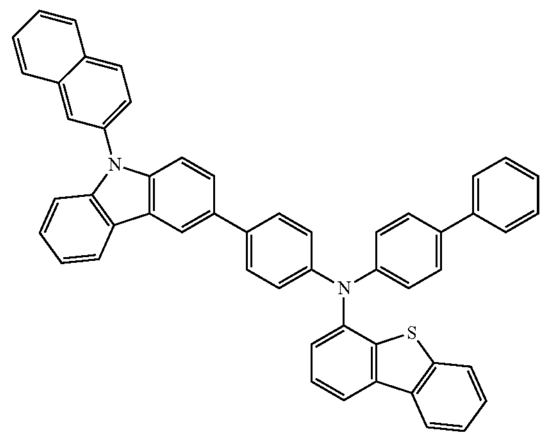
A55
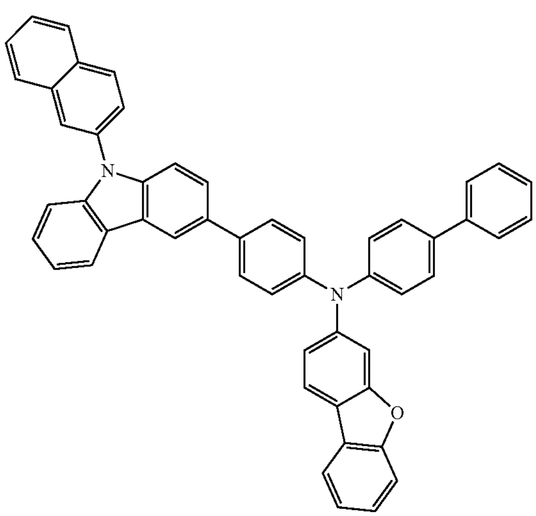
A56
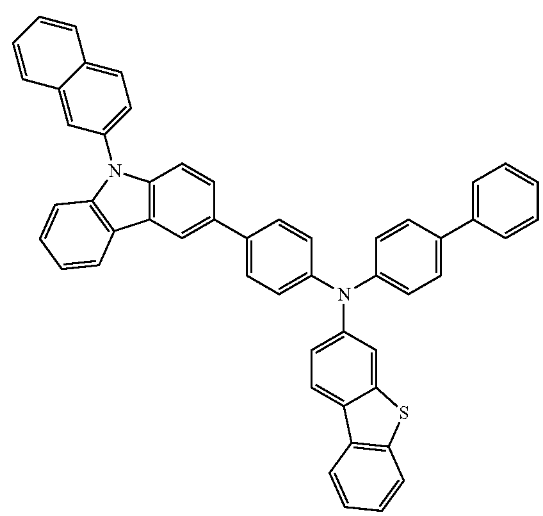

-continued
A57
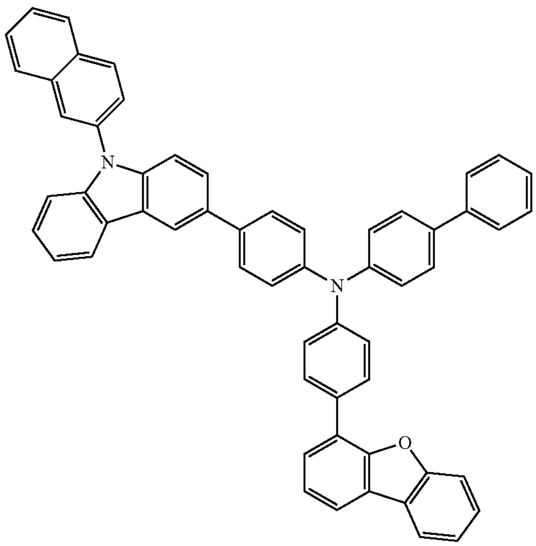
A58
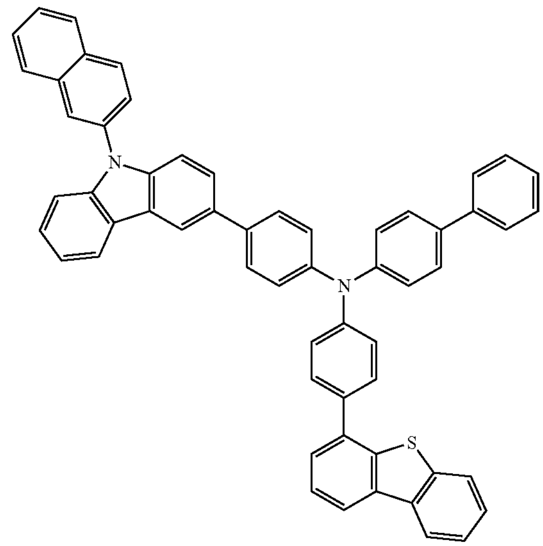
A59
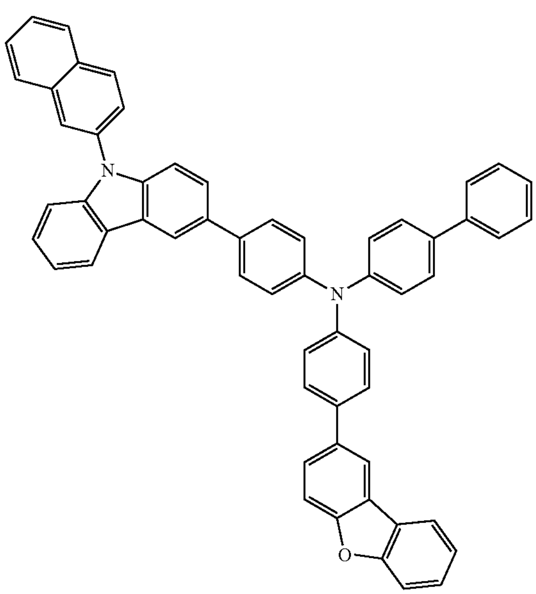
A60
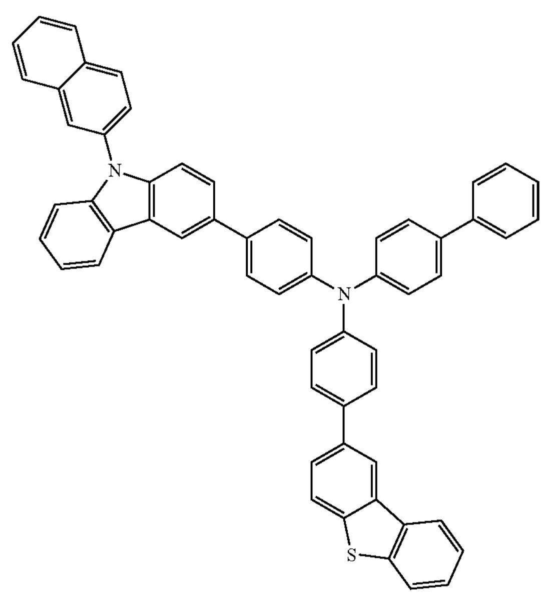

-continued
A61
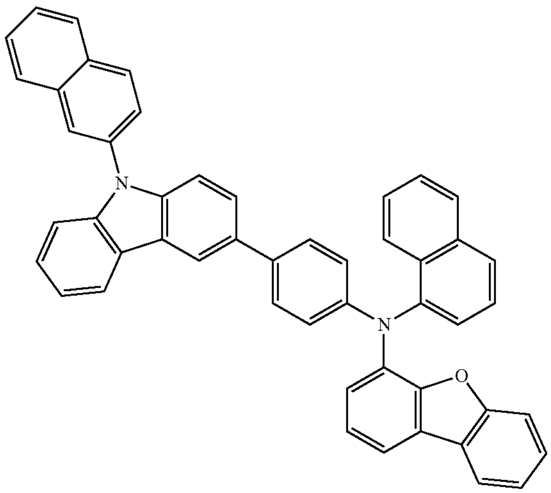
A62
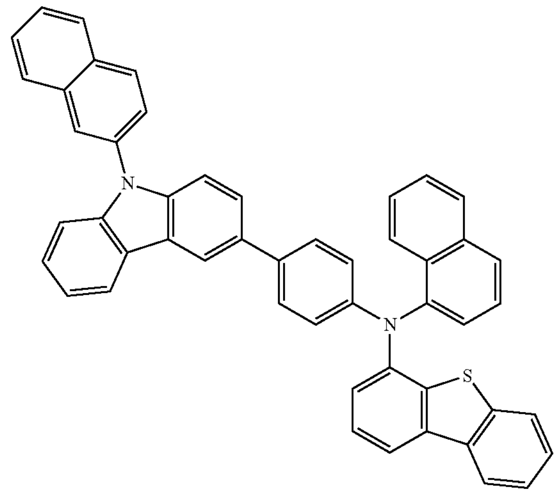
A63
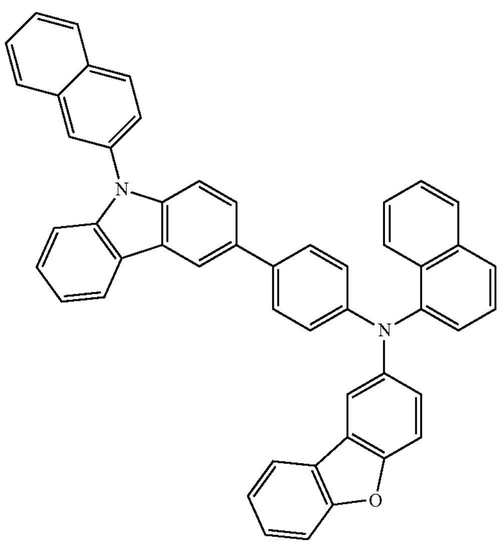
A64
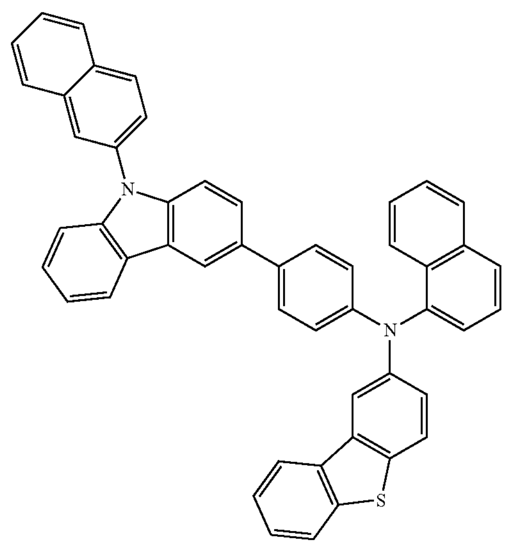
A65
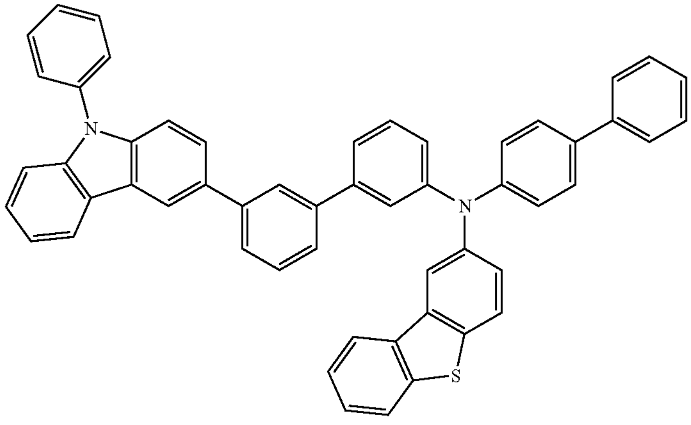

-continued
A66
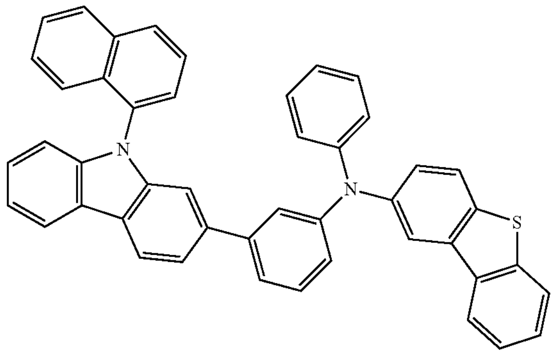
A67
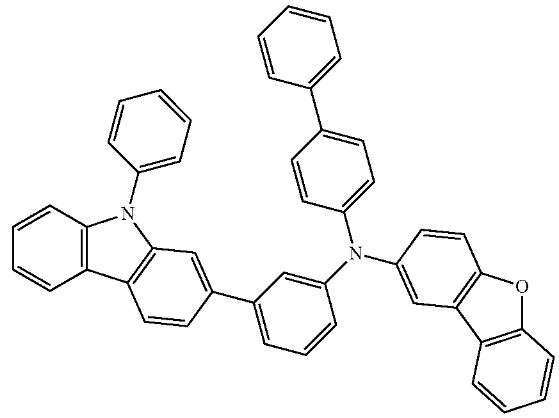
A68
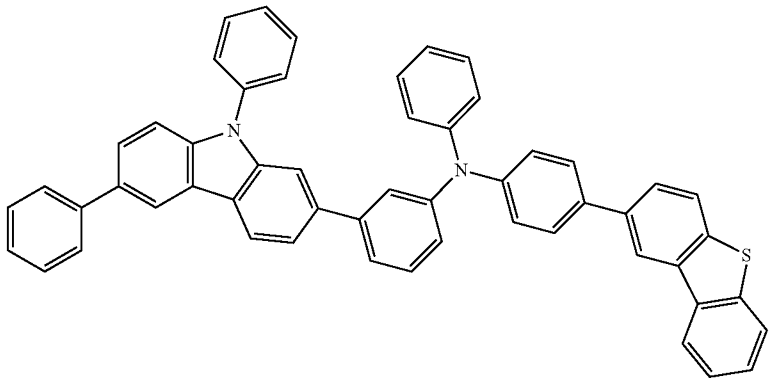
A69
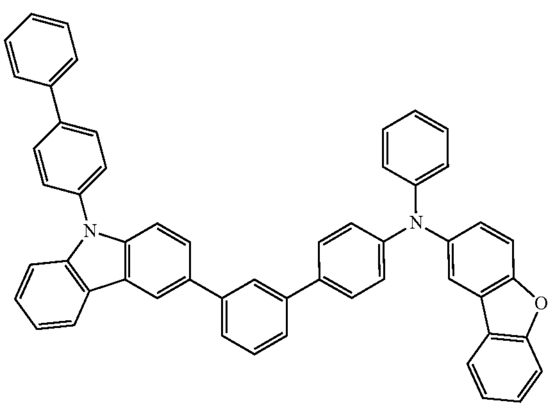
A70
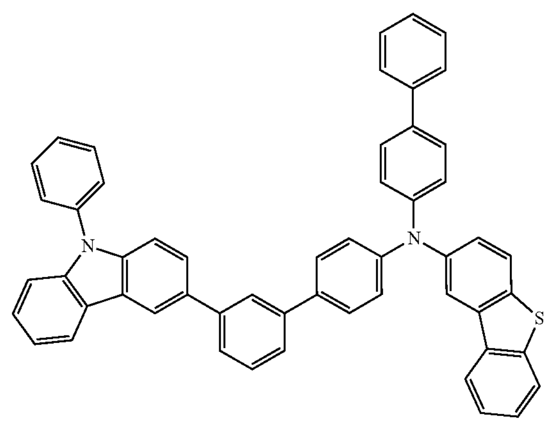
A71
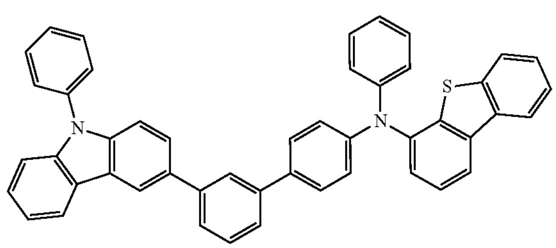
A72
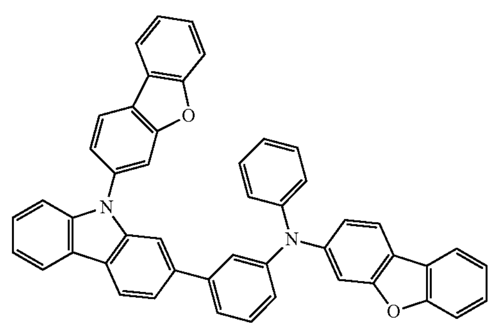

-continued
A73
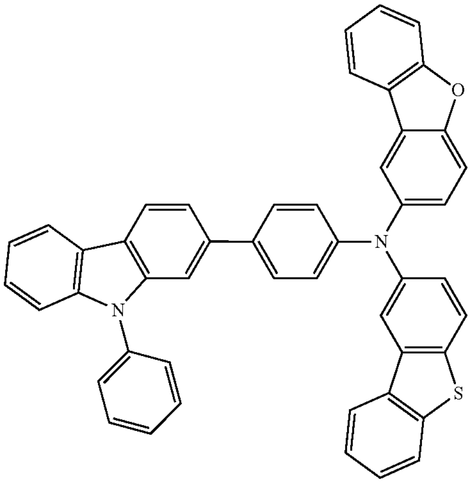
A74
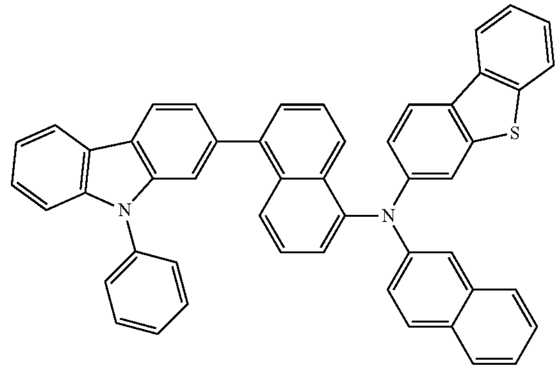
A75
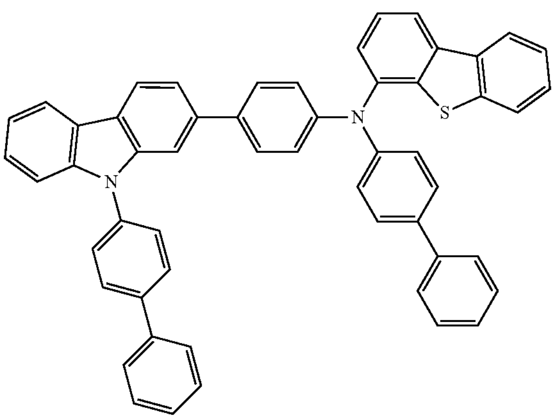
A76
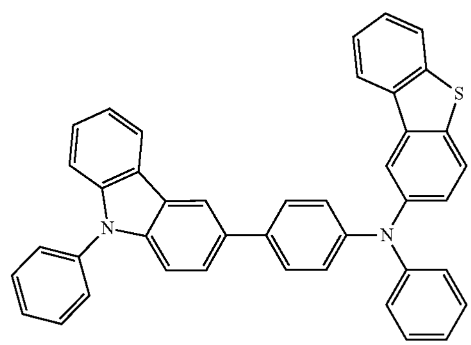
A77
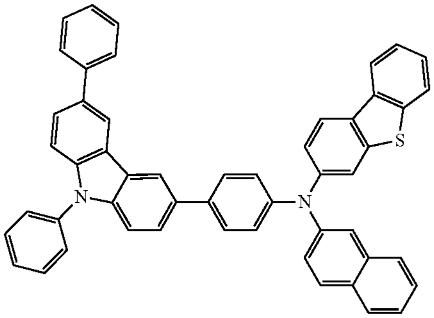
A78
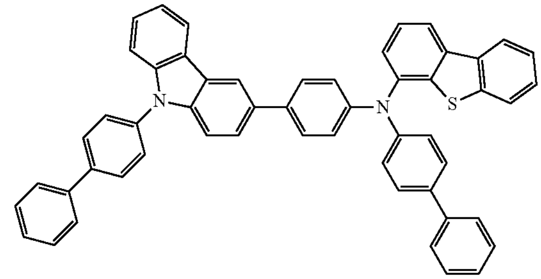

-continued
A79
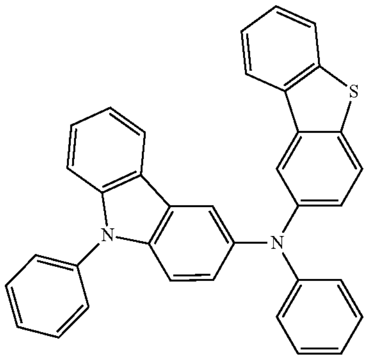
A80
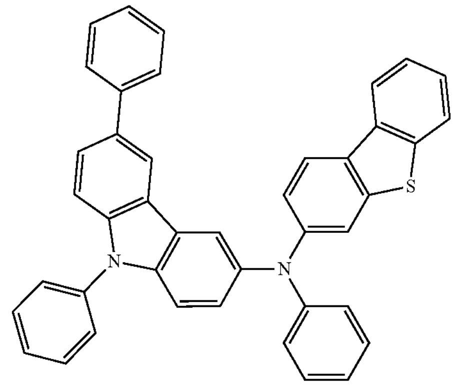
A81
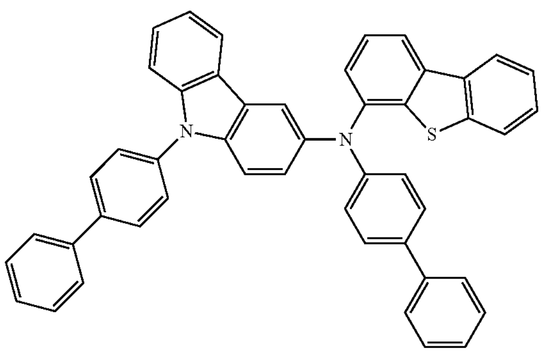
A82
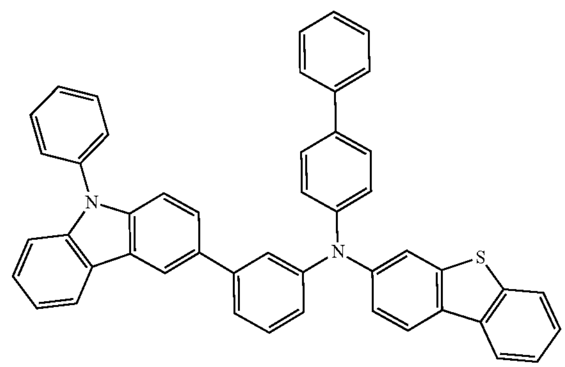
A83
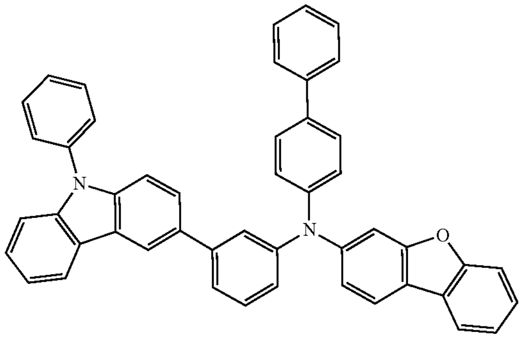
B1
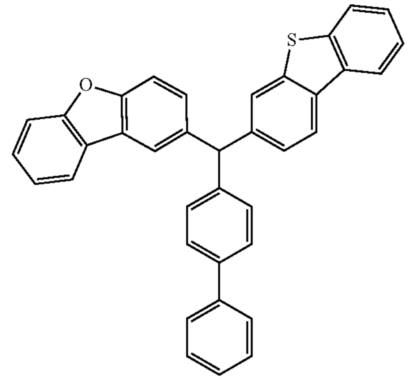

-continued
B2
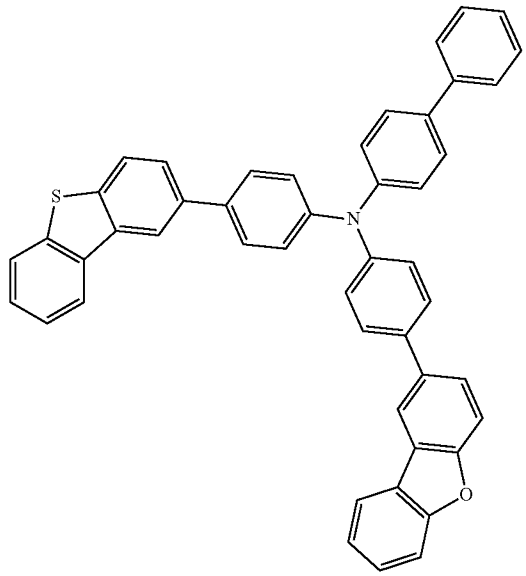
B3
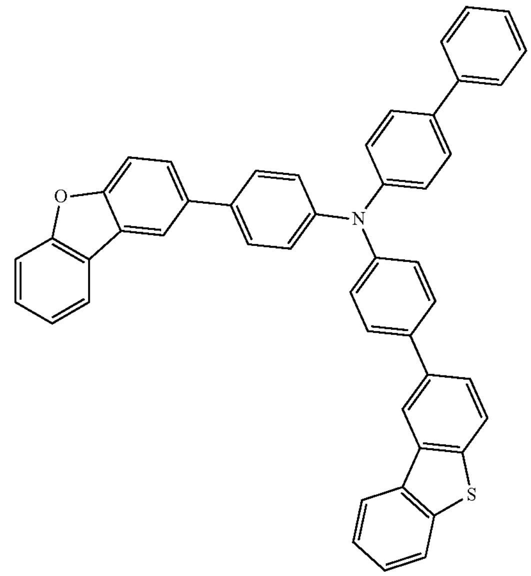
B4
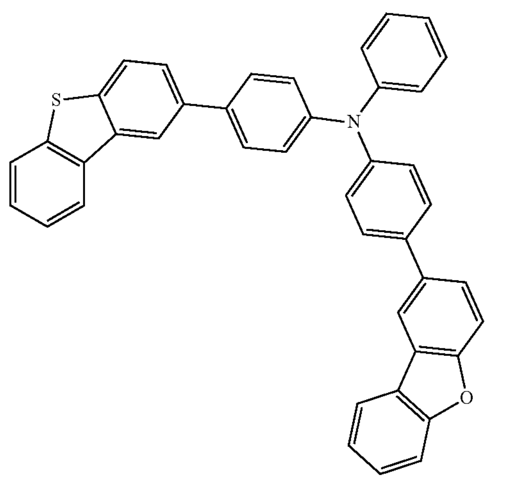
B5
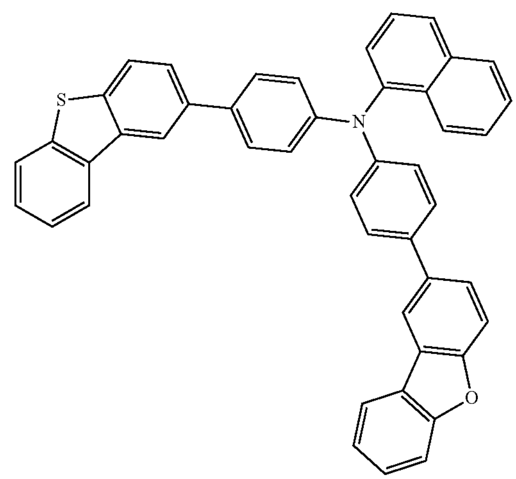
B6
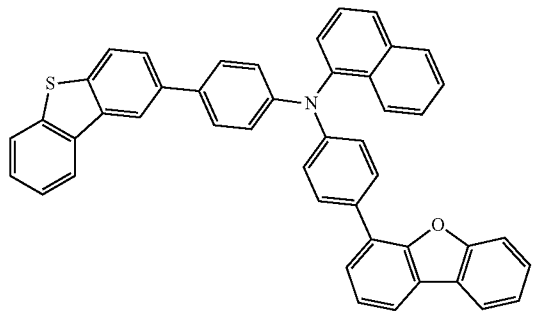
B7
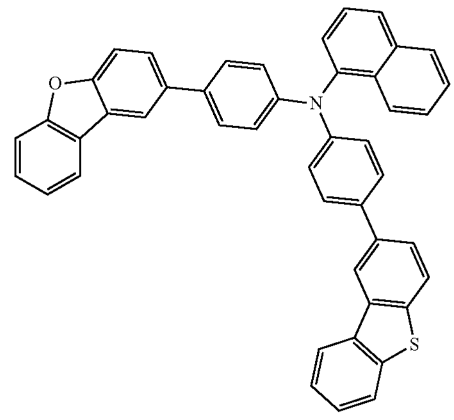

-continued
B8
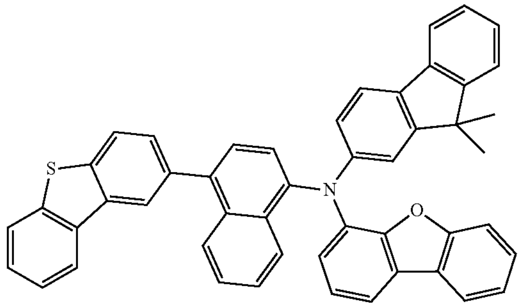
B9
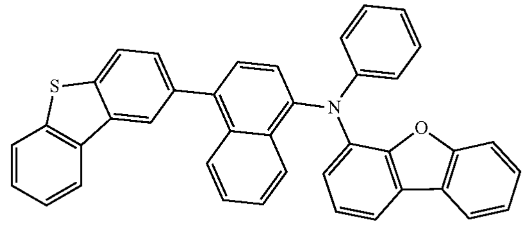
B10
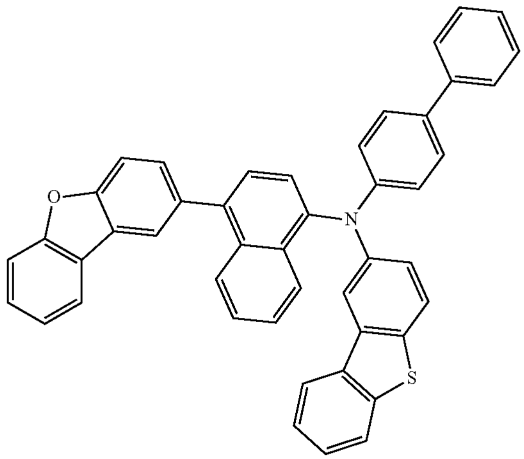
B11
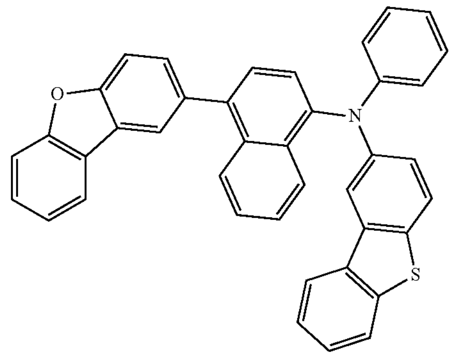
B12
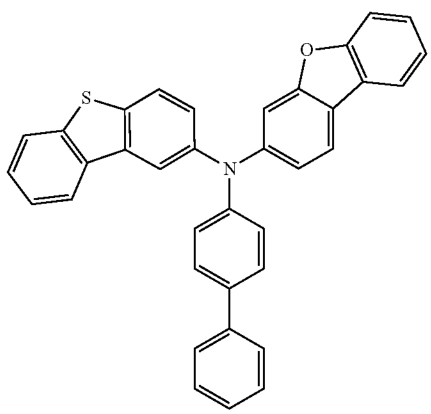
B13
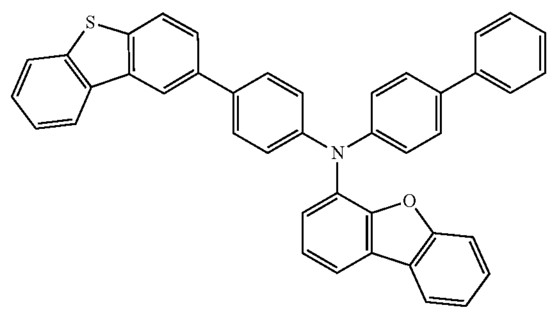
B14
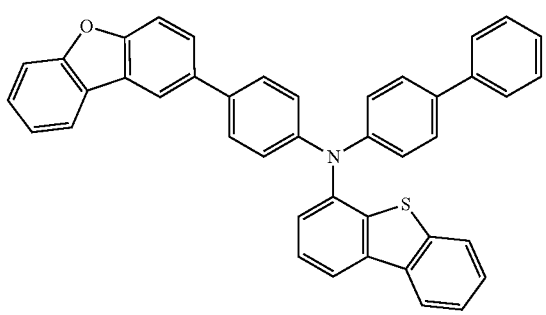
B15
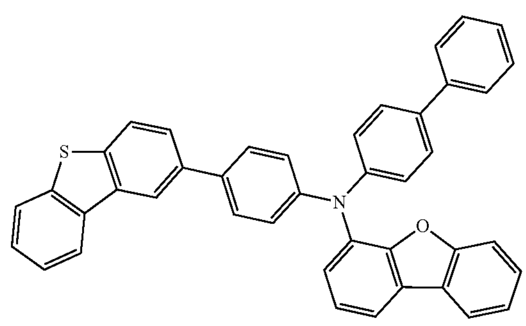

-continued
B16
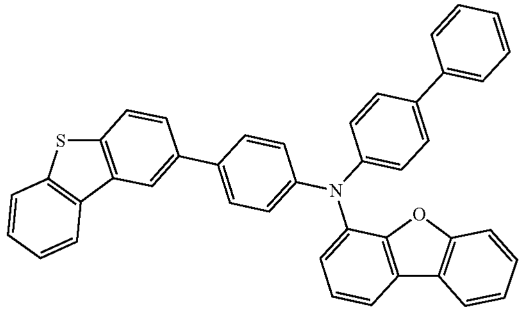
B17
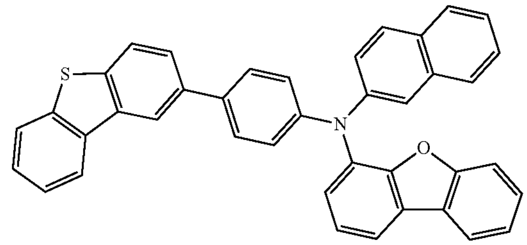
B18
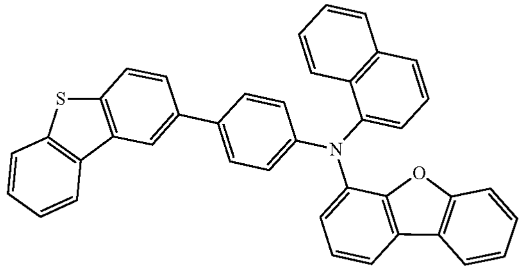
B19
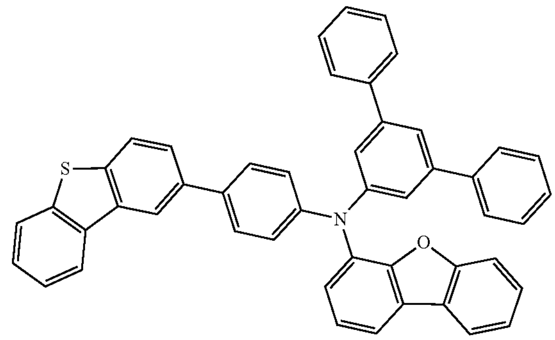
B20
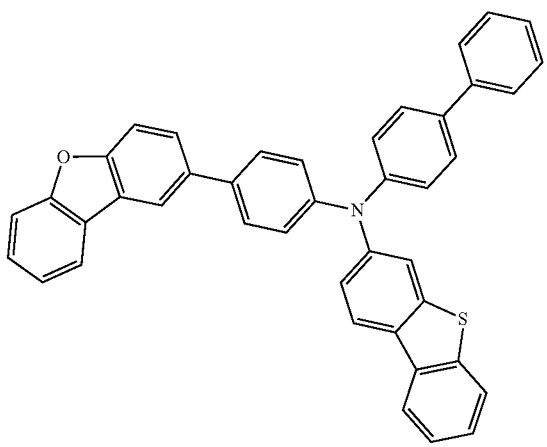
B21
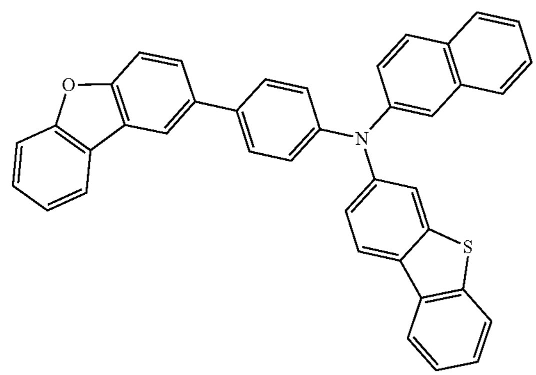
B22
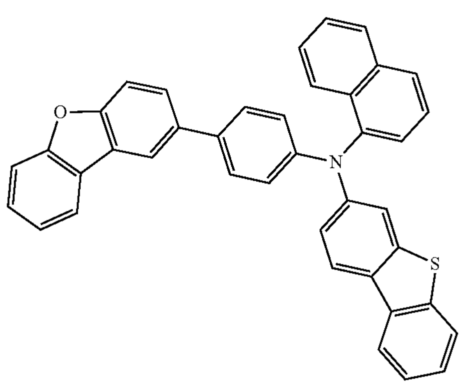
B23
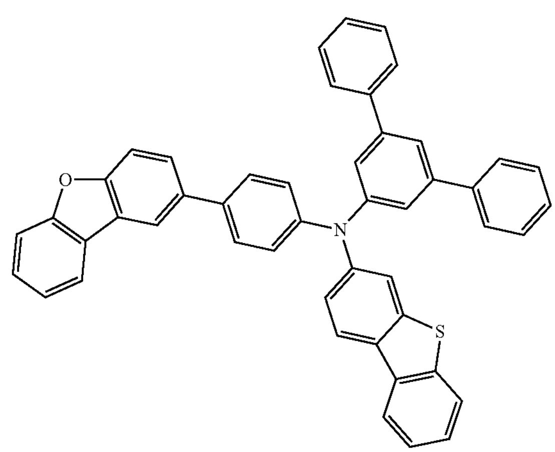

-continued
B24
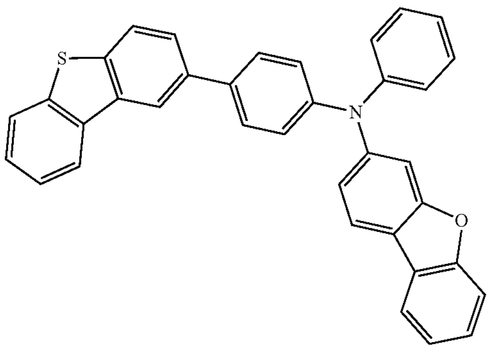
B25
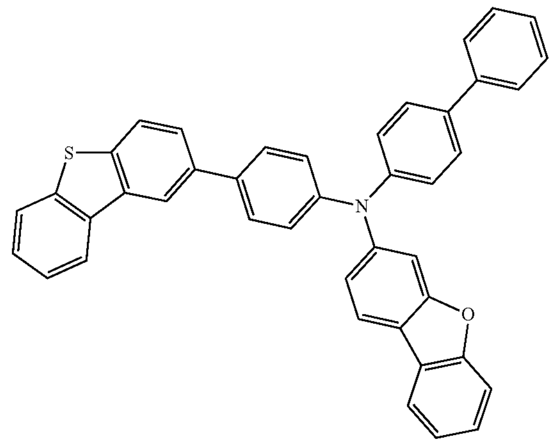
B26
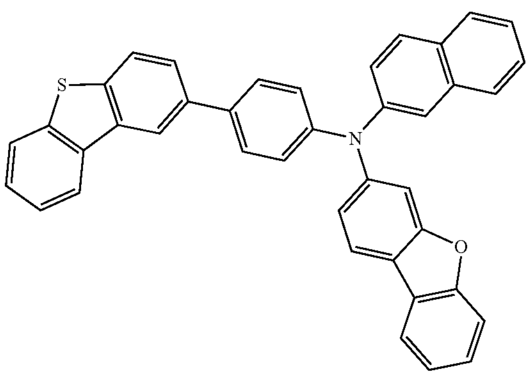
B27
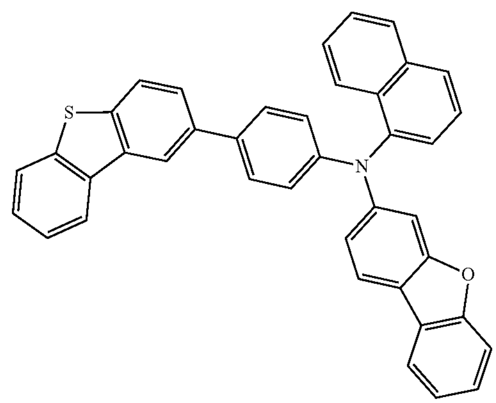
B28
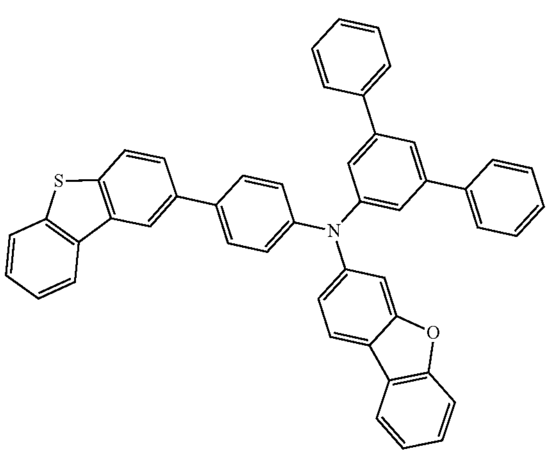
B29
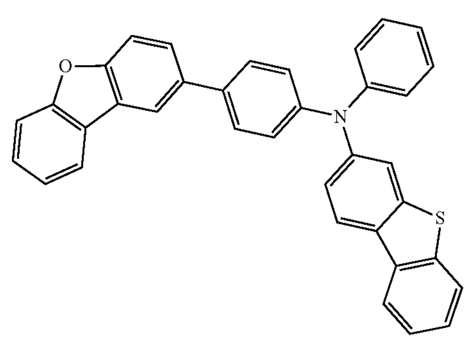

-continued
B30
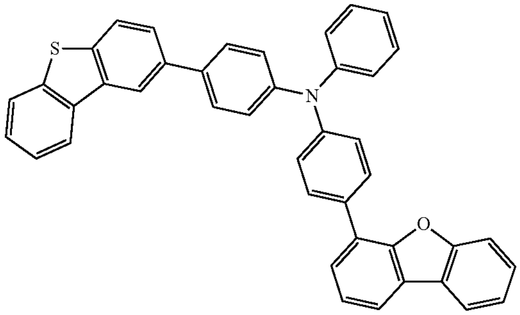
B31
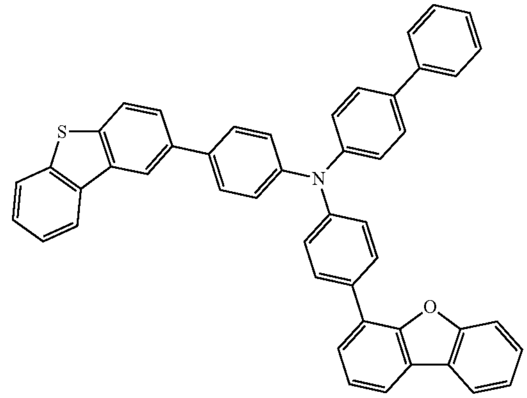
B32
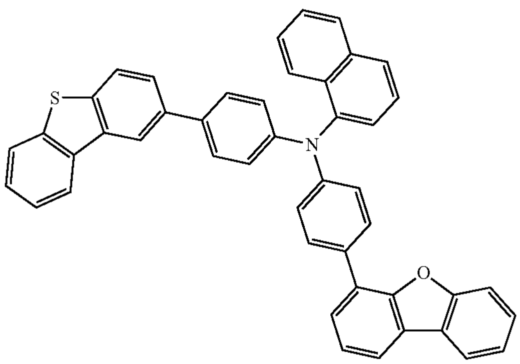
B33
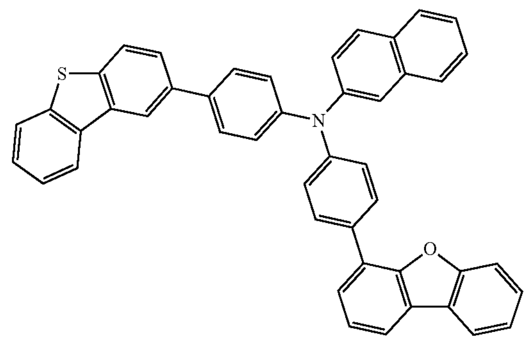
B34
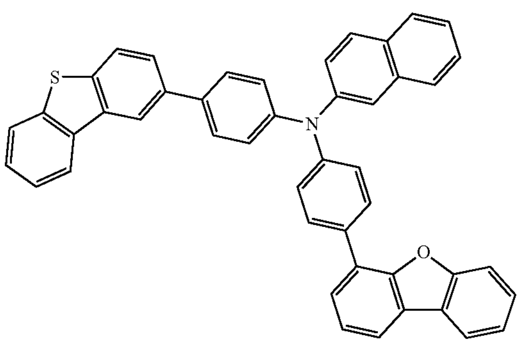
B35
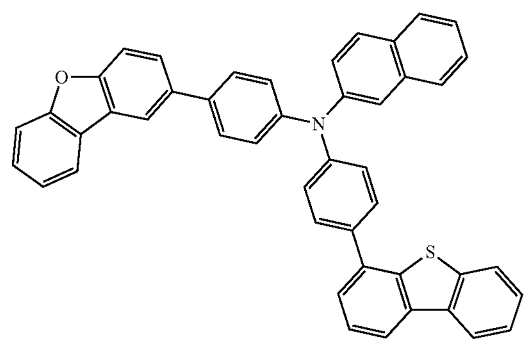
B36
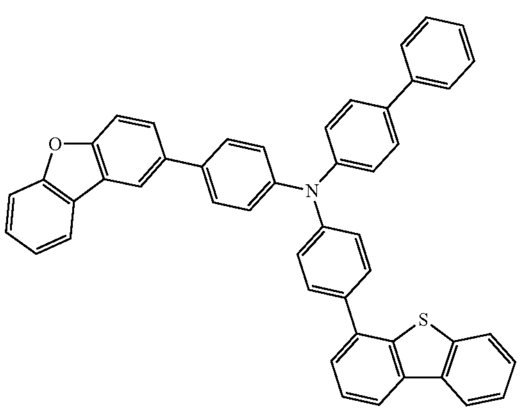
B37
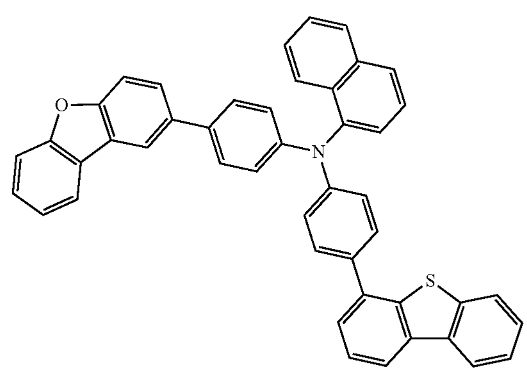

-continued
B38
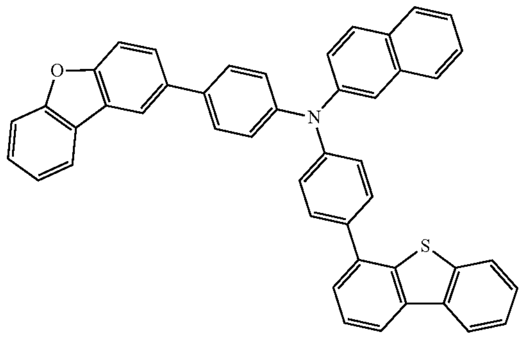
B39
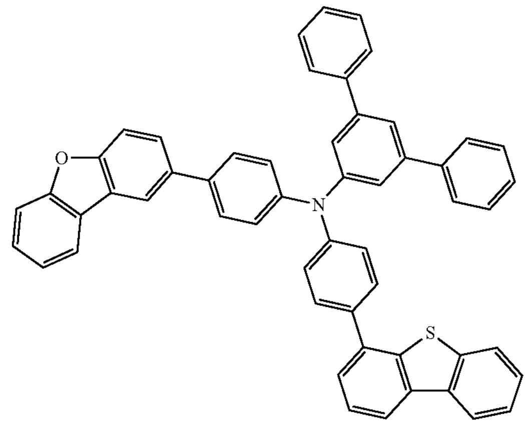
B40
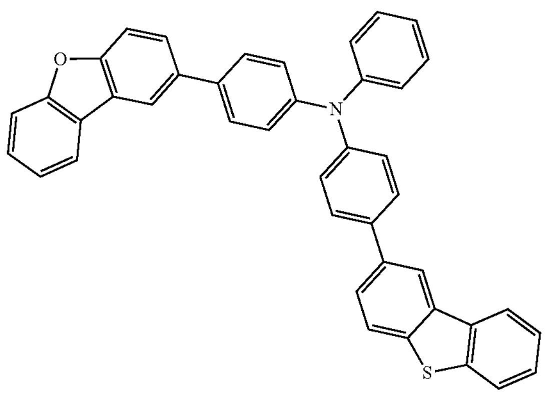
B41
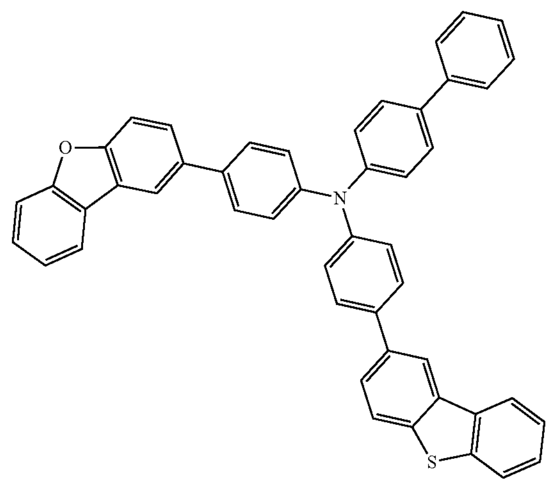
B42
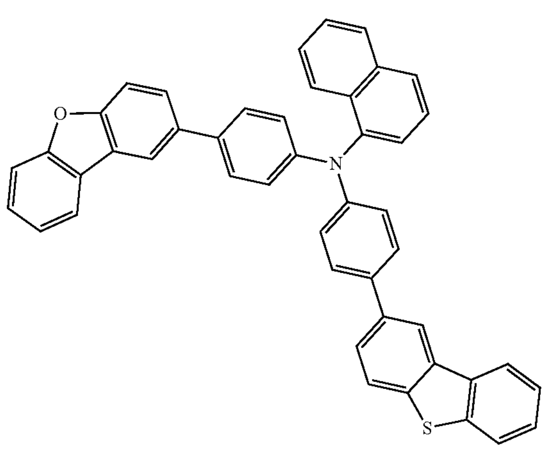
B43
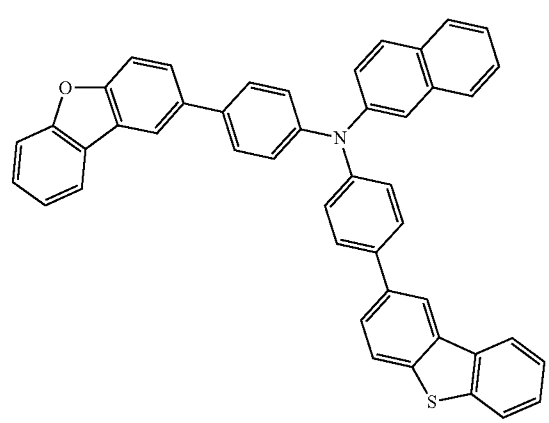

-continued
B44
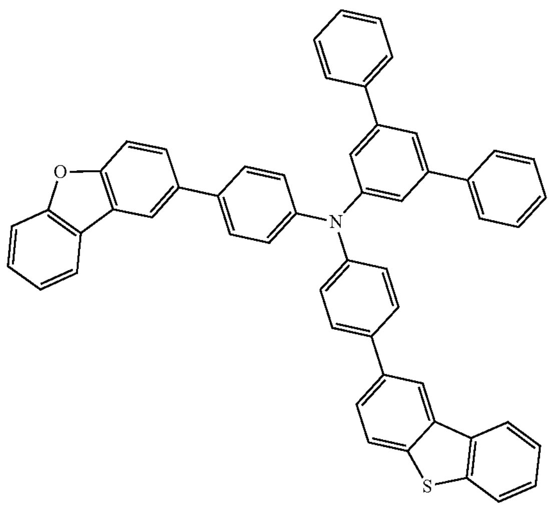
B45
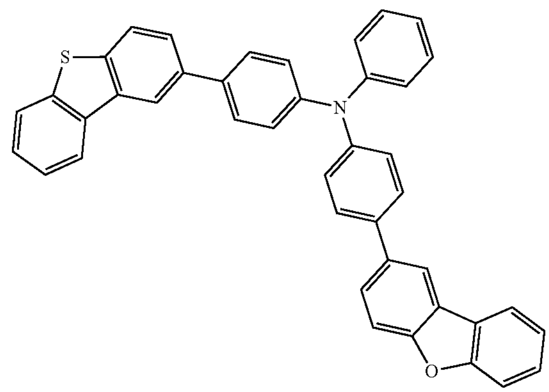
B46
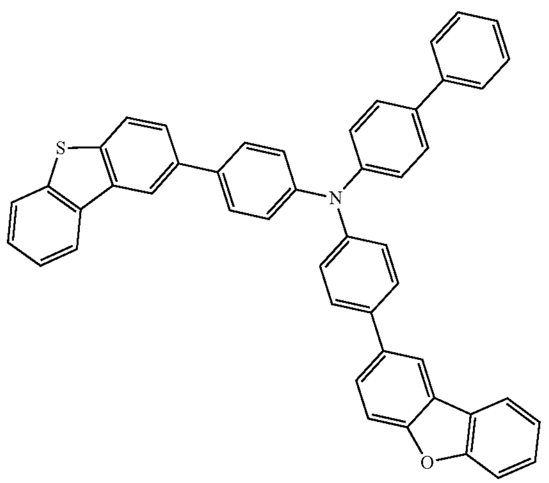
B47
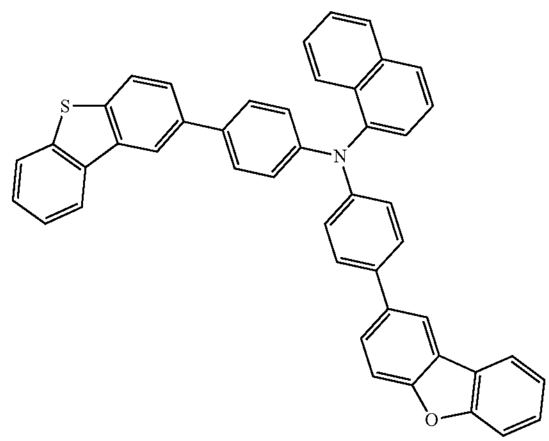
B48
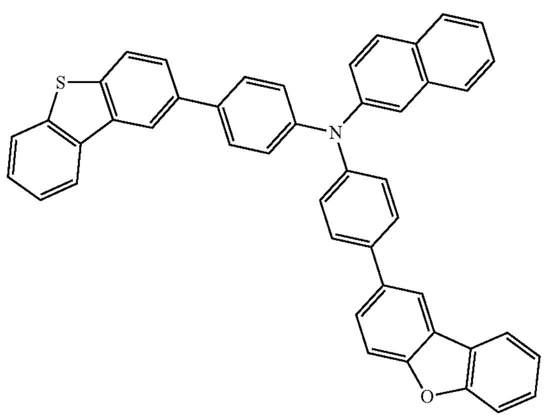
B49
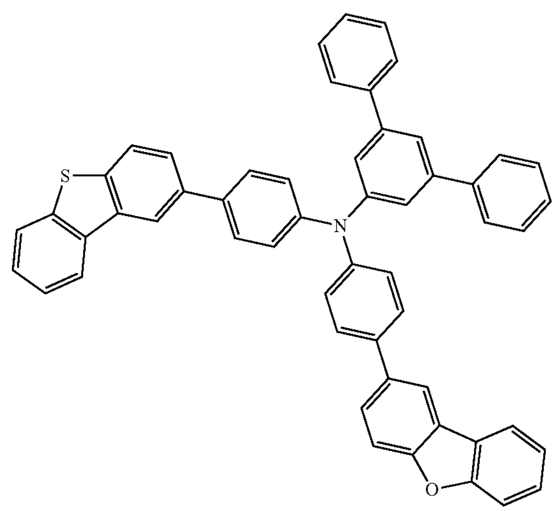

-continued
B50
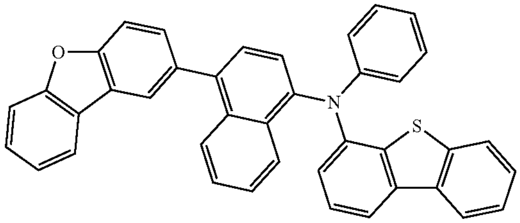
B51
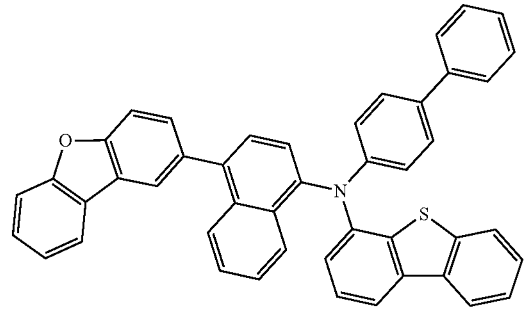
B52
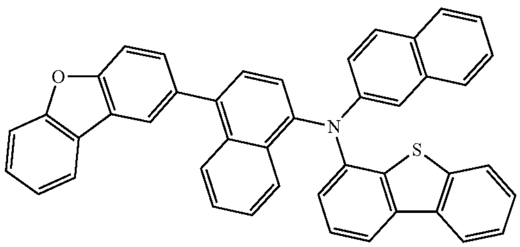
B53
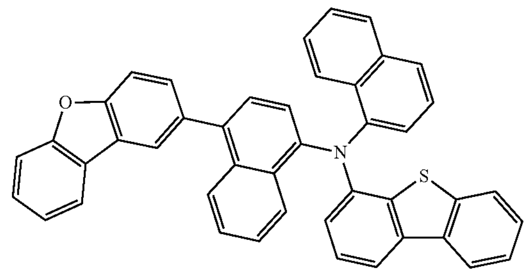
B54
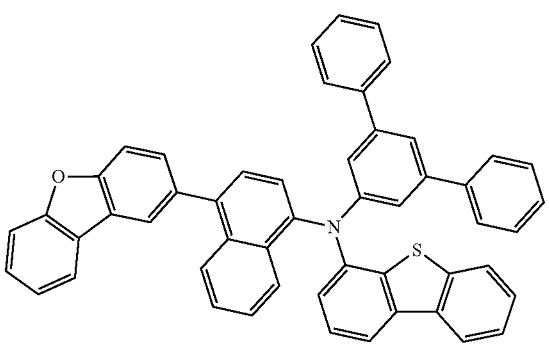
B55
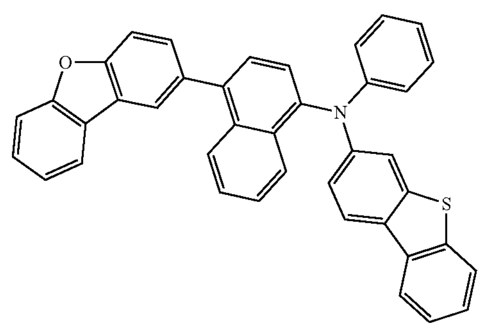
B56
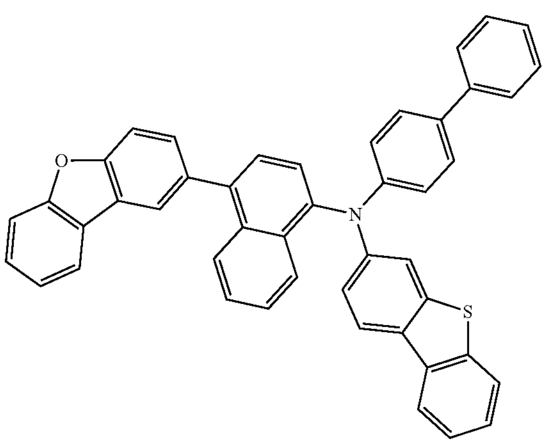
B57
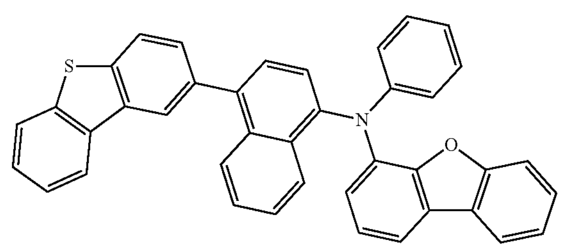

-continued
B58
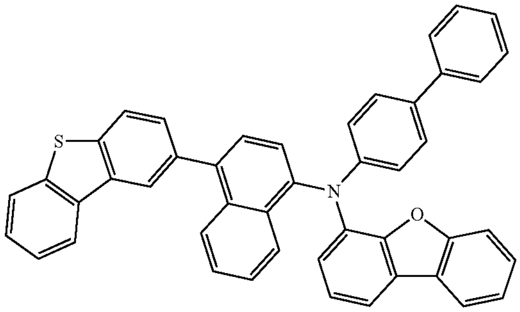
B59
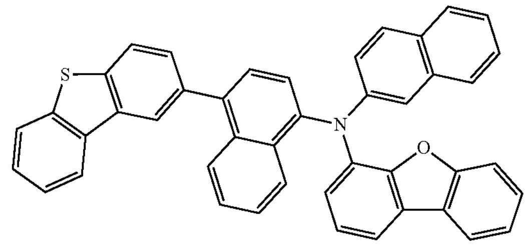
B60
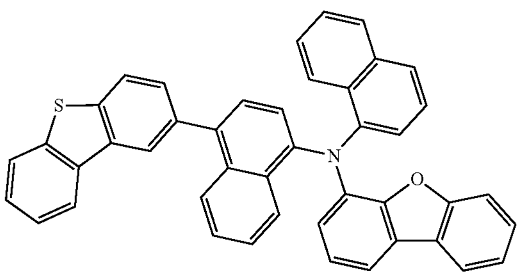
B61
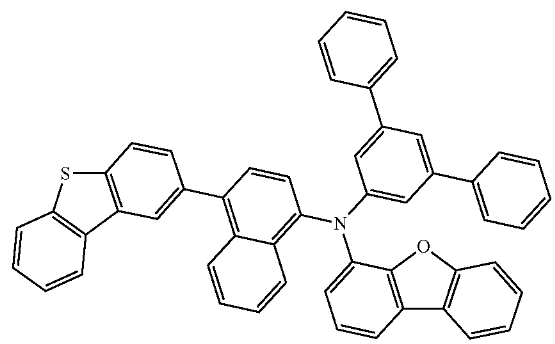
B62
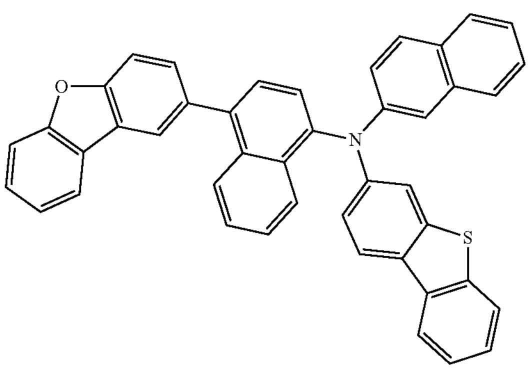
B63
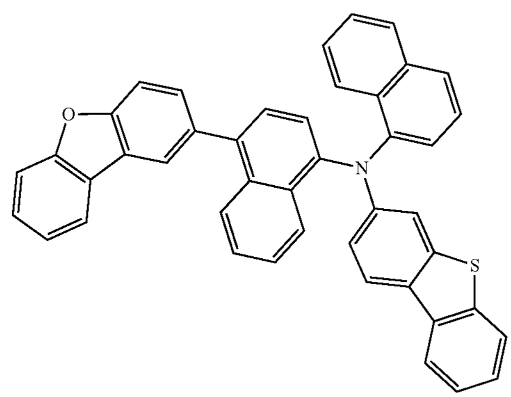
B64
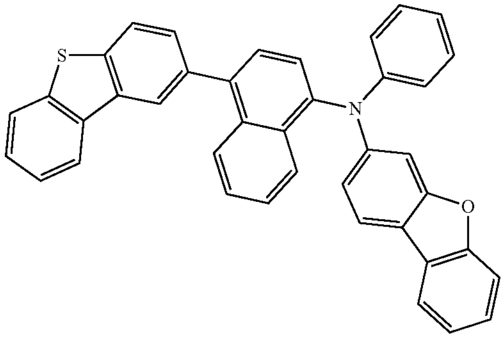
B65
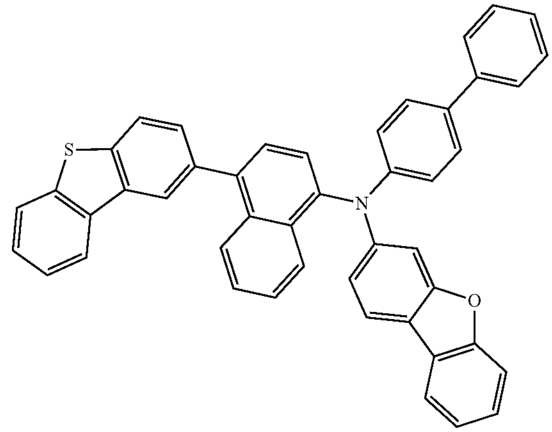

-continued
B66
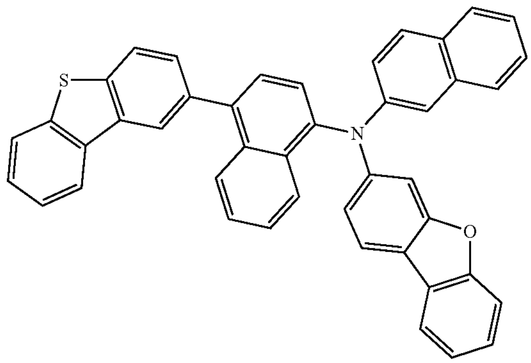
B67
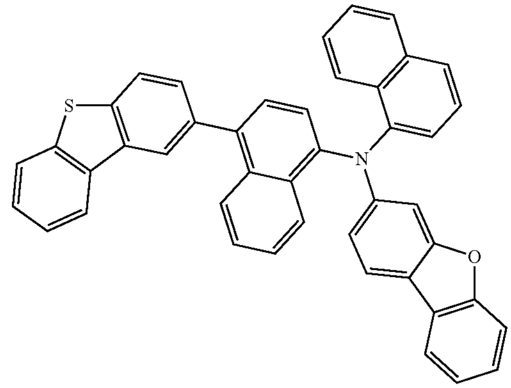
B68
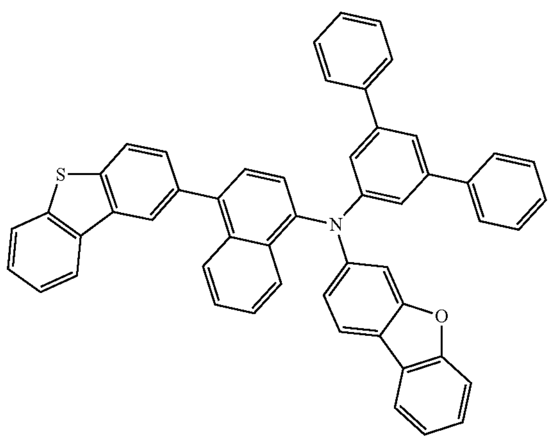
B69
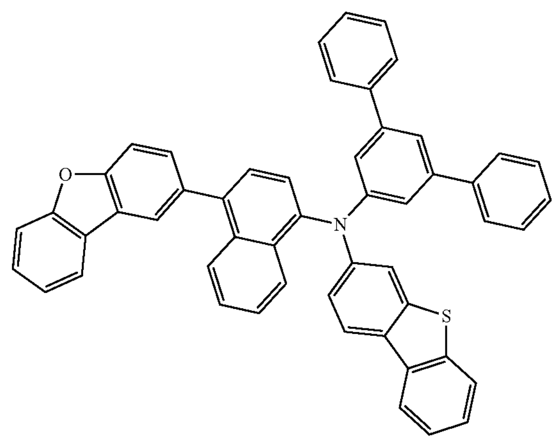
B70
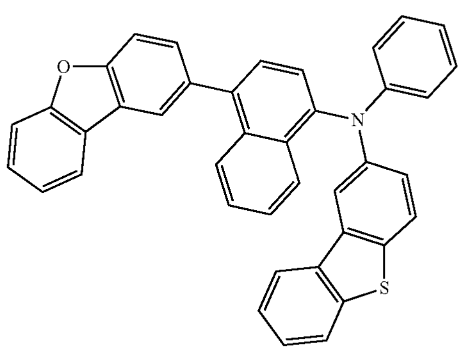
B71
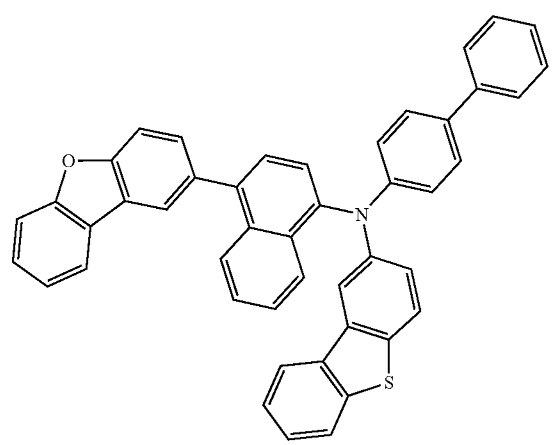

-continued
B72
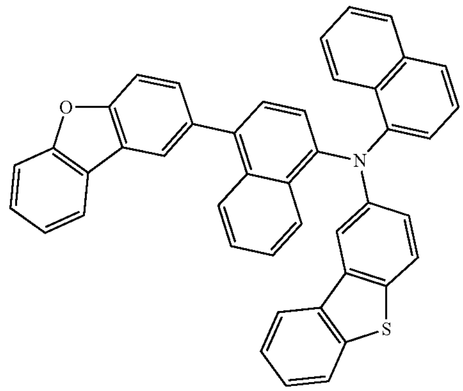
B73
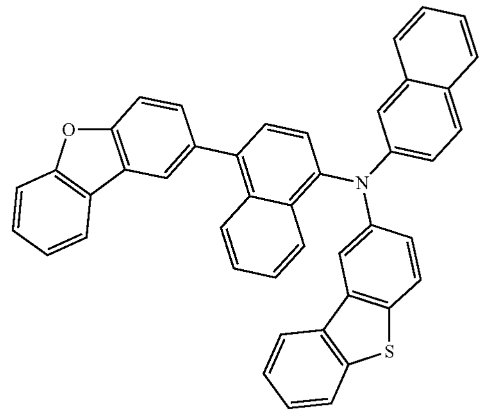
B74
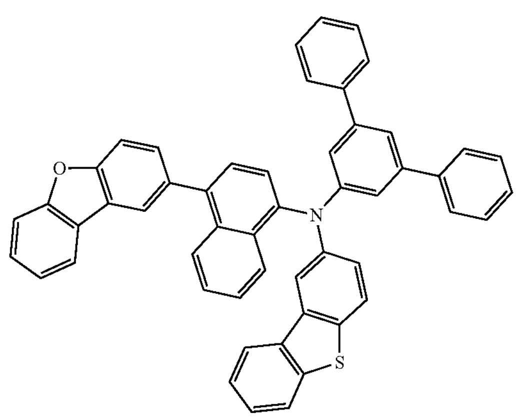
C1
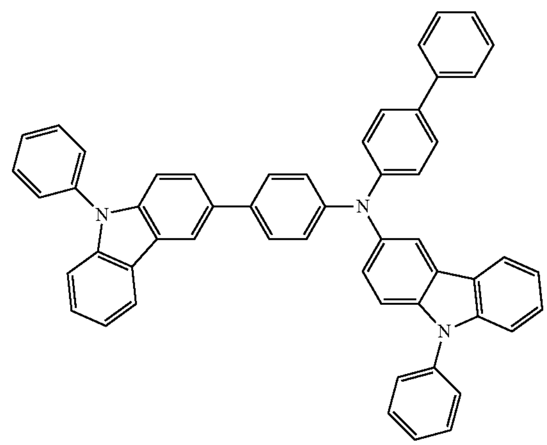
C2
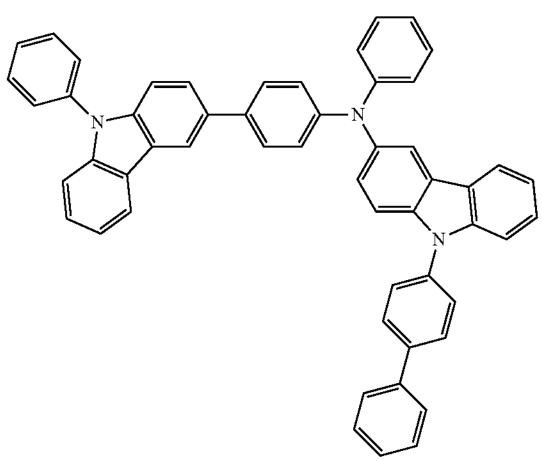
C3
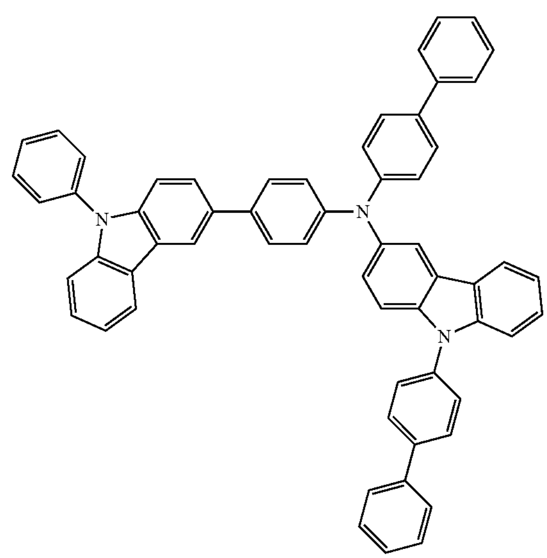

-continued
C4
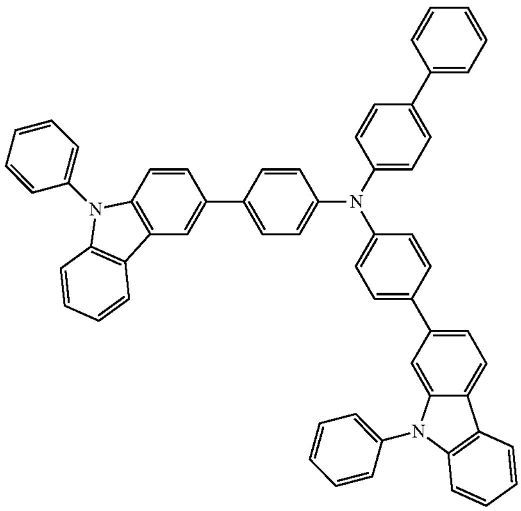
C5
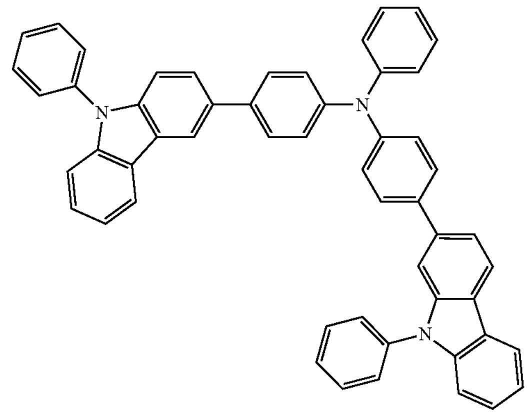
C6
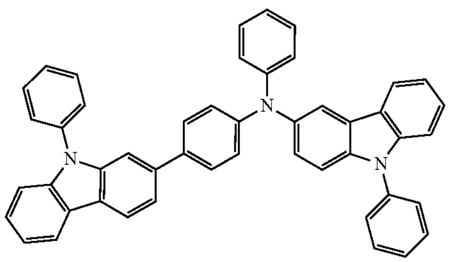
C7
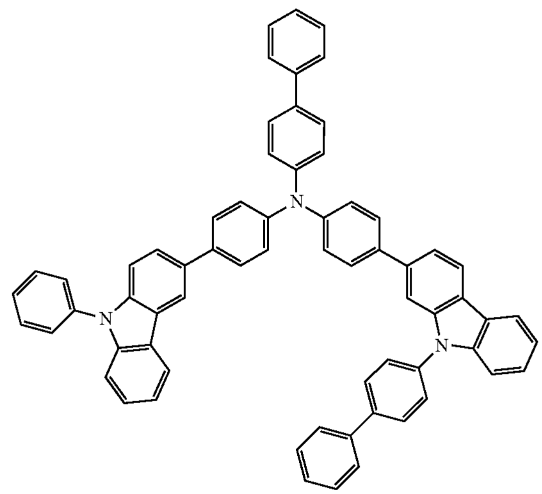
C8
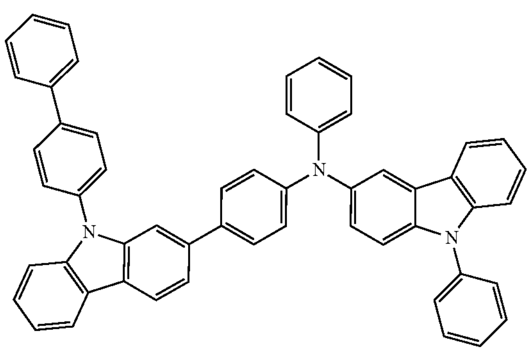
C9
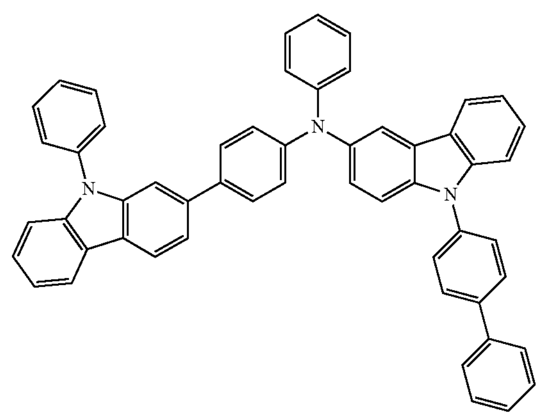

-continued
C10
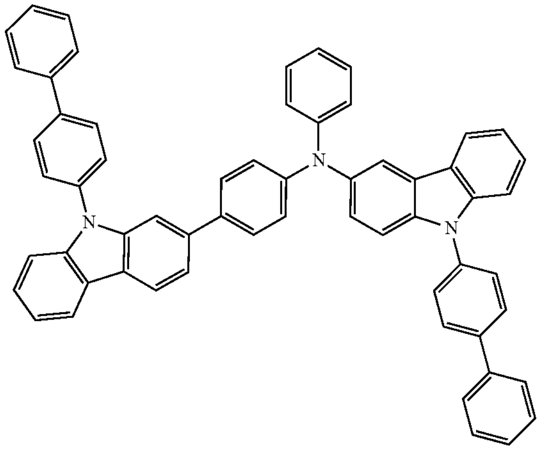
C11
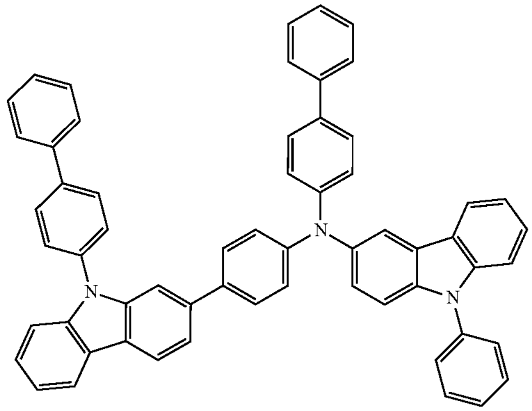
C12
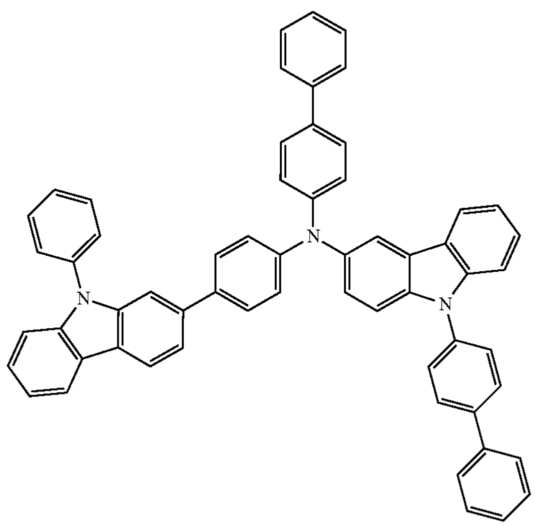
C13
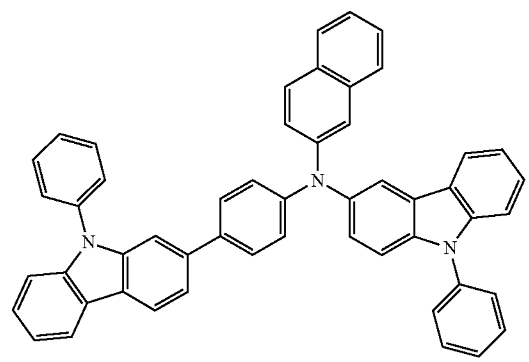
C14
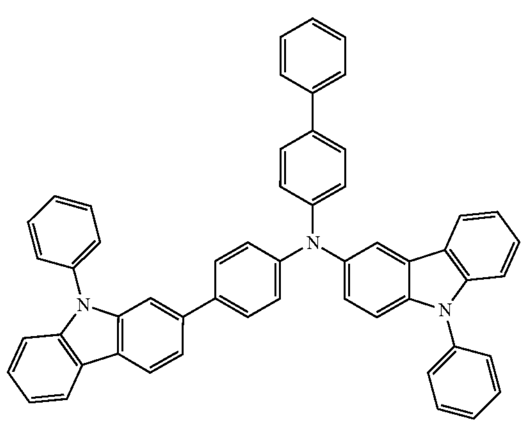
C15
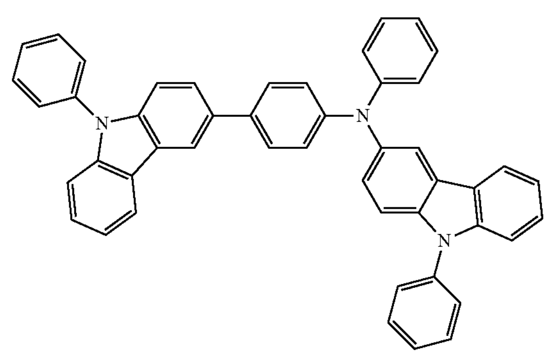

-continued
D1
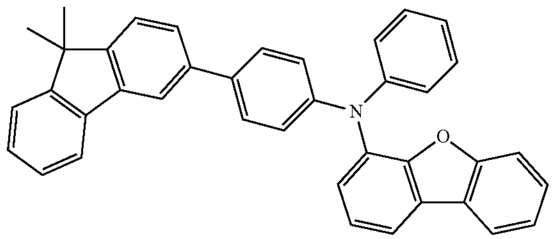
D2
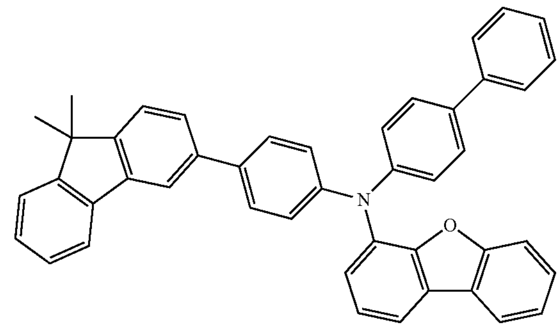
D3
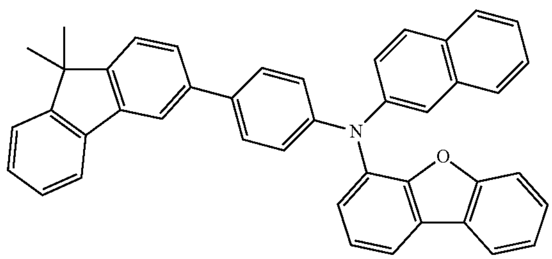
D4
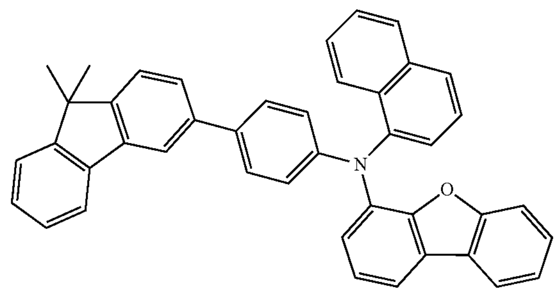
D5
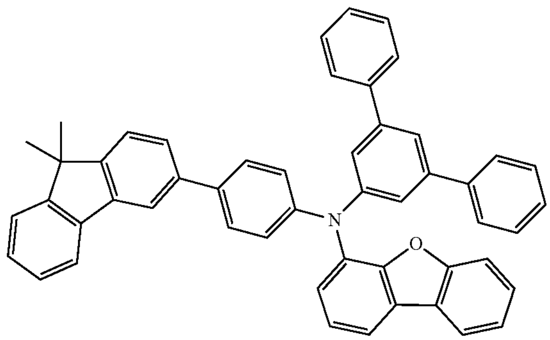
D6
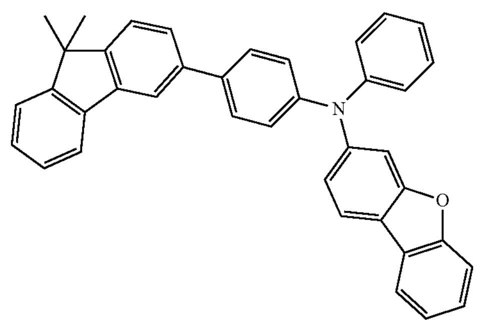
D7
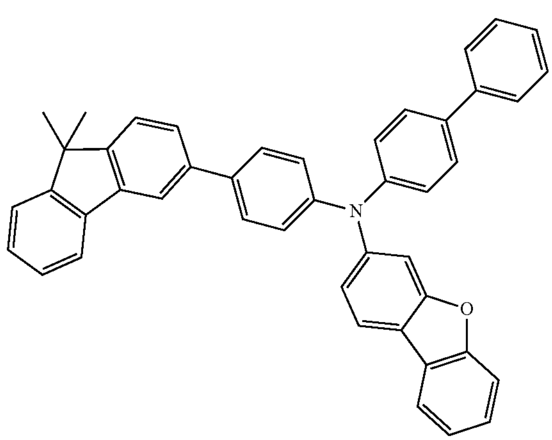
D8
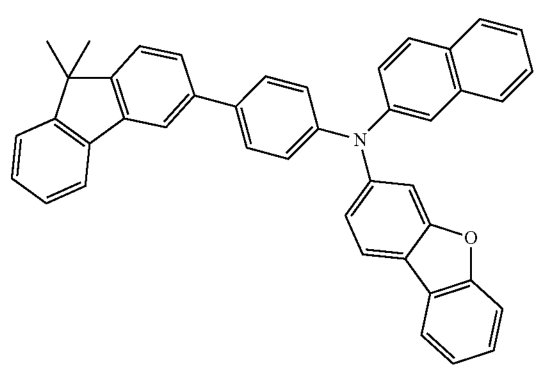

-continued
D9
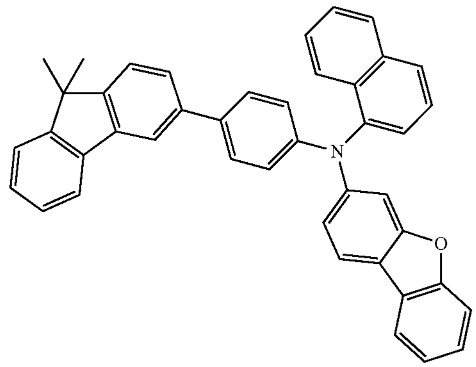
D10
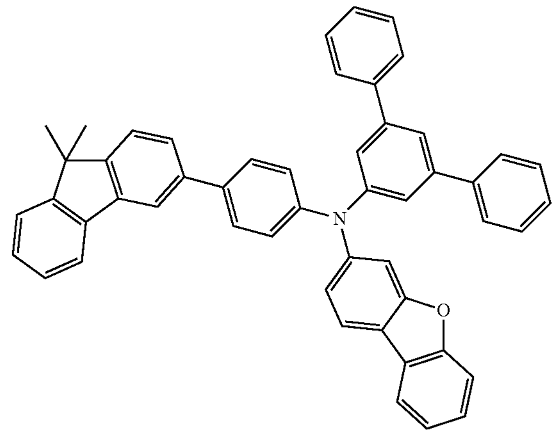
D11
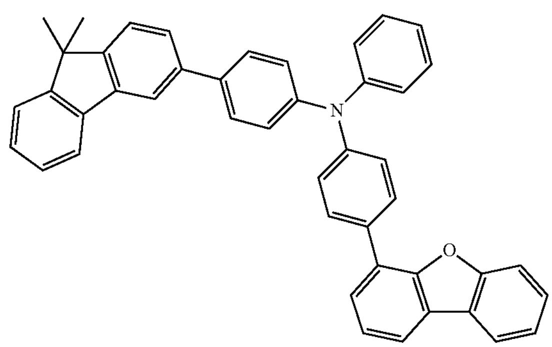
D12
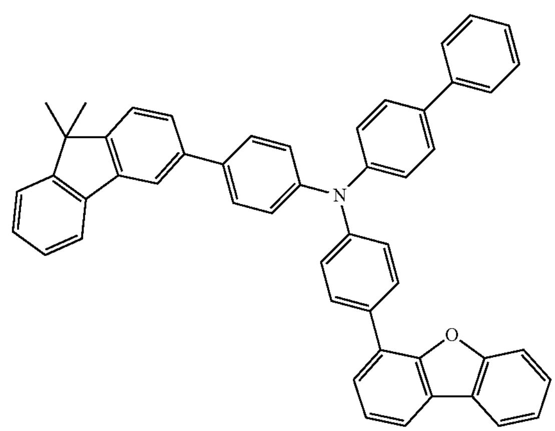
D13
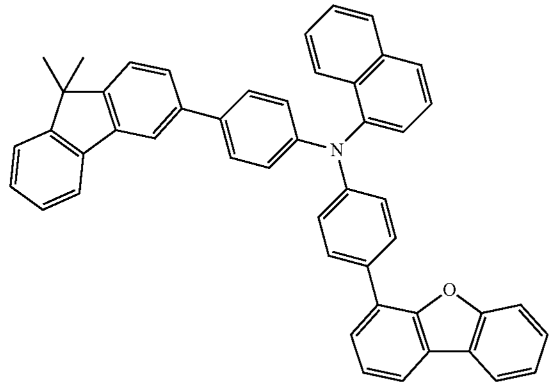
D14
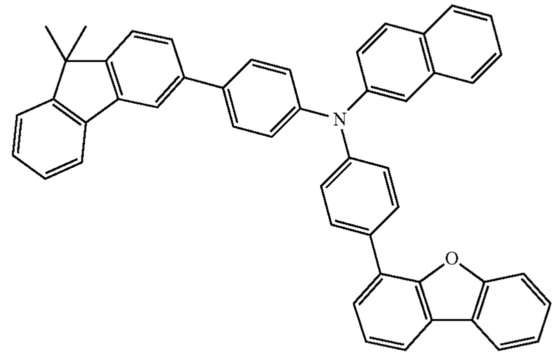

-continued
D15
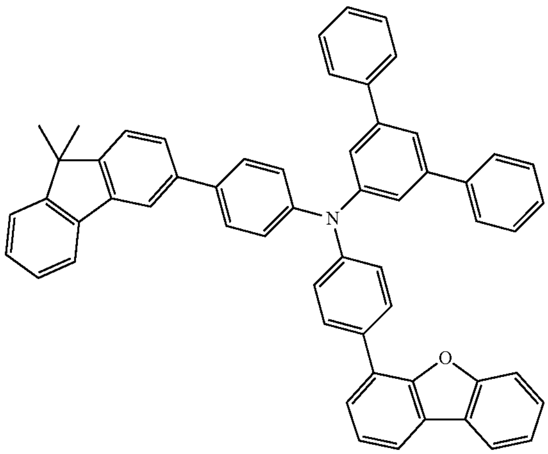
D16
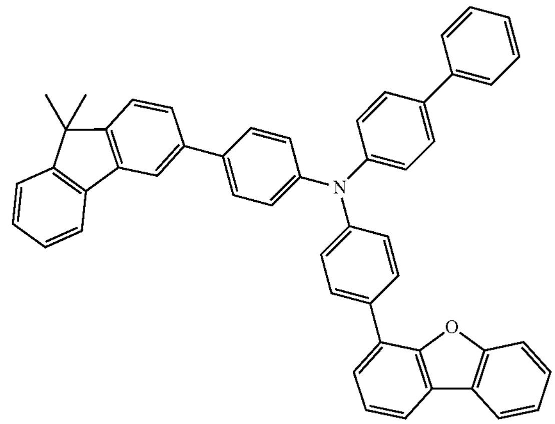
D17
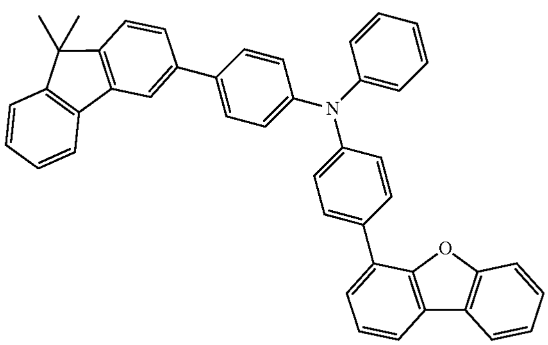
D18
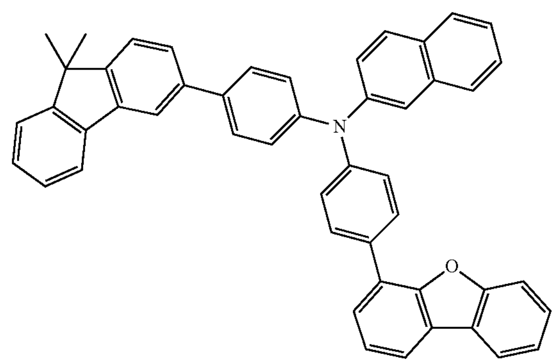
D19
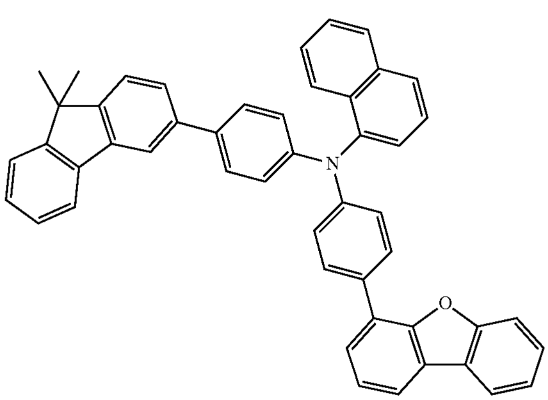
D20
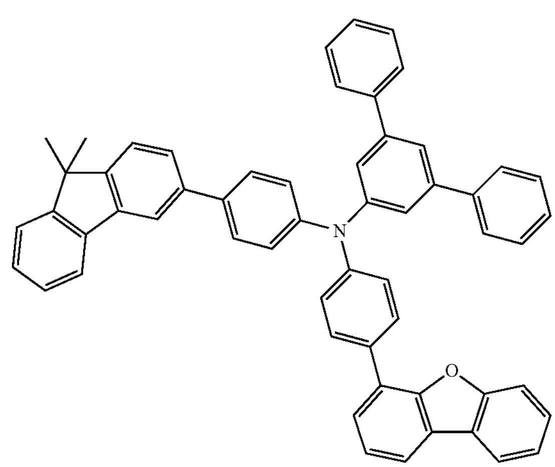

-continued
D21
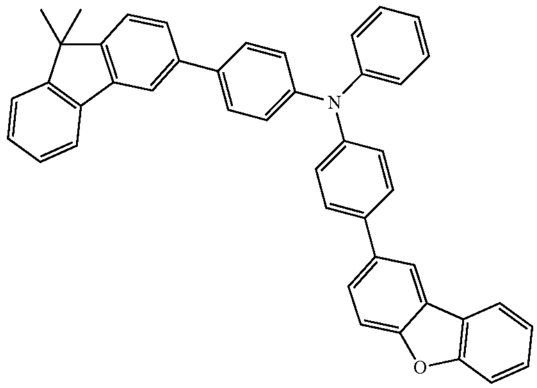
D22
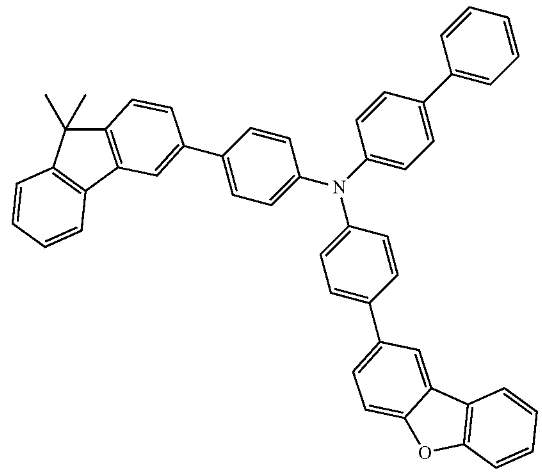
D23
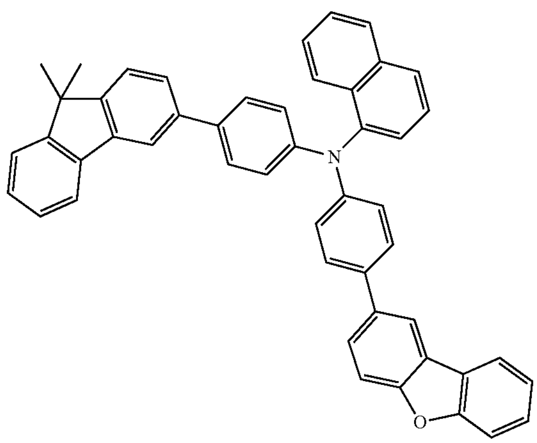
D24
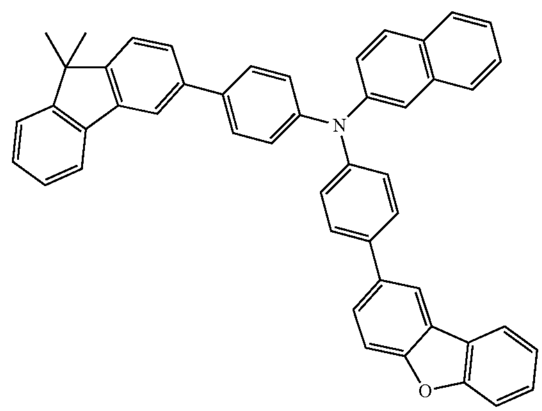
D25
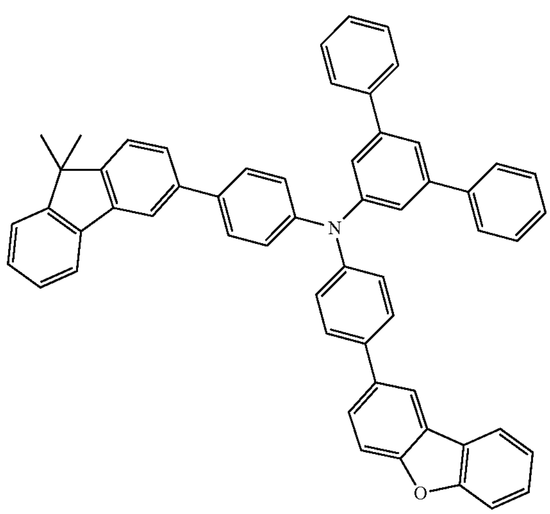
D26
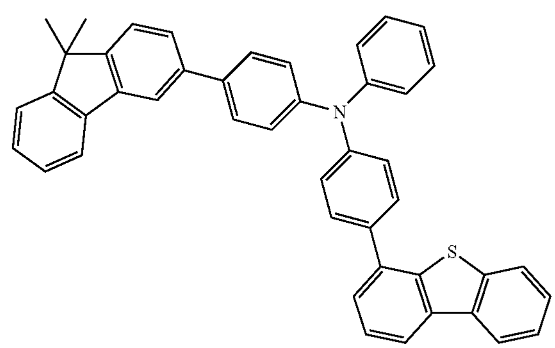

-continued
D27
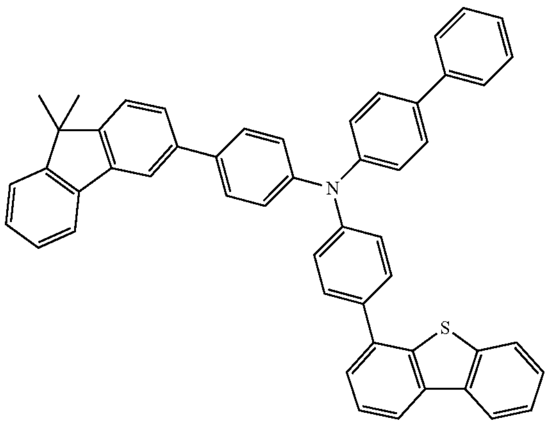
D28
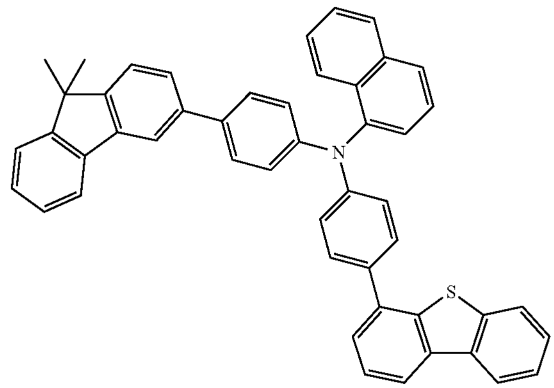
D29
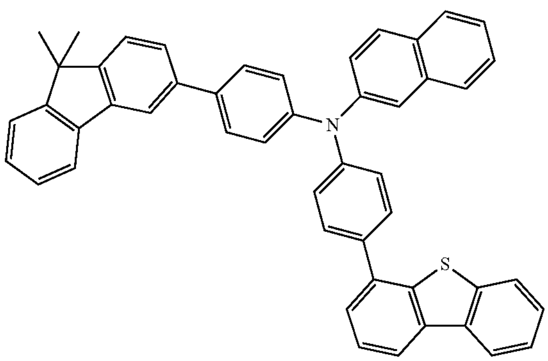
D30
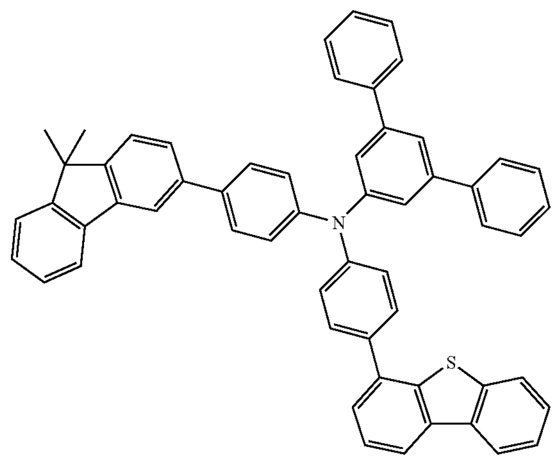
D31
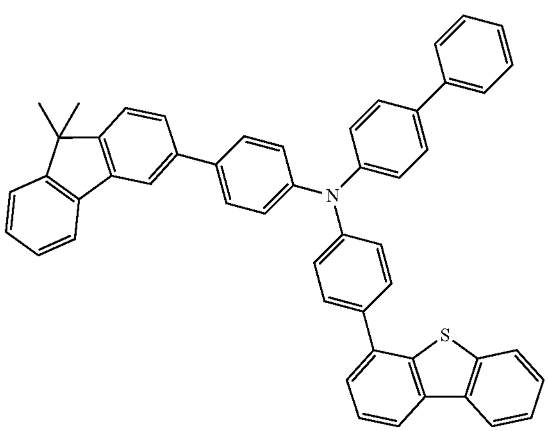
D32
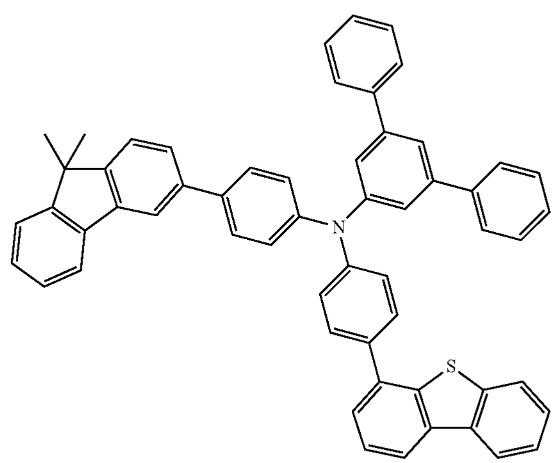

-continued
D33
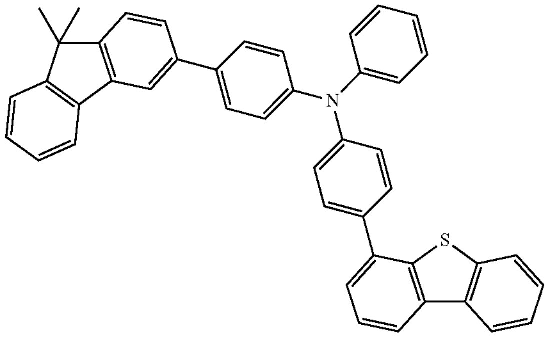
D34
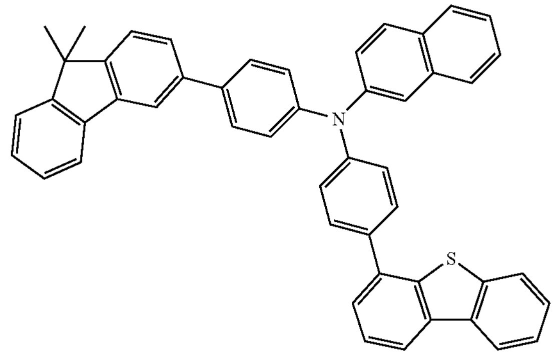
D35
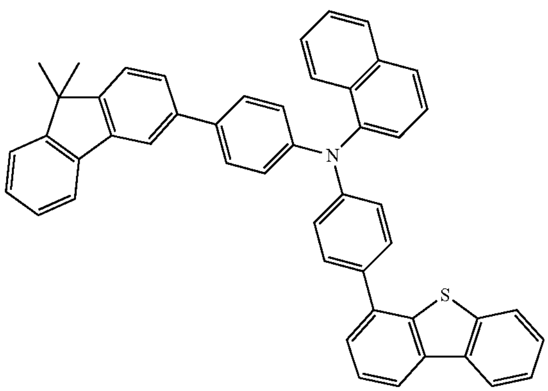
D36
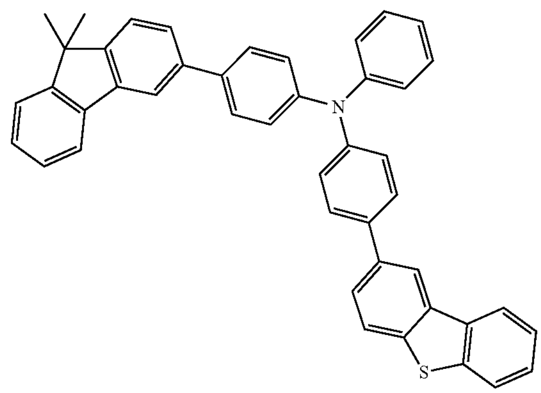
D37
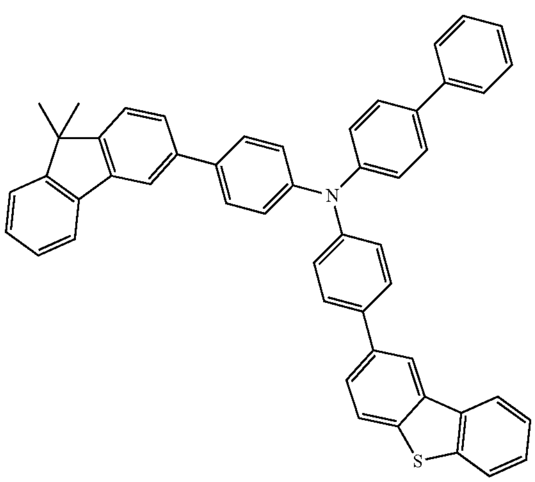
D38
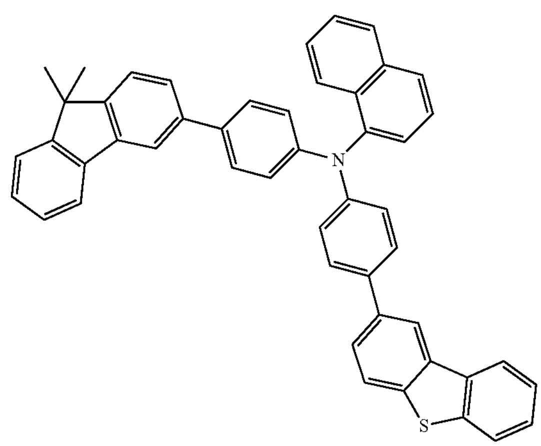

-continued
D39
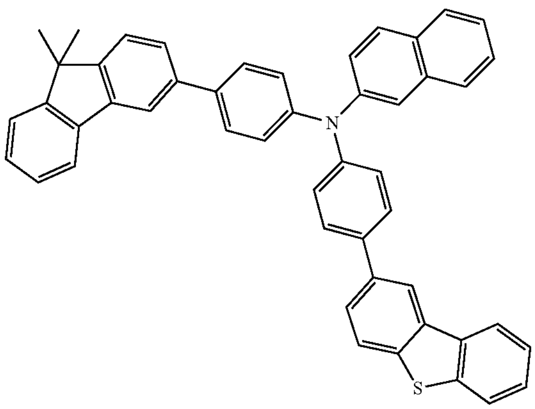
D40
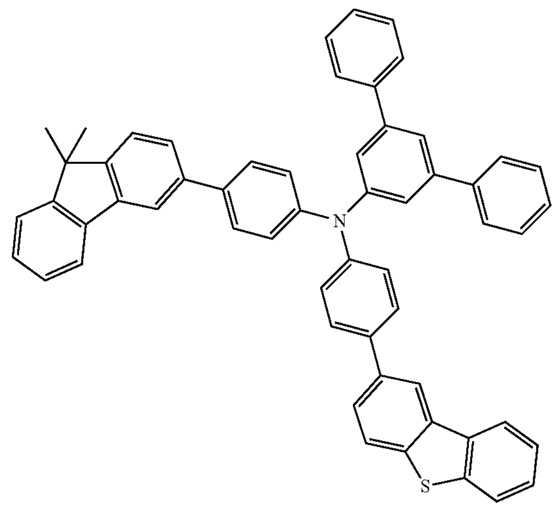
D41
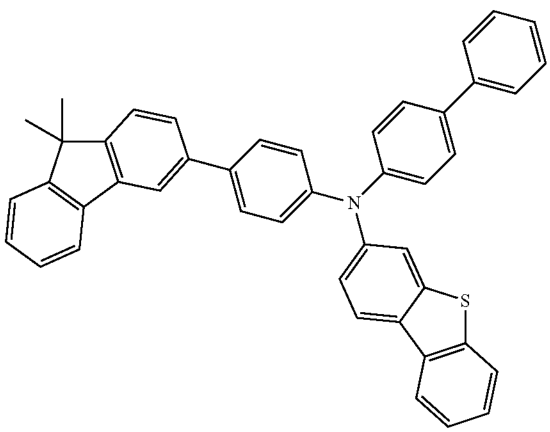
D42
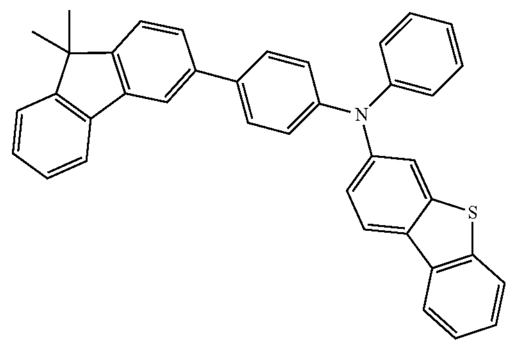
D43
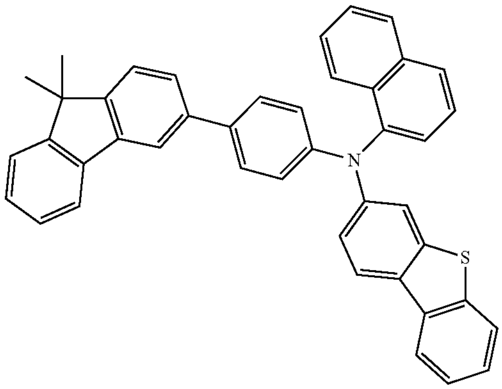
D44
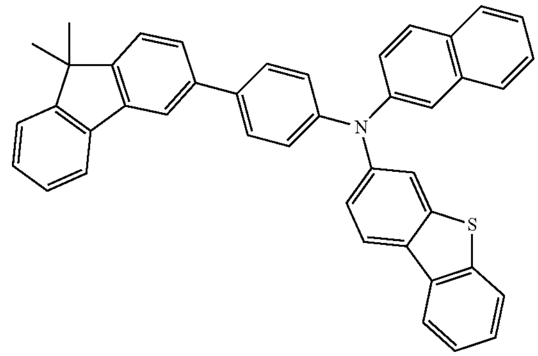

-continued
D45
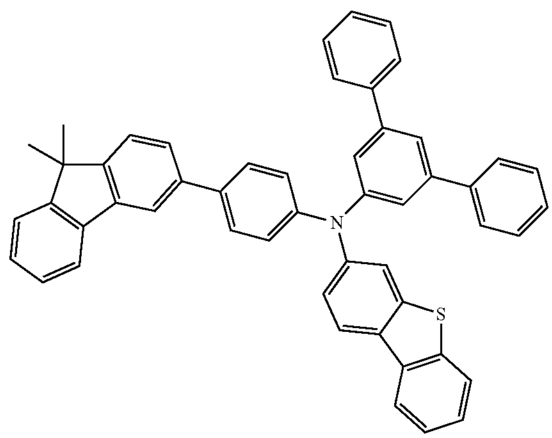
D46
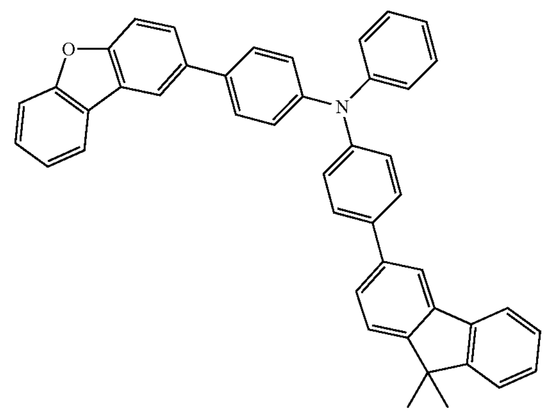
D47
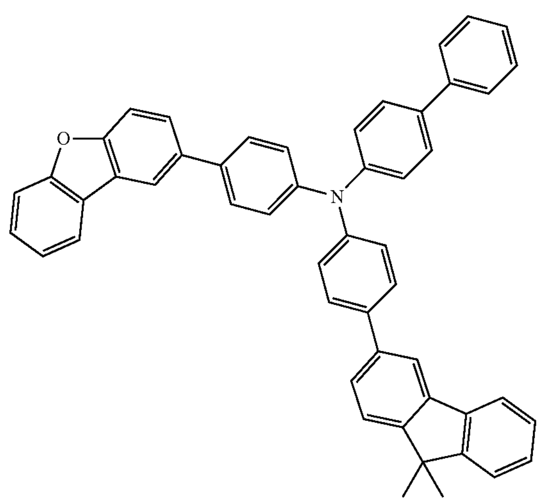
D48
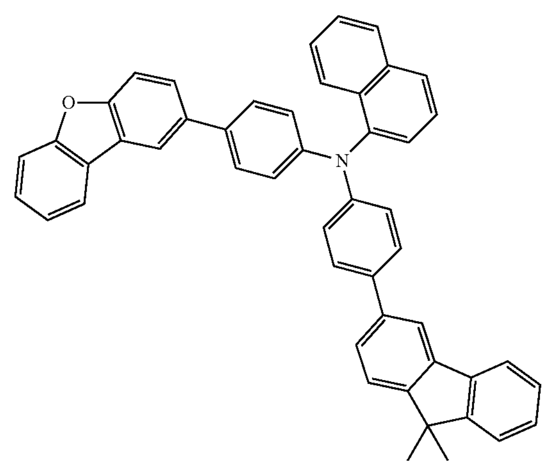
D49
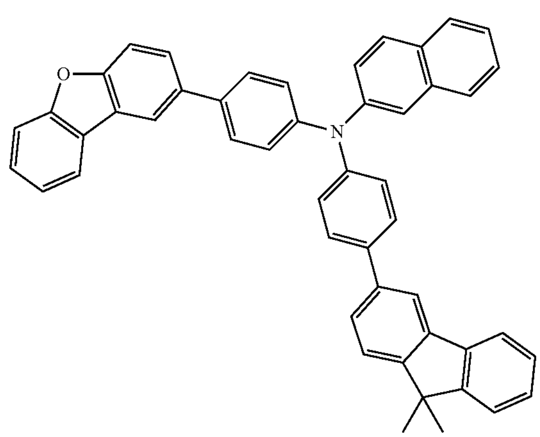
D50
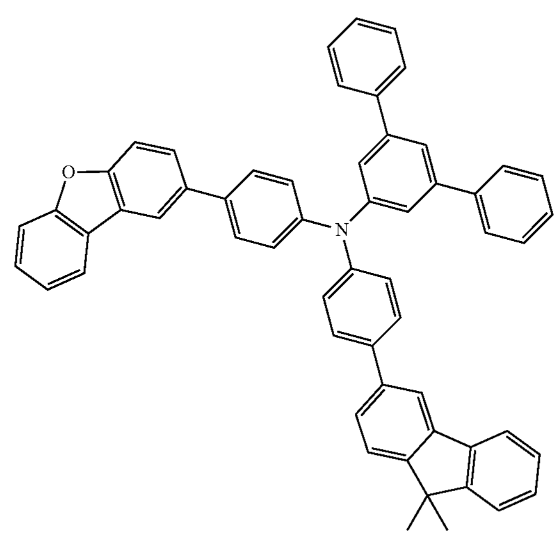

-continued
D51
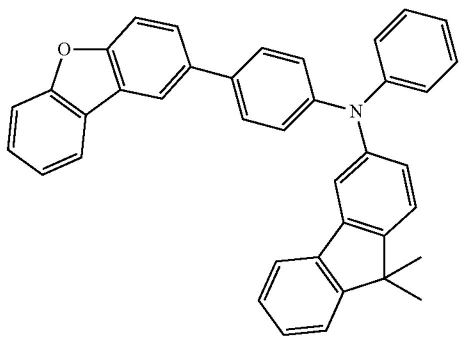
D52
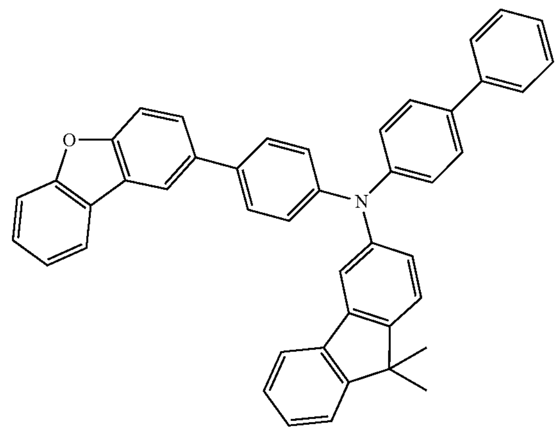
D53
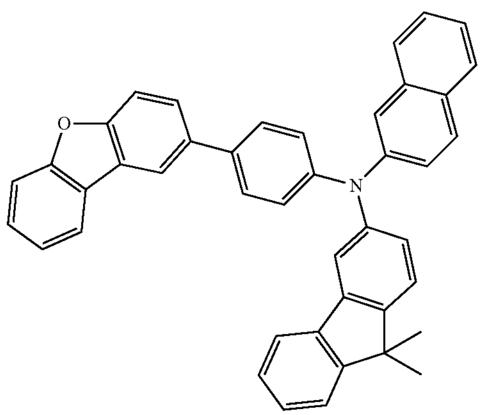
D54
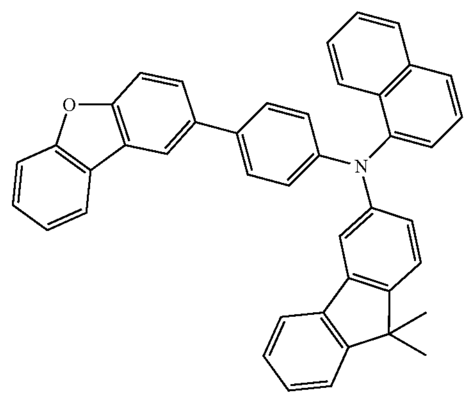
D55
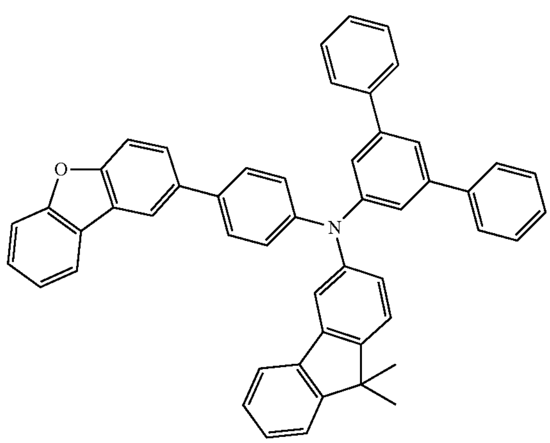
D56
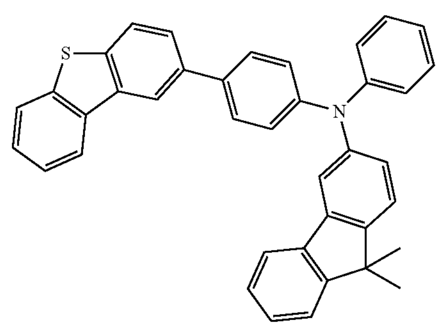

-continued
D57
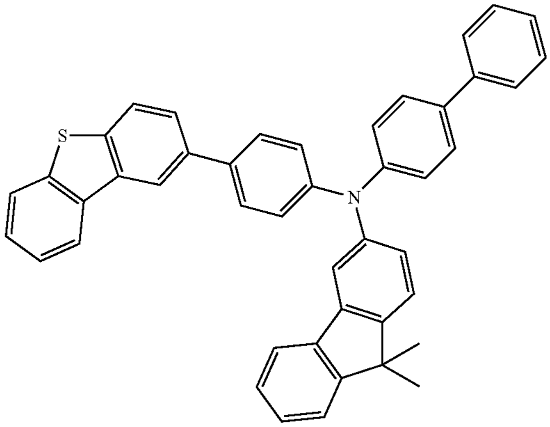
D58
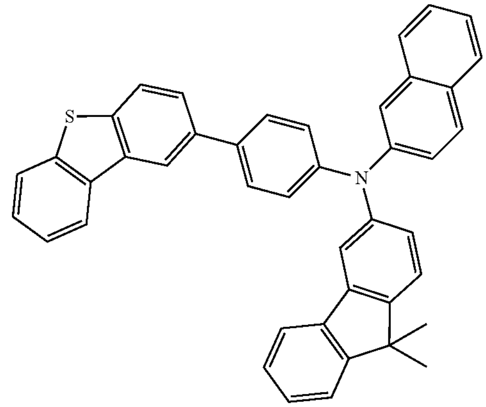
D59
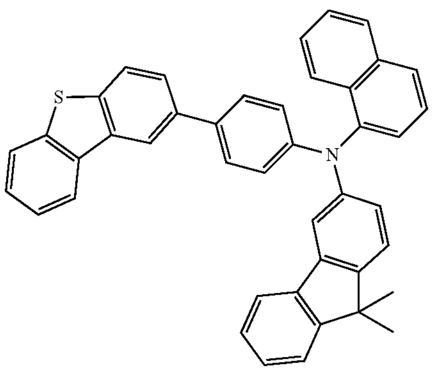
D60
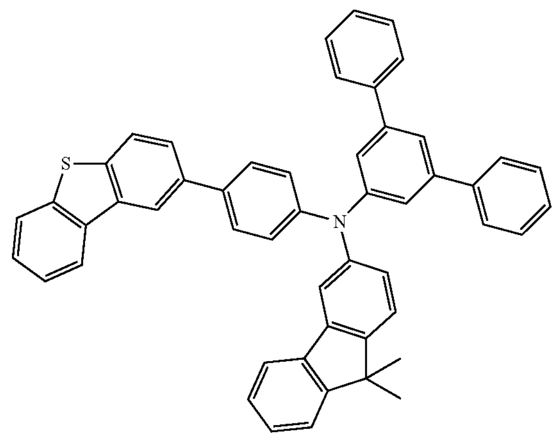
D61
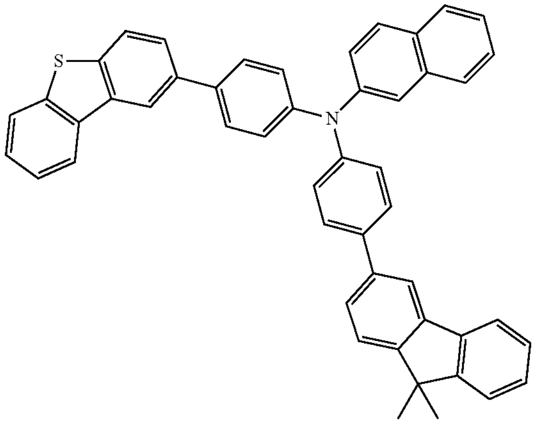
D62
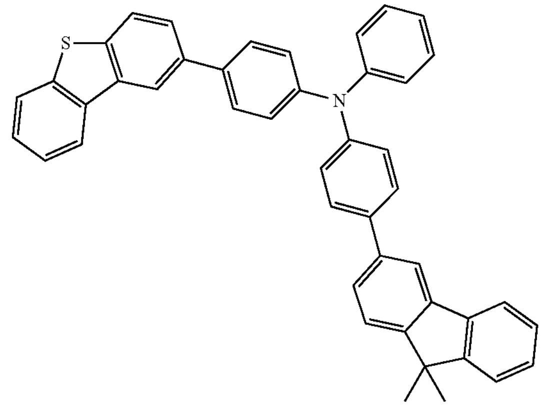

-continued

D63

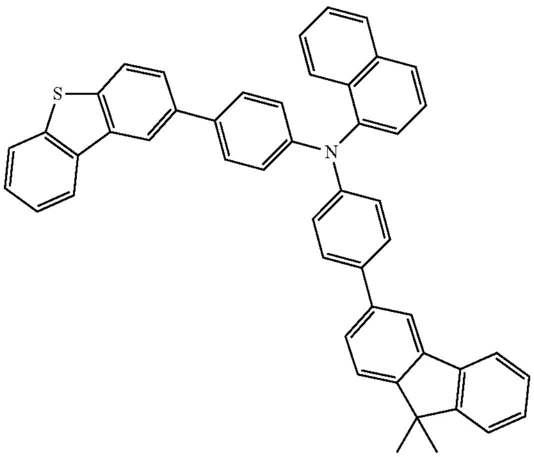

D64

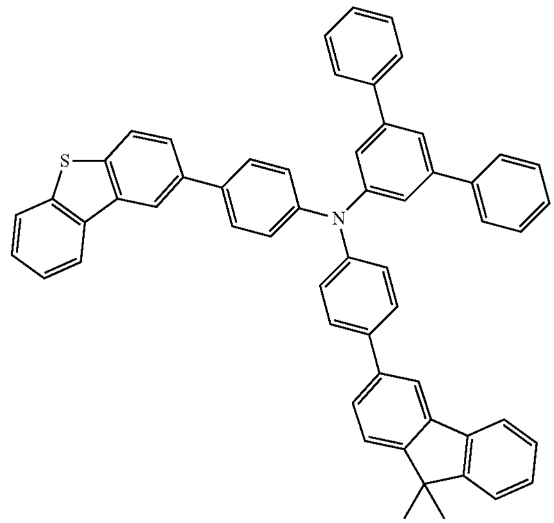

D65

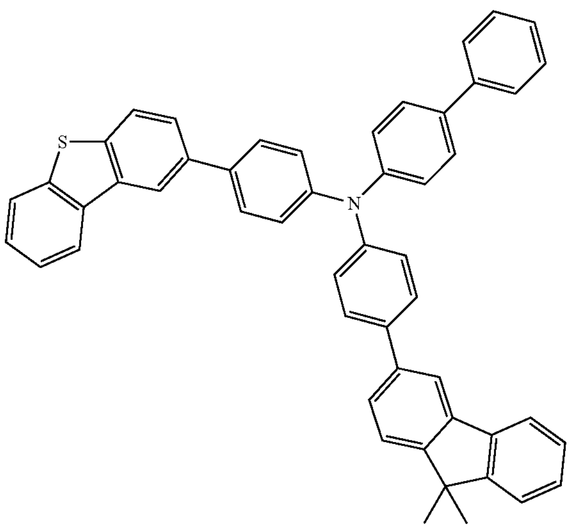

17. An organic light-emitting device comprising:

a first electrode;

a second electrode;

an organic layer between the first electrode and the second electrode, the organic layer comprising an emission layer, and a hole transport region between the first electrode and the emission layer, wherein the hole transport region comprises a hole transport layer (HTL) and a fluorescent assistant layer (FAL), the fluorescent assistant layer is between the hole transport layer and the emission layer, the emission layer comprises a host and a dopant, the host comprises a first compound represented by Formula 1, and the fluorescent assistant layer comprises a second compound represented by one of Formulae 2 and 3:

Formula 1

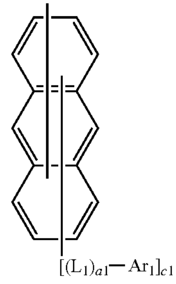

-continued

Formula 1-1

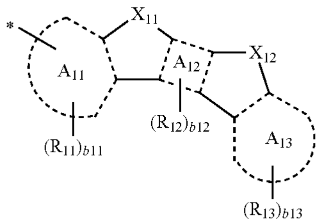

Formula 1-2

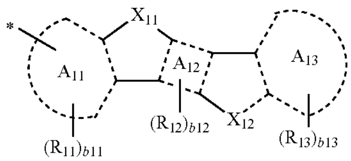

Formula 2

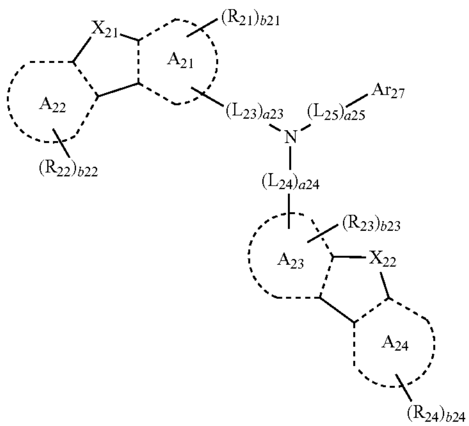

Formula 3

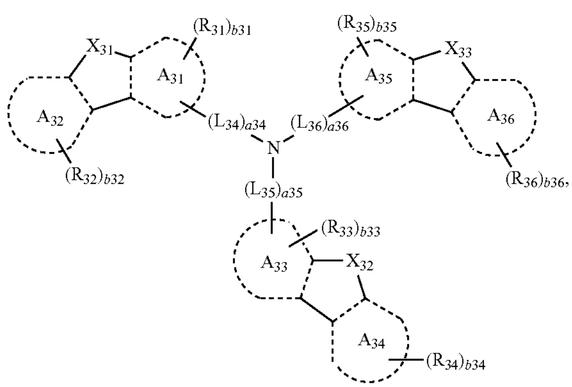

wherein, in Formulae 1, 1-1, 1-2, 2, and 3, $X_{11}$ is selected from $N[(L_{11})_{a11}\text{-}Ar_{11}]$, $C(Ar_{13})(Ar_{15})$, O, and S, $X_{12}$ is selected from $N[(L_{12})_{a12}\text{-}Ar_{12}]$, $C(Ar_{14})(Ar_{16})$, O, and S, $X_{21}$ is selected from $N[(L_{21})_{a21}\text{-}Ar_{21}]$, $C(Ar_{23})(Ar_{25})$, O, and S, $X_{22}$ is selected from $N(L_{22})_{a22}\text{-}Ar_{22}]$, $C(Ar_{24})(Ar_{26})$, O, and S, provided that i) $X_{21}$ is $N[(L_{21})_{a21\text{-}Ar21}$ ]and $X_{22}$ is $N[(L_{21})_{a21}\text{-}Ar_{21,}$ ], or ii) $X_{21}$ is $C(Ar_{23})(Ar_{25})$ and/or $X_{22}$ is $C(Ar_{24})(Ar_{26})$, $X_{31}$ is selected from $N[(L_{31})_{a31}\text{-}Ar_{31}$ $]C(Ar_{34})(Ar_{37})$, O, and S, $X_{32}$ is selected from $N(L_{32})_{a32}\text{-}Ar_{32})]$, $C(Ar_{35})(Ar_{38})$, O, and S, $X_{33}$ is selected from $N[(L_{33})_{a33}\text{-}Ar_{33}]$, $C(Ar_{36})(Ar_{39})$, O, and S, wherein when $X_{31}$ is $N[(L_{31}\ )_{a31}\text{-}Ar_{31}]$, $X_{32}$is $N(L_{32})_{a32}\text{-}Ar_{32}]$, and $X_{33}$ is selected from $N[(_{33})_{a33}\text{-}Ar_{33}]$, O, and S;

when $X_{31}$ is $C(Ar_{34})(Ar_{37})$, $X_{32}$ is $C(Ar_{35})(Ar_{38})$, and $X_{33}$ is selected from $C(Ar_{36})(Ar_{39})$, O, and S; and when $X_{31}$ is O, $X_{32}$ is S, and $X_{33}$ is $N[(L_{33})_{a33}\text{-}Ar_{33}]$, and when $X_{31}$ is S, $X_{32}$ is O and $X_{33}$ is $N[(L_{33})_{a33}\text{-}Ar_{33}]$, $A_{11}$ to $A_{13}$, $A_{21}$ to $A_{24}$, and $A_{31}$ to $A_{36}$ are each independently selected from a $C_5$-$C_{20}$ cyclic group and a $C_1$-$C_{20}$ heterocyclic group, $L_1$, $L_{11}$, $L_{12}$, $L_{21}$ to $L_{25}$, and $L_{31}$ to $L_{36}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1, a11, a12, a21 to a25, and a31 to a36 are each independently an integer selected from 0 to 3, $Ar_1$ is selected from a group represented by Formula 1-1, a group represented by Formula 1-2, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one $Ar_1$ is represented by Formula 1-1, Formula 1-2, or one of Formulae 5-10 to 5-13:

5-10

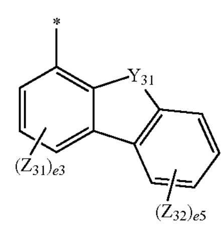

5-11

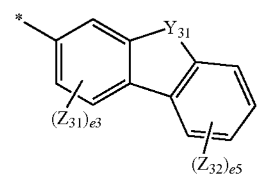

5-12

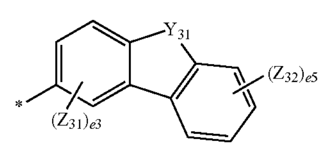

-continued

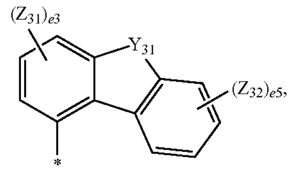

5-13 wherein, in Formulae 5-10 to 5-13, $Y_{31}$ is selected from $C(Z_{34})(Z_{35})$,O, and S, and $Z_{31}$, $Z_{32}$, $Z_{34}$, and $Z_{35}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, and —$Si(Q_{31})(Q_{32})(Q_{33})$, wherein $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, and a naphthyl group, e3 is an integer selected from 1 to 3, e5 is an integer selected from 1 to 4, and * indicates a binding site to an adjacent atom, $Ar_{11}$ to $Ar_{16}$, $Ar_{21}$ to $Ar_{26}$, and $Ar_{31}$ to $Ar_{39}$ are each independently selected from a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, $Ar_{27}$ is selected from the group consisting of:

a phenyl group, a biphenyl group, a terphenyl group, a naphthyl group, a phenanthrenyl group, an anthracenyl group, a triphenylenyl group, a pyrenyl group, and a chrysenyl group; and a phenyl group, a biphenyl group, a terphenyl group, a naphthyl group, a phenanthrenyl group, an anthracenyl group, a triphenylenyl group, a pyrenyl group, and a chrysenyl group, each substituted with at least one selected from deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, and —$Si(Q_{31})(Q_{32})(Q_{33})$, wherein $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, and a naphthyl group, $R_1$, $R_{11}$ to $R_{13}$, $R_{21}$ to $R_{24}$, and $R_{31}$ to $R_{36}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_4)(Q_5)$, and —$(Q_6)(Q_7)$, provided that $R_{21}$ to $R_{24}$ and $R_{31}$ to $R_{36}$ each independently do not include a carbazolyl group, a dibenzofuranyl group, or a dibenzothiophenyl group, b1 is an integer selected from 0 to 9, b11 to b13, b21 to b24, and b31 to b36 are each independently an integer selected from 0 to 6, c1 is an integer selected from 1 to 4, and at least one substituent of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from the group consisting of:

deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl,—Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{11}$)($Q_{12}$)($Q_{13}$), —N($Q_{14}$)($Q_{15}$), and —B($Q_{16}$)($Q_{17}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, —Si($Q_{21}$)($Q_{22}$)($Q_{23}$), —N($Q_{24}$)($Q_{25}$), and —B($Q_{26}$)($Q_{27}$); and —Si($Q_{31}$)($Q_{32}$)($Q_{33}$),—N($Q_{34}$)($Q_{35}$), and —B($Q_{36}$)($Q_{37}$), wherein $Q_1$ to $Q_7$, $Q_{11}$ to $Q_{17}$, $Q_{21}$ to $Q_{27}$, and $Q_{31}$ to $Q_{37}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group, and

* indicates a binding site to an adjacent atom, wherein the organic light-emitting device satisfies Equations 1 to 3:

$$E_{HTL,HOMO} > E_{FAL,HOMO} > E_{host,HOMO} \quad \text{Equation 1}$$

$$E_{host/dopant,\ LUMO} < E_{FAL,LUMO} \quad \text{Equation 2}$$

$$\mu_{h,Fal} \leq \mu_{h,HTL} \quad \text{Equation 3}$$

wherein, in Equations 1 to 3, $E_{HTL,\ HOMO}$ indicates an actual measurement value of enegy level of highest occupied molecular orbital (HOMO) of a material for the hole transport layer, $E_{FAL,\ HOMO}$ indicates an actual measurement value of energy level of HOMO of the second compound, $E_{host,\ HOMO}$ indicates an actual measurement value of energy level of HOMO of the first compound, $E_{host/dopant,\ LUMO}$ indicates an actual measurement value of energy level of lowest unoccupied molecular orbital (LUMO) of each of the first compound and the dopant, $E_{FAL,\ LUMO}$ indicates an actual measurement value of energy level of LUMO of the second compound, $\mu_{h,FAL}$ indicates a hole mobility of the second compound, and $\mu_{h,HTL}$ indicates a hole mobility of the material for the hole transport layer.

18. The organic light-emitting device of claim 17, wherein the dopant is represented by Formula 501:

Formula 501

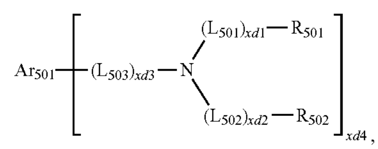

wherein, in Formula 501, $Ar_{501}$ is selected from the group consisting of:

a naphthalene, a heptalene, a fluorene, a spiro-bifluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-bifluorene, a benzofluorene, a dibenzofluorene, a phenalene, a phenanthrene, an anthracene, a fluoranthene, a triphenylene, a pyrene, a chrysene, naphthacene, a picene, a perylene, a pentaphene, and an indenoanthracene, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, a terphenyl group, and —Si($Q_{501}$)($Q_{502}$)($Q_{503}$), wherein $Q_{501}$ to $Q_{503}$ are each independently selected from hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group, $L_{501}$ to $L_{503}$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, $R_{501}$ and $R_{502}$ are each independently selected from the group consisting of:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group, xd1 to xd3 are each independently selected from 0, 1, 2, and 3, and xd4 is selected from 1, 2, 3, and 4.

* * * * *